(12) United States Patent
Koduri

(10) Patent No.: US 12,230,594 B2
(45) Date of Patent: Feb. 18, 2025

(54) PRINTED PACKAGE AND METHOD OF MAKING THE SAME

(71) Applicant: Texas Instruments Incorporated, Dallas, TX (US)

(72) Inventor: Sreenivasan K. Koduri, Dallas, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 196 days.

(21) Appl. No.: 17/557,372

(22) Filed: Dec. 21, 2021

(65) Prior Publication Data

US 2022/0208701 A1 Jun. 30, 2022

Related U.S. Application Data

(60) Provisional application No. 63/132,989, filed on Dec. 31, 2020.

(51) Int. Cl.
*H01L 23/532* (2006.01)
*H01L 23/00* (2006.01)

(52) U.S. Cl.
CPC ........ *H01L 24/05* (2013.01); *H01L 23/53204* (2013.01); *H01L 24/03* (2013.01);
(Continued)

(58) Field of Classification Search
CPC ........... H01L 24/05; H01L 2224/04042; H01L 2924/0665
See application file for complete search history.

(56) References Cited

U.S. PATENT DOCUMENTS 4,974,057 A 11/1990 Tazima
5,550,406 A 8/1996 McCormick
(Continued)

FOREIGN PATENT DOCUMENTS

EP 0240746 A 10/1987

OTHER PUBLICATIONS

PCT Search Report Intl App No. PCT/US 2021/065620 mailed Apr. 21, 2022, 3 pgs.
(Continued)

*Primary Examiner* — Dale E Page
*Assistant Examiner* — Ilner Jean Baptiste
(74) *Attorney, Agent, or Firm* — Ronald O. Neerings; Frank D. Cimino

(57) ABSTRACT

A method for interconnecting bond pads of semiconductor dies or devices with corresponding leads in a lead frame with printed conductive interconnects in lieu of bond wires and an apparatus resulting from the above method. More specifically, some examples include printing an insulating foundation path from bond-pads on a semiconductor die to leads of a lead frame to which the semiconductor die is attached. A foundation conductive trace is printed on top of the insulating foundation path from each bond pad on the die to a corresponding lead of the lead frame. Optionally, on top of the conductive trace, a cover insulating cover layer is applied on exposed portions of the conductive interconnects and the foundation insulating layer. Preferably, this can be the same material as foundation layer to fully adhere and blend into a monolithic structure, rather than separate layers. Optionally, a protective layer is then applied on the resulting apparatus.

51 Claims, 128 Drawing Sheets

(52) U.S. Cl.
CPC .............. *H01L 2224/04042* (2013.01); *H01L 2924/0665* (2013.01); *H01L 2924/10253* (2013.01)

(56) References Cited

U.S. PATENT DOCUMENTS

| | | | |
|---|---|---|---|
| 2014/0312503 A1* | 10/2014 | Seo ................... | H01L 27/14618 257/774 |
| 2017/0047266 A1* | 2/2017 | Ihara ...................... | H01L 24/11 |
| 2019/0043733 A1* | 2/2019 | Kapusta ................ | H01L 23/552 |
| 2020/0083147 A1 | 3/2020 | Bito et al. | |

OTHER PUBLICATIONS

Extended European Search Report mailed Aug. 5, 2024, European Application No. 21916464.7, 8 pages.

* cited by examiner

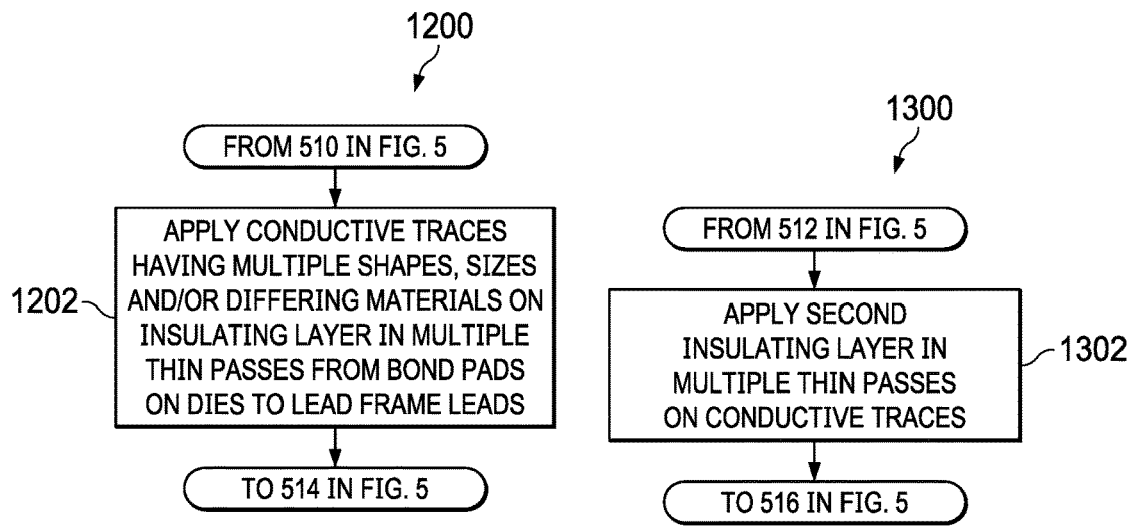
FIG. 12
FIG. 13
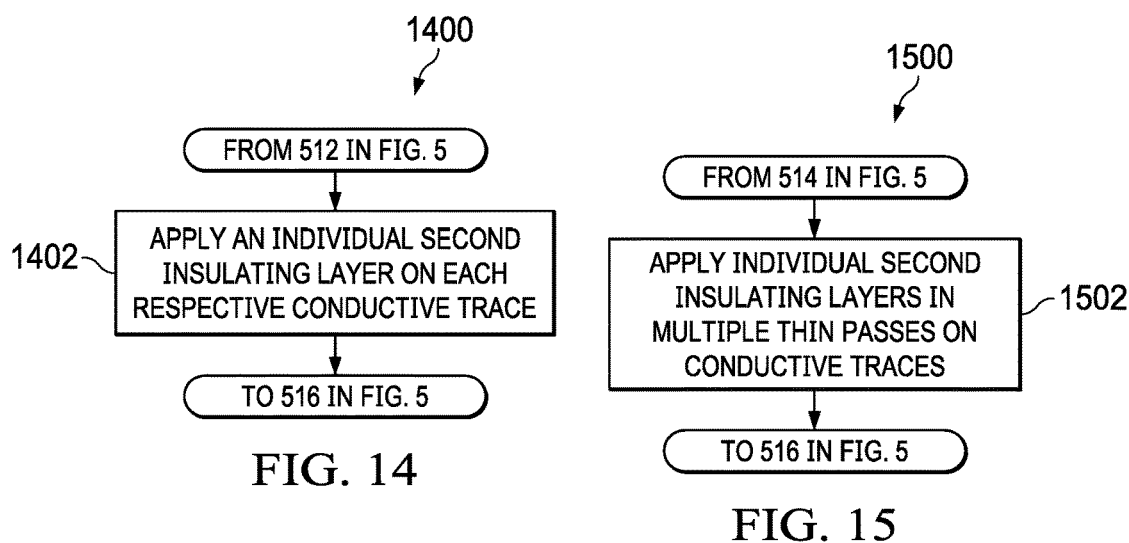
FIG. 14
FIG. 15
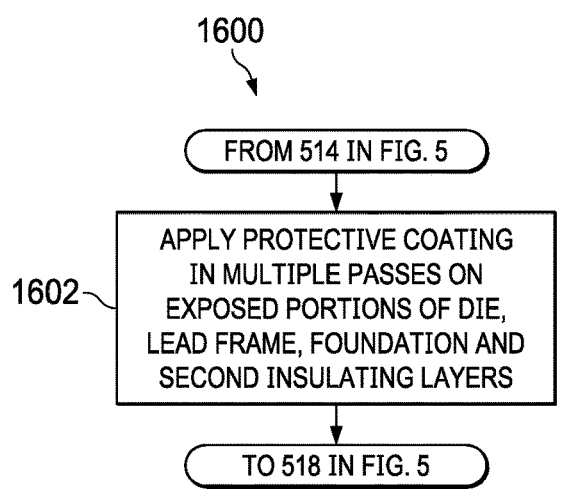
FIG. 16

PRINTING

PRINTED PACKAGE AND METHOD OF MAKING THE SAME

PRIORITY CLAIM TO PREVIOUS APPLICATIONS

This application claims the benefit of U.S. Provisional Application No. 61/132,989 filed Dec. 31, 2020 entitled "PRINTED PACKAGE AND METHOD OF MAKING THE SAME", which is herein incorporated by reference in its entirety.

CROSS REFERENCE TO RELATED APPLICATIONS

This application is related to copending application Ser. No. 63/132,825 filed Dec. 31, 2020, Docket No. TI-92763US01 by Sreenivasan Koduri, entitled "CONFIGURABLE LEADED PACKAGE", which is herein incorporated by reference in its entirety.

BACKGROUND

Wirebonding, or wire bonding, is a process of providing electrical connection between a silicon chip and external leads of a semiconductor device using very fine bonding wires. Typically, gold (Au), aluminum (Al), or copper (Cu) wire is used. During ball wire bonding, a ball is first formed by melting the end of the wire (which is held by a bonding tool known as a capillary) through electronic flame-off (EFO). This free-air ball has a diameter ranging from 1.5 to 2.5 times the wire diameter. Free air ball size consistency, controlled by the EFO and the tail length, is critical in good bonding. The free-air ball is then brought into contact with the bond pad. Adequate amounts of pressure, heat, and ultrasonic forces are then applied to the ball for a specific amount of time, forming the initial metallurgical weld between the ball and the bond pad as well as deforming the ball bond itself into its final shape. The wire is then run to the corresponding finger of the lead frame, forming a gradual arc or "loop" between the bond pad and the lead finger. Pressure and ultrasonic forces are applied to the wire to form the second bond (known as a wedge bond, stitch bond, or fishtail bond, this time with the lead finger. The wire bonding machine or wirebonder breaks the wire in preparation for the next wire bonding cycle by clamping the wire and raising the capillary.

One of the benefits of Moore's law is the continued reduction in die size and cost.

However, while the die size sunk significantly, the printed circuit board (PCB) geometries did not scale at the same rate. This requires the package to redistribute the connections on a small die to a large PCB area. This dissimilar rate of evolution in die and PCB has constrained how much the package size can shrink. Size, location, and pitch of the pins on package are in part defined by the limitations of the PCB and SMT (board assembly) processes. Wire bonding has been the most traditional way of achieving these interconnects between a die and a lead frame to which it is attached within a packaged semiconductor that can be formed from attached to the PCB. Innovations in wire bonding over the past several decades have been significant.

SUMMARY

This Summary is provided to introduce a brief selection of disclosed concepts in a simplified form that are further described below in the Detailed Description including drawings provided. This Summary is not intended to limit the claimed subject matter's scope Examples provide a method for interconnecting bond pads of semiconductor dies or devices with corresponding leads in a lead frame with printed conductive interconnects in lieu of prior art bond wires and an apparatus resulting from the above method. More specifically, some examples include printing an insulating foundation path (PI, Epoxy, Silicone, etc.) from bond-pads on a semiconductor die to leads of a lead frame to which the semiconductor die is attached. A foundation conductive trace is printed on top of the insulating foundation path from each bond pad on the die to a corresponding lead of the lead frame (conductive ink, conductive polymer, sintered Cu sintered Ag, Ag epoxy, etc.). Optionally, on top of the conductive trace, a cover insulating cover layer is applied on exposed portions of the conductive interconnects and the foundation insulating layer. Preferably, this can be the same material as foundation layer to fully adhere and blend into a monolithic structure, rather than separate layers. Optionally, a protective layer is applied on the resulting apparatus using lamination, spray coating, injection molding, casting, A-B multipart casting (epoxy+hardner), glazing, roller painting, brush painting, dipping, screen printing, etc., methods.

BRIEF DESCRIPTION OF THE DRAWINGS

FIG. 12 is a flow diagram of still another example method for manufacturing a packaged electronic device 1200 that modifies the method of FIG. 5 between steps 510 & 514.

FIG. 13 is a flow diagram of still yet another example method for manufacturing a packaged electronic device 1300 that modifies the method of FIG. 5 between steps 512 & 516.

FIG. 14 is a flow diagram of another example method for manufacturing a packaged electronic device 1400 that modifies the method of FIG. 5 between steps 512 & 516.

FIG. 15 is a flow diagram of yet another example method for manufacturing a packaged electronic device 1500 that modifies FIG. 5 between steps 512 & 516.

FIG. 16 is a flow diagram of still another example method for manufacturing a packaged electronic device 1600 that modifies the method of FIG. 5 between steps 514 & 518.

FIG. 75 is a schematic diagram of an EHD/Electrospraying printing apparatus.

FIG. 76 is a schematic diagram of a Laser-induced forward transfer (LIFT) printing apparatus.

FIG. 77A is a top view of an electronic assembly undergoing fabrication according to the example method 500 of FIG. 5 with the implementation at 1102 of FIG. 11, which shows multiple interconnect shapes, sizes, materials, and contacts can be created on a single die.

FIG. 77B is a cross-sectional view of the electronic assembly of FIG. 77A along various reference lines FIG. 78A shows a step gradient in which there is a discrete step boundary between conductive interconnect and insulating layers as different printing inks are used for each, one conductive and the other insulating.

FIG. 78B shows an alternative to the discrete step boundary shown in FIG. 78A in which there are proposed gradient transitions between the conductive interconnect and insulating layers where the printer is provided with a mix of two contacting materials while gradually changing the mix ratio.

FIGS. 79A-79I alternative implementations for a printed package.

Figure 80A:
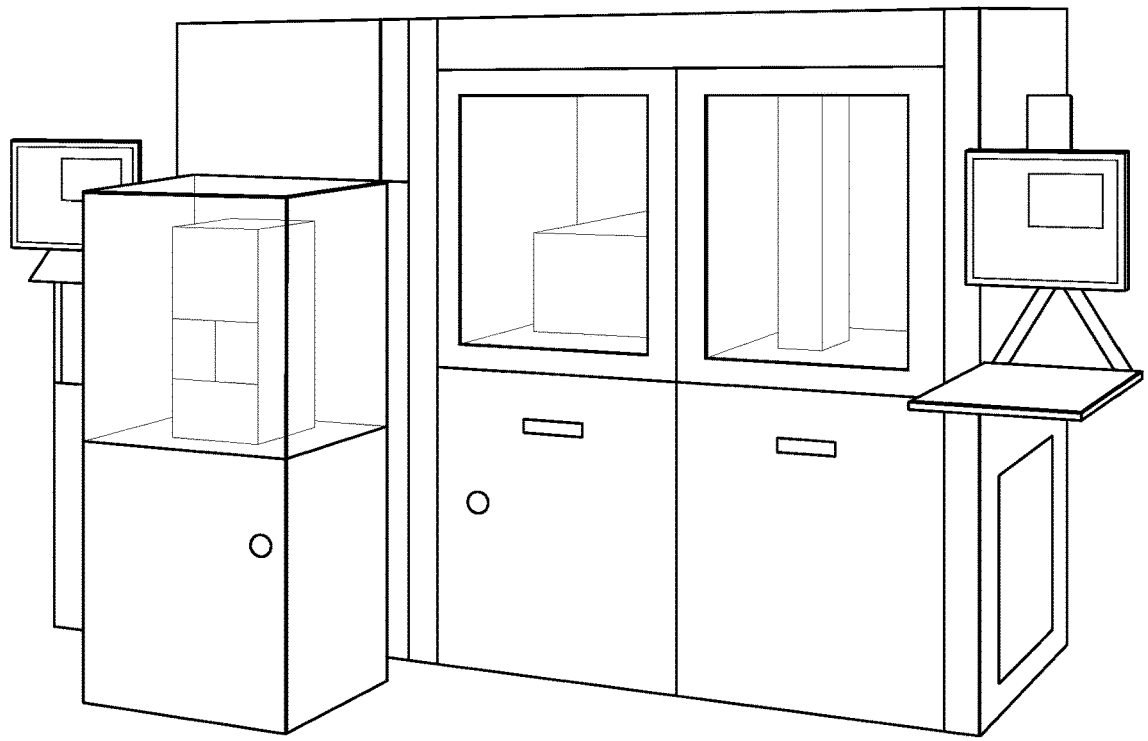

FIG. 80A shows a commercially available inkjet printer.

Figure 80B:
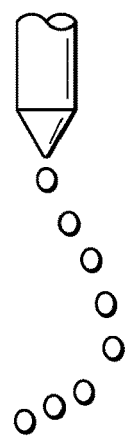
Figure 80C:
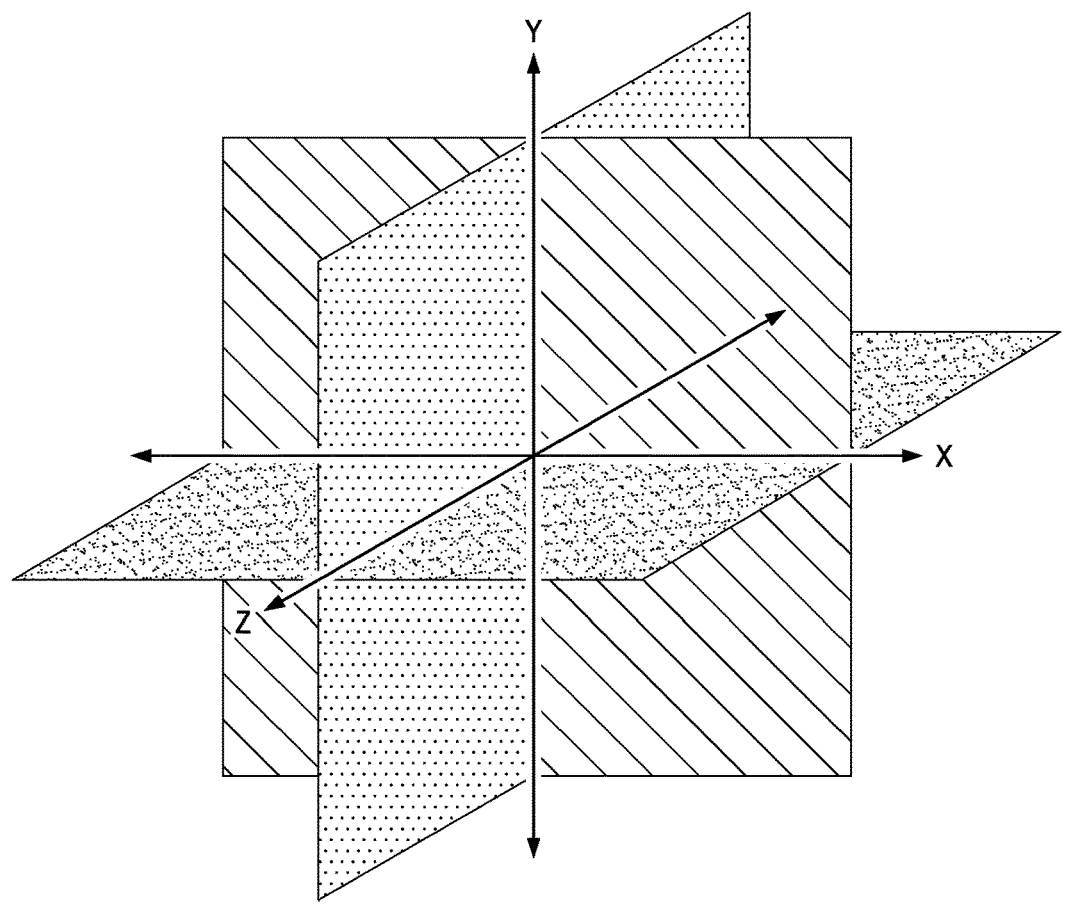

FIG. 80B shows an individual print nozzle for providing individually controlled flow of a specific material and can move along the X, Y & Z axis shown in FIG. 80C.

FIG. 80C shows an X, Y & Z axis.

Figure 81B:
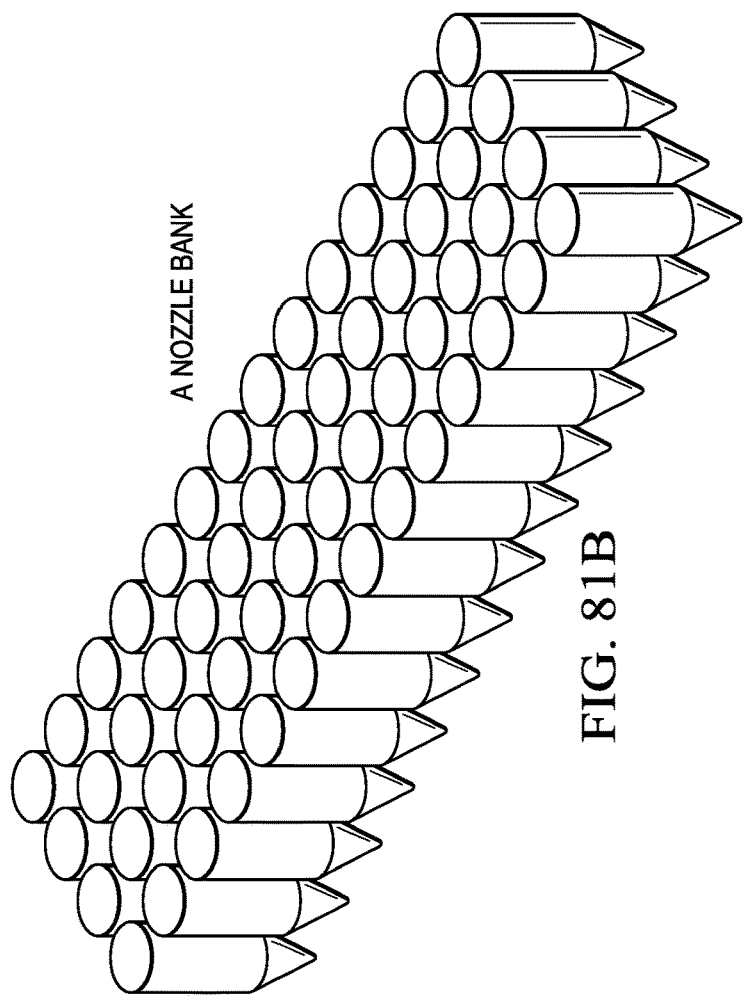
Figure 81A:
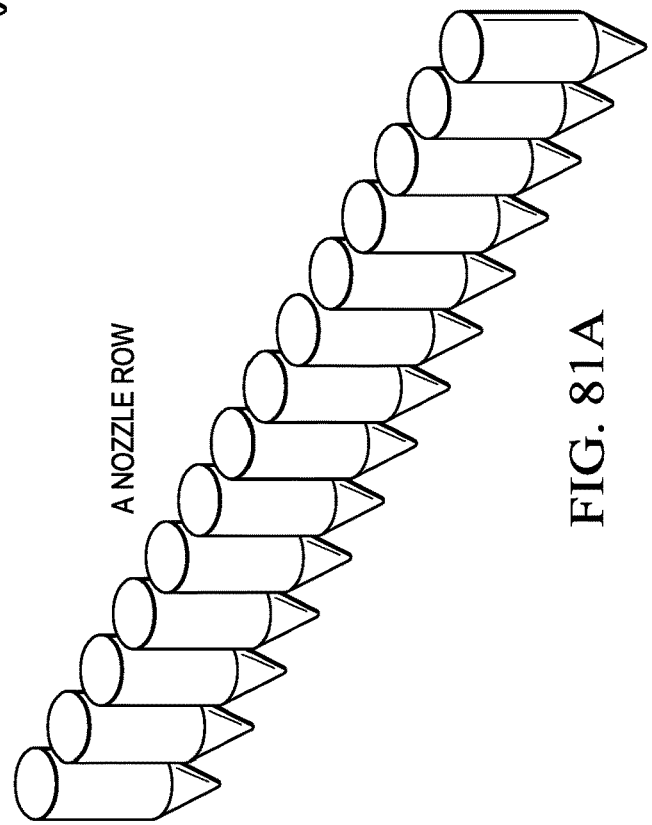

FIG. 81A shows a nozzle row for replacing the individual print nozzle of FIG. 80B.

FIG. 81B shows a nozzle bank for replacing the individual print nozzle of FIG. 80B.

Figure 81C:
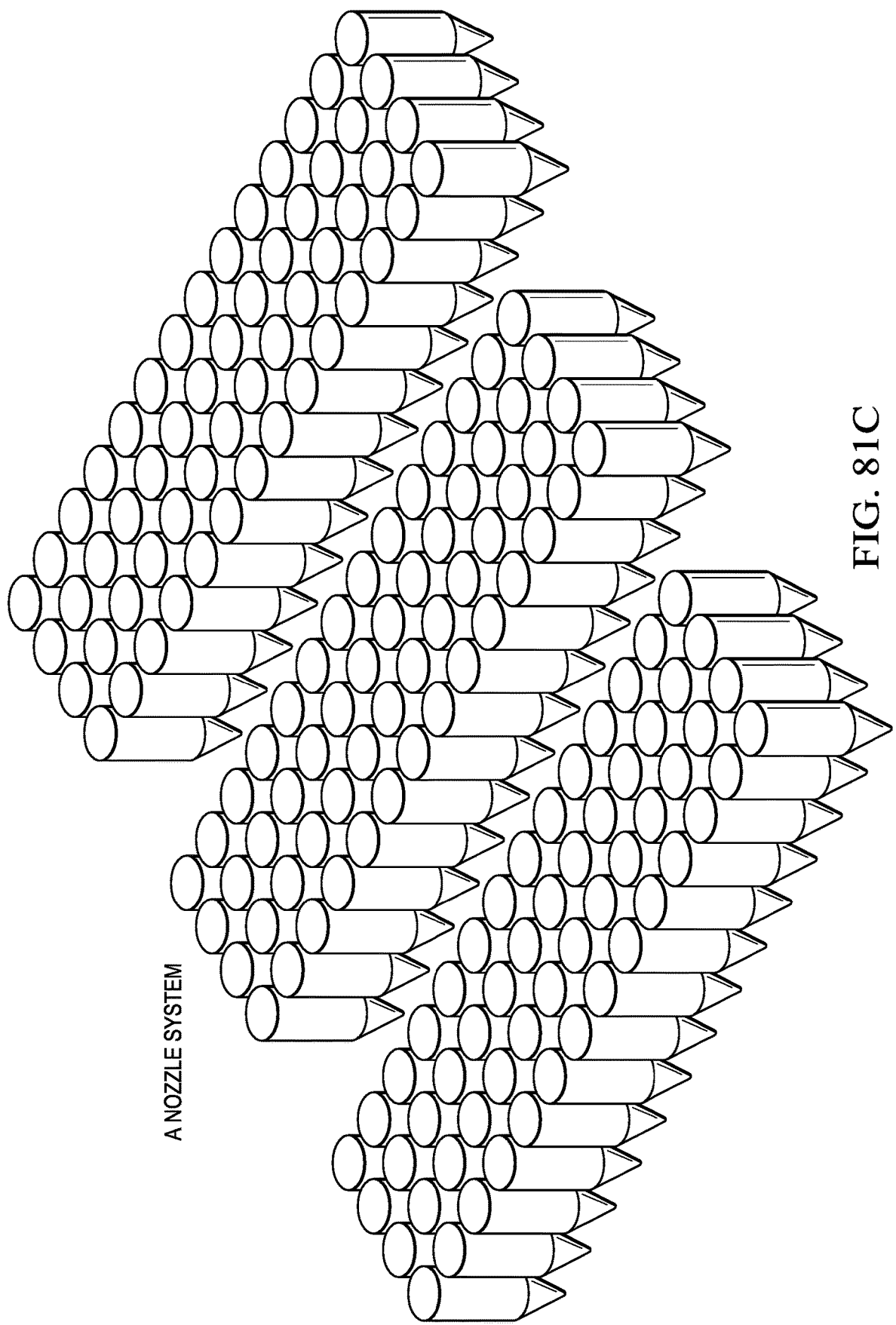

FIG. 81C shows a nozzle system for replacing the individual print nozzle of FIG. 80B.

Figure 82:
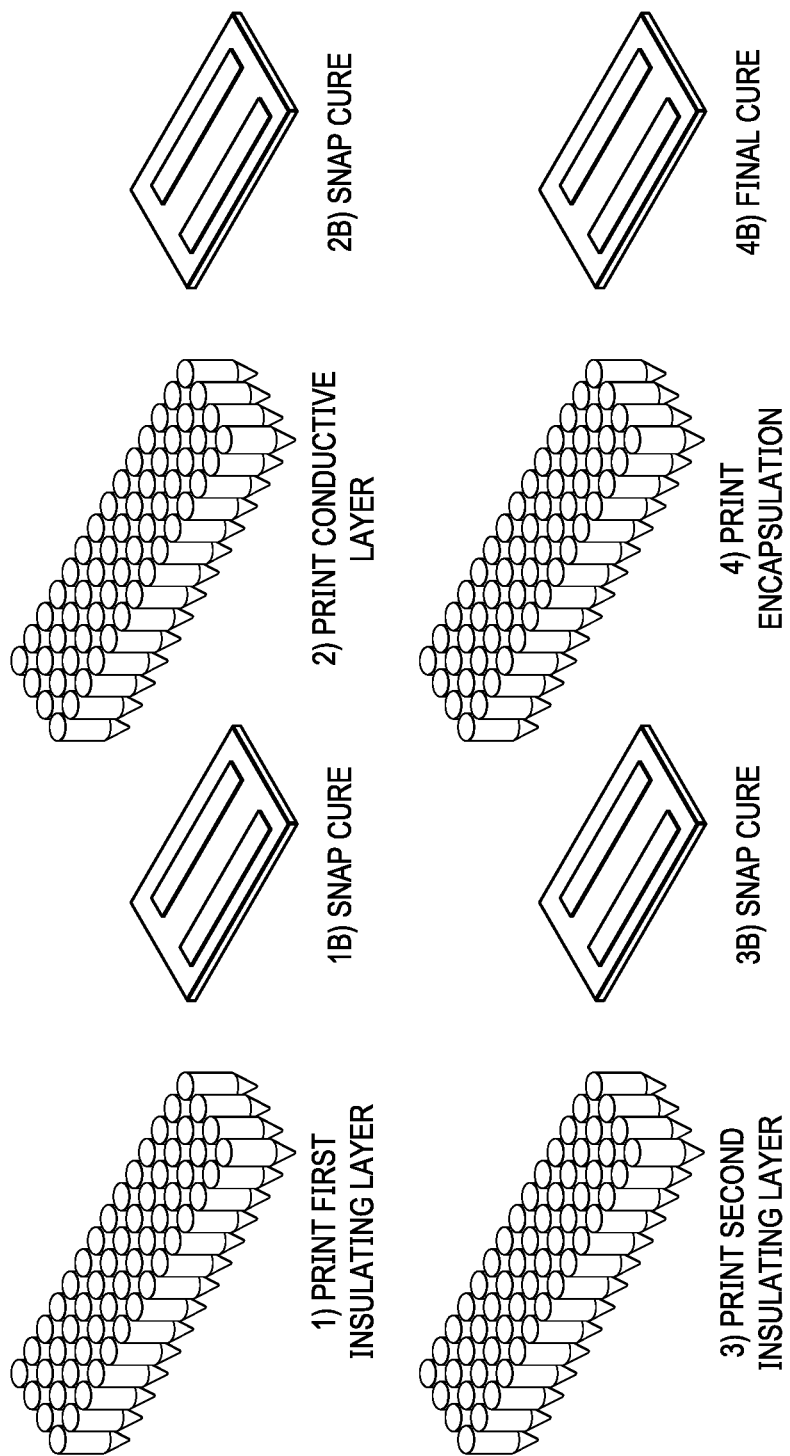

FIG. 82 shows an example of a printing system for printing the foundation insulating layer(s), conductive interconnects, cover insulating layers and protective layer(s) which sequentially arranging banks of printing nozzles and with integrated curing systems to enable productivity and materials flexibility, according to above described examples.

DETAILED DESCRIPTION

In the drawings, like reference numerals refer to like elements throughout, and the various features are not necessarily drawn to scale. In the following discussion and in the claims, the terms "including", "includes", "having", "has", "with", or variants thereof are intended to be inclusive in a manner similar to the term "comprising", and thus should be interpreted to mean "including, but not limited to . . . " Also, the term "couple" or "couples" is intended to include indirect or direct electrical or mechanical connection or combinations thereof. For example, if a first device couples to or is coupled with a second device, that connection may be through a direct electrical connection, or through an indirect electrical connection via one or more intervening devices and connections.

In this description, the terms "semiconductor die" and "semiconductor device" are used and are synonymous. As used herein, "semiconductor die" means a die formed using semiconductor material. Examples include dies containing integrated circuits, where several and sometimes hundreds or thousands of transistors are formed and are coupled together using patterned conductors to perform a desired function. Additional examples include dies including passive devices such as resistors, capacitors, inductors and diodes formed on a semiconductor substrate. Discrete devices such as one, or a few, power field effect transistors (FETs), bipolar junction transistors (BJTs), rectifiers, and amplifiers formed on semiconductor substrates are also examples of semiconductor dies. Analog-to-digital converters, RF filters, transceivers, photocells, photodiodes, digital micromirror devices (DMDs), and transformers are additional examples of semiconductor dies. As used herein, a "packaged semiconductor device" or "a packaged electronic device" is a semiconductor die that has been mounted on a substrate with leads or terminals for making electrical connections, and which is wholly or partially covered in mold compound or other protective material.

In this description, the term "leadframe" or "lead frame" is used. As used herein, "leadframe" or "lead frame" are metal structures inside a semiconductor chip/die package that carry signals or power from the chip/die to the outside of the package or vis versa. Lead frames can be made of Cu or an alloy of Cu. Laminate (substrate, PCB, etc.), brass, steel, aluminum, etc., can be formed from alterative choices. Metal lead frames can be pre-plated with NiPdAu, NuPd, NuPdAgAu, Ag spot, Cu, NiSn, Sn, etc. Bare Cu lead frames are also an option. The finish of the lead frames can additionally be roughened to increase adhesion.

In this description, the term "inkjet deposition" is used for an example process of depositing material. As used herein, "inkjet deposition" means depositing material from a liquid in a reservoir that feeds a nozzle by forming drops in response to an electrical signal as the nozzle is moved with respect to a surface. An inkjet deposition tool may have tens, hundreds or more nozzles. In printing, the material is ink, and the inkjet deposition process is referred to as "inkjet printing". In deposition of materials in manufacturing, the liquid to be deposited can be referred to as "ink" and as used herein the term "ink" can include solder, dielectrics, conductive materials, adhesives, and polymers as used in the arrangements. Inkjet deposition allows precise placement of material by using "drop on demand" (DOD) technology, where a reservoir of the liquid has a nozzle, and a small volume of the liquid is forced from the nozzle in response to an electrical signal. The liquid forms a drop as it falls vertically onto a surface. The precision of the inkjet deposition tool allows deposition of the liquid material in some areas and not in others as the tool traverses across the surface (or if the tool is fixed, as the surface moves beneath the tool). The reservoir can include a piezo-electric actuator that expels a known volume of ink through a nozzle in response to an electrical signal, or in a thermal inkjet deposition tool, the liquid can be heated quickly by a resistive element in the reservoir, and expand, forcing a known volume of liquid through the nozzle. The liquid forms drops that travel vertically to land on the surface that the material is deposited on. Because the material can be very accurately placed even in small areas, no etch or material removal step is needed to remove material after the inkjet deposition. Also, the material is used very efficiently with little waste when compared to spin coating, screen print deposition or slit print deposition processes. Multiple inkjet deposition passes can be used to build up a thicker layer of material.

In this description, the terms "screen print deposition" and "slit print deposition" are used. As used herein, screen print deposition means using a stencil to cover areas to be excluded from the deposition and dragging a liquid ink across the stencil, while openings in the stencil allowing deposition in those areas. As used herein, slit print deposition means using slits in a tool and moving the slits across the substrate as ink flows through the slits to deposit the material onto the substrate.

Figure 1:
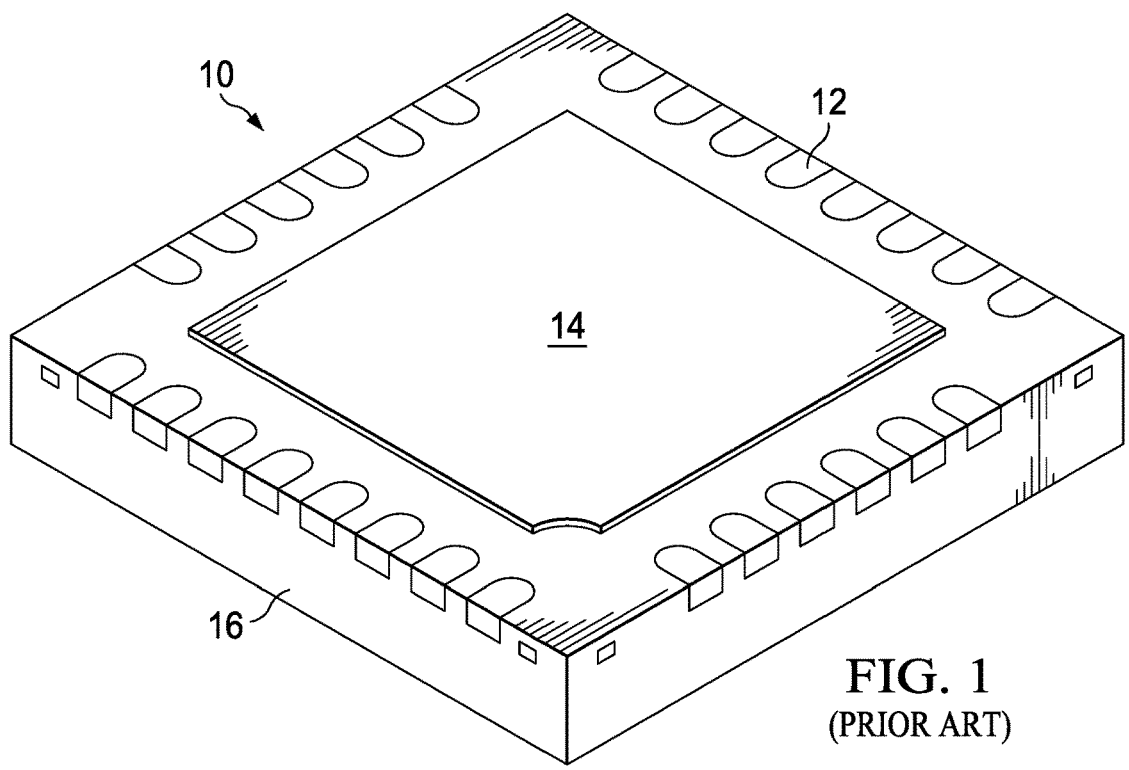
FIG. 1 is a perspective view of a bottom surface of a typical 28-pin, single row, QFN device.

A Quad Flat No Leads package (QFN) is a widely used device in the consumer electronics market. QFN devices have been in use for about 20 years. Unlike for leaded devices, in QFN, the electrical contacts or terminals are inset into the mold cap. Nothing extends from the QFN device in order to surface mount, see FIG. 1. This feature of the non-leaded packages (QFN and SON) allows them to be small, on the order of chip-scale.

Figure 2:
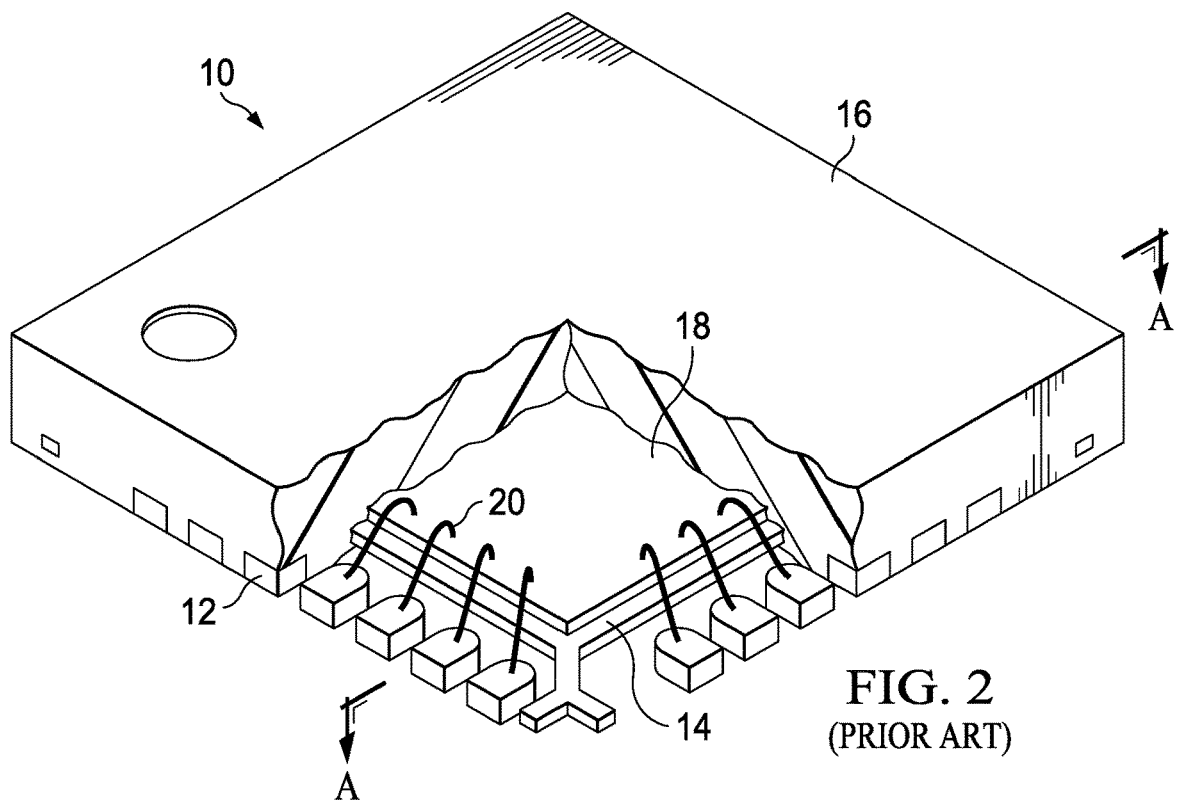
FIG. 2 is a perspective view of a top surface of the QFN device of FIG. 1 with a portion of the device encapsulation material removed.
Figure 3:
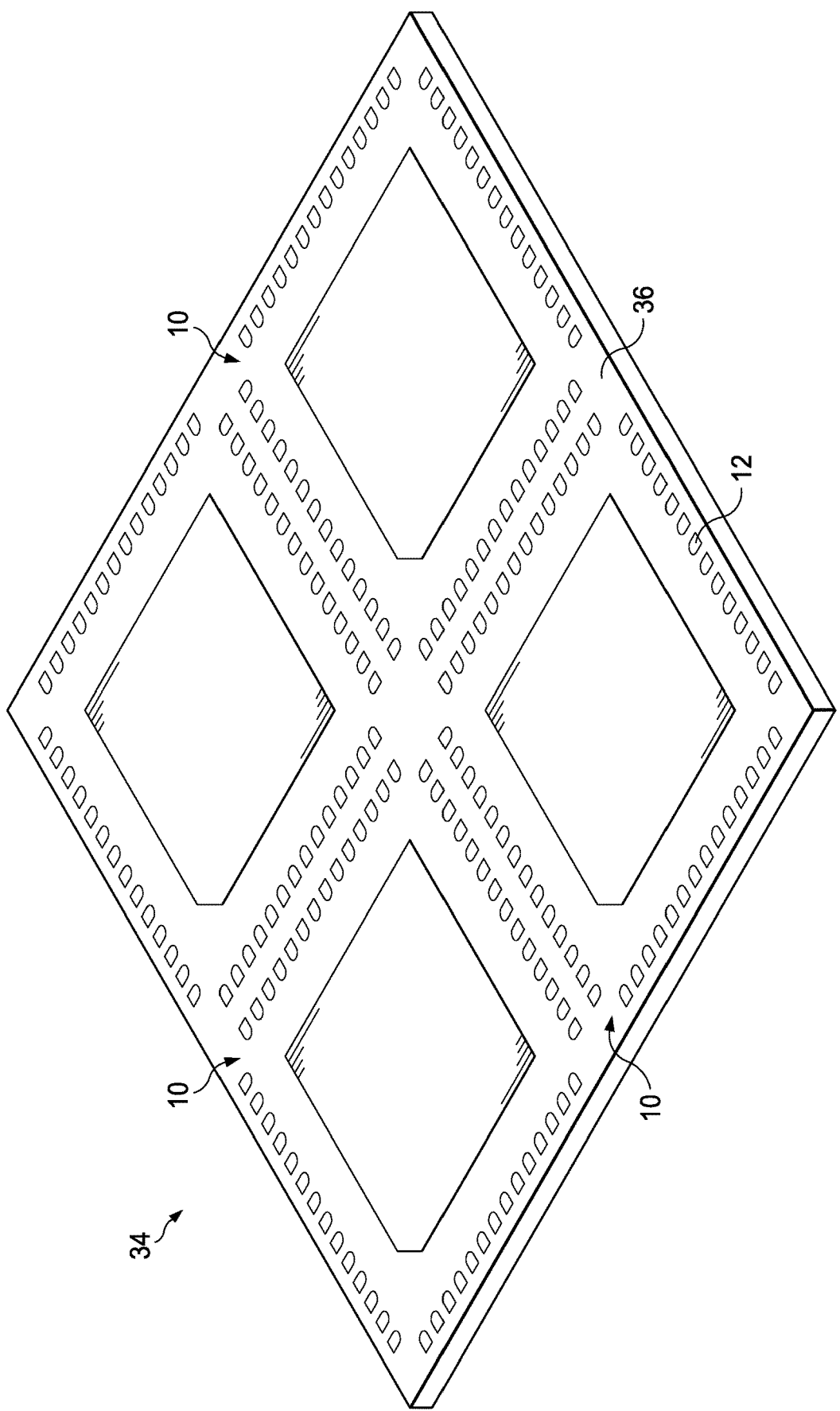
FIG. 3 is a perspective view of a portion of a lead frame strip, four QFN lead frames being shown.
Figure 4:
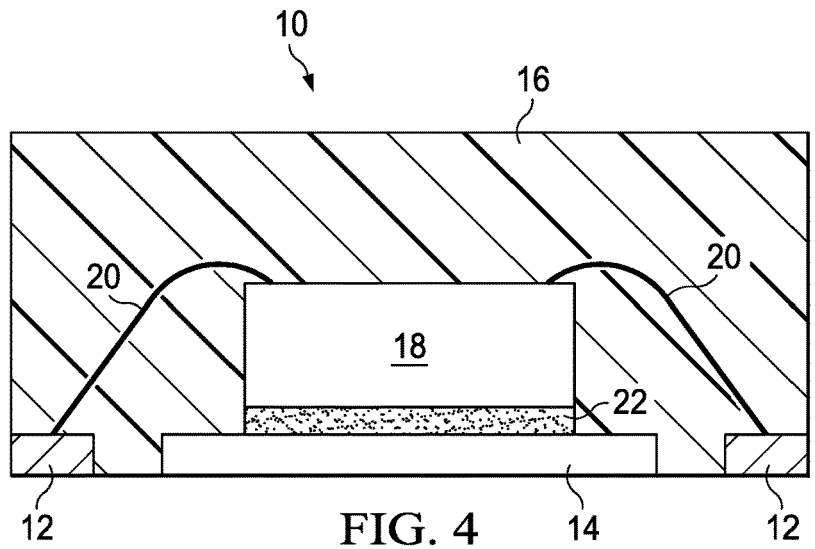
FIG. 4 is a side sectional view of QFN device 10 along reference line A-A of FIG. 2.

A QFN device 10 begins with a lead frame having a die attach pad 14, which may also serve as a thermal pad, and leads 12, see FIG. 2. In at least one embodiment the lead frame is constructed of copper material, 200 um (or 8 mils) thick and the width of each lead is 200 mm. Next, an integrated circuit (IC) die 18 is attached, via die attach material 22, to a top surface of die attach pad 14. Next, wire bonds 20 are formed between lead frame leads 12 and the electrical contacts or terminals of the IC die 18. Finally, the resulting combination of IC die, die support pad, lead frame and bond wires are encapsulated with a mold compound 16. Typically plastic is used as the mold compound, but use of other materials, including ceramics, can also be used. In a typical QFN fabrication process 34, there are multiple QFN devices 10 on a lead frame strip 36 that are block molded/encapsulated at the same time, see FIG. 3. The QFN devices 10 are thereafter singulated to produce individual QFN devices or units, see FIGS. 1 & 2. A flat surface at the bottom of the QFN device is the only contact surface for mounting to a printed wiring board (PWB). Leads 12 and die attach/thermal pad 14 are not covered by the plastic mold/encapsulant 16. The exposed surface of the die attach/thermal pad 14 can be soldered to a corresponding pad on a PWB or attached with other heat conductive die attach material. The leads 12 of QFN device 10 can be soldered to corresponding electrical contacts or terminals, on a PWB. FIG. 4 is a side sectional view of QFN device 10 along reference line A-A of FIG. 2.

Wire bonding, as shown above in device 10, is fundamentally a unit process in which a standard wire size (and material) is used to make one bond at a time. Wireless Chip Scale Packages (WCSP), etc., packages limit the ability to utilize very small dies. Because of the shape of the wire bond loops, the subsequent step of encapsulation is typically done with transfer molding, which is also a complex process. Wire bonding and molding processes also severely limit the size of the strip (lead frame) that can be processed through respective processes. This in turn limits productivity and ability to reduce costs associated with manufacturing. Moreover, in addition to the production and cost issues associated with wire bonded devices, dies designed for higher operating frequencies such as those encountered in mmWave devices (20-300 GHz) make wire bonded interconnects lossy and cause incoming signals to reflect away from the signals intended destination. As a result of all of these issues a replacement interconnect technology for wire bonding is needed as die sizes continue to shrink and/or operating frequencies of the dies continue to increase.

Figure 5:
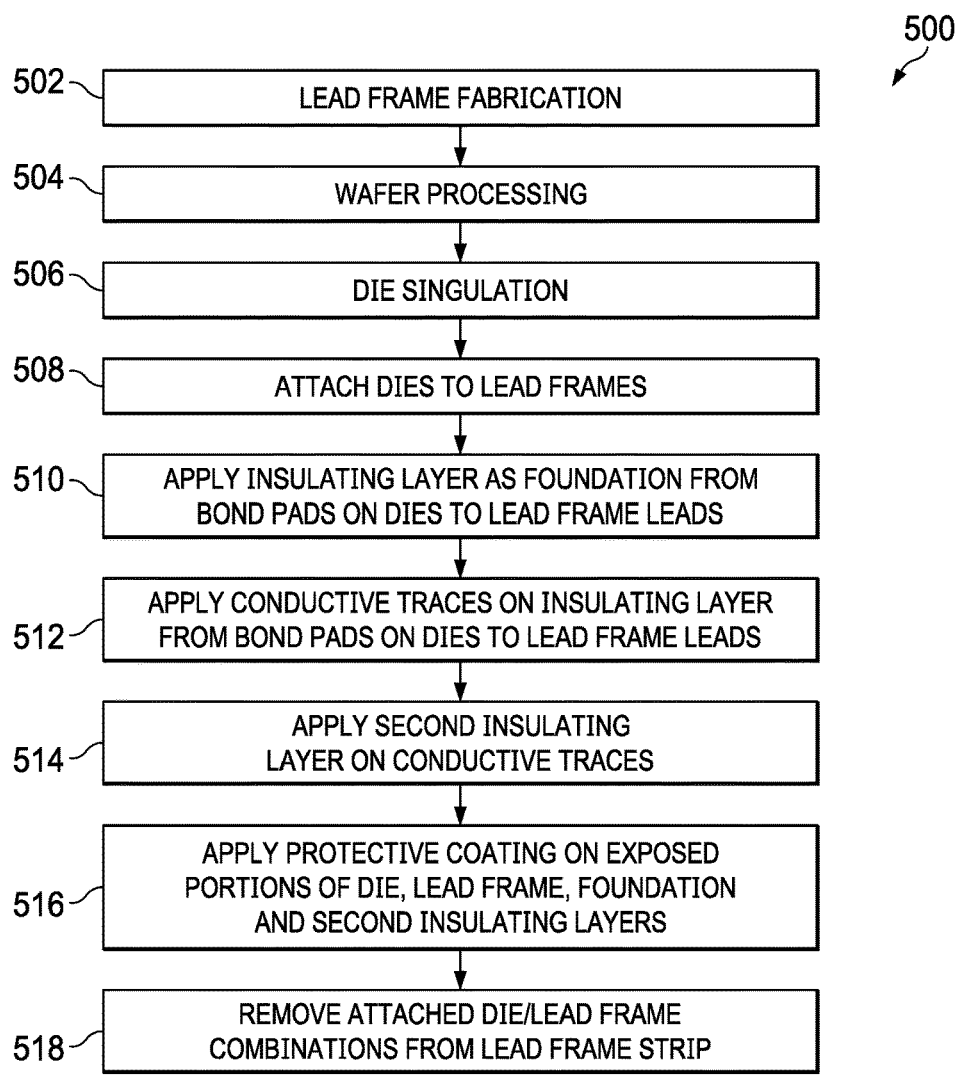
FIG. 5 is a flow diagram of a method for manufacturing a packaged electronic device.

FIG. 5 shows a method for manufacturing a packaged electronic device that overcomes many of the aforementioned problems and limitations of wire bonded interconnects between lead frame leads and bond pads on a die attached to the lead frame. The method includes, inter alia, printing conductive interconnects between bond pads on an integrated circuit die to corresponding leads of a lead frame to which the integrated circuit is attached. Described examples of printing include inkjet, scribe dispensing, aerosol jet, Laser Transfer, Spray, EHD, Microdispensing, etc. to print or deposit conductive inks, conductive polymers, metal filled epoxies, sintering metallic powder, liquid assisted sintering particles, or solder paste to form conductive traces and/or contacts. In one embodiment, a method 500 includes lead frame fabrication at 502 which can include manufacturing a lead frame strip having multiple lead frames or lead frame units. Alternatively, a lead frame strip could instead be acquired from a company that manufactures the desired lead frame strip. Wafer processing at 504 is used to produce multiple desired integrated circuit devices or dies on a wafer. Die singulation is performed at 506 to separate the multiple die wafer into individual integrated circuit dies. Alternatively, individual integrated circuit dies could instead be acquired from a company that manufactures the desired integrated circuit dies. Integrated circuit dies are next attached to the lead frame units using an epoxy, silicone, solder, sintered metal, hybrid polymers, or other adhesives at 508. After the integrated circuit dies are attached to the lead frame units, a base or foundation insulating layer is applied spanning from bond pads on the dies to respective lead fingers of the lead frame units at 510. A polymer, epoxy, silicone, mold or other insulating material can be used for the insulating layer. At 512 conductive traces are formed between bond pads on the dies to respective lead fingers on the lead frame units by depositing or otherwise forming conductive inks, conductive polymers, metal filled epoxies, sintered metallic powder, liquid assisted sintering particles or solder paste on the foundation insulating layer from bond pads on the dies to respective lead fingers on the lead frame units. A covering or second insulating layer is applied on exposed portions of the conductive traces at 514. A protective coating is applied on uncovered or exposed portions of the die, base insulating layer, second insulating layer and lead frame leads at 516. The coated die/lead frames are thereafter singulated and removed from the lead frame strip at 518.

Figure 6:
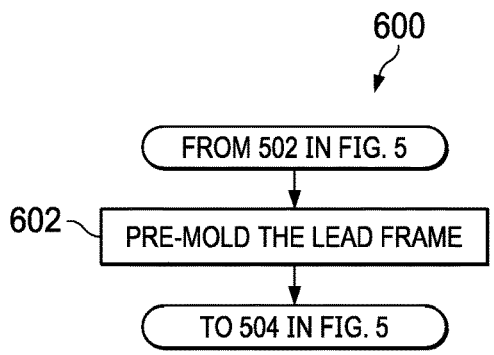
FIG. 6 is a flow diagram of one example method for manufacturing a packaged electronic device 600 that modifies the method of FIG. 5 between steps 502 & 504.
Figure 7:
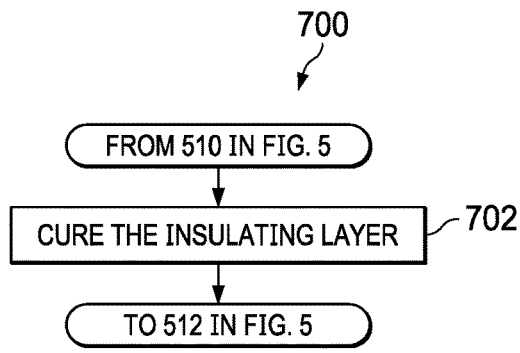
FIG. 7 is a flow diagram of another example method for manufacturing a packaged electronic device 700 that modifies the method of FIG. 5 between steps 510 & 512.
Figure 8:
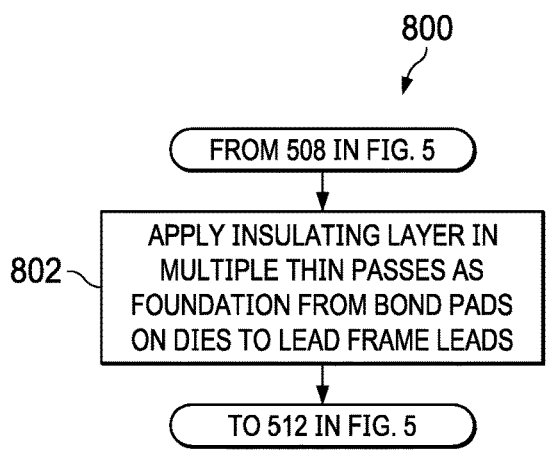
FIG. 8 is a flow diagram of yet another example method for manufacturing a packaged electronic device 800 that modifies the method of FIG. 5 between steps 508 & 512.
Figure 9:
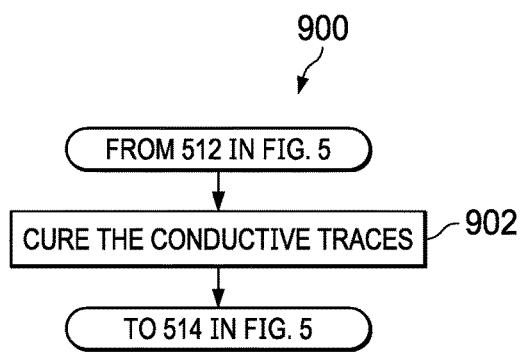
FIG. 9 is a flow diagram of still yet another example method for manufacturing a packaged electronic device 900 that modifies the method of FIG. 5 between steps 512 & 514.

FIGS. 6-16 show various example modifications to the method for manufacturing a packaged electronic device shown in FIG. 5, each modification producing a different embodiment or example. FIG. 6 shows one example method for manufacturing a packaged electronic device 600 that modifies the method of FIG. 5 between steps 502 & 504. This example includes pre-molding the lead frame at step 602 prior to wafer processing at step 504. Alternatively, pre-molding of the lead frame can occur at any time after fabrication of the lead frame at step 502 to just prior to insulating layer application at step 510. FIG. 7 shows another example method for manufacturing a packaged electronic device 700 that modifies the method of FIG. 5 between steps 510 & 512. This example includes curing the insulating layer at step 702 prior to applying conductive traces on the insulating layer from bond pads on dies to lead frame leads. FIG. 8 shows yet another example method for manufacturing a packaged electronic device 800 that modifies the method of FIG. 5 between steps 508 & 512. This example includes replacing the step of applying the insulating layer as foundation from bond pads on dies to lead frame leads at step 510 in FIG. 5 with apply the insulating layer in multiple thin passes as foundation from bond pads on dies to lead frame leads at step 802. This step essentially replaces the single pass application of the foundation insulating layer at step 510 in FIG. 5 with a multiple pass foundation layer at step 802. FIG. 9 shows still yet another example method for manufacturing a packaged electronic device 900 that modifies the method of FIG. 5 between steps 512 & 514. This example includes curing the conductive traces at step 902 prior to applying the second insulating layer on contact traces at step 514.

Figure 10:
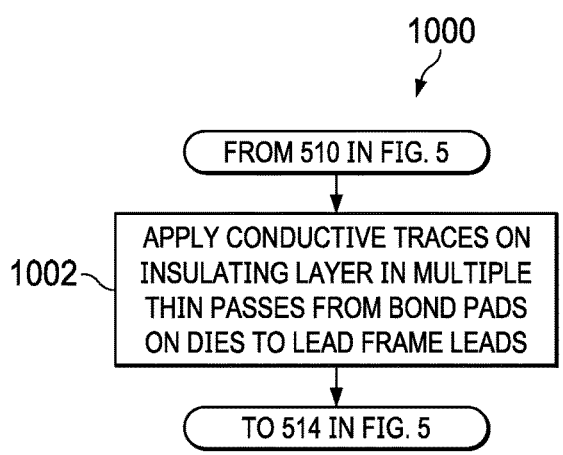
FIG. 10 is a flow diagram of another example method for manufacturing a packaged electronic device 1000 that modifies the method of FIG. 5 between steps 510 & 514.
Figure 11:
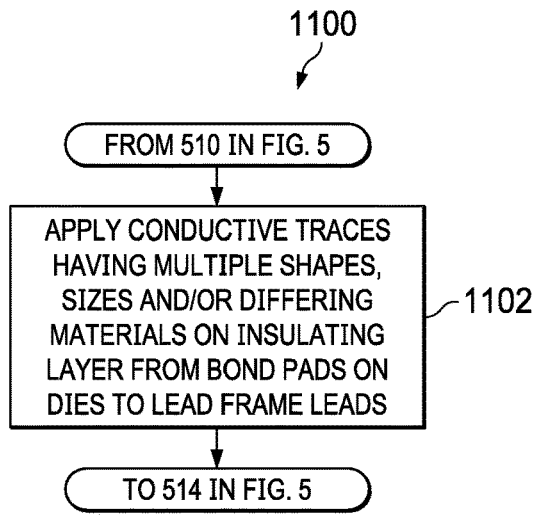
FIG. 11 is a flow diagram of yet another example method for manufacturing a packaged electronic device 1100 that modifies the method of FIG. 5 between steps 510 & 514.

FIG. 10 shows another example method for manufacturing a packaged electronic device 1000 that modifies the method of FIG. 5 between steps 510 & 514. This example includes replacing the single pass apply conductive traces on insulating layer from bond pads on dies to lead frame leads at step 512 in FIG. 5 with multiple pass conductive traces applied on insulating layer from bond pads on dies to lead frame leads at step 1002. This step essentially replaces the single pass conductive traces at step 512 in FIG. 5 with a multiple pass conductive traces at step 1002. FIG. 11 shows yet another example method for manufacturing a packaged electronic device 1100 that modifies the method of FIG. 5 between steps 510 & 514. This example includes replacing the conductive traces applied on insulating layer from bond pads on dies to lead frame leads at step 512 in FIG. 5 with conductive traces having multiple shapes, sizes, and/or differing materials on insulating layer from bond pads on dies to lead frame leads at step 1102. This step essentially replaces the single shape, size and/or material traces at step 512 of FIG. 5 with conductive traces having differing shapes, sizes and/or materials at step 1102. FIG. 12 shows still another example method for manufacturing a packaged electronic device 1200 that modifies the method of FIG. 5 between steps 510 & 514. This example includes replacing the single pass apply conductive traces applied on insulating layer from bond pads on dies to lead frame leads at step 512 in FIG. 5 with conductive traces applied in multiple thin passes having differing shapes, sizes and/or materials at step 1202. This step essentially replaces the single pass conductive traces at step 512 of FIG. 5 with conductive traces, applied in multiple thin passes, having differing shapes, sizes and/or materials at step 1202.

FIG. 13 shows still yet another example method for manufacturing a packaged electronic device 1300 that modifies the method of FIG. 5 between steps 512 & 516. This example includes replacing the single pass second insulating layer on conductive traces at step 514 in FIG. 5 with a second insulating layer applied in multiple thin passes on the conductive traces at step 1302. FIG. 14 shows another example method for manufacturing a packaged electronic device 1400 that modifies the method of FIG. 5 between steps 512 & 516. This example includes replacing the second insulating layer on conductive traces at step 514 in FIG. 5 with an individual second insulating layer on each respective conductive trace at step 1402. FIG. 15 shows yet another example method for manufacturing a packaged electronic device 1500 that modifies FIG. 5 between steps 512 & 516. This example includes replacing the second insulating layer on conductive traces at step 514 in FIG. 5 with an individual second insulating layer in multiple thin passes on each respective conductive trace at step 1502. FIG. 16 shows still another example method for manufacturing a packaged electronic device 1600 that modifies the method of FIG. 5 between steps 514 & 518. This example includes replacing step 516 in FIG. 5 with applying the protective coating in multiple passes on exposed portions of the die, lead frame, foundation and second insulating layers at step 1602. Each of the methods shown in FIGS. 6-16 can be used to modify the method in FIG. 5 alone, or in combination with one or more of the other methods.

To overcome the aforementioned deficiencies of wire bonds, in various embodiments, wire bonds 20 in FIG. 4 are replaced with printed conductive traces or interconnects enclosed within first and second insulating layers. FIGS. 17-92 show a packaged electronic device (e.g., a QFN device in this example) undergoing fabrication according to the example method 500 of FIG. 5 including as modified by various ones of, or combinations of, FIGS. 6-16.

Figure 17A:
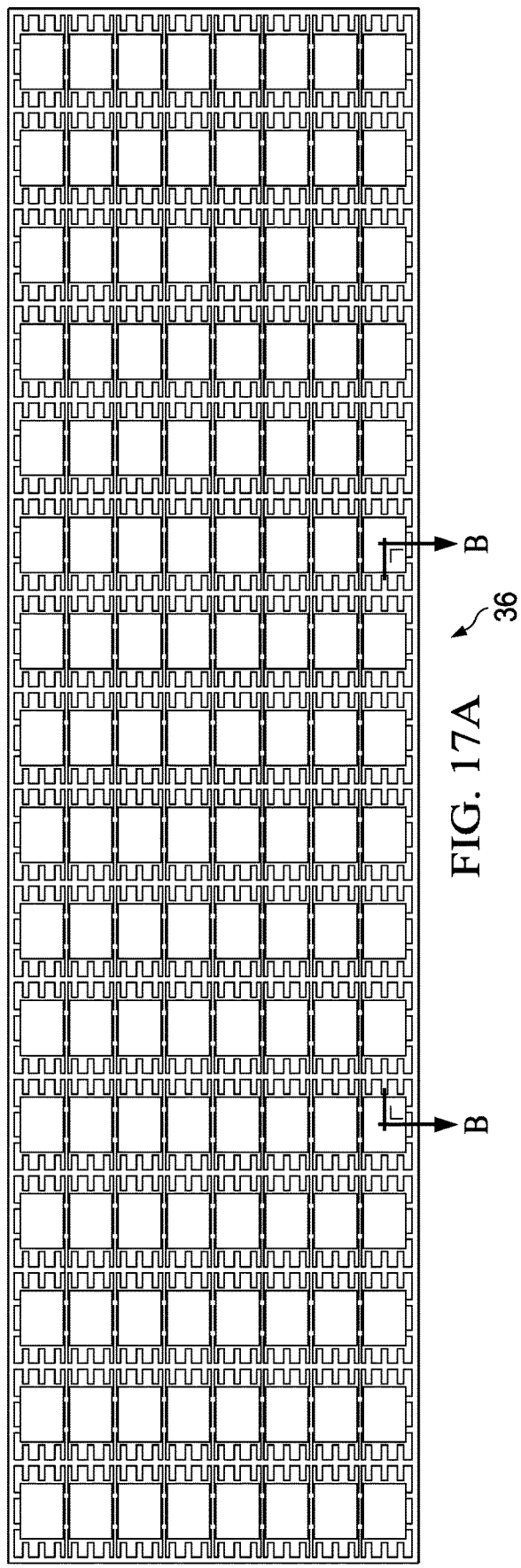
FIG. 17A is a top view of a QFN lead frame strip 36 comprising a number of individual six lead or pin lead frame units 37.
Figure 17B:
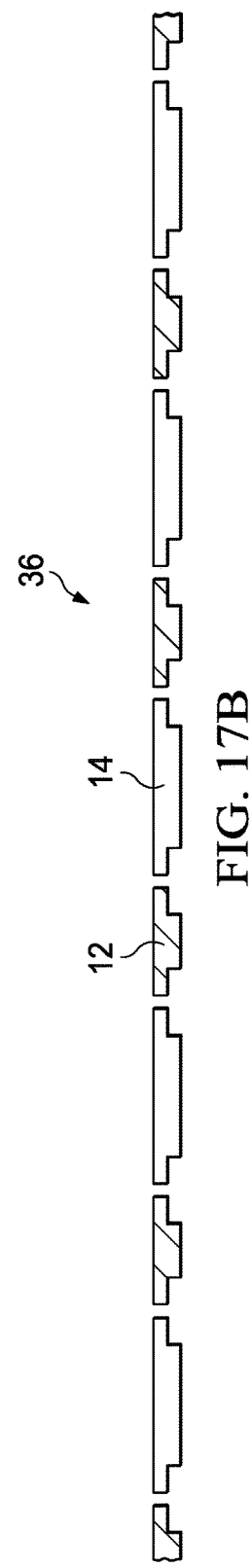
FIG. 17B is a cross sectional view of QFN lead frame strip 36 along reference line B-B of FIG. 17A.
Figure 18A:
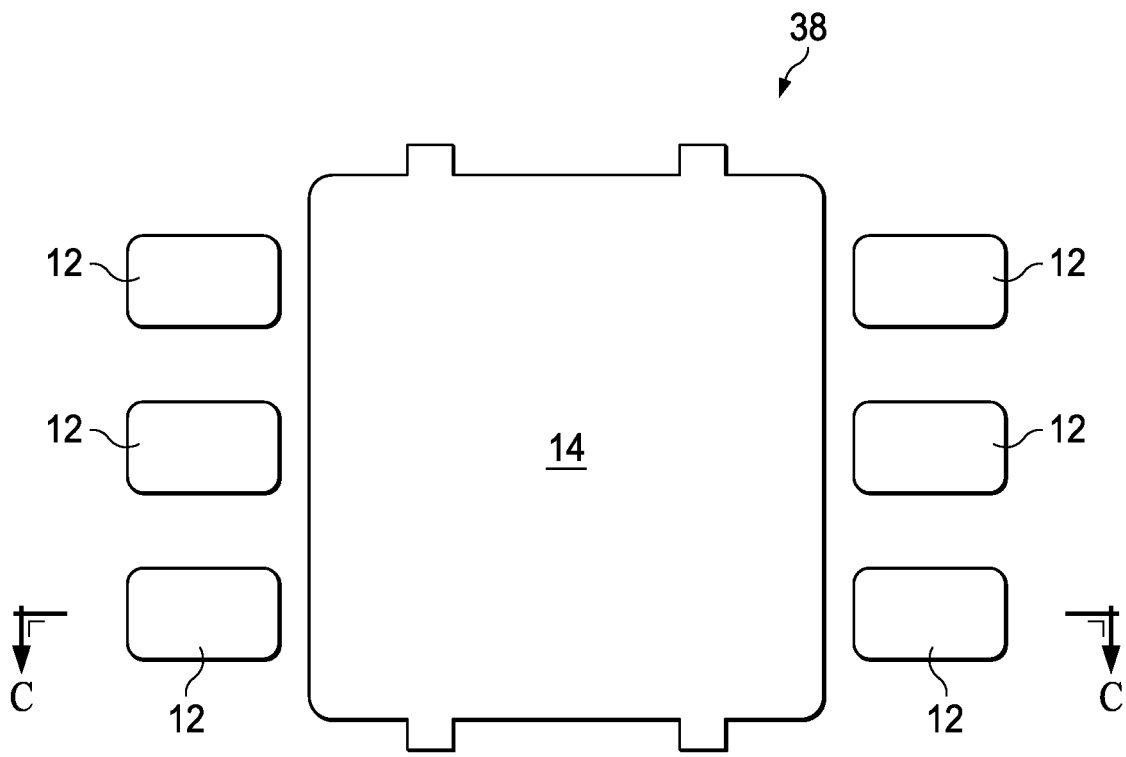
FIG. 18A is a top view of an individual lead frame unit 38.
Figure 18B:
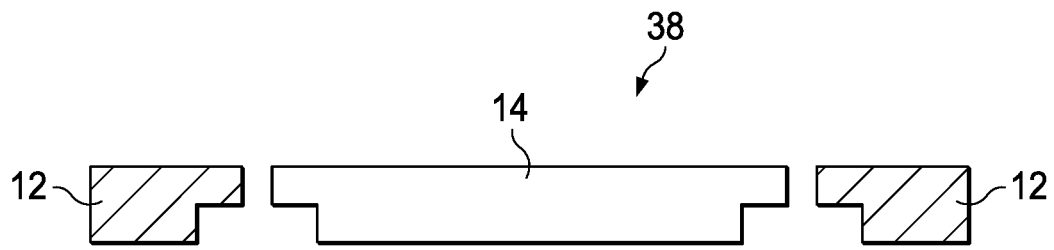
FIG. 18B is a side view of the individual lead frame unit 38 along reference line C-C of FIG. 18A.
Figure 19A:
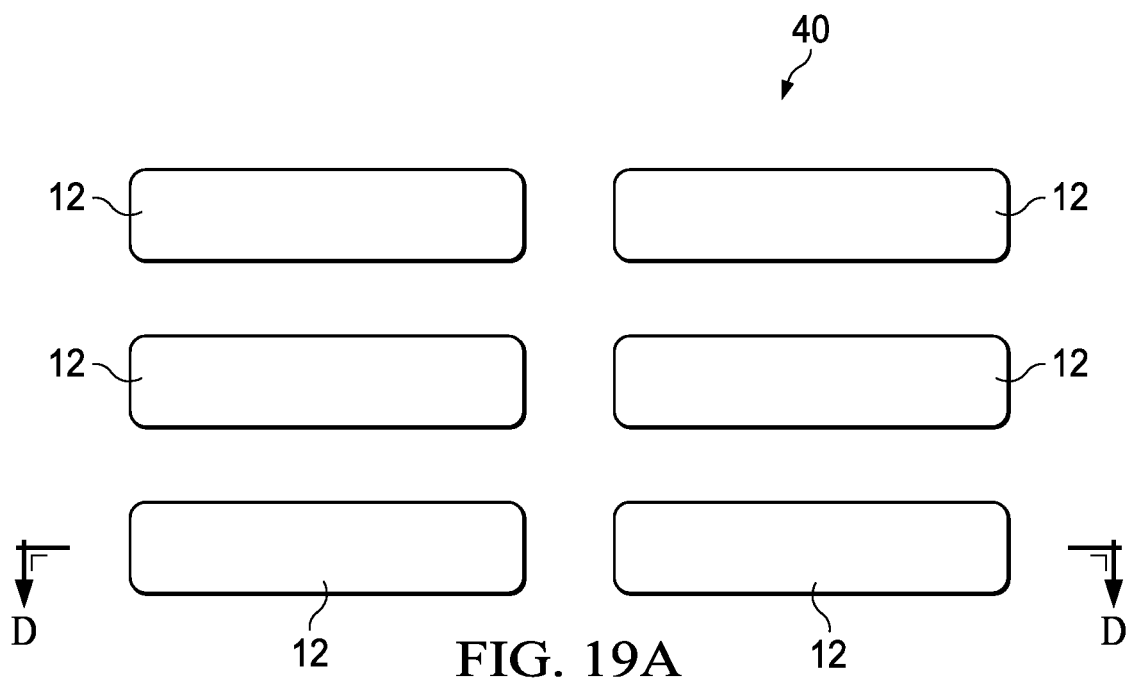
FIG. 19A is a top view of an alternative Chip-on-Lead (COL) lead frame unit 40 for attaching a bottom surface of a die directly to a portion of leads 12.
Figure 19B:
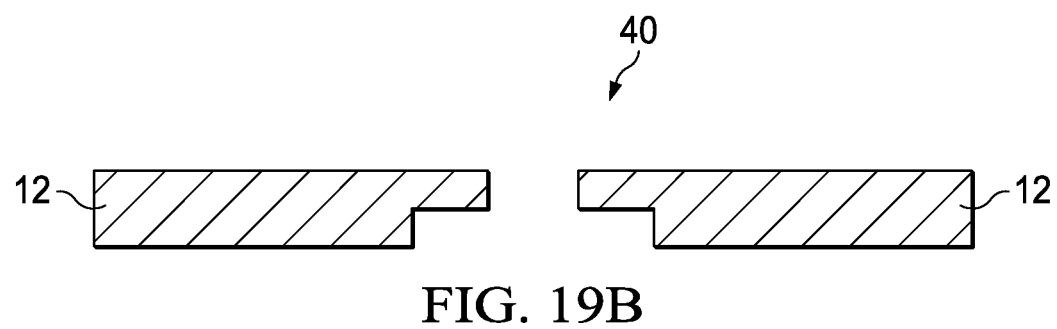
FIG. 19B is a side view of the individual lead frame unit 38 along reference line D-D of FIG. 19A.

According to one embodiment or example, a process for making a QFN device with printed conductive traces or interconnects begins with selection or creation of a lead frame strip (e.g., fabricated at 502 in FIG. 5). FIG. 17A is a top view of a QFN lead frame strip 36 comprising a number of individual six lead or pin lead frame units 37. FIG. 17B is a cross sectional view of QFN lead frame strip 36 along reference line B-B of FIG. 17A. A large number of lead frame units can comprise a single lead frame strip or panel. In at least one embodiment of the invention, the lead frame can be of a much larger size than traditional lead frames as this embodiment will not use traditional wire bonding or traditional molding which are limited by current manufacturing equipment. Typical lead frames are 4 to 8 mils thick. Lead frame (panel) size can be 50×100 mm to 300×200 mm. FIG. 18A is a top view of an individual lead frame unit 38. FIG. 18B is a side view of the individual lead frame unit 38 along reference line C-C of FIG. 18A. FIG. 19A is a top view of an alternative Chip-on-Lead (COL) lead frame unit 40 for attaching a bottom surface of a die directly to a portion of leads 12, thus omitting die attach pad 14 found in the lead frame unit 38 of FIGS. 18A & 18B. FIG. 19B is a side view of the individual lead frame unit 38 along reference line D-D of FIG. 19A.

Figure 20A:
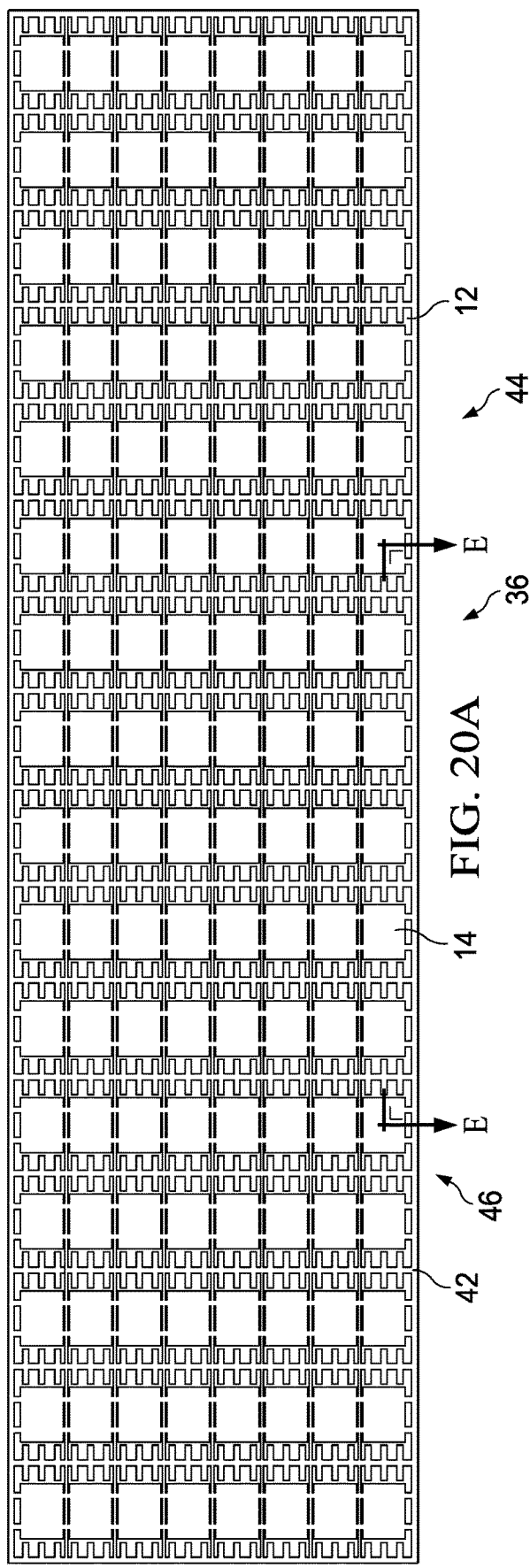
FIG. 20A is a top view of a pre-molded QFN lead frame strip 44.
Figure 20B:
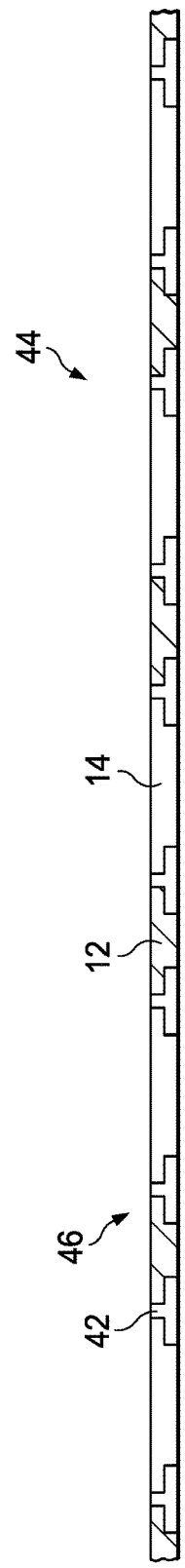
FIG. 20B is a cross sectional view of pre-molded QFN lead frame strip 44 along reference line E-E of FIG. 20A.
Figure 21A:
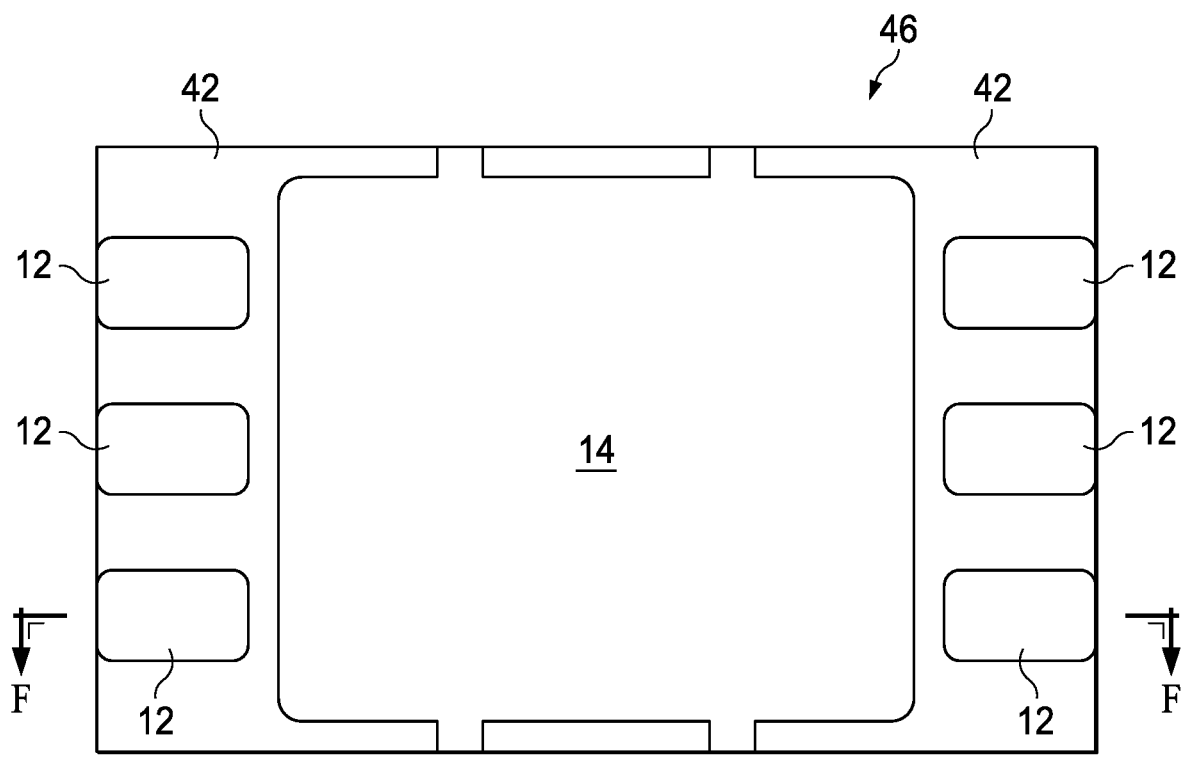
FIG. 21A is a top view of a pre-molded lead frame unit 46 on QFN lead frame strip 46.
Figure 21B:
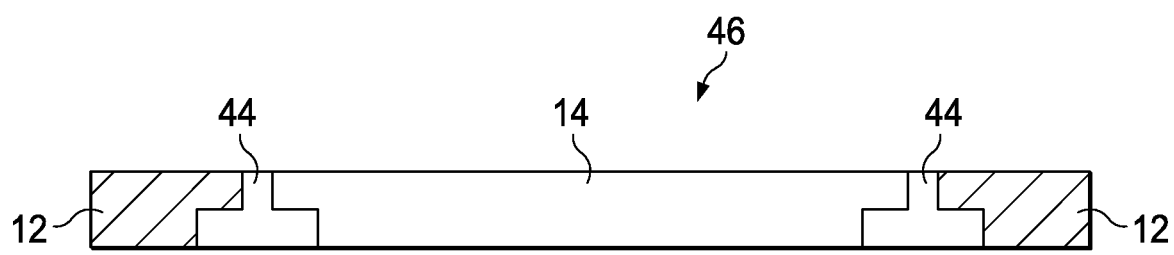
FIG. 21B is a cross sectional view of the pre-molded lead frame unit 46 shown in FIG. 21A along reference line F-F.
Figure 22A:
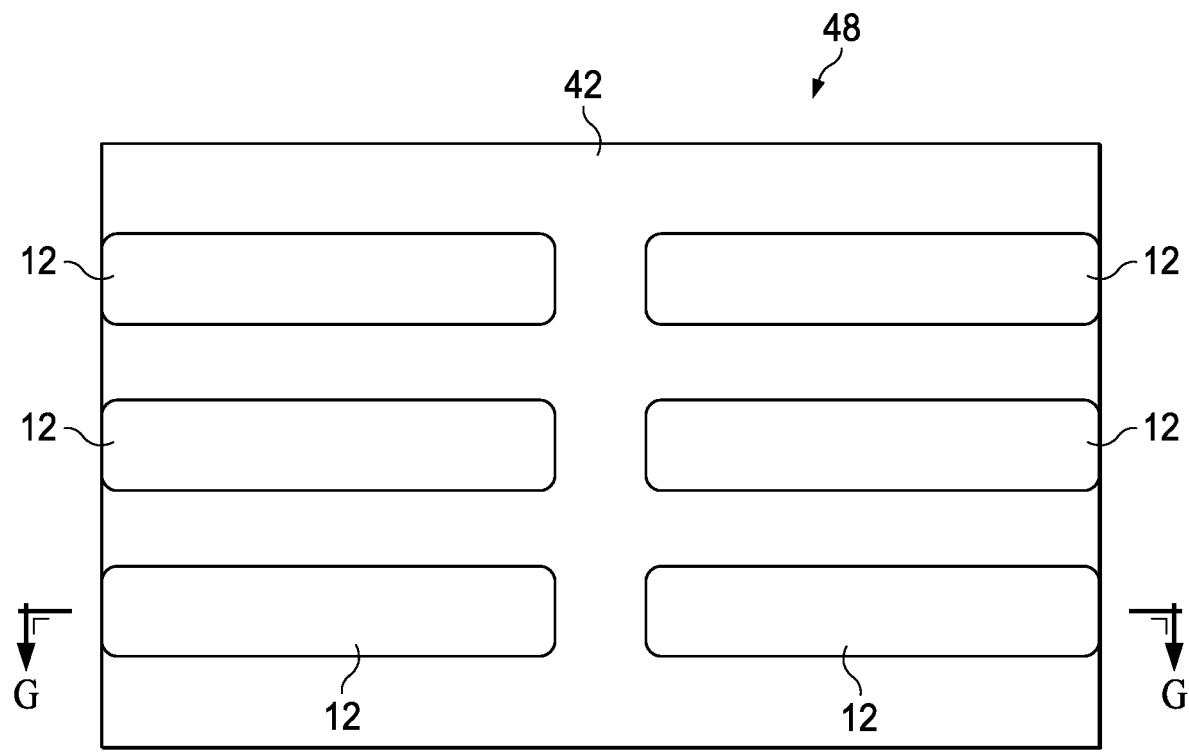
FIG. 22A is a top view of a COL lead frame unit with pre-molding 48.
Figure 22B:
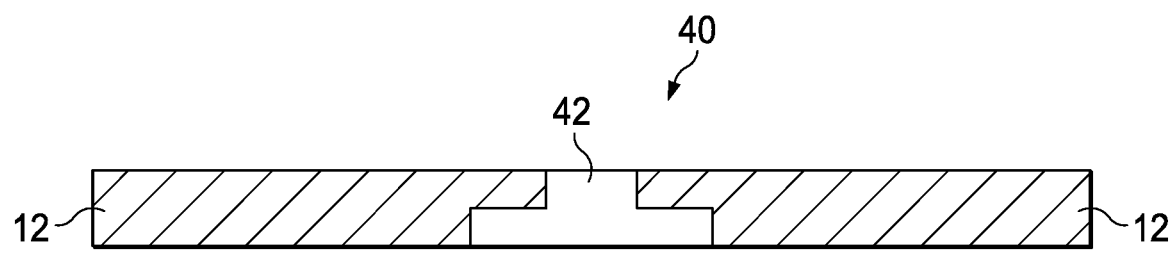
FIG. 22B is a cross sectional view of the pre-molded lead frame unit 46 shown in FIG. 22A along reference line G-G.

Lead frames can be pre-molded 42 to fill the gaps between metal sections with insulating materials such as mold compound, epoxy, polymer or ceramics (e.g., fabricated at 602 in FIG. 6). Alternatively, a pre-taped lead frame can be used instead of pre-molding. In such cases, the tape can be sacrificial. Pre-molding thickness is typically the same as the lead frame thickness. For COL configurations, this step can be skipped. FIG. 20A is a top view of a pre-molded QFN lead frame strip 44. FIG. 20B is a cross sectional view of pre-molded QFN lead frame strip 44 along reference line E-E of FIG. 20A. FIG. 21A is a top view of a pre-molded lead frame unit 46 on QFN lead frame strip 46. FIG. 21B is a cross sectional view of the pre-molded lead frame unit 46 shown in FIG. 21A along reference line F-F. FIG. 22A is a top view of a COL lead frame unit with pre-molding 48. FIG. 22B is a cross sectional view of the pre-molded lead frame unit 46 shown in FIG. 22A along reference line G-G. Alternatively, instead of manufacturing a lead frame strip (e.g., at 502 in FIG. 5), a lead frame strip could instead be acquired from a company that manufactures the desired lead frame strip.

A semiconductor wafer is processed (e.g., at 504 in FIG. 5) to fabricate a number of integrated circuit (ICs) or dies on the wafer according to well techniques to fabricate dies of desired size, shape and function (not shown). Each die portion 18 includes a semiconductor portion (e.g., silicon) and conductive features 50 (e.g., copper pads or posts).

Alternatively, instead of processing a wafer to produce desired integrated circuits (ICs) or dies, desired integrated circuits (ICs) or dies could instead be acquired from a company that manufactures the desired integrated circuit (ICs) or dies, such as Texas Instruments Incorporated. The multiple processed die portions 18 on the wafer are subsequently singulated from the wafer (e.g., at 506 in FIG. 5) using a dicing technique such as mechanical saw, laser, water jet or other technique sufficient to separate multiple die portions into individual singulated dies 18. Alternatively, instead of singulating the individual dies 18 on the wafer, desired singulated dies 18 could instead be acquired from a company that manufactures the desired integrated circuit (ICs) or dies and singulates the dies 18 into individual dies, such as Texas Instruments Incorporated. While FIG. 5 discloses lead frame fabrication at (502), wafer processing at (504) and die singulation at (506), the order and timing of these steps can be reordered so long as the lead frames in lead frame strip 36 and singulated IC dies are both completed and ready for the next processing step.

In order to overcome the limitations and deficiencies of wire bonding as an interconnect between a die and a corresponding lead frame and/or leads in a packaged semiconductor device, the present disclosure describes multiple implementations for forming printed and/or deposited conductive traces or interconnects between die 18 and corresponding lead frame and/or lead frame parts, such as lead frame leads 12, instead of forming wire bonds, such as wire bonds 20. Unlike traditional wire bonding, proposed implementations deposit or print electrically conductive traces or interconnects between bond pads on the die and conductors on the lead frame. Printed electronics refers to the use of ink-based organic/inorganic materials with electronic properties (metallic, conductive, semiconducting, dielectric) that can be printed both on rigid and flexible substrates to achieve one or several functions in logic/memory-based active devices as well as sensors, batteries, antennas and/or passive devices such as resistors, inductors and capacitors. Printing techniques to be considered for printing electronics include: Inkjet, Aerosol jet, Laser Transfer, Spray, EHD/ Electrospraying & Microdispensing with their respective advantages and disadvantages being discussed later in the disclosure.

Figure 23A:
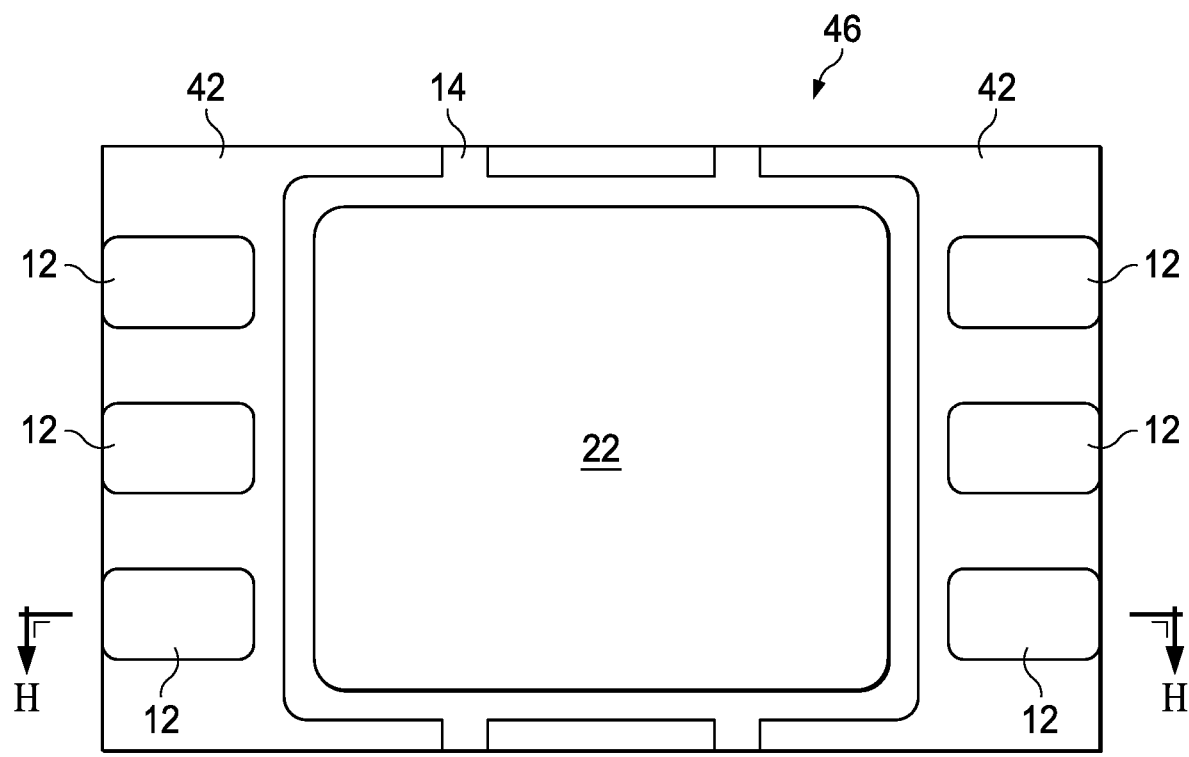
FIG. 23A is a top view of lead frame 46 in FIG. 21 with a layer of die attach on die attach pad 14.
Figure 23B:
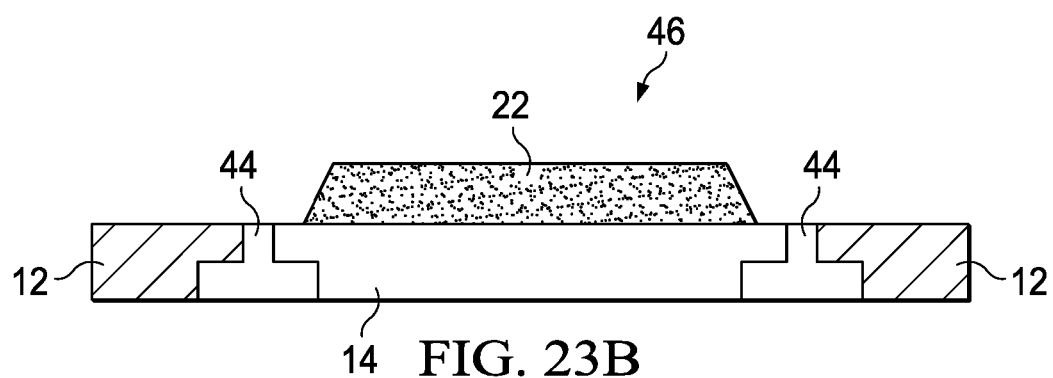
FIG. 23B is a side view of lead frame 46 of FIG. 23A along the reference line H-H.
Figure 23C:
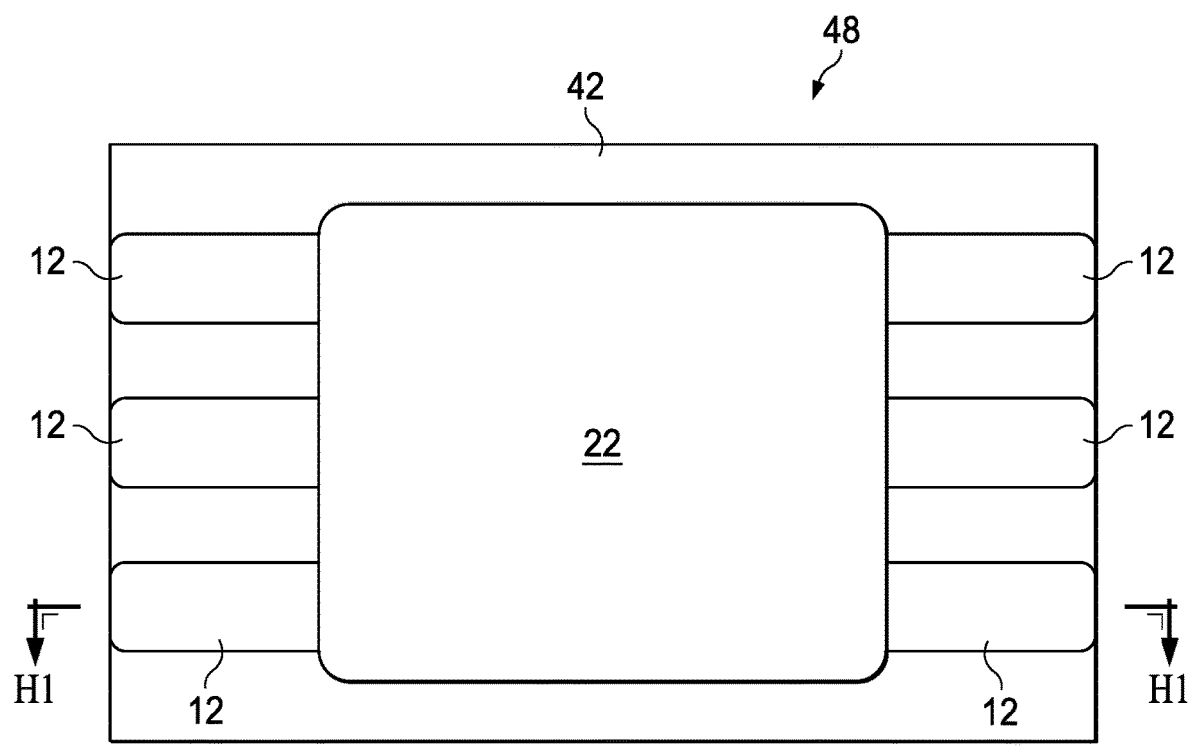
FIG. 23C is a top view of lead frame 48 in FIG. 22 with a layer of die attach on leads 12.
Figure 23D:
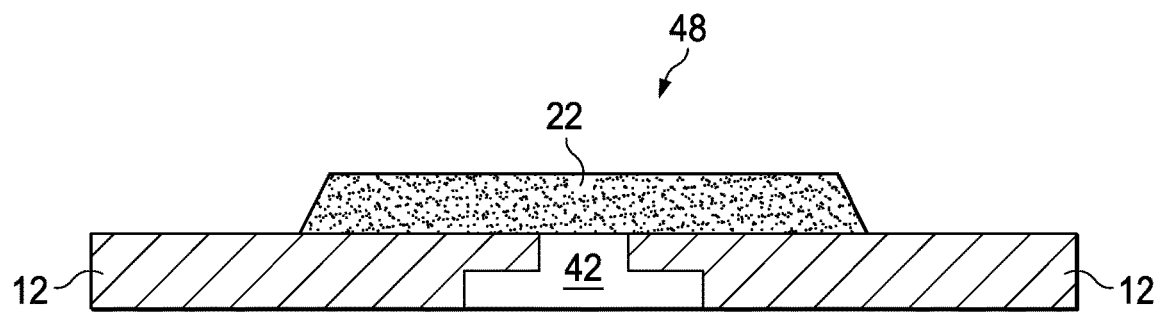
FIG. 23D is a side view of lead frame 48 of FIG. 23C along the reference line H1-H1.

Depositing or printing electrically conductive traces or interconnects includes multiple steps. An adhesive die attach 22 can be dispensed (or printed) on the top side of die attach pad 14 in the pre-molded lead frame unit 46 see FIGS. 23A & 23B. FIG. 23A is a top view of lead frame 46 in FIG. 21 with a layer of die attach on die attach pad 14. FIG. 23B is a side view of lead frame 46 of FIG. 23A along the reference line H-H. Die attach 22 can be traditional die attach tape applied using techniques known in the art or can be a liquid or viscous material deposited using other known techniques such as screen-printing, photolithography and etching or CVD, PVD or vacuum evaporation. Alternatively, adhesive die attach 22 can be printed or deposited using inkjet printing, spray coating, microdispensing, aerosol jet, ElectroHydroDynamic (EHD) techniques with the appropriate adhesive and insulating or conductive properties. Optionally, adhesive die attach 22 can be applied, dispensed (or printed) on the top side of leads 12 that support die 18 in the chip-on-lead (COL) pre-molded lead frame unit 48 see FIGS. 23C & 23D. FIG. 23C is a top view of lead frame 48 in FIG. 22 with a layer of die attach on leads 12. FIG. 23D is a side view of lead frame 48 of FIG. 23C along the reference line H1-H1. Alternatively, adhesive die attach 22 can instead be dispensed on the bottom side of die 18 instead of leads 12 in FIGS. 23C & 23D or on leads 12 in FIGS. 23C & 23D. The die attach 22 can be formed from an epoxy, silicone, solder sintered metal, hybrid polymers, or other adhesives. Die attach 22 can be electrically conductive or insulating depending upon design requirements including whether or not heat and/or current is to be conducted through die attach pad 14 or leads 12 beneath the die for COL configurations. For COL configurations, insulating die attach is required to avoid pin shorting. Integrated circuit (IC) die 18 is next placed on the lead frame unit with die attach 22 coupling integrated circuit (IC) die 18 to the pre-molded lead frame unit 46 OR optionally, to pre-molded lead frame unit 48 (e.g., at 508 in FIG. 5).

Figure 24A:
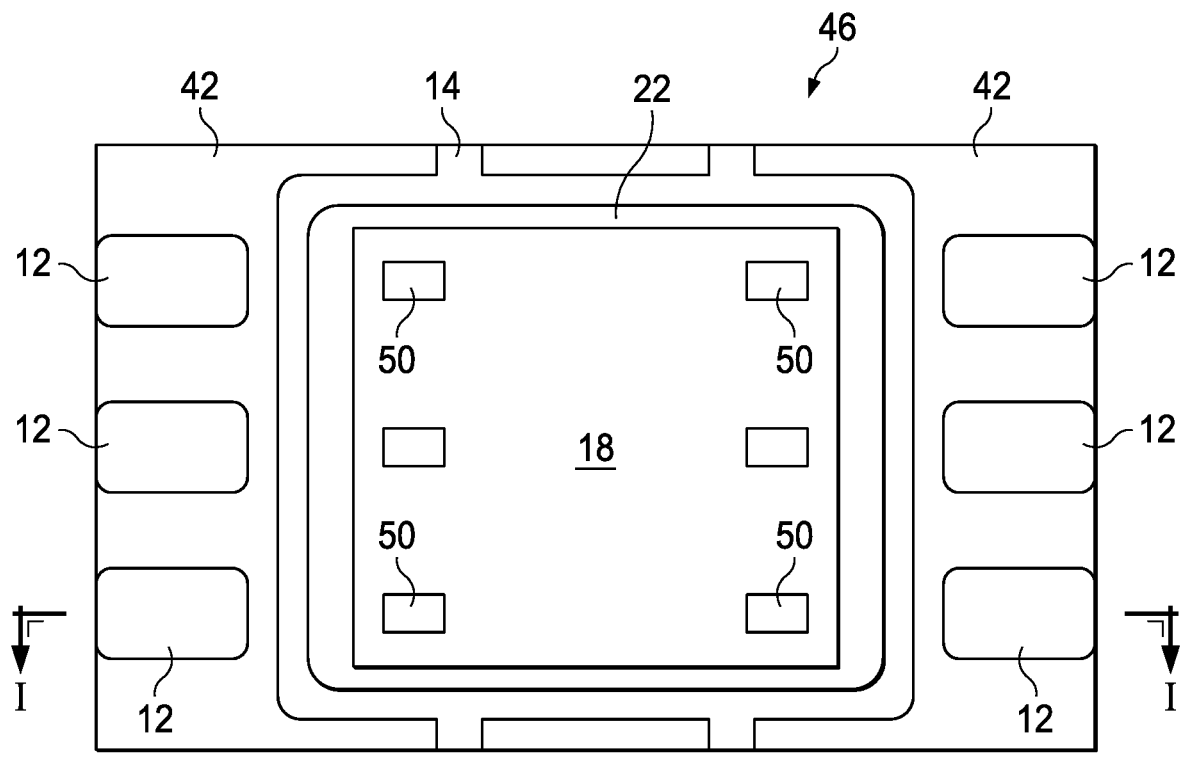
FIG. 24A is a top view of an integrated circuit (IC) die 18 attached, via die attach material 22, to a top surface of die attach pad 14 of pre-molded lead frame unit 46.
Figure 24B:
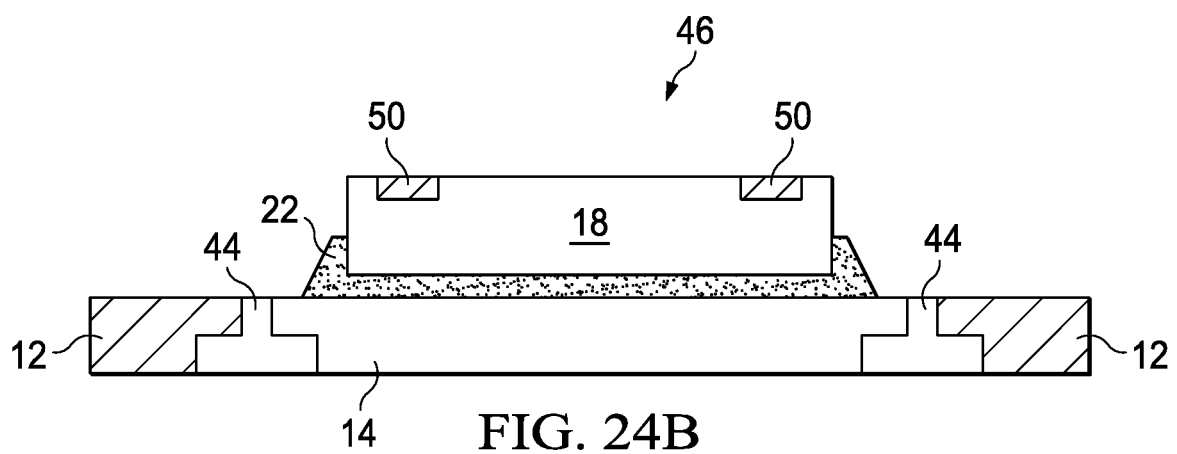
FIG. 24B is a cross-sectional view of integrated circuit (IC) die 18 attached, via die attach material 22, to a top surface of die attach pad 14 of pre-molded lead frame unit 46 along reference line I-I in FIG. 24A.
Figure 24C:
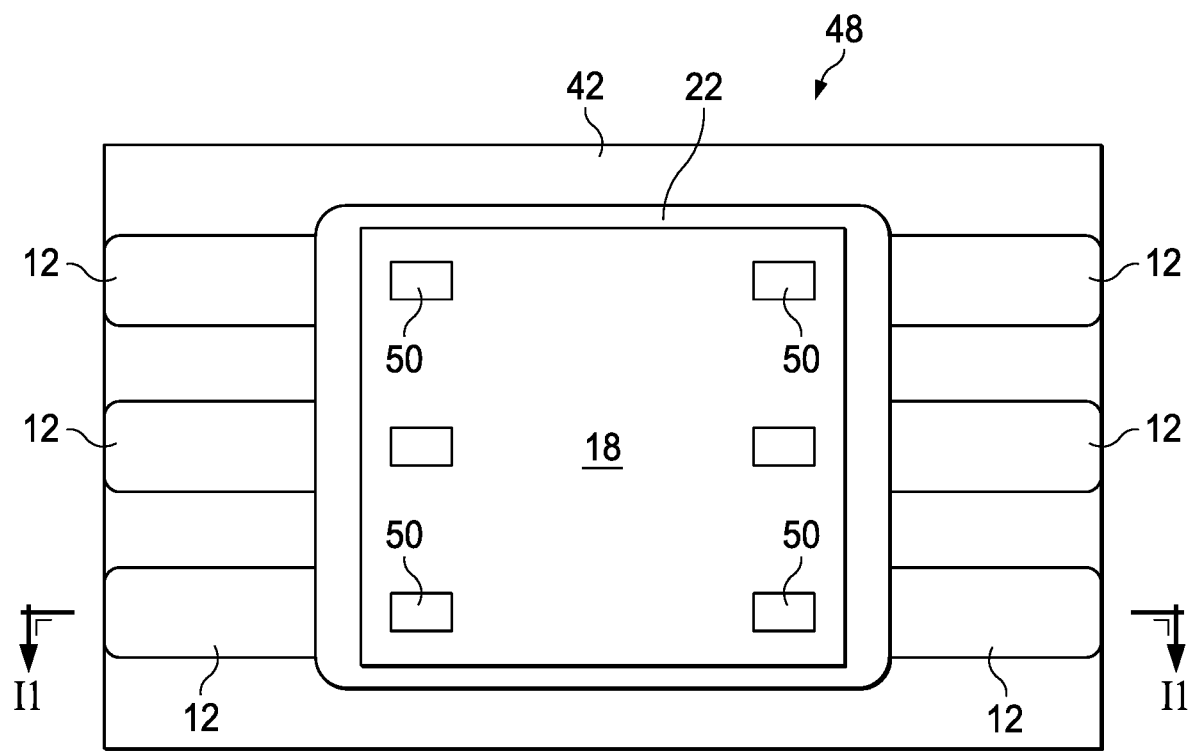
FIG. 24C is a top view of an optional example in which an integrated circuit (IC) die 18 attached, via die attach material 22, to a top surface of leads 12 of chip-on-lead (COL) pre-molded lead frame unit 48.
Figure 24D:
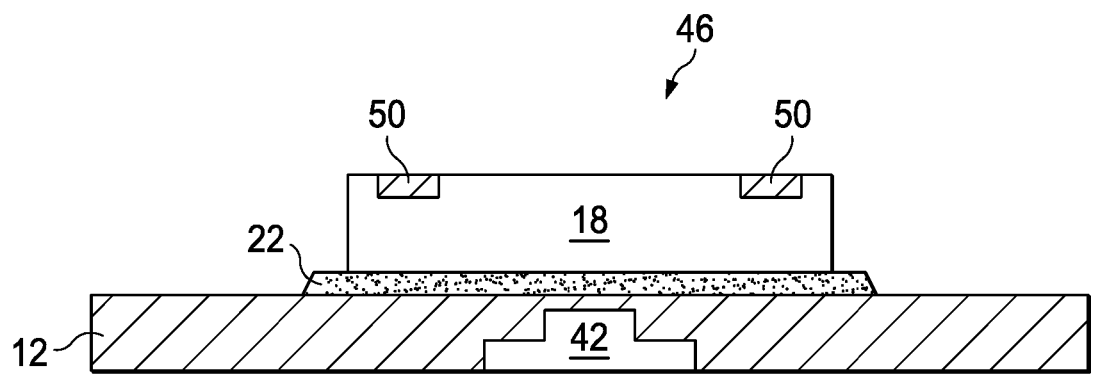
FIG. 24D is a cross-sectional view of integrated circuit (IC) die 18 attached, via die attach material 22, to leads 12 of pre-molded lead frame unit 48 along reference line I1-I1 in FIG. 24D.

FIG. 24A is a top view of an integrated circuit (IC) die 18 attached, via die attach material 22, to a top surface of die attach pad 14 of pre-molded lead frame unit 46. FIG. 24B is a cross-sectional view of integrated circuit (IC) die 18 attached, via die attach material 22, to a top surface of die attach pad 14 of pre-molded lead frame unit 46 along reference line I-I in FIG. 24A. FIG. 24C is a top view of an optional example in which an integrated circuit (IC) die 18 attached, via die attach material 22, to a top surface of leads 12 of chip-on-lead (COL) pre-molded lead frame unit 48. FIG. 24D is a cross-sectional view of integrated circuit (IC) die 18 attached, via die attach material 22, to leads 12 of pre-molded lead frame unit 48 along reference line I1-I1 in FIG. 24D.

Figure 25A:
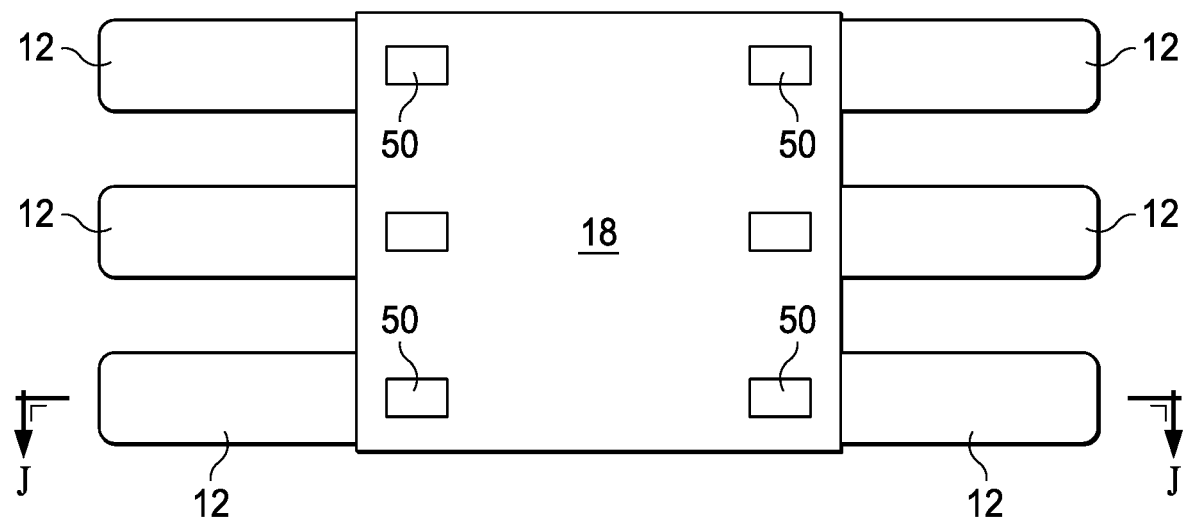
FIG. 25A is a top view of an alternative COL embodiment in which there is no die support pad and integrated circuit (IC) die 18 is attached directly to leads 12 of the lead frame unit (a non-premolded lead frame is shown in the implementation of FIG. 24A without mold material between leads 12).
Figure 25B:
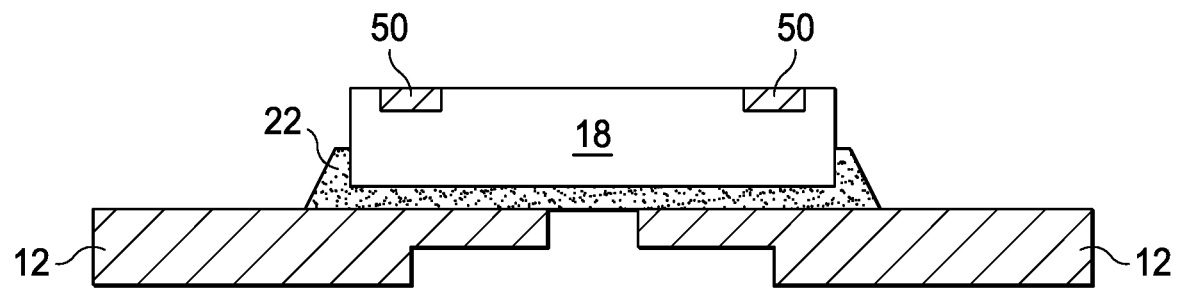
FIG. 25B is a side view of the alternative COL implementation along reference line J-J of FIG. 25A in which there is no die support pad and integrated circuit (IC) die 18 is attached directly to leads 12 of the lead frame unit.

FIG. 25A is a top view of an alternative COL embodiment in which there is no die support pad and integrated circuit (IC) die 18 is attached directly to leads 12 of the lead frame unit (a non-premolded lead frame is shown in the implementation of FIG. 24A without mold material between leads 12). FIG. 25B is a side view of the alternative COL implementation along reference line J-J of FIG. 25A in which there is no die support pad and integrated circuit (IC) die 18 is attached directly to leads 12 of the lead frame unit.

Base or Foundation Insulating Layer(s)

Figure 26A:
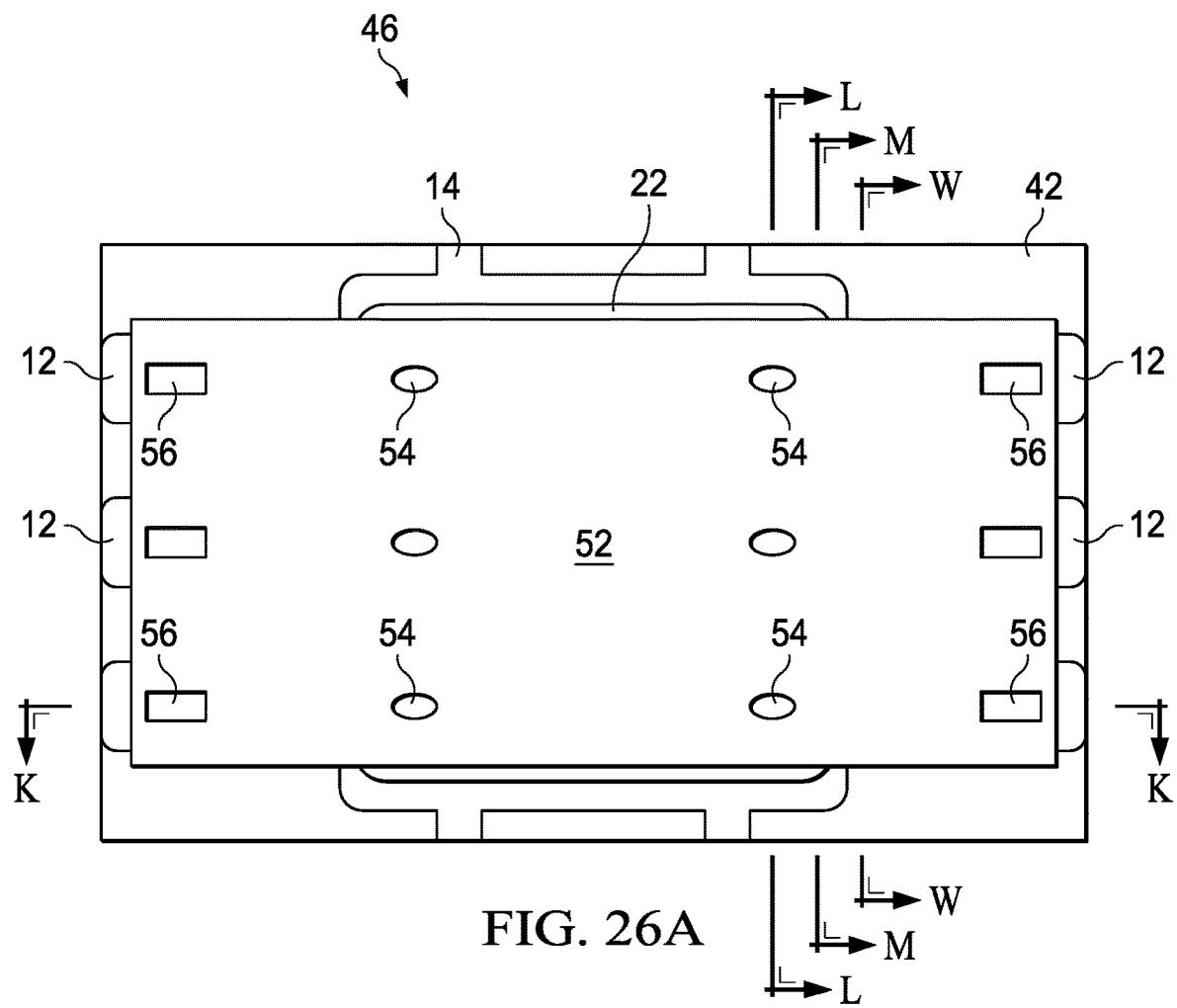
FIG. 26A is a top view of an electronic assembly undergoing fabrication according to the example method 500 of FIG. 5 with the implementation at 510, wherein a blanket insulating layer 52 is printed, deposited, formed or otherwise applied as a foundation layer spanning a portion of a top surface of lead fingers 12 in pre-molded lead frame 46, across pre-mold 42, up one side of die 18, across the top of die 18, down an opposite side of die 18, across pre-mold 42 on an opposite side of pre-molded lead frame 46 and to a portion of a top surface of lead fingers 12 on the opposite side of pre-molded lead frame 46 (e.g., at 510 in FIG. 5).

FIGS. 26A-36 show an electronic assembly undergoing fabrication according to the example method 500 of FIG. 5 with the implementation at 510. In an example, in FIG. 26A, a blanket insulating layer 52 is printed, deposited, formed or otherwise applied as a foundation layer spanning a portion of a top surface of lead fingers 12 in pre-molded lead frame 46, across pre-mold 42, up one side of die 18, across the top of die 18, down an opposite side of die 18, across pre-mold 42 on an opposite side of pre-molded lead frame 46 and to a portion of a top surface of lead fingers 12 on the opposite side of pre-molded lead frame 46 (e.g., at 510 in FIG. 5). Optionally blanket insulating layer 52 can be cured at this time (e.g., at 702 in FIG. 7), or later with additional layers. A polymer, epoxy, silicon, mold, or other insulators can be used for blanket insulating layer 52. Insulating layer 52 follows the contours of the topology on lead frame 46 and die 18, while smoothing the turns in the Z axis. Insulating layer 52 is applied to create a path and access for a later layer of conductive ink or other conductive material that forms a conductive interconnect between bond pads 54 on die 18 and leads 12. As can be seen in FIG. 26A, blanket insulating layer 52 covers the top surface of die 18 and side surfaces of die 18 which are adjacent bond pads 50. Blanket insulating layer 52 can be formed or deposited using one of multiple techniques such as screen-printing, photolithography and etching, CVD, PVD, vacuum evaporation, inkjet printing, spray coating, microdispensing, aerosol jet, ElectroHydroDynamic (EHD) techniques with the appropriate insulating properties.

If inkjet printing is used, insulating layer 52 can be formed from an inkjet deposition compatible polymer such as a polyimide ink, a thermally curable epoxy-based polymer ink, and a UV-curable acrylate ink. It is preferred that a polymer with a modulus less than 3.4 GPa and more preferred less than 2 GPa be used, to avoid undue stress on the assembly. A thickness of the insulating layer 52 can be in the range of about 2 μm to 35 μm. A more preferred range is about 2 μm to not more than 20 μm, and still more preferred in a range from about 2 μm to about 10 μm. Because the inkjet solvent deposition material has a solvent, the initial thickness, after the solvent dissipates, the remaining material forms the insulating layer at a reduced thickness. To achieve the desired thickness, multiple inkjet depositions can be performed (e.g., at 802 in FIG. 8). Inkjet deposition allows precise placement of material by using "drop on demand" (DOD) technology, where a reservoir of the liquid has a nozzle and a small volume of the liquid is forced from the nozzle in response to an electrical signal. The liquid forms a drop as it falls vertically onto a surface.

Figure 26B:
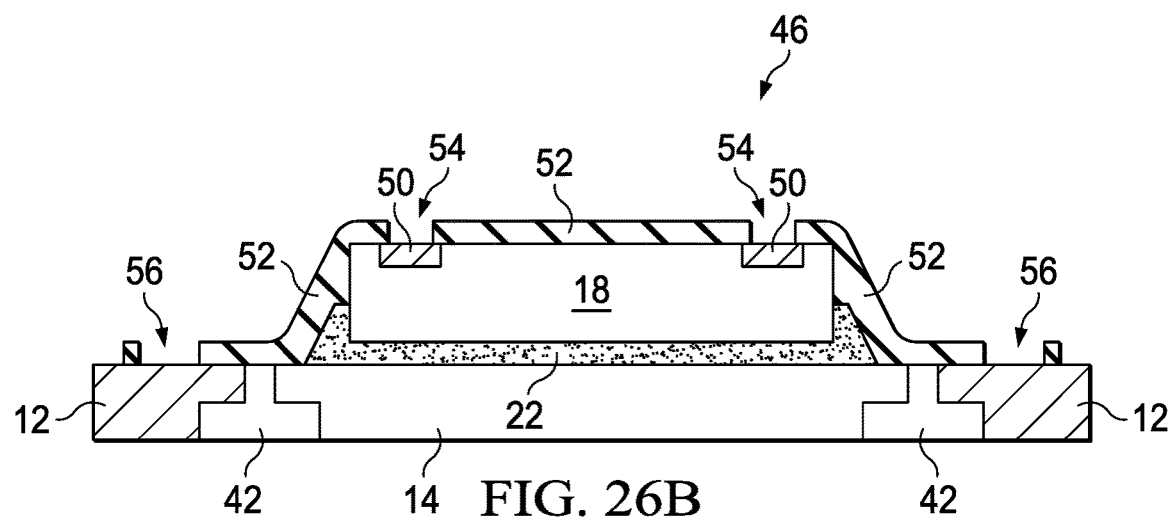
FIGS. 26B-26J are cross-sectional views of the electronic assembly of FIG. 26A along various reference lines.

The precision of the inkjet deposition tool allows deposition of the liquid material in some areas and not in others as the tool traverses across the surface (or if the tool is fixed, as the surface moves beneath the tool). Because the insulating material can be very accurately placed even in small areas, no etch or material removal step is needed to remove material after the inkjet deposition. See FIG. 26A, insulating layer 52 does not cover through holes or voids 54 above bond pads 50 on die 18 or through holes or voids 56 in insulating layer 52 above a top surface of each lead 12 on lead frame 46. With inkjet printing, no etch or material removal step is needed for through hole or voids 54 or 56 to remove material after the inkjet deposition, which reduces material waste and avoids a later etch or ablation step. The through hole or void 54 & 56 facilitate later connection of a conductive material between leads 12 on lead frame 46 and bond pads 50 on die 18. To achieve the desired thickness of insulating layer 52, multiple inkjet depositions can be performed (e.g., at 802 in FIG. 8). A single pass deposition increases manufacturing throughput and reduces costs but may not produce the more accurate and/or desirable results from multiple pass deposition. As additional inkjet materials are developed, a reduction in the amount of solvent can reduce the initial thickness needed and thereby reduce the need for multiple pass depositions. FIG. 26B is a cross-sectional view of integrated circuit (IC) die 18 attached, via die attach material 22, to a top surface of die attach pad 14 of pre-molded lead frame unit 46 along reference line K-K in FIG. 26A.

Figure 26C:
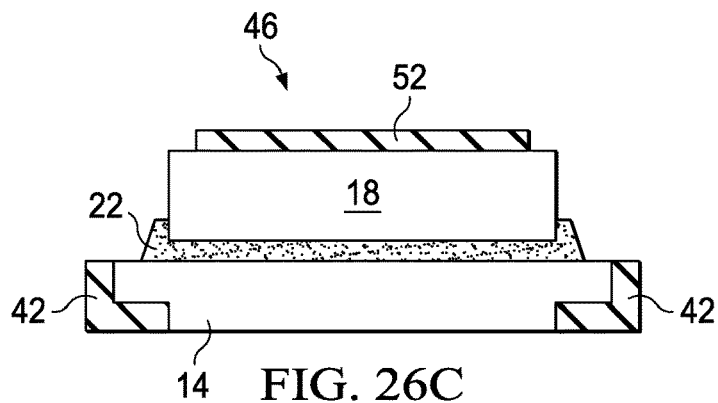
Figure 26D:
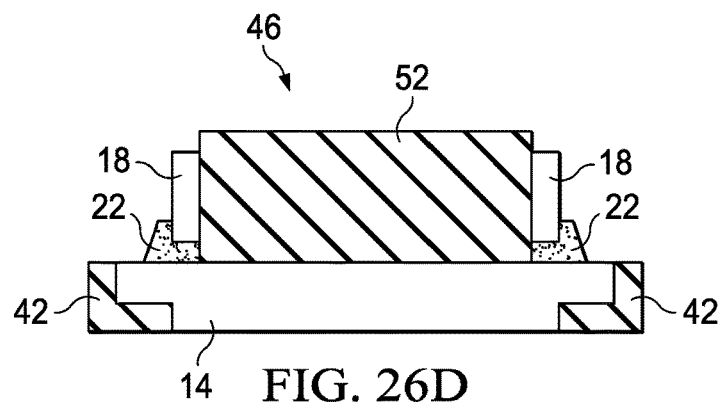

According to one example, insulating layer 52 is a blanket layer upon which conductive material will be deposited on from bond pads 50 on die 18 to leads 12. FIG. 26C is a cross-sectional view of integrated circuit (IC) die 18 attached, via die attach material 22, to a top surface of die attach pad 14 of pre-molded lead frame unit 46 along reference line M-M in FIG. 26A. FIG. 26D is a cross-sectional view of integrated circuit (IC) die 18 attached, via die attach material 22, to a top surface of die attach pad 14 of pre-molded lead frame unit 46 along reference line W-W in FIG. 26A, which shows the insulating layer 52 extending down a vertical side of die 18 to die pad 46.

Figure 26E:
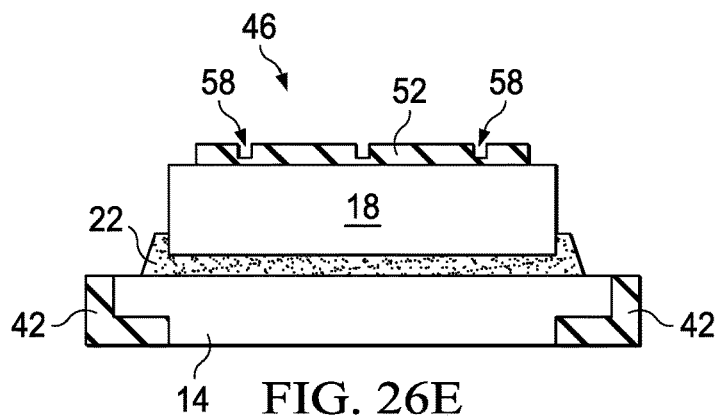
Figure 26F:
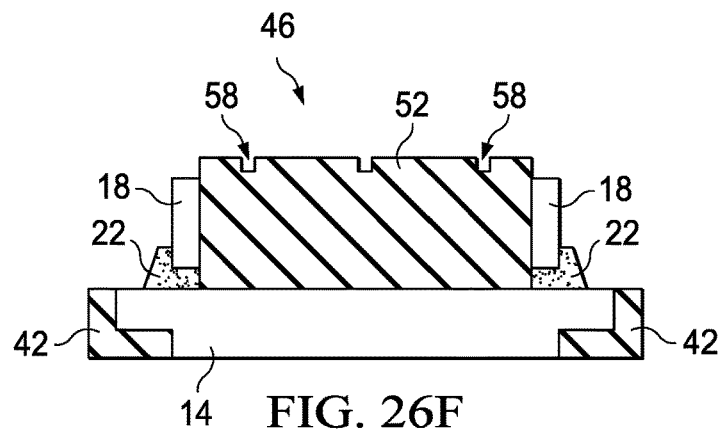

According to another example, insulating layer 52 is a blanket layer with rectangular channel or grooves 58 for subsequent conductive material to be deposited in from bond pads 50 on die 18 to leads 12. FIG. 26E is a cross-sectional view of integrated circuit (IC) die 18 attached, via die attach material 22, to a top surface of die attach pad 14 of pre-molded lead frame unit 46 along reference line M-M in FIG. 26A. FIG. 26F is a cross-sectional view of integrated circuit (IC) die 18 attached, via die attach material 22, to a top surface of die attach pad 14 of pre-molded lead frame unit 46 along reference line W-W in FIG. 26A, which shows insulating layer 52 extending down a vertical side of die 18 to die pad 46.

Figure 26G:
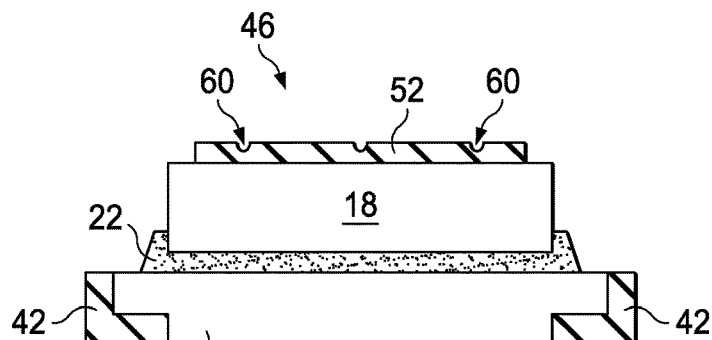
Figure 26H:
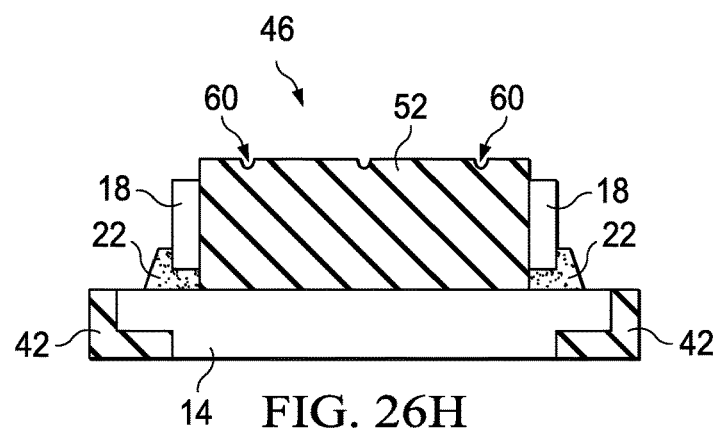
Figure 26I:
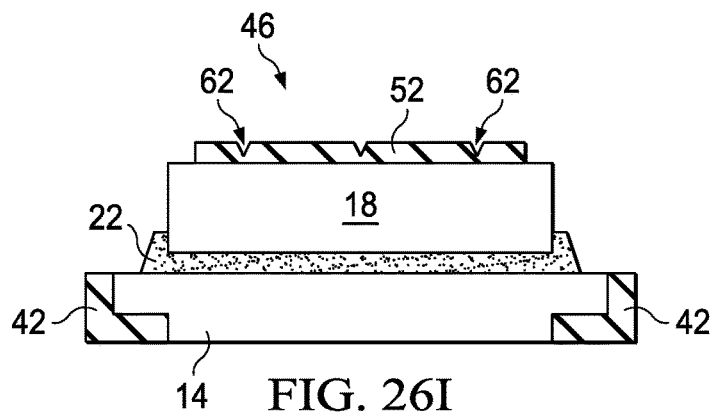
Figure 26J:
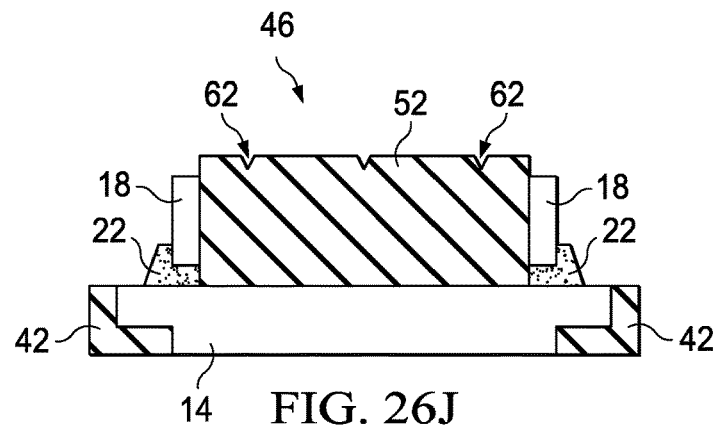

According to yet another example, insulating layer 52 is a blanket layer with semicircular channels 60 formed in blanket layer 52 from bond pads 50 on die 18 to leads 12. FIG. 26G is a cross-sectional view of integrated circuit (IC) die 18 attached, via die attach material 22, to a top surface of die attach pad 14 of pre-molded lead frame unit 46 along reference line M-M in FIG. 26A. FIG. 26H is a cross-sectional view of integrated circuit (IC) die 18 attached, via die attach material 22, to a top surface of die attach pad 14 of pre-molded lead frame unit 46 along reference line W-W in FIG. 26A, which shows insulating layer 52 extending down a vertical side of die 18 to die pad 46. According to still another example, insulating layer 52 is a blanket layer with v-shaped channels 62 formed in blanket layer 52 from bond pads 50 on die 18 to leads 12. FIG. 26I is a cross-sectional view of integrated circuit (IC) die 18 attached, via die attach material 22, to a top surface of die attach pad 14 of pre-molded lead frame unit 46 along reference line M-M in FIG. 26A. FIG. 26J is a cross-sectional view of integrated circuit (IC) die 18 attached, via die attach material 22, to a top surface of die attach pad 14 of pre-molded lead frame unit 46 along reference line W-W in FIG. 26A, which shows insulating layer 52 extending down a vertical side of die 18 to die pad 46. While above examples of rectangular 58, semicircular 60 & v-shaped 62 channels in blanket layer 52 have been described, other channel configurations are possible and are contemplated by this disclosure.

Figure 27A:
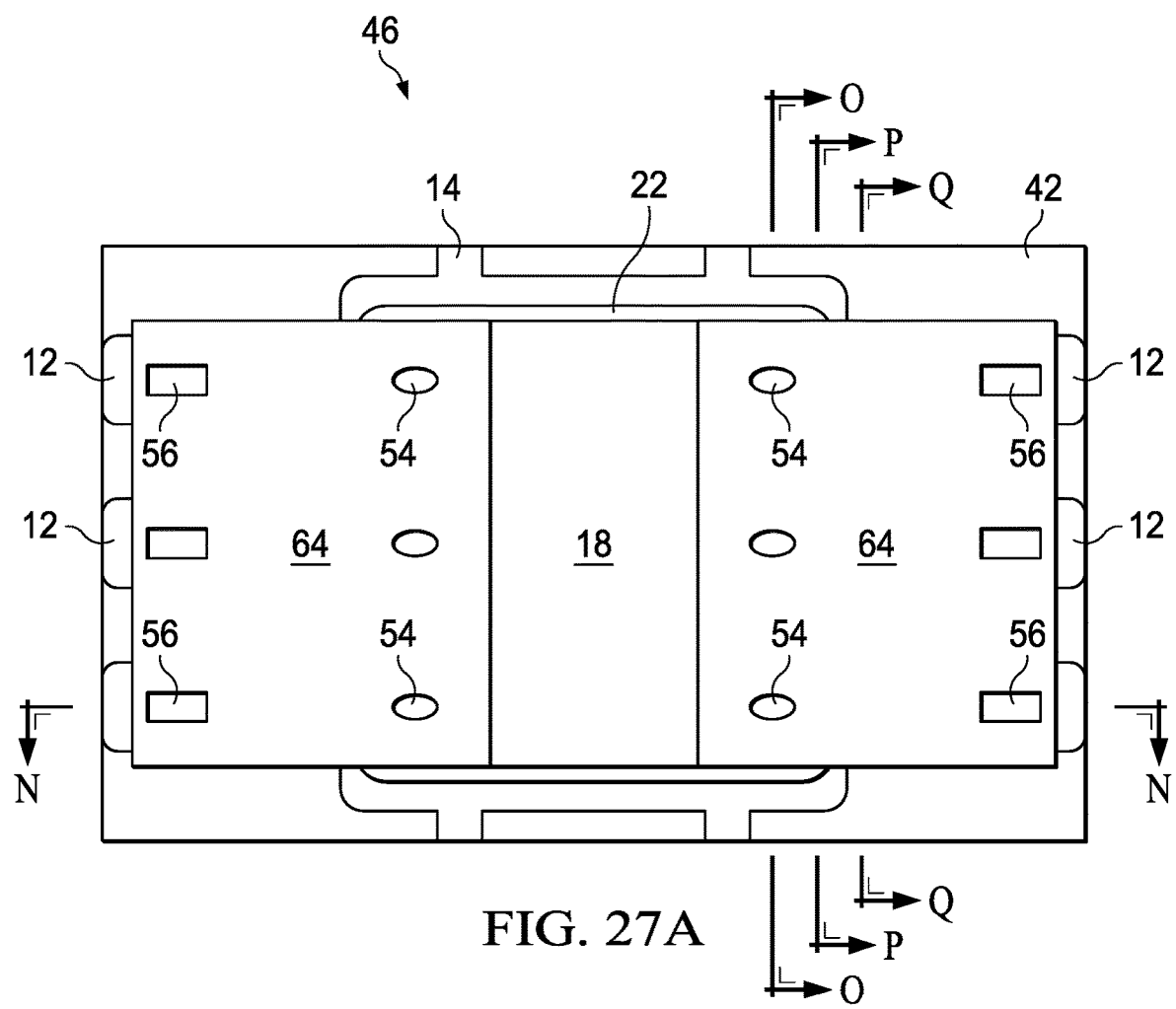
FIG. 27A is a top view of an electronic assembly undergoing fabrication according to the example method 500 of FIG. 5 with the implementation at 510, wherein instead of using a single blanket insulating layer as shown in FIGS. 26A-26J, two spaced apart half-blanket insulating layers 64 are applied as foundation layers, each spanning a top surface of a portion of lead fingers 12 in pre-molded lead frame 46, across pre-mold 42, up one side of die 18, across a portion of the top of die 18 just past bond pads 50 on die 18 (e.g., at 510 in FIG. 5).

In another example, in FIG. 27A, instead of using a single blanket insulating layer, two spaced apart half-blanket insulating layers 64 are applied as foundation layers, each spanning a top surface of a portion of lead fingers 12 in pre-molded lead frame 46, across pre-mold 42, up one side of die 18, across a portion of the top of die 18 just past bond pads 50 on die 18 (e.g., at 510 in FIG. 5). Optionally half-blanket insulating layers 64 can be cured at this time (e.g., at 702 in FIG. 7), or later with additional layers. A polymer, epoxy, silicon, mold, or other insulators can be used for half-blanket insulating layers 64. Insulating layers 64 each follow the contours of the topology on lead frame 46 and die 18, while smoothing the turns in the Z axis. Insulating layers 64 are applied to create a path and access for a later layer of conductive ink or other conductive material. As can be seen in FIG. 27A, each half-blanket insulating layer 64 covers a portion of the top surface of die 18 just past bond pads 50 and a side surfaces of die 18. Half-blanket insulating layers 64 can be formed or deposited using one of multiple techniques such as screen-printing, photolithography and etching, CVD, PVD, vacuum evaporation, inkjet printing, spray coating, microdispensing, aerosol jet, ElectroHydroDynamic (EHD) techniques with the appropriate insulating properties.

If inkjet printing is used, half-blanket insulating layers 64 can be formed from an inkjet deposition compatible polymer such as a polyimide ink, a thermally curable epoxy-based polymer ink, and a UV-curable acrylate ink. It is preferred that a polymer with a modulus less than 3.4 GPa and more preferred less than 2 GPa be used, to avoid undue stress on the assembly. A thickness of the insulating layers 64 can be in the range of about 2 μm to 35 μm. A more preferred range is about 2 μm to not more than 20 μm, and still more preferred in a range from about 2 µm to about 10 µm. Because the inkjet solvent deposition material has a solvent, the initial thickness, after the solvent dissipates, the remaining material forms the insulating layer at a reduced thickness. To achieve the desired thickness, multiple inkjet depositions can be performed (e.g., at 802 in FIG. 8). Inkjet deposition allows precise placement of material by using "drop on demand" (DOD) technology, where a reservoir of the liquid has a nozzle and a small volume of the liquid is forced from the nozzle in response to an electrical signal. The liquid forms a drop as it falls vertically onto a surface.

Figure 27B:
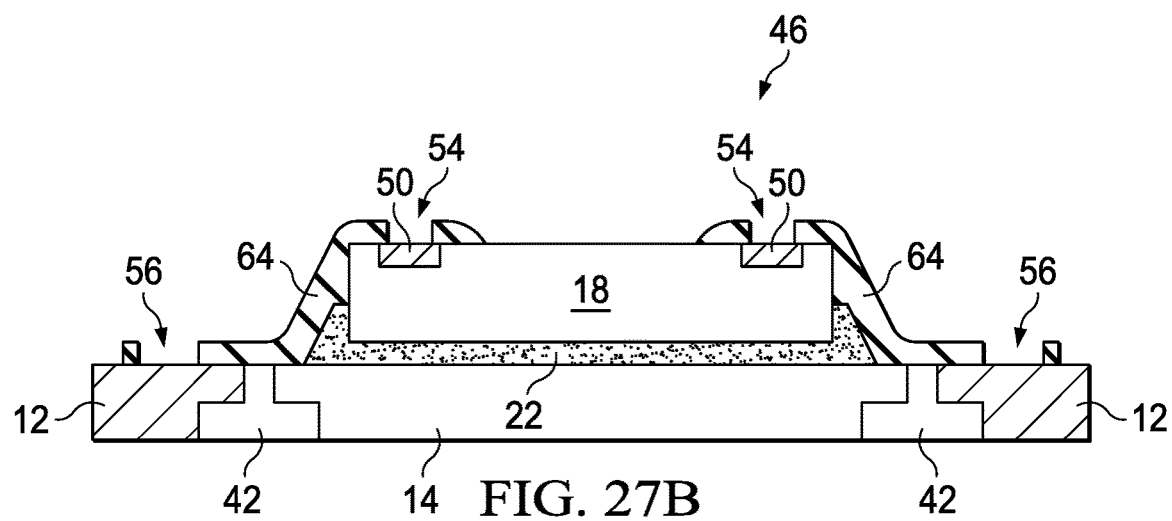
FIGS. 27B-27J are cross-sectional views of the electronic assembly of FIG. 27A along various reference lines.

The precision of the inkjet deposition tool allows deposition of the liquid material in some areas and not in others as the tool traverses across the surface (or if the tool is fixed, as the surface moves beneath the tool). Because the insulating material can be very accurately placed even in small areas, no etch or material removal step is needed to remove material after the inkjet deposition. See FIGS. 27A & 27B, insulating layers 64 do not cover through holes or voids 54 above bond pads 50 on die 18 or through holes or voids 56 in insulating layers 64 above a top surface of each lead 12 on lead frame 46. With inkjet printing, no etch or material removal step is needed for through holes or voids 54 or 56 to remove material after the inkjet deposition, which reduces material waste and avoids a later etch or ablation step. The through holes or voids 54 & 56 facilitate later connection of a conductive material between leads 12 on lead frame 46 and bond pads 50 on die 18. To achieve the desired thickness of half-blanket insulating layers 64, multiple inkjet depositions can be performed (e.g., at 802 in FIG. 8). A single pass deposition increases manufacturing throughput and reduces costs but may not produce the most accurate and/or desirable results that are possible with multiple pass deposition. As additional inkjet materials are developed, a reduction in the amount of solvent can reduce the initial thickness needed and thereby reduce the need for multiple pass depositions. FIG. 27B is a cross-sectional view of integrated circuit (IC) die 18 attached, via die attach material 22, to a top surface of die attach pad 14 of pre-molded lead frame unit 46 along reference line N-N in FIG. 27A.

Figure 27C:
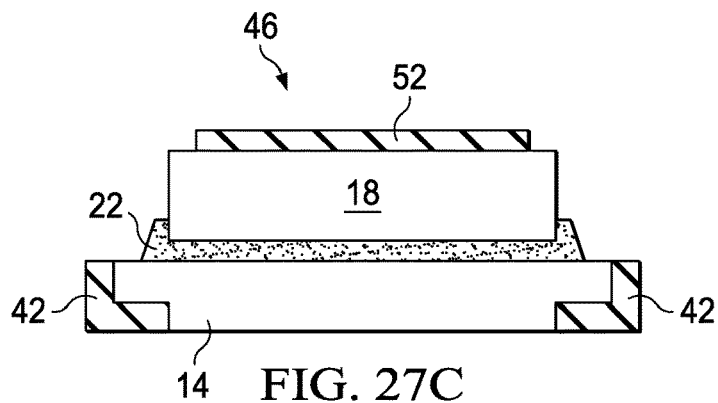
Figure 27D:
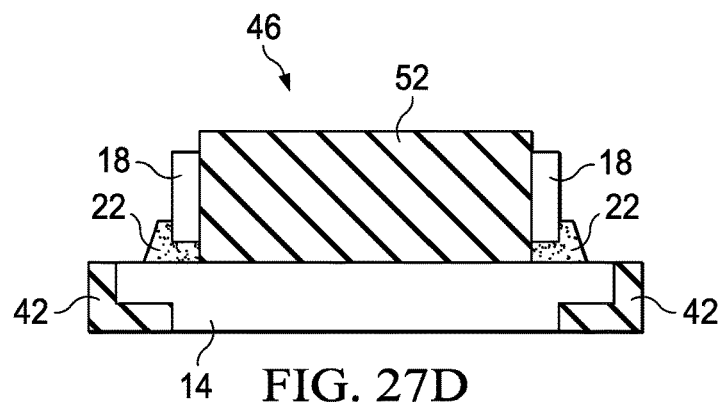
Figure 27E:
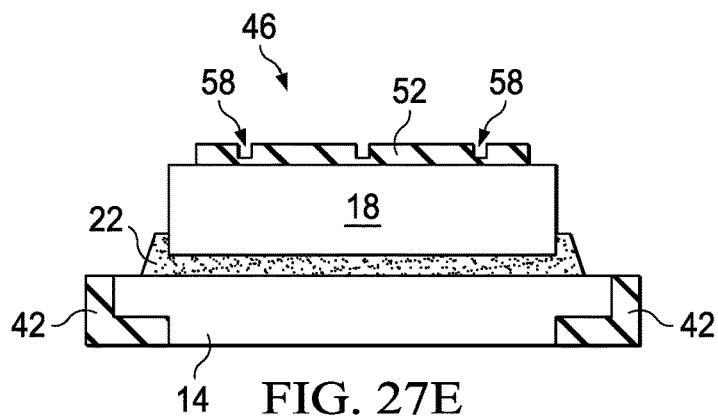
Figure 27F:
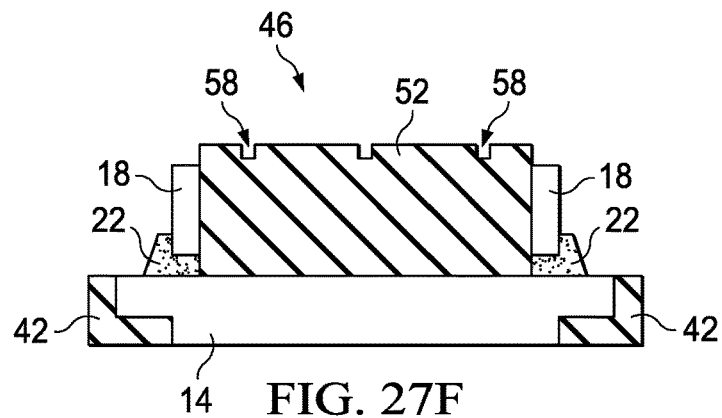

According to one example, each half-blanket insulating layer 64 in FIG. 27A is a blanket layer with no channel or grooves upon which conductive material will be deposited from bond pads 50 on die 18 to corresponding leads 12. FIG. 27C is a cross-sectional view of integrated circuit (IC) die 18 attached, via die attach material 22, to a top surface of die attach pad 14 of pre-molded lead frame unit 46 along reference line P-P in FIG. 27A. FIG. 27D is a cross-sectional view of integrated circuit (IC) die 18 attached, via die attach material 22, to a top surface of die attach pad 14 of pre-molded lead frame unit 46 along reference line Q-Q in FIG. 27A, which shows insulating layer 64 extending down a vertical side of die 18 to die pad 46. According to another example, each half-blanket insulating layer 64 in FIG. 27E is a blanket layer with rectangular channels 58 formed in blanket layer 52 from bond pads 50 on die 18 to leads 12 within which conductive material will be deposited from bond pads 50 on die 18 to corresponding leads 12. FIG. 27E is a cross-sectional view of integrated circuit (IC) die 18 attached, via die attach material 22, to a top surface of die attach pad 14 of pre-molded lead frame unit 46 along reference line P-P in FIG. 27A. FIG. 27F is a cross-sectional view of integrated circuit (IC) die 18 attached, via die attach material 22, to a top surface of die attach pad 14 of pre-molded lead frame unit 46 along reference line Q-Q in FIG. 27A, which shows insulating layer 64 extending down a vertical side of die 18 to die pad 46.

Figure 27G:
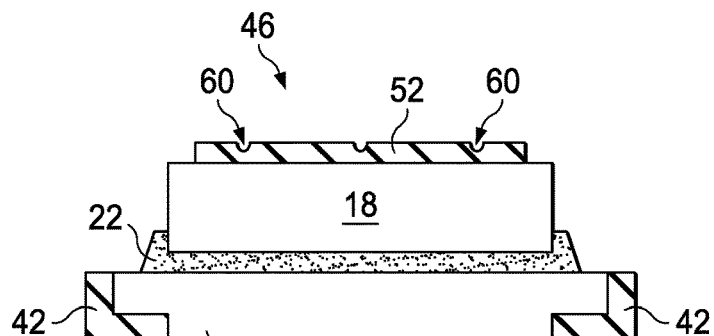
Figure 27H:
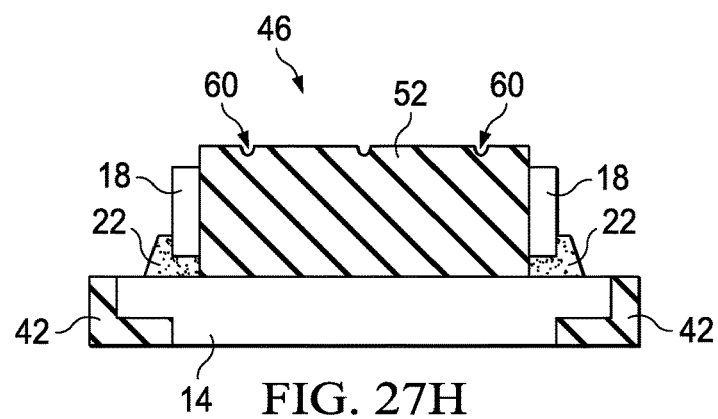
Figure 27I:
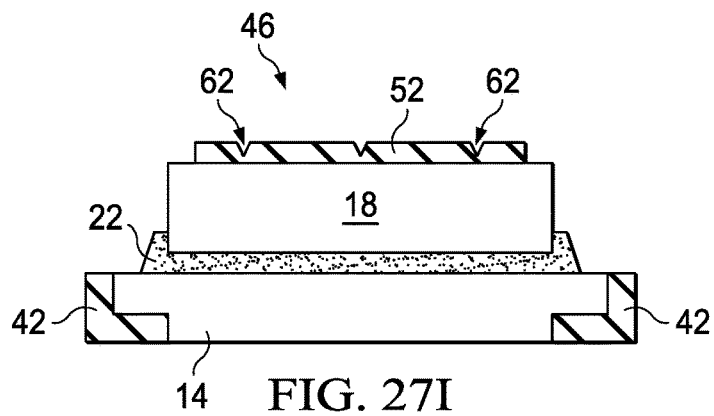
Figure 27J:
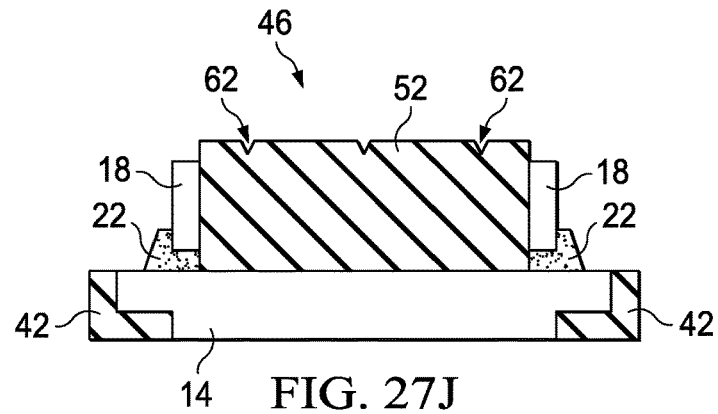

According to yet another example, each half-blanket insulating layer 64 is a blanket layer with semicircular channels 60 formed in blanket layer 64 from bond pads 50 on die 18 to leads 12 within which conductive material will be deposited from bond pads 50 on die 18 to corresponding leads 12. FIG. 27G is a cross-sectional view of integrated circuit (IC) die 18 attached, via die attach material 22, to a top surface of die attach pad 14 of pre-molded lead frame unit 46 along reference line P-P in FIG. 27A. FIG. 27H is a cross-sectional view of integrated circuit (IC) die 18 attached, via die attach material 22, to a top surface of die attach pad 14 of pre-molded lead frame unit 46 along reference line Q-Q in FIG. 27A, which shows insulating layer 64 extending down a vertical side of die 18 to die pad 46. According to still another example, each half-blanket insulating layer 64 is a blanket layer with v-shaped channels 62 formed in blanket layer 64 from bond pads 50 on die 18 to leads 12 within which conductive material will be deposited from bond pads 50 on die 18 to corresponding leads 12. FIG. 27I is a cross-sectional view of integrated circuit (IC) die 18 attached, via die attach material 22, to a top surface of die attach pad 14 of pre-molded lead frame unit 46 along reference line P-P in FIG. 27A. FIG. 27J is a cross-sectional view of integrated circuit (IC) die 18 attached, via die attach material 22, to a top surface of die attach pad 14 of pre-molded lead frame unit 46 along reference line Q-Q in FIG. 27A, which shows insulating layer 64 extending down a vertical side of die 18 to die pad 46. While above examples of rectangular 58, semicircular 60 & v-shaped 62 channels in blanket layers 64 have been described, other channel configurations are possible and are contemplated by this disclosure.

Figure 28A:
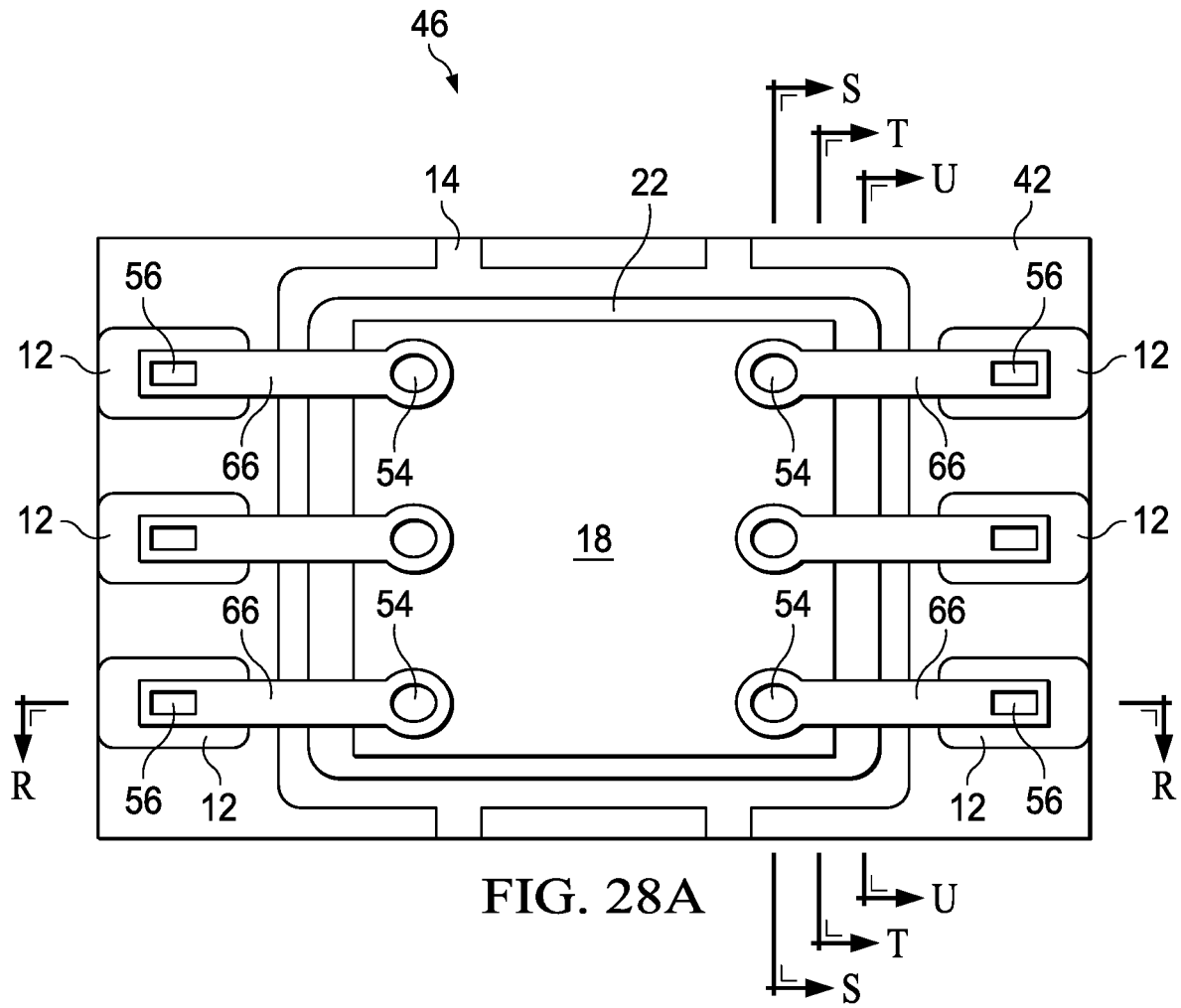
FIG. 28A is a top view of an electronic assembly undergoing fabrication according to the example method 500 of FIG. 5 with the implementation at 510, wherein individual insulating layers 66 are utilized instead of the blanket insulating layer 52 in FIGS. 26A-J or the half-blanket insulating layers 64 in FIGS. 27A-J.

In another example, in FIG. 28A, individual insulating layers 66 are utilized instead of the blanket insulating layer 52 in FIGS. 26A-J or the half-blanket insulating layers 64 in FIGS. 27A-J. Each individual insulating layer 66 is a foundation layer for a later applied or deposited conductive layer. Each individual insulating layer 66 spans a portion of the top surface of an individual lead finger 12 in pre-molded lead frame 46, across pre-mold 42, up one side of die 18, across the top of die 18 just beyond a single bond pad 50 on one side of die 18 (e.g., at 510 in FIG. 5). A polymer, epoxy, silicon, mold, or other insulators can be used for each insulating layer 66. Each insulating layer 66 follows the contours of the topology on lead frame 46 and die 18, while smoothing the turns in the Z axis. Each insulating layer 66 creates a path or foundation and access for a later layer of conductive ink or other conductive material to be applied thereon. As can be seen in FIG. 28A, each insulating layer 66 surrounds a bond pad 50 on die 18 with a hole, void, or opening 56 in insulating layer 66 above bond pad 50. Each insulating layer 64 extends from a respective bond pad 50, over a top surface of die 18, down a side surface of die 18 closest to bond pad 50 and to lead frame 46, across pre-mold 42 and to a lead 12 on the other side of pre-mold 42. A hole, void, or opening 54 is formed in insulating layer 64 above a top portion of each lead 12. Insulating layers 66 can be formed or deposited using one of multiple techniques such as screen-printing, photolithography and etching, CVD, PVD, vacuum evaporation, inkjet printing, spray coating, microdispensing, aerosol jet, ElectroHydroDynamic (EHD) techniques with the appropriate insulating properties.

If inkjet printing is used, insulating layers 66 can be formed from an inkjet deposition compatible polymer such as a polyimide ink, a thermally curable epoxy-based polymer ink, and a UV-curable acrylate ink. It is preferred that a polymer with a modulus less than 3.4 GPa and more preferred less than 2 GPa be used, to avoid undue stress on the assembly. A thickness of the insulating layer 66 can be in the range of about 2 μm to 35 μm. A more preferred range is about 2 μm to not more than 20 μm, and still more preferred in a range from about 2 μm to about 10 μm. Because the inkjet solvent deposition material has a solvent, the initial thickness, after the solvent dissipates, the remaining material forms the insulating layer at a reduced thickness. Optionally individual insulating layers 66 can be cured at this time (e.g., at 702 in FIG. 7), or later with additional layers. To achieve the desired thickness, multiple inkjet depositions can be performed (e.g., at 802 in FIG. 8). Inkjet deposition allows precise placement of material by using "drop on demand" (DOD) technology, where a reservoir of the liquid has a nozzle and a small volume of the liquid is forced from the nozzle in response to an electrical signal. The liquid forms a drop as it falls vertically onto a surface.

Figure 28B:
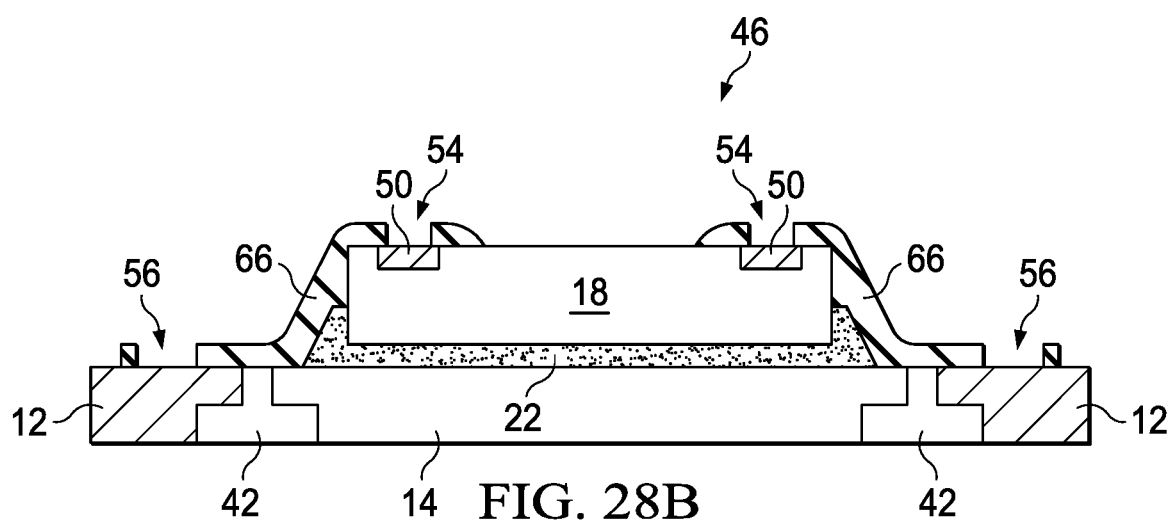
FIGS. 28B-28J are cross-sectional views of the electronic assembly of FIG. 28A along various reference lines.

The precision of the inkjet deposition tool allows deposition of the liquid material in some areas and not in others (such as hole, void or openings 54 & 56) as the tool traverses across the surface (or if the tool is fixed, as the surface moves beneath the tool). Because the insulating material can be very accurately placed even in small areas, no etch or material removal step is needed to remove material after the inkjet deposition (such as in creating holes, voids or openings 54 & 56). See FIG. 28A, individual insulating layers 66 do not cover through hole, void or openings 54 above bond pads 50 on die 18 or through hole, voids or openings 56 in insulating layers 66 above a top surface of each lead 12 on lead frame 46. With inkjet printing, no etch or material removal step is needed for through hole or voids 54 or 56 to remove material after the inkjet deposition, which reduces material waste and avoids a later etch or ablation step. The through hole, void or openings 54 & 56 facilitate later connection of an electrically conductive material between leads 12 on lead frame 46 and corresponding bond pads 50 on die 18. To achieve the desired thickness of half-blanket insulating layers 66, multiple inkjet depositions can be performed (e.g., at 802 in FIG. 8). A single pass deposition increases manufacturing throughput and reduces costs but may not produce as precisely defined features as multiple pass deposition. As additional inkjet materials are developed, a reduction in the amount of solvent can reduce the initial thickness needed and thereby reduce the need for multiple pass depositions. FIG. 28B is a cross-sectional view of integrated circuit (IC) die 18 attached, via die attach material 22, to a top surface of die attach pad 14 of pre-molded lead frame unit 46 along reference line R-R in FIG. 28A.

Figure 28C:
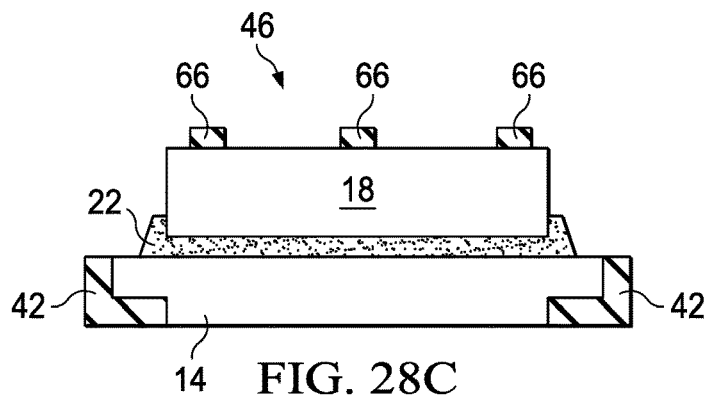
Figure 28D:
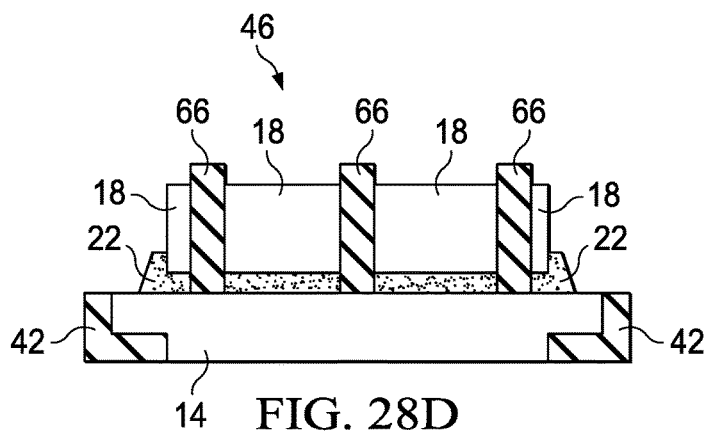

According to one example, each insulating layer 66 is an individual insulating layer with no channel or grooves for subsequent conductive material to be deposited on from bond pads 50 on die 18 to leads 12. FIG. 28C is a cross-sectional view of integrated circuit (IC) die 18 attached, via die attach material 22, to a top surface of die attach pad 14 of pre-molded lead frame unit 46 along reference line T-T in FIG. 28A. FIG. 28D is a cross-sectional view of integrated circuit (IC) die 18 attached, via die attach material 22, to a top surface of die attach pad 14 of pre-molded lead frame unit 46 along reference line U-U in FIG. 28A, which shows the insulating layers extending down a vertical side of die 18 to die pad 46.

Figure 28E:
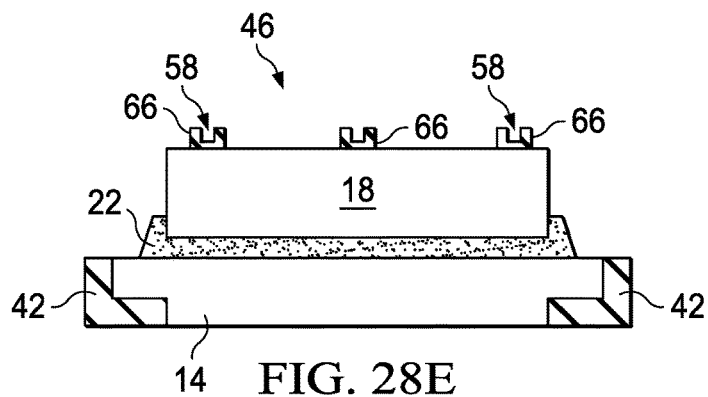
Figure 28F:
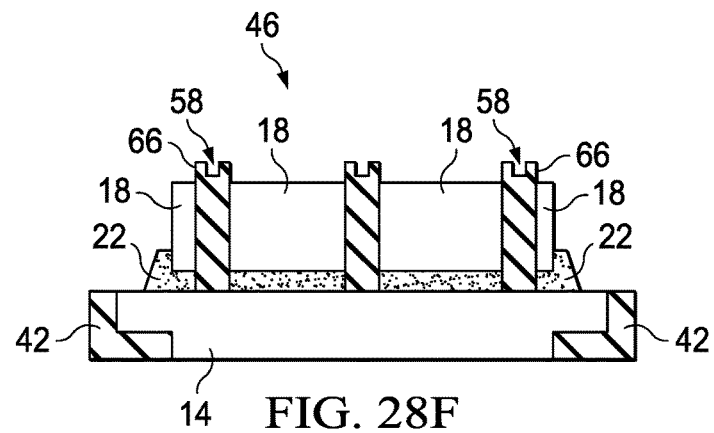
Figure 28G:
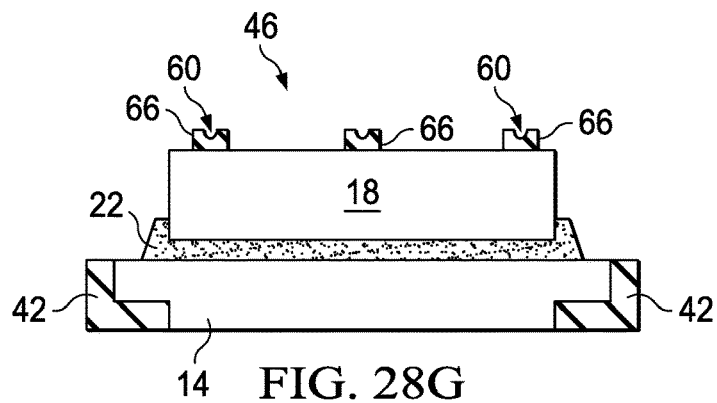
Figure 28H:
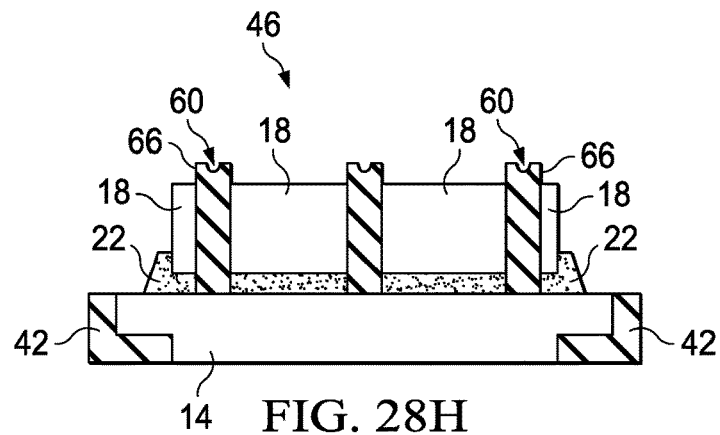

According to another example, each insulating layer 66 is an individual insulating layer with a rectangular shaped channel or groove for subsequent conductive material to be deposited in from bond pads 50 on die 18 to leads 12. FIG. 28E is a cross-sectional view of integrated circuit (IC) die 18 attached, via die attach material 22, to a top surface of die attach pad 14 of pre-molded lead frame unit 46 along reference line T-T in FIG. 28A, which shows each insulating layer 66 having a rectangular shaped channel or groove 58 on a top surface of die 18. FIG. 28F is a cross-sectional view of integrated circuit (IC) die 18 attached, via die attach material 22, to a top surface of die attach pad 14 of pre-molded lead frame unit 46 along reference line U-U in FIG. 28A, which shows the insulating layers extending down a vertical side of die 18 to die pad 46. According to yet another example, each insulating layer 66 is an individual insulating layer with a semicircular shaped channel or groove for subsequent conductive material to be deposited in from bond pads 50 on die 18 to leads 12. FIG. 28G is a cross-sectional view of integrated circuit (IC) die 18 attached, via die attach material 22, to a top surface of die attach pad 14 of pre-molded lead frame unit 46 along reference line T-T in FIG. 28A, which shows each insulating layer 66 having a semicircular shaped channel or groove 60 on a top surface of die 18. FIG. 28H is a cross-sectional view of integrated circuit (IC) die 18 attached, via die attach material 22, to a top surface of die attach pad 14 of pre-molded lead frame unit 46 along reference line U-U in FIG. 28A, which shows the insulating layers extending down a vertical side of die 18 to die pad 46.

Figure 28I:
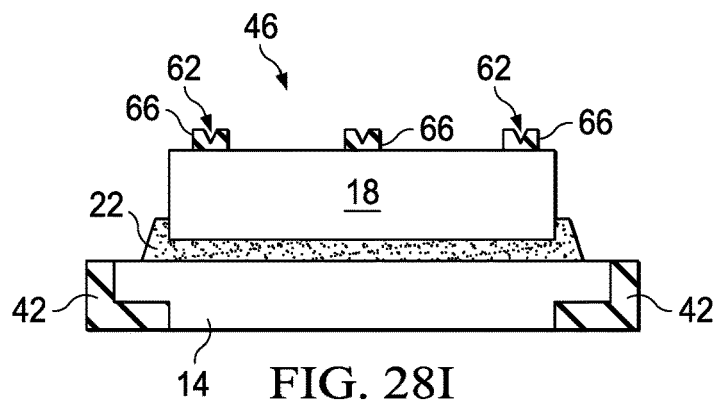
Figure 28J:
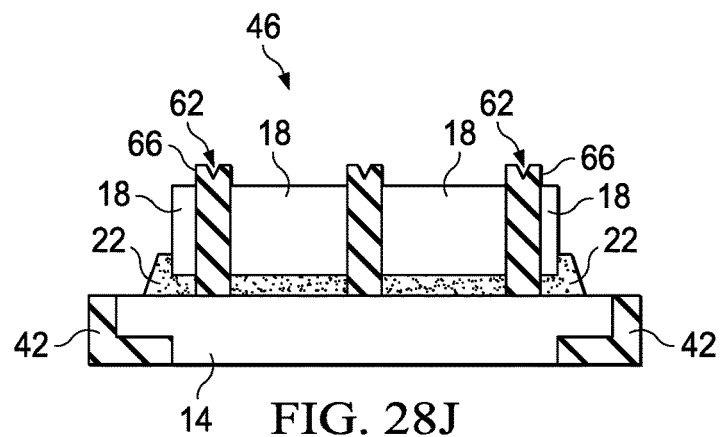

According to still another example, each insulating layer 66 in FIG. 28E is an individual insulating layer formed with a v-shaped channel or groove 62 for subsequent conductive material to be deposited in from bond pads 50 on die 18 to leads 12. FIG. 28I is a cross-sectional view of integrated circuit (IC) die 18 attached, via die attach material 22, to a top surface of die attach pad 14 of pre-molded lead frame unit 46 along reference line T-T in FIG. 28A. FIG. 28J is a cross-sectional view of integrated circuit (IC) die 18 attached, via die attach material 22, to a top surface of die attach pad 14 of pre-molded lead frame unit 46 along reference line U-U in FIG. 28A, which shows each insulating layer 66 extending from a top surface of die 18, down a side surface of die 18 and to a top surface of lead frame 46. While above examples of rectangular 58, semicircular 60 & v-shaped 62 channels in blanket layers 64 have been described, other channel configurations are possible and anticipated by this disclosure.

Individual insulating layers 66 can be formed or deposited using one of multiple techniques. Insulating layers 66 can be formed from an inkjet deposition compatible polymer such as a polyimide ink, a thermally curable epoxy-based polymer ink, and a UV-curable acrylate ink. It is preferred that a polymer with a modulus less than 3.4 GPa and more preferred less than 2 GPa be used, to avoid undue stress on the assembly. A thickness of the insulating layer 52 can be in the range of about 2 μm to 35 μm. A more preferred range is about 2 μm to not more than 20 μm, and still more preferred in a range from about 2 μm to about 10 μm. Because the inkjet solvent deposition material has a solvent, the initial thickness, after the solvent dissipates, the remaining material forms the insulating layer at a reduced thickness. To achieve the desired thickness, multiple inkjet depositions can be performed (e.g., at 802 in FIG. 8). Inkjet deposition allows precise placement of material by using "drop on demand" (DOD) technology, where a reservoir of the liquid has a nozzle and a small volume of the liquid is forced from the nozzle in response to an electrical signal. The liquid forms a drop as it falls vertically onto a surface.

FIGS. 29A-29L show one example, in which a non-screen printing process 800 is performed using a print head 68 that is controlled to translate along a controlled lateral direction or path 70 while directing insulating material along a vertical direction 72 to get a desired contour of blanket insulating layer 52 (e.g., in FIGS. 26A-26J), half-blanket insulating layer 64 (e.g., in FIGS. 27A-27J) or individual insulating layers 66 (e.g., in FIGS. 28A-28J). In one example, the process is performed with an inkjet print head 68 having position control apparatus such as servo controls configured to translate, and control the position of, the print head 68 in three dimensions (e.g., the X and Y directions shown in the figures and an orthogonal Z direction out of the page in FIGS. 29A-29L). In one implementation, the printing system translates the print head 68 in an X-Z plane while controlling the Y direction spacing between the top side of lead frame 46, die 18 and the print head 68. The printing system in one example also controls the delivery of insulating material from a nozzle of the print head to turn the printing on and off, for example, to facilitate precise, high resolution control over locations where the insulating material is printed and where it is not printed. In addition, the non-screen printing process 800 provides control over the deposited insulating material thickness (e.g., in the Y direction) through one or more of deposition rate and controlling the time the print head 68 is positioned over a particular area of lead frame 46 and/or die 18. This facilitates printing insulating material to different thicknesses at different locations in certain implementations.

Figure 29A:
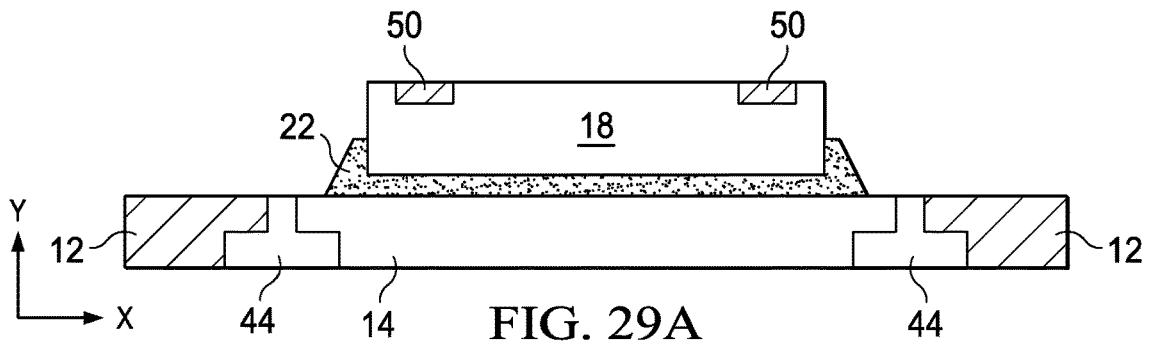
FIG. 29A shows a die 18 attached to a pre-molded lead frame 46 prior to applying insulating material.
Figure 29B:
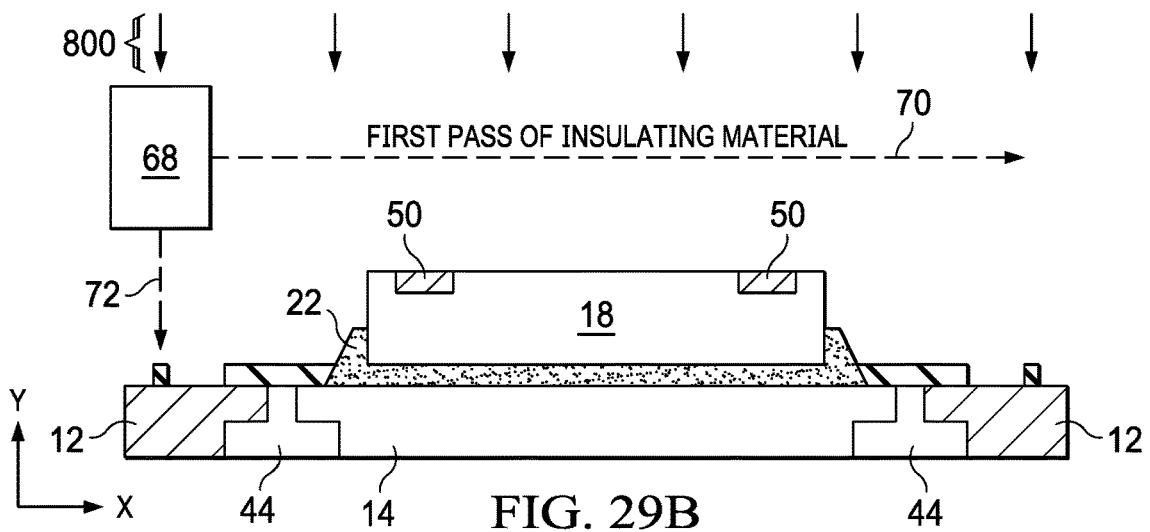
FIGS. 29B-29L showing the results of multiple sequential passes of printing insulating material by print head 68.
Figure 29C:
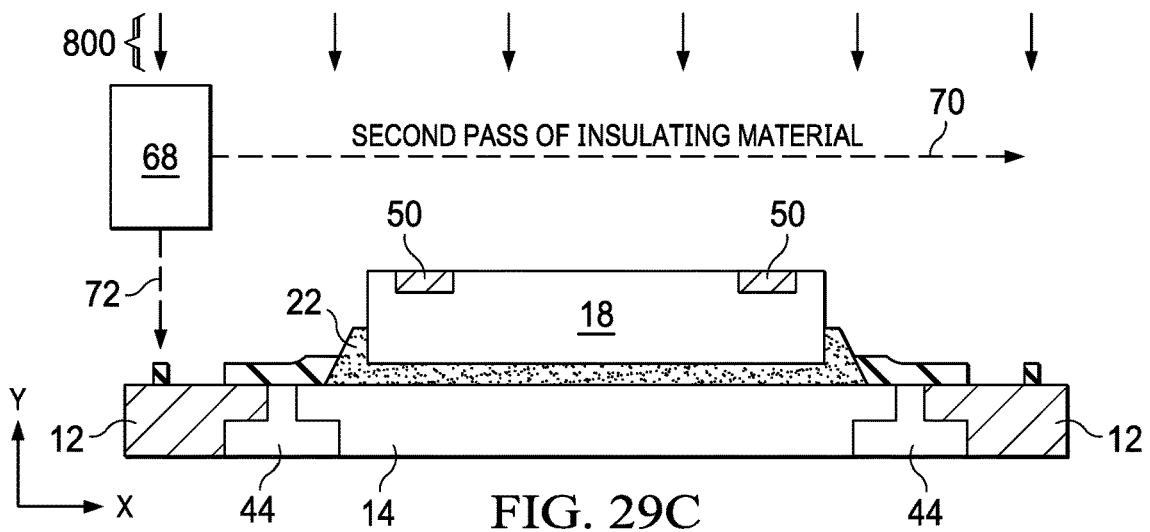
Figure 29D:
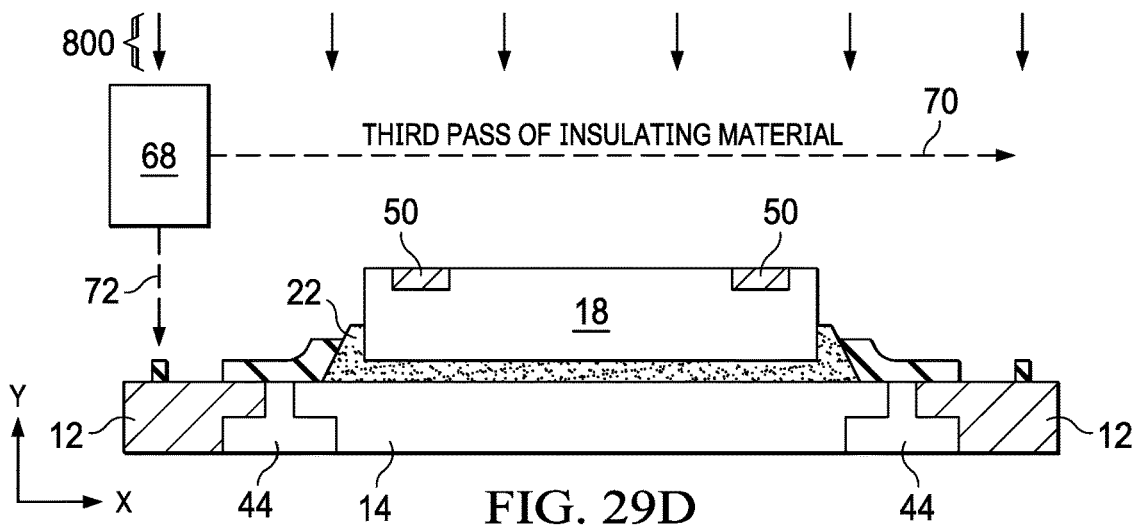
Figure 29E:
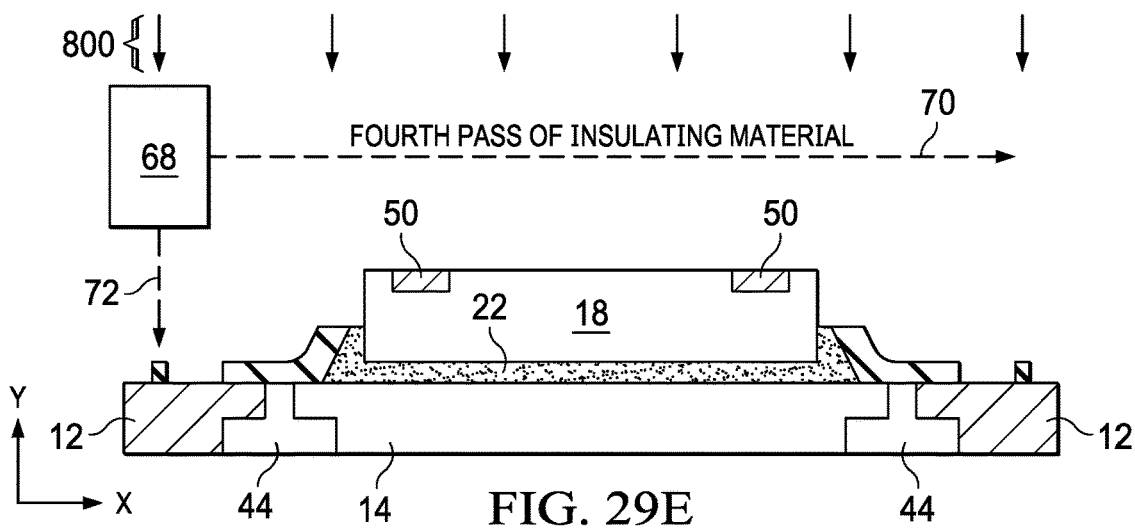
Figure 29F:
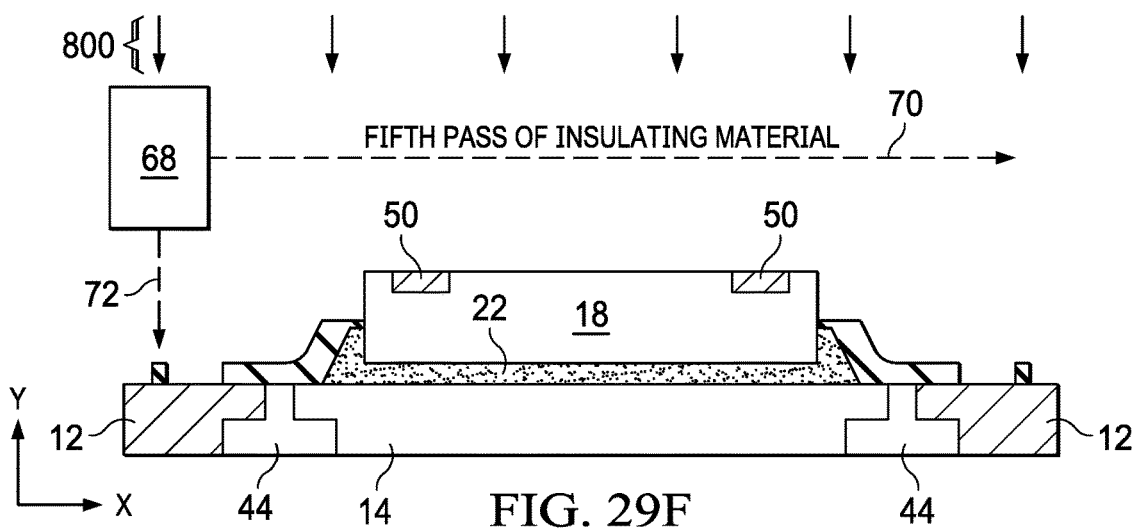
Figure 29G:
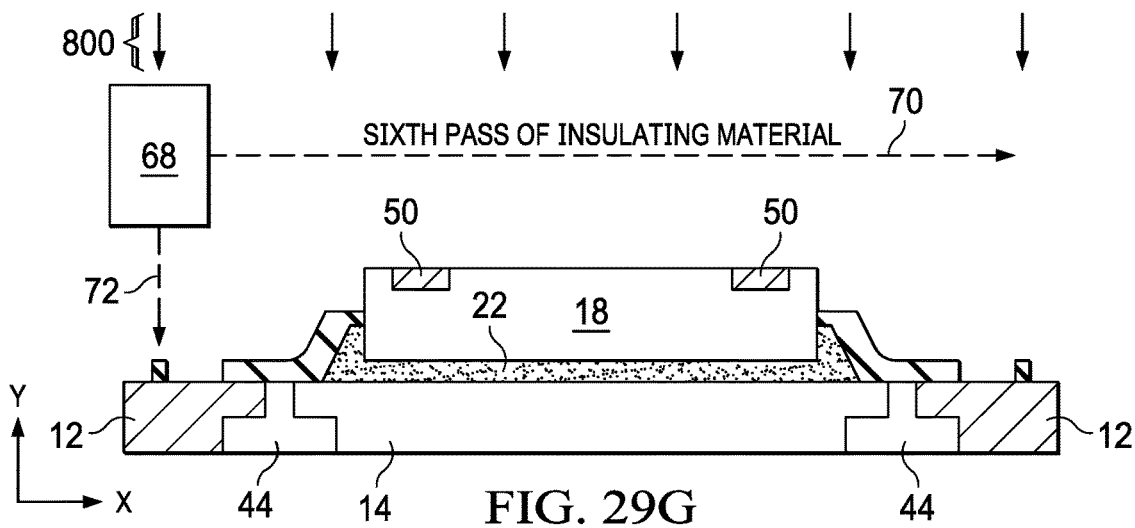
Figure 29H:
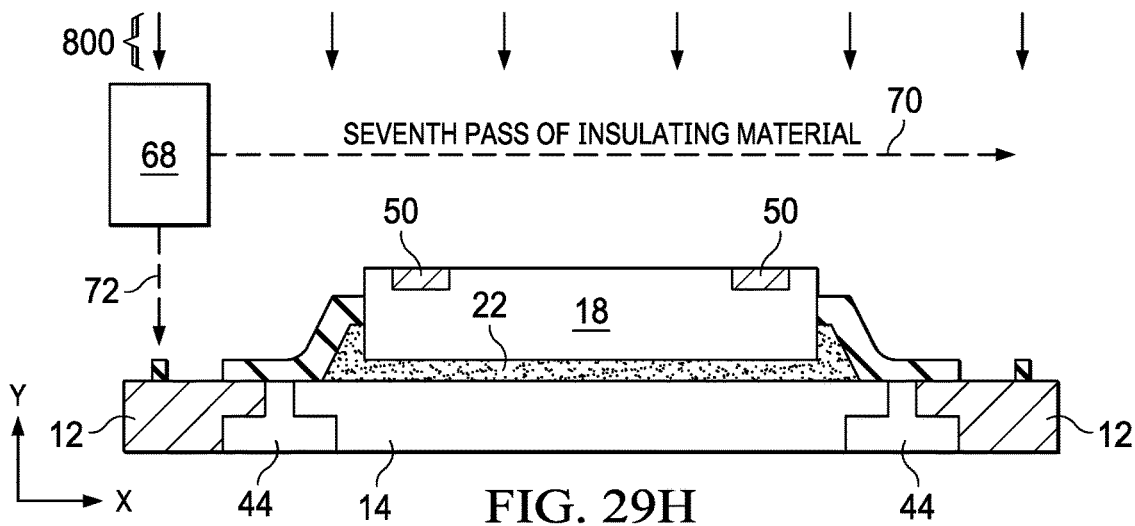
Figure 29I:
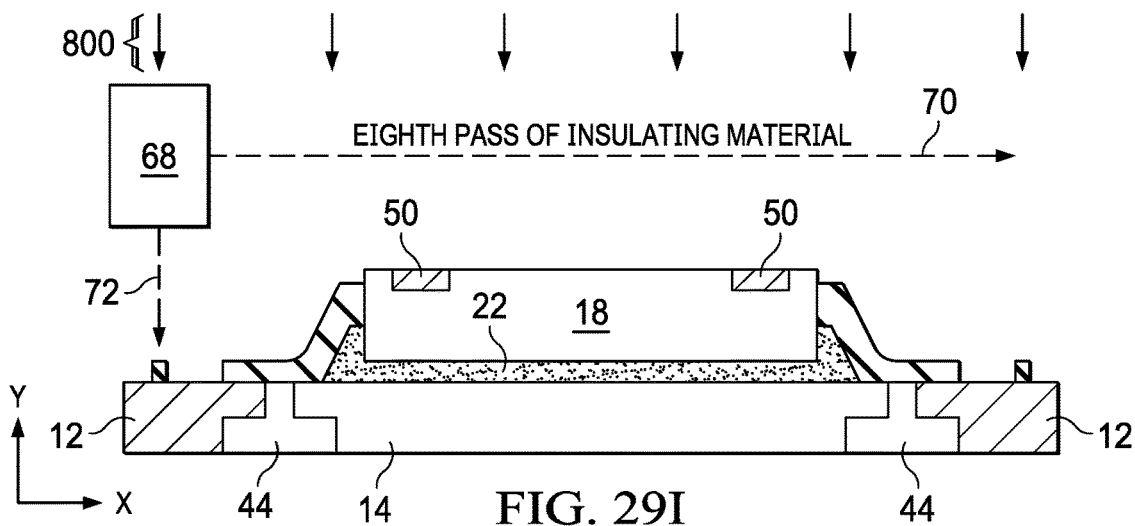
Figure 29J:
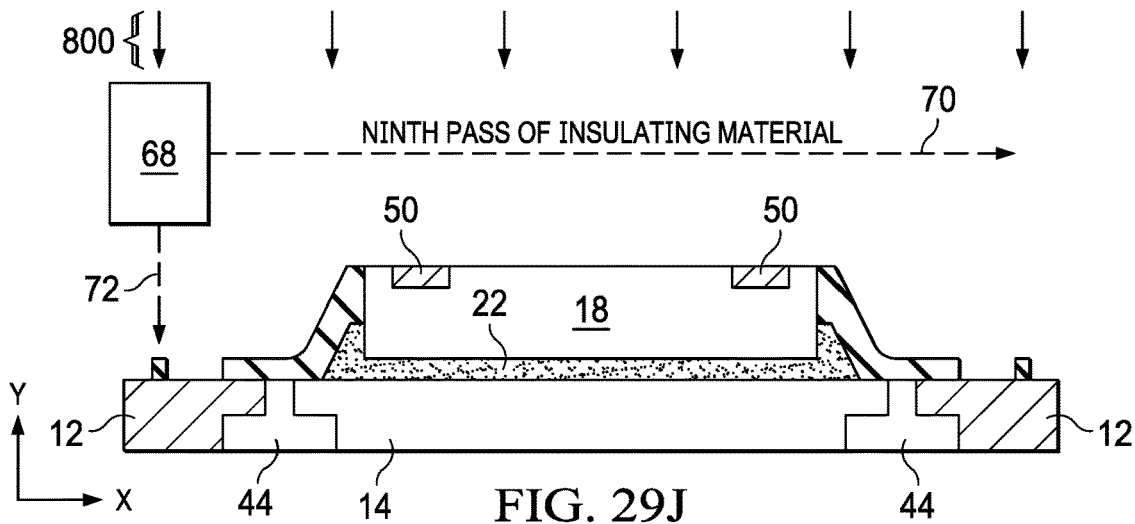
Figure 29K:
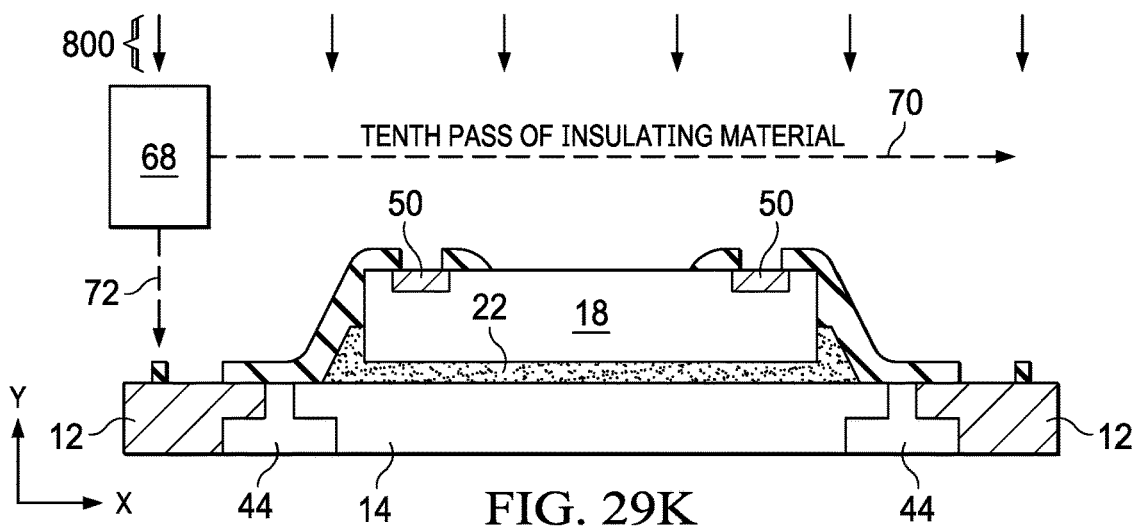
Figure 29L:
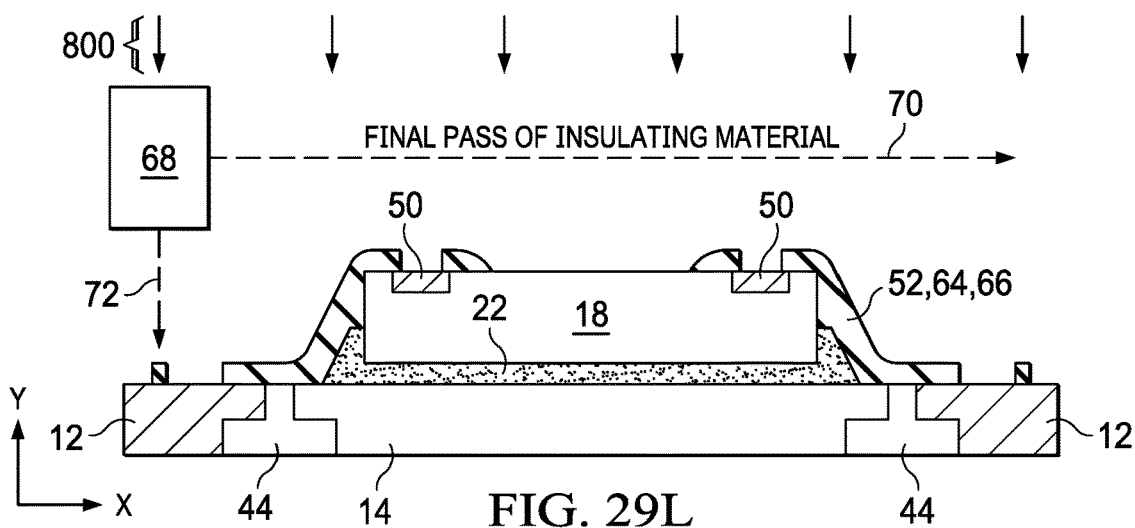

To get the desired contour of the insulating layers 52, 64 & 66 along the non-horizontal surfaces, insulating material can be formed or applied in multiple passes with each pass dispensing viscus material onto Z dimension at only desired X-Y location. Viscosity of material and exposure to temperature, light, or gas can keep the partially hardened material in place. FIG. 29A shows a die 18 attached to a pre-molded lead frame 46 prior to applying insulating material. FIG. 29B shows the result of a first pass of printing insulating material by print head 68. FIG. 29C shows the result of a second pass of printing insulating material by print head 68. FIG. 29D shows the result of a third pass of printing insulating material by print head 68. FIG. 29E shows the result of a fourth pass of printing insulating material by print head 68. FIG. 29F shows the result of a fifth pass of printing insulating material by print head 68. FIG. 29G shows the result of a sixth pass of printing insulating material by print head 68. FIG. 29H shows the result of a seventh pass of printing insulating material by print head 68. FIG. 29I shows the result of an eighth pass of printing insulating material by print head 68. FIG. 29J shows the result of a ninth pass of printing insulating material by print head 68. FIG. 29K shows the result of a tenth pass of printing insulating material by print head 68. FIG. 29L shows the result of a final pass of printing insulating material by print head 68. While FIGS. 29B-29L show a total of eleven passes of printing insulating material by print head 68, more or fewer could be used in practice depending on many factors including the type of insulating material used, viscosity of the insulating material, desired thickness of the insulating material, desired resolution of control of the deposition of the insulating material, etc. Also, in the example of depositing blanket layer 52, portions of blanket layer 52 will extend across a top surface of die 18 between bond pads 50 on opposite side of die 18 (not show in FIGS. 29K & 29L).

Figure 30:
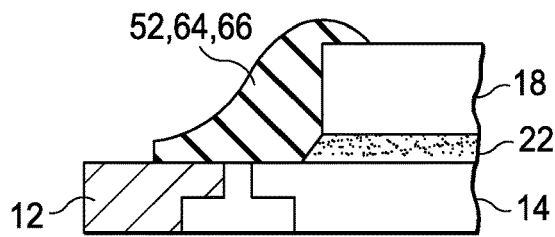
FIGS. 30-33 are partial side sectional view of a die attached to a lead frame according to various examples.
Figure 31:
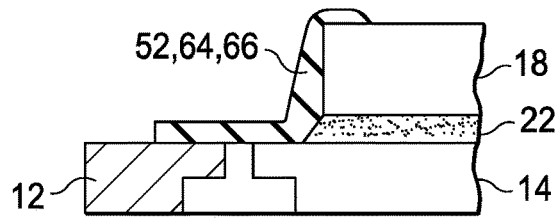
Figure 32:
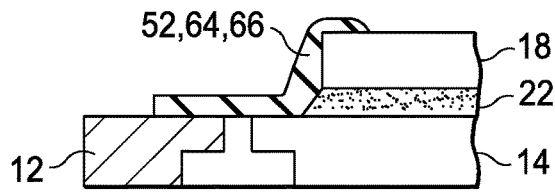
Figure 33:
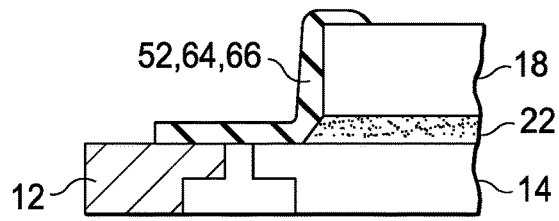
Figure 34:
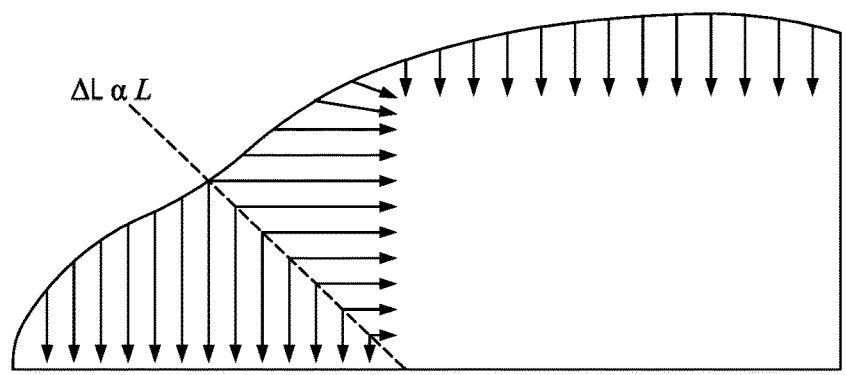
FIG. 34 is a pictorial view showing that shrinkage of the insulating material, especially polymer, is proportional to its distance from the closest contact surface.

Different orientations of the insulating material can be created depending on the type, viscosity and amount of the printed or otherwise deposited insulating material. FIG. 30 shows one example including a larger amount of insulating material in the insulating layer (52, 64, 66), especially around a side wall surface of die 18 where it attaches to die support pad 14 of pre-molded lead frame 46 and a top surface of insulating layer (52, 64, 66) is almost at a diagonal layer from a top surface of die 18 to a top surface of a lead 12. FIG. 31 shows another example in which a thinner insulating layer (52, 64, 66) includes a smaller amount of insulating material is deposited, especially around a side wall surface of die 18 where it attaches to die support pad 14 of pre-molded lead frame 46 and insulating layer (52, 64, 66) is almost at a vertical layer from a top surface of die 18 toward die attach pad 14. FIG. 32 shows yet another example where an overall height of the insulating layer (52, 64, 66) can be reduced by using a thinner die 18. FIG. 33 shows still another example in which a thicker die attach 22 is used, a portion of which extends outward along die pad 14 away from die 18, thus allowing the use of a thinner insulating layer (52, 64, 66) in which a smaller amount of insulating material is deposited, especially around a side wall surface of die 18 where it attaches to die support pad 14 of pre-molded lead frame 46 and insulating layer (52, 64, 66) is almost at a vertical layer from a top surface of die 18 toward die attach pad 14. However, shrinkage of the insulating material, especially polymer, is proportional to its distance from the closest contact surface, see FIG. 34.

Figure 35:
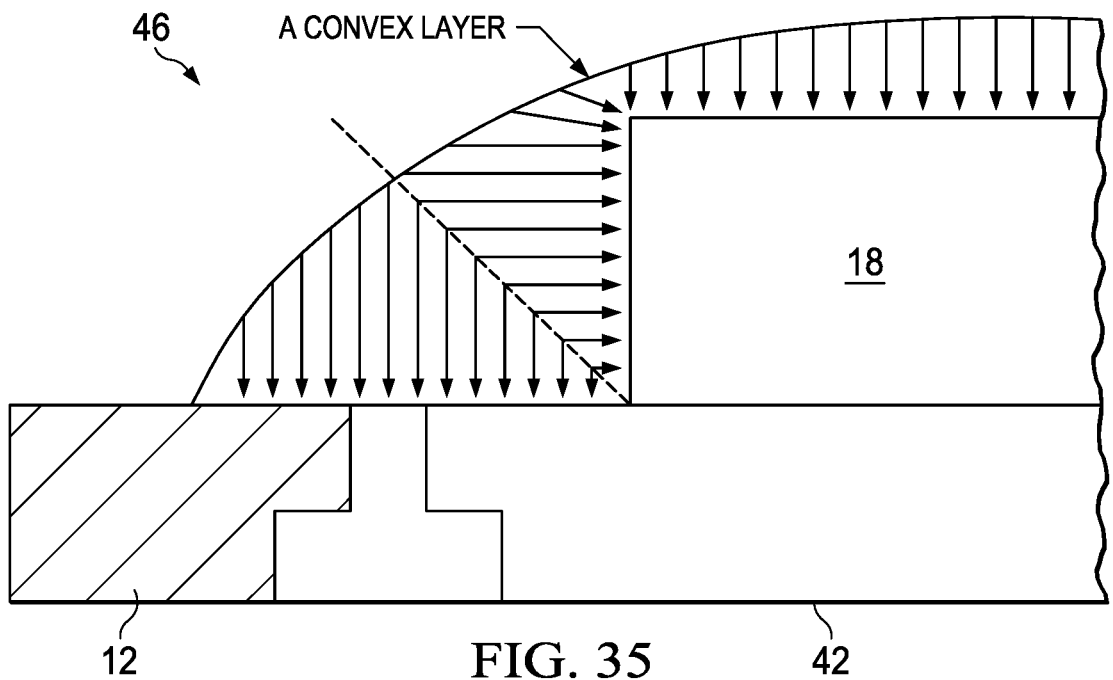
FIG. 35 is a partial side sectional view of a die attached to a lead frame wherein a convex shape to the insulating layer results from the significant amount of insulating material deposited on the die and lead frame.
Figure 36:
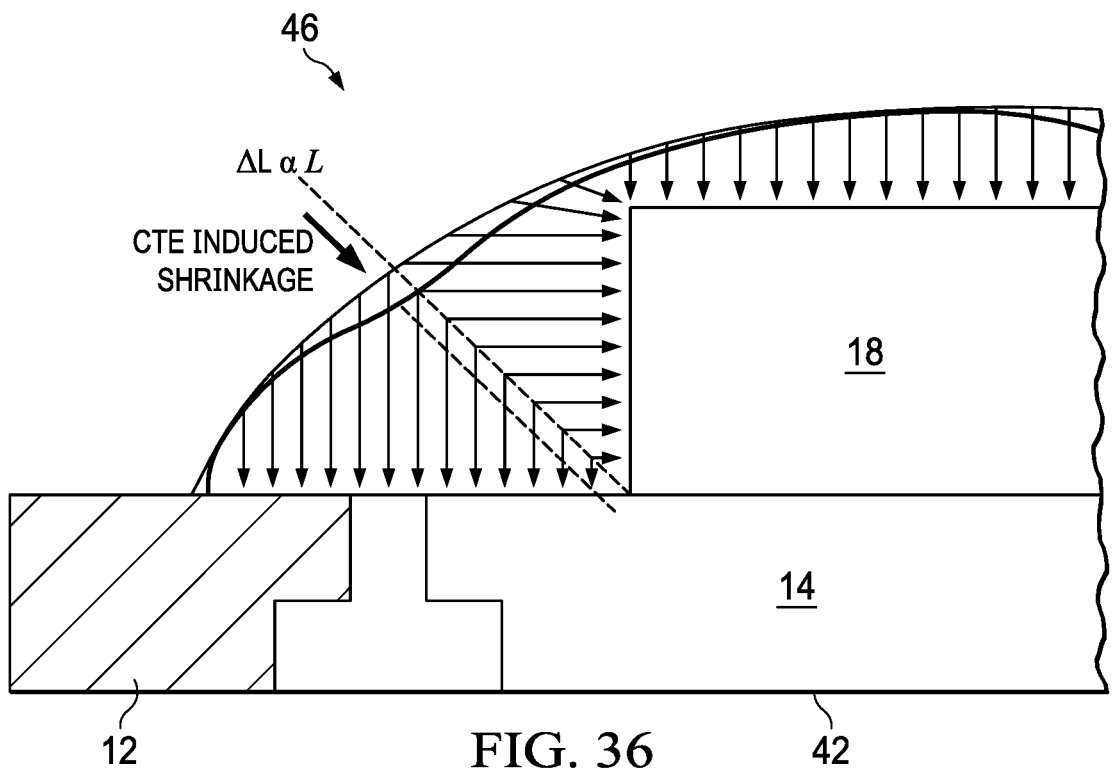
FIG. 36 is a partial side sectional view of a die attached to a lead frame, as in FIG. 35, showing the result of CTE shrinkage of an insulating layer having a convex outer surface.
Figure 37A:
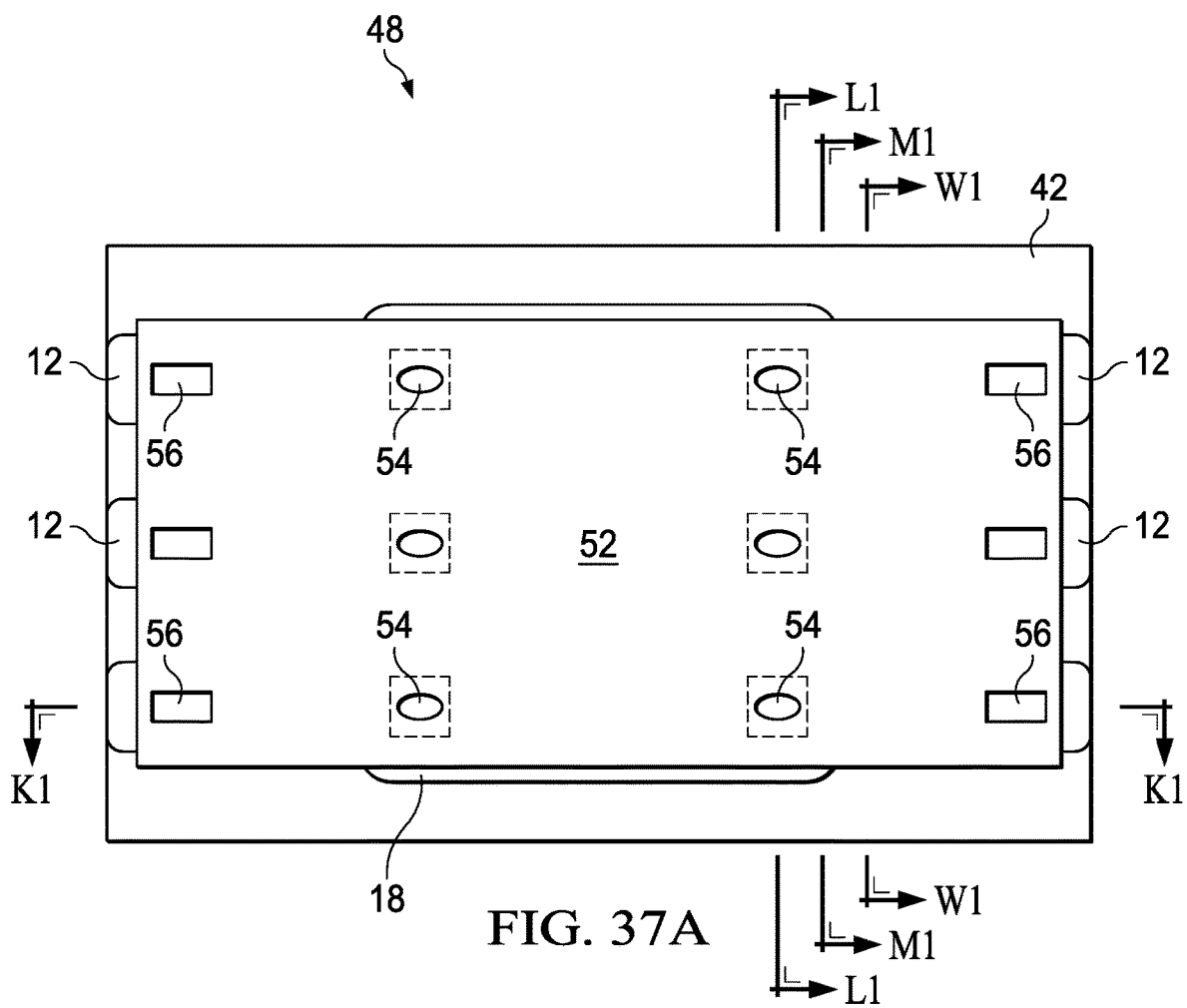
FIG. 37A is a top view of an electronic assembly undergoing fabrication according to the example method 500 of FIG. 5 with the implementation at 510, wherein a blanket insulating layer 52 is printed, deposited, formed or otherwise applied as a foundation layer spanning a portion of a top surface of lead fingers 12 in pre-molded lead frame 48, across pre-mold 42, up one side of die 18, across the top of die 18, down an opposite side of die 18, across pre-mold 42 on an opposite side of pre-molded lead frame 48 and to a portion of a top surface of lead fingers 12 on the opposite side of pre-molded lead frame 48 (e.g., at 510 in FIG. 5).
Figure 37B:
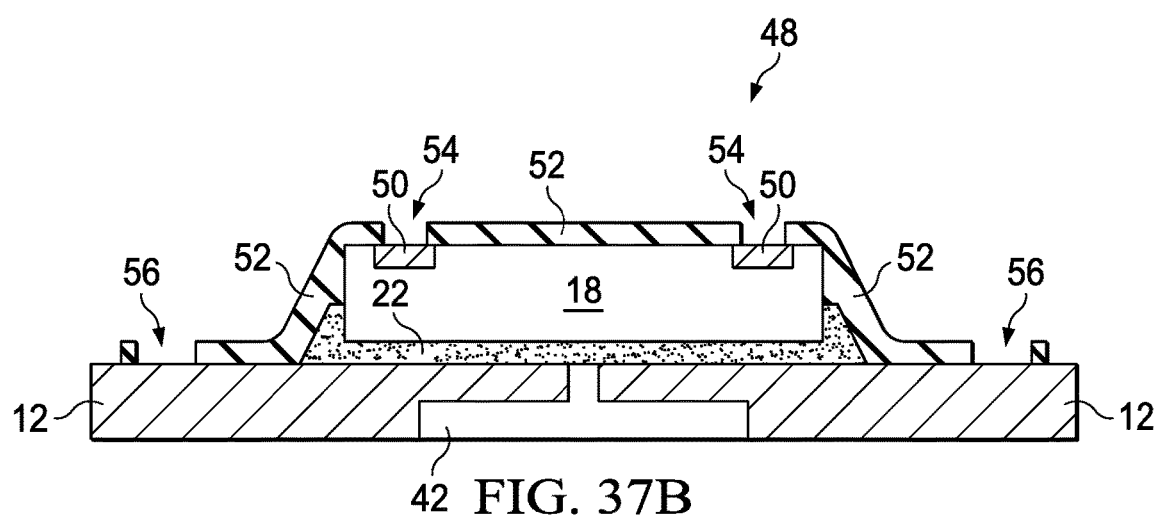
FIG. 37B is a cross-sectional view of the electronic assembly of FIG. 37A along reference lines K1-K1.
Figure 38A:
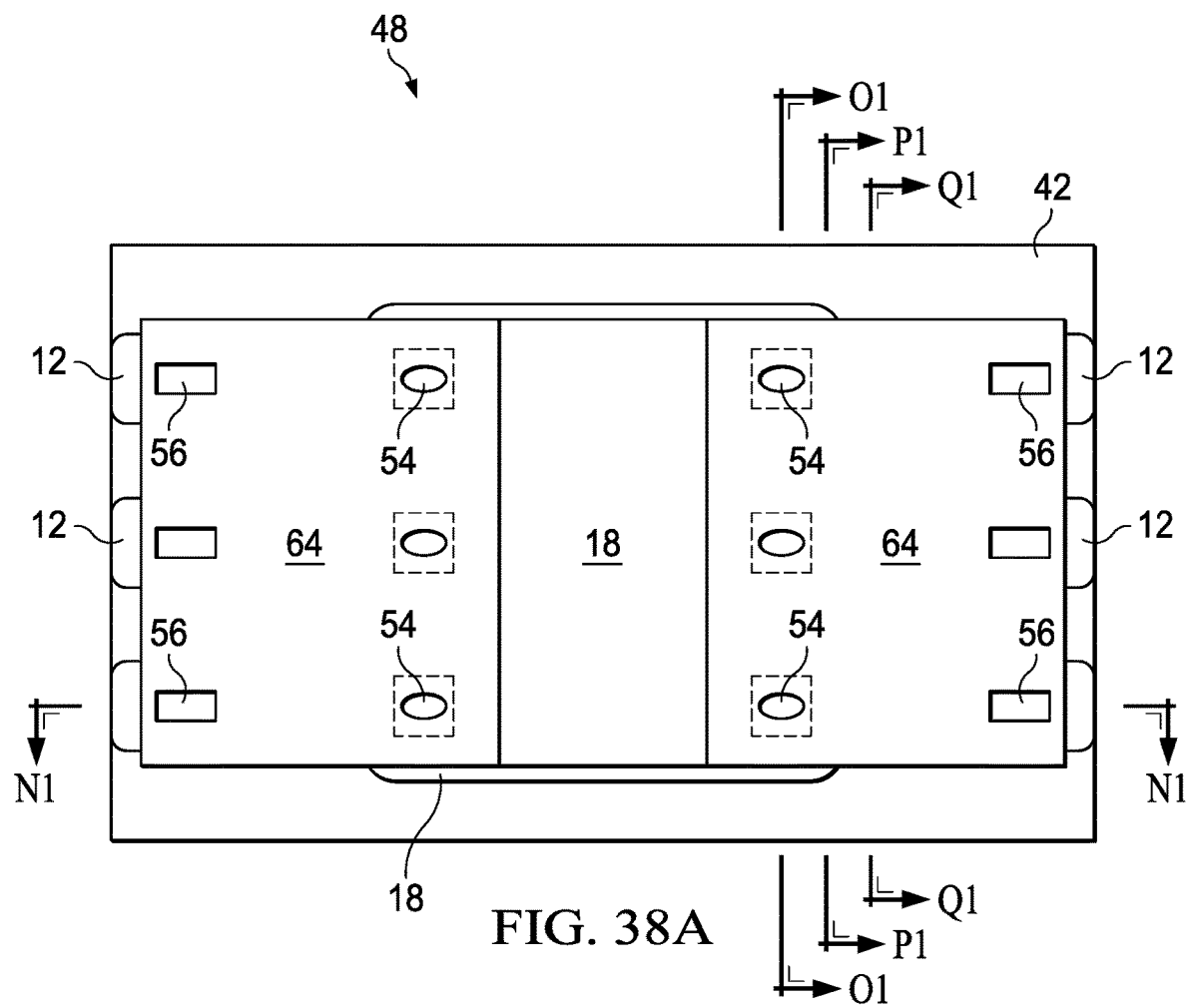
FIG. 38A is a top view of an electronic assembly undergoing fabrication according to the example method 500 of FIG. 5 with the implementation at 510, wherein instead of using a single blanket insulating layer as shown in FIGS. 37A & 37B, two spaced apart half-blanket insulating layers 64 are applied as foundation layers, each spanning a top surface of a portion of lead fingers 12 in pre-molded lead frame 48, across pre-mold 42, up one side of die 18, across a portion of the top of die 18 just past bond pads 50 on die 18 (e.g., at 510 in FIG. 5).
Figure 38B:
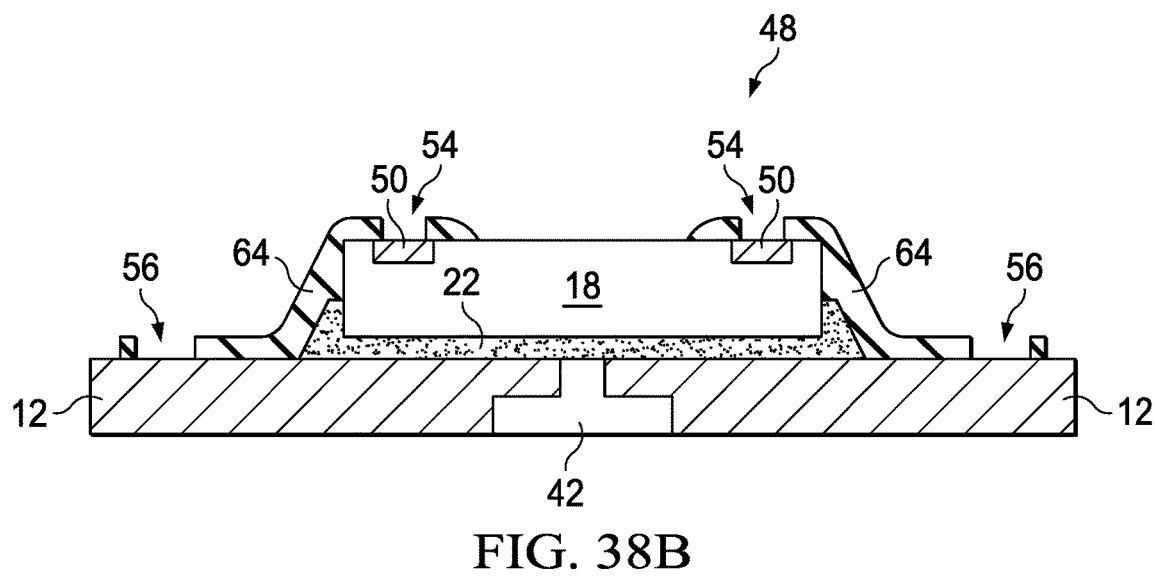
FIG. 38B is a cross-sectional view of the electronic assembly of FIG. 38A along reference line N1-N1.
Figure 39A:
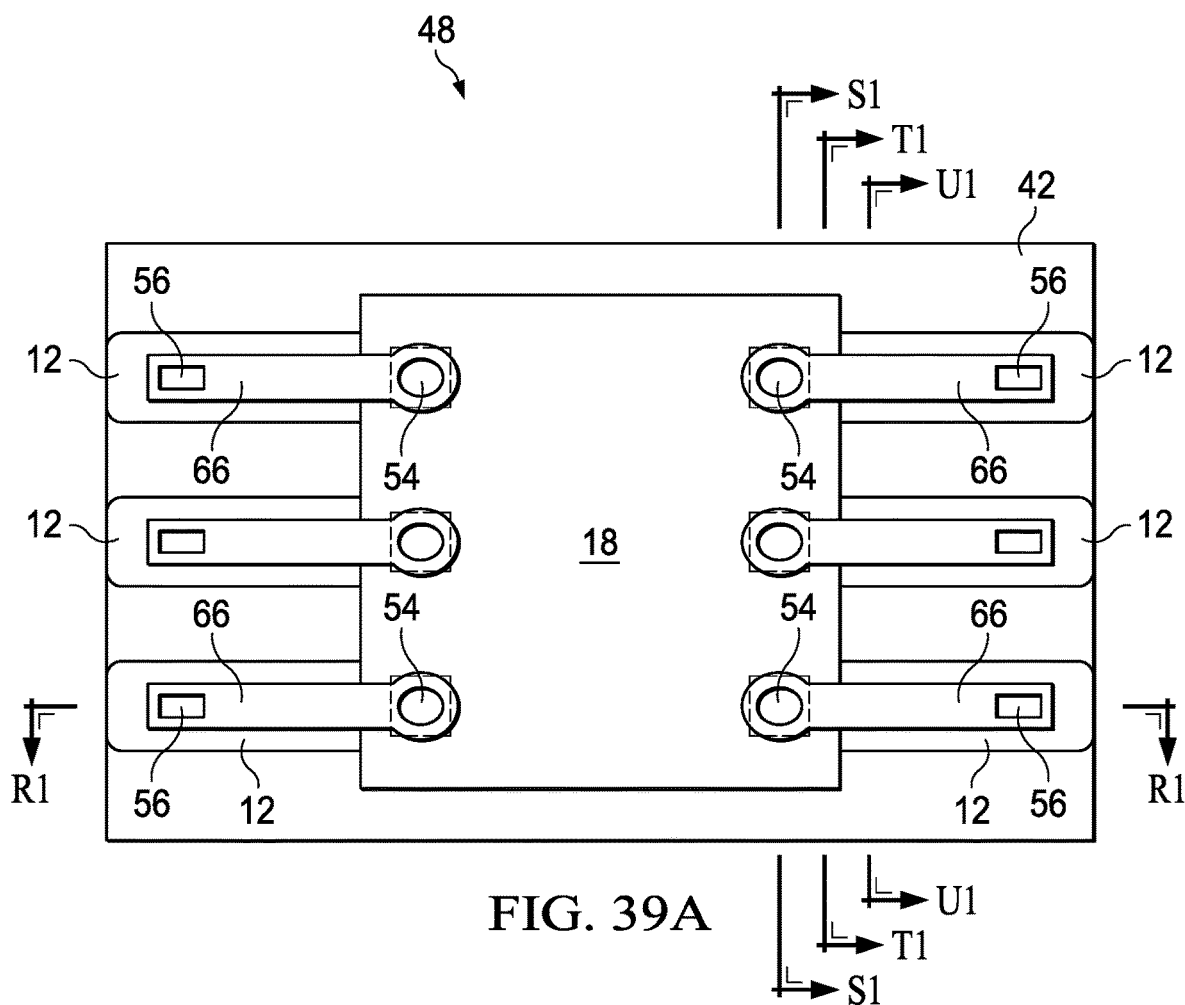
FIG. 39A is a top view of an electronic assembly undergoing fabrication according to the example method 500 of FIG. 5 with the implementation at 510, wherein individual insulating layers 66 are utilized instead of the blanket insulating layer 52 in FIG. 37B or the half-blanket insulating layers 64 in FIGS. 38A & 38B.
Figure 39B:
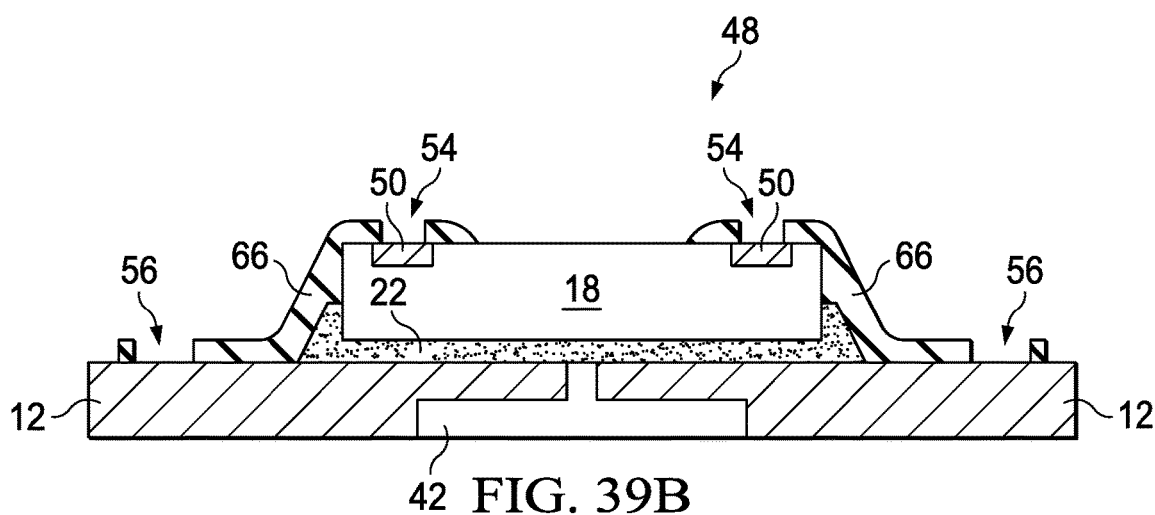
FIG. 39B is a cross-sectional view of the electronic assembly of FIG. 39A along reference line R1-R1.

FIG. 35 shows an example where a significant insulating layer is formed on a corresponding die and lead frame. A convex shape results from the significant amount of insulating material deposited on the die and lead frame. A thick or non-uniform layer of insulating material will cause increased stresses within a packaged semiconductor device due to the expansion and contraction properties of the different materials comprising the packaged device due to the coefficient of thermal expansion (CTE). FIG. 36 shows the result of CTE shrinkage of an insulating layer having a convex outer surface—the shrinkage will be greatest toward the nearest solid surfaces, which can result in separation between the insulating layer and any other surfaces to which it is attached. On the other hand, thinner insulating layers that contour the horizontal surface of pre-molded lead frame 46 and vertical side surface of die 18 create more uniformity and less CTE related stress. Also, reducing the vertical thickness of die 18 will help reduce CTE related stress by reducing the vertical height of the insulating layer.

In the illustrated examples in FIGS. 29B-29L, the non-screen printing process 800 is an inkjet printing process. An inkjet implementation of the non-screen printing process 800 is advantageous for efficiently printing feature sizes on the order of 100's of microns down to 10-50 microns. In another example, the non-screen printing process 800 is an electrostatic jet printing process. An electrostatic jet printing implementation of the non-screen printing process 800 provides finer resolution, for example, to print feature sizes down to 10-50 µm. The material for the insulating layer includes solvent, and so the insulating layer is initially deposited at a thicker layer than the desired finished layer. In an example, the material deposited for the insulating layer is 60% solvent so that only 40% of the initial deposited material remains after a quick drying. Alternative materials can have a reduced solvent to material ratio, so that less initial thickness is needed for the same thickness final layer, as less solvent is dissipated. Non-mold material for the insulating layer has a light filler loading, for example 20-30% filler weight, which provides control of the viscosity, conformality, wettability, modulus and coefficient of thermal expansion (CTE). In comparison, if mold compound is used as the insulating layer, mold compound used in some arrangements can be 90% filler weight. Liquid resin for packaging, on the other hand, can have 50-60% filler weight. In alternative arrangements, the insulating layer (52, 64, 66) can be deposited by spraying, spin coating, dispensing by other methods, and by vapor deposition.

FIGS. 37A, 37B, 38A, 38B, 39A & 39B show alternative chip-on-lead (COL) packaged electronic devices. A significant difference between the alternative chip-on-lead (COL) packaged electronic devices and the previously discussed devices is in a COL device, lead frame 46 which has a die attach pad 14 & leads 12 which are spaced from the die attach pad, is replaced with a lead frame that contains leads but no die attach pad. In the case of a COL device, a semiconductor die is attached directly to, and is supported by, the leads rather than a die attach pad, such as die attach pad 14. The actual steps for fabricating the COL devices are otherwise substantially similar to the fabrication previously discussed for devices having a die attach pad with leads spaced apart from the die attach pad (see FIGS. 27A-29L) and will not be repeated herein.

Conductive Traces or Interconnects

FIGS. 40A-43L show an electronic assembly undergoing fabrication according to the example method 500 of FIG. 5 with the implementation at step 512. Step 512 includes applying conductive traces on insulating layer from bond pads on dies to lead frame leads. The conductive traces, and any contacts, can be made with low resistive material(s). Conductive inks, conductive polymers, metal filled epoxies, sintering metallic powder, liquid assisted sintering particles, solder paste, etc. can be used to form this trace and contacts. This material can be applied using at least one of many techniques, including inkjet printing, EHD/Electrospraying printing, spray coating printing, aerosol jet printing, microdispensing printing, laser induced forward transfer printing, microtransfer printing, scribe dispensing, screen printing. The conductive material forming the conductive trace is constrained within the outline created by the previously described blanket 52, half-blanket 64 & individual 66 insulating layers which form the foundation insulating layer(s). This will avoid unexpected shorts or opens. The conductive material follows the contours of the foundation layer and adheres well with that prior layer and next cover layer.

Figure 40A:
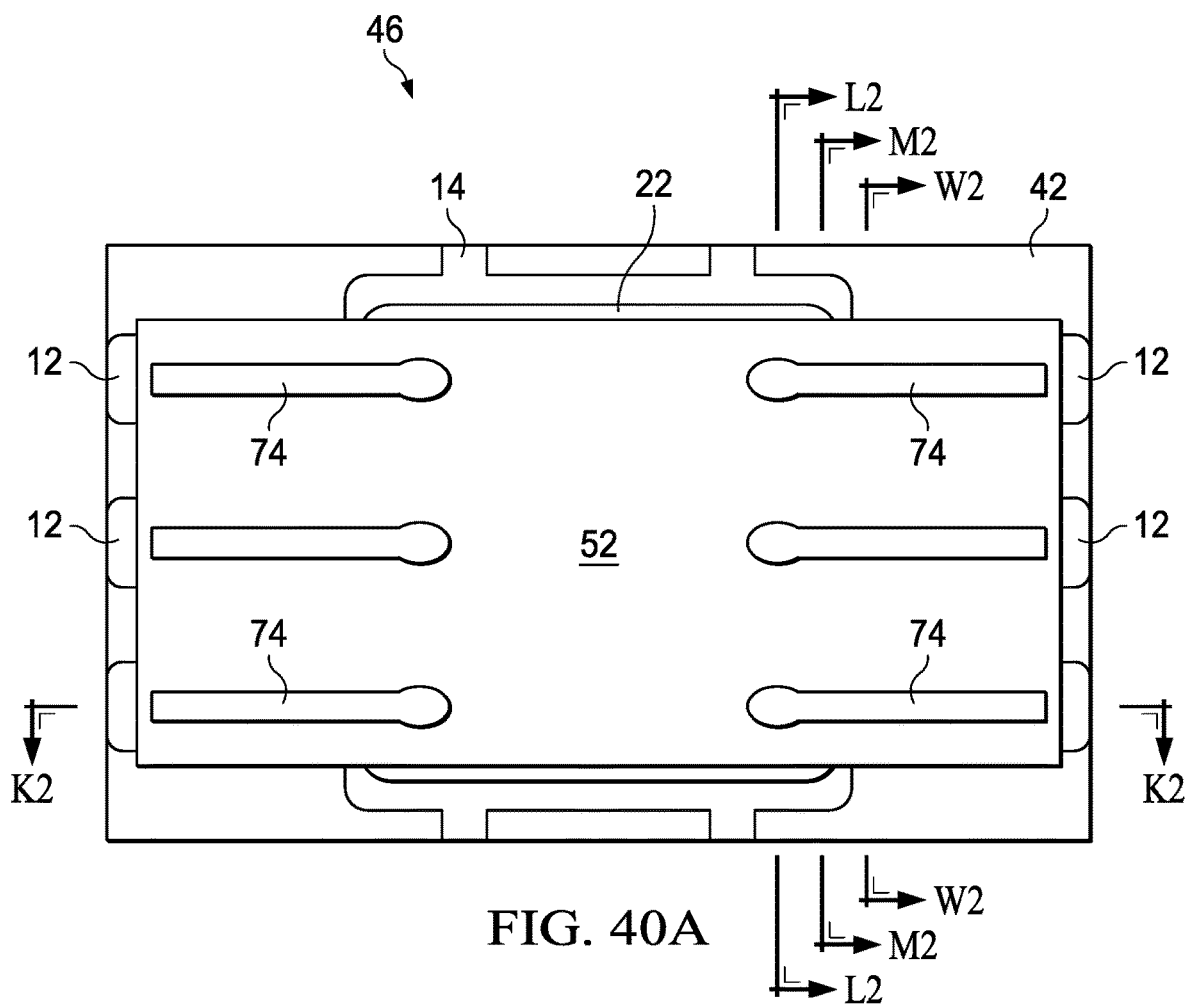
FIG. 40A is a top view of an electronic assembly undergoing fabrication according to the example method 500 of FIG. 5 with the implementation at 512, wherein multiple electrically conductive traces or interconnects 74 are printed or formed on blanket insulating layer 52 (e.g., FIGS. 26A-26J), each conductive trace or interconnect being between a respective bond pad 50 of die 18 and a corresponding top surface of a respective lead 12 of pre-molded lead frame 46.

FIG. 40A shows an example where multiple electrically conductive traces or interconnects 74 are printed or formed on blanket insulating layer 52 (e.g., FIGS. 26A-26J), each conductive trace or interconnect being between a respective bond pad 50 of die 18 and a corresponding top surface of a respective lead 12 of pre-molded lead frame 46 (e.g., at 512 in FIG. 5). In one example one end of each electrically conductive trace or interconnect 74 extends down through a through-hole or void 54 in blanket insulating layer 52 and to a respective bond pad 50 on die 18 and another opposite end of each electrically conductive trace or interconnect 74 extends down through a through-hole or void 56 to a top surface of a corresponding lead 12 on lead frame 46. In another example a solder ball, solder paste or other electrically conductive material is printed or deposited in through-hole or voids 54 & 56 prior to conductive trace or interconnect being printed or deposited (not shown). In this example, one end of each electrically conductive trace or interconnect 74 extends to the respective solder ball, solder paste or other electrically conductive material in through-hole or void 54 and the other end of the electrically conductive trace or interconnect 74 extends to the solder ball, solder paste or other electrically conductive material in through-hole or void 54. The above steps are repeated to connect each of the remaining bond pads 50 on die 18 to a top surface of a corresponding respective lead 12 of lead frame 46. Optionally electrically conductive trace or interconnect 74 can be cured after each layer of conductive material is applied (e.g., at 902 in FIG. 9), or after multiple layers of conductive material are applied.

Each conductive trace or interconnect 74 follows the topology of insulating layer 52 which follows the contours of the topology on lead frame 46 and die 18, while smoothing the turns in the Z axis. As can be seen in FIG. 40A, each of the interconnects 74 couples a bond pad 50 on die 18 to a corresponding lead 12 on pre-molded lead frame 46. In the example of FIG. 40A, an electrically conductive trace or interconnect 74 couples each of the six bond pads 50 on die 18 to a corresponding one of the six leads on pre-molded lead frame 46. Each electrically conductive trace or interconnect 74 can be formed or deposited using one of the previously described printing techniques. Each electrically conductive trace or interconnect 74 can be formed from a conductive ink(s), conductive polymers(s), metal filled epoxy(s), sintering metallic powder, liquid assisted sintering particles, solder paste, etc. It is preferred that the selected conductive material have a modulus less than 3.4 GPa and more preferred less than 2 GPa be used, to avoid undue stress on the assembly. A thickness of the conductive layer 74 can be in the range of about 2 µm to 35 µm. A more preferred range is about 2 µm to not more than 20 µm, and still more preferred in a range from about 2 µm to about 10 µm. When inkjet printing is employed, the inkjet solvent deposition material has a solvent, the initial thickness, after the solvent dissipates, the remaining material forms the electrically conductive trace or interconnect 74 at a reduced thickness. To achieve the desired thickness, multiple inkjet depositions can be performed (e.g., at 1002 in FIG. 10). Inkjet deposition allows precise placement of material by using "drop on demand" (DOD) technology, where a reservoir of the liquid has a nozzle and a small volume of the liquid is forced from the nozzle in response to an electrical signal. The liquid forms a drop as it falls vertically onto a surface.

Figure 40B:
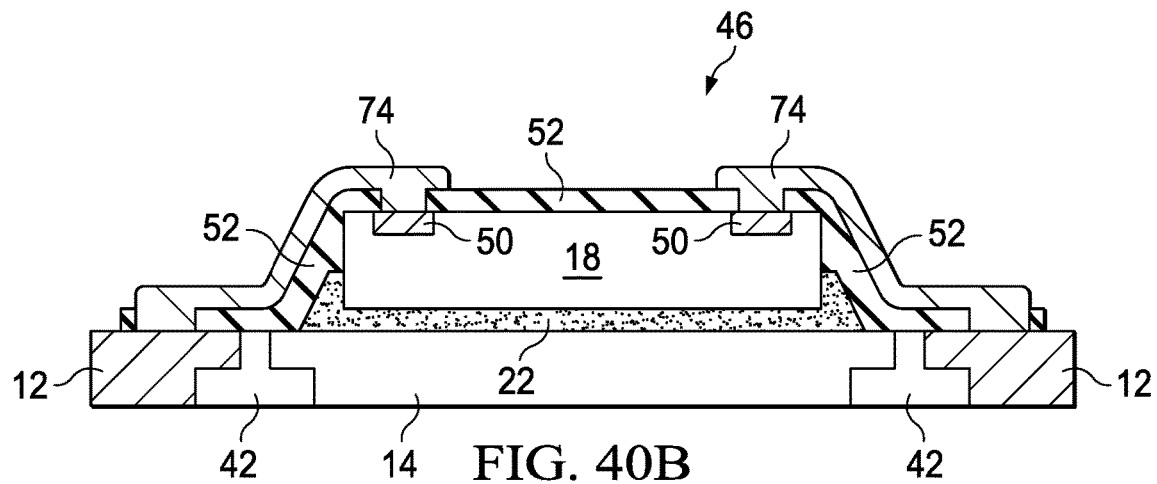
FIGS. 40B-40J are cross-sectional views of the electronic assembly of FIG. 40A along various reference lines.

The precision of the inkjet deposition tool allows deposition of the liquid material in some areas and not in others as the tool traverses across the surface (or if the tool is fixed, as the surface moves beneath the tool). Because the conductive material can be very accurately placed even in small areas, no etch or material removal step is needed to remove material after the inkjet deposition. To achieve the desired thickness of conductive trace or interconnect 74, a single deposition can be performed or multiple inkjet depositions can be performed (e.g., at 1002 in FIG. 10). A single pass deposition is more preferred to increase manufacturing throughput and reduces costs but may not produce as accurate and/or desirable results as produced by multiple pass deposition. As additional inkjet materials are developed, a reduction in the amount of solvent can reduce the initial thickness needed and thereby reduce the need for multiple pass depositions. FIG. 40B is a cross-sectional view of FIG. 40A along reference line K2-K2.

Figure 40C:
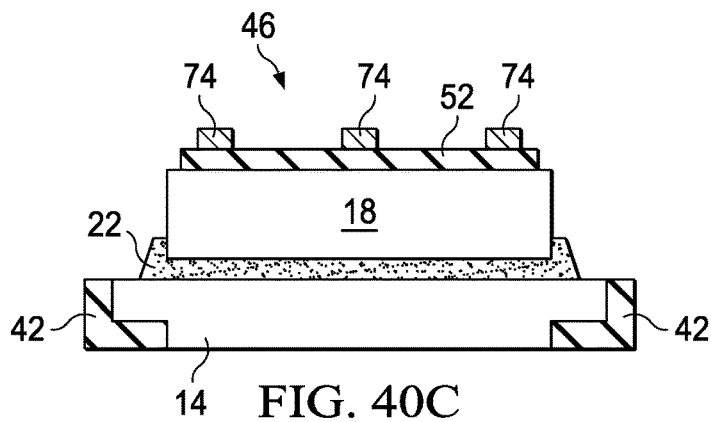
Figure 40D:
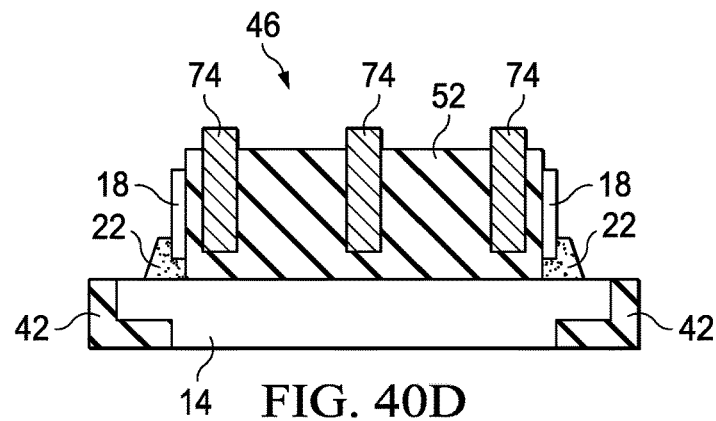

According to one example, multiple conductive traces or interconnects 74 are formed on top of blanket insulating layer 52 which comprises no channel or grooves for conductive traces or interconnects 74 to be deposited from bond pads 50 on die 18 to leads 12. FIG. 40C is a cross-sectional view of integrated circuit (IC) die 18 attached, via die attach material 22, to a top surface of die attach pad 14 of pre-molded lead frame unit 46 along reference line M2-M2 in FIG. 40A. FIG. 40D is a cross-sectional view of integrated circuit (IC) die 18 attached, via die attach material 22, to a top surface of die attach pad 14 of pre-molded lead frame unit 46 along reference line W2-W2 in FIG. 40A, which shows the insulating layer 52 extending down a vertical side of die 18 to die pad 46 with conductive traces or interconnects 74 on top of insulating layer 52. Since there is no channel or groove in insulating layer 52 (e.g., FIGS. 40C & 40D) to contain interconnects 74, the shape of the resulting conductive traces or interconnects 74 could be just about any desired shape including square, rectangular, half-circular depending on the type, amount and viscosity of the conductive material printed or deposited as well as the number of layers and curing applied to the layers.

Figure 40E:
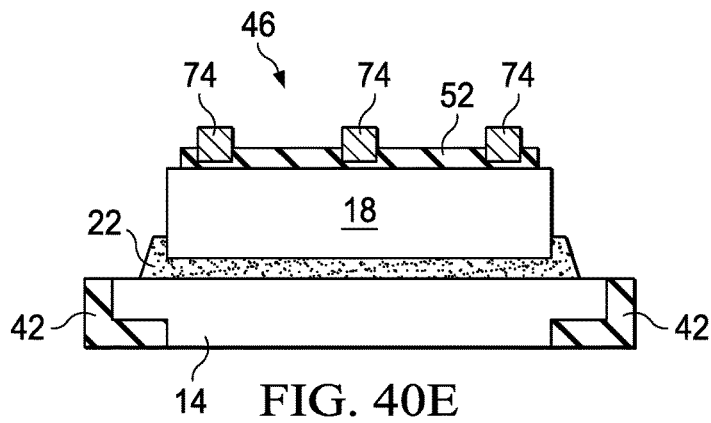
Figure 40F:
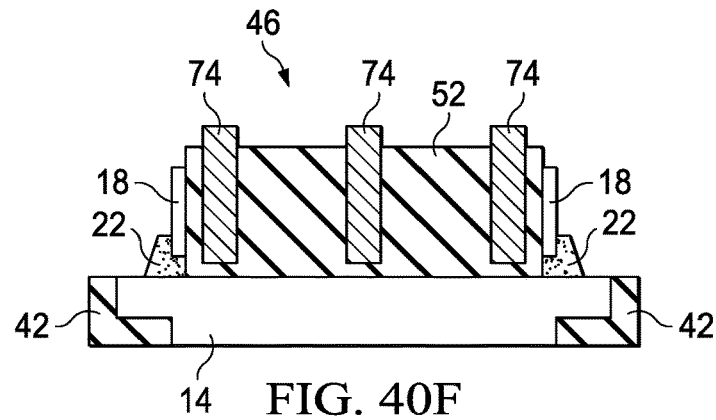

According to another example, insulating layer 52 is a blanket layer with rectangular channel or grooves 58 for subsequent conductive material to be deposited in from bond pads 50 on die 18 to leads 12. FIG. 40E is a cross-sectional view of integrated circuit (IC) die 18 attached, via die attach material 22, to a top surface of die attach pad 14 of pre-molded lead frame unit 46 along reference line M2-M2 in FIG. 40A. Conductive traces or interconnects 74 are formed partially (see FIG. 40E), or fully (not shown), within rectangular channel or grooves 58, giving conductive traces or interconnects a rectangular shape. A portion of conductive traces or interconnects 74 can extend above rectangular channel or grooves 58 if additional conductive material is deposited, and/or has higher viscosity and/or if curing is performed shortly after conductive material is applied. FIG. 40F is a cross-sectional view of integrated circuit (IC) die 18 attached, via die attach material 22, to a top surface of die attach pad 14 of pre-molded lead frame unit 46 along reference line W2-W2 in FIG. 40A, which shows insulating layer 52 extending down a vertical side of die 18 to die pad 46.

Figure 40G:
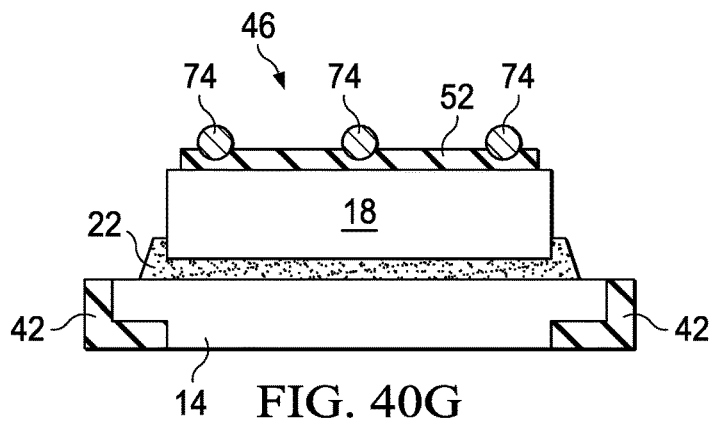
Figure 40H:
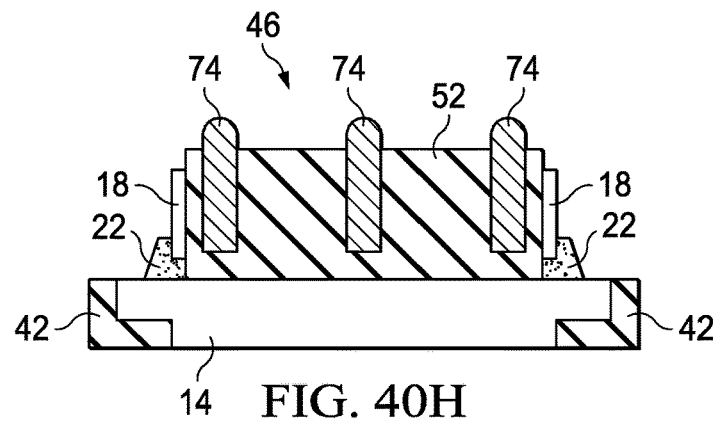

According to yet another example, insulating layer 52 is a blanket layer with semi-circular (i.e., half-circle) channel or grooves 60 for subsequent conductive material to be deposited in from bond pads 50 on die 18 to leads 12. FIG. 40G is a cross-sectional view of integrated circuit (IC) die 18 attached, via die attach material 22, to a top surface of die attach pad 14 of pre-molded lead frame unit 46 along reference line M2-M2 in FIG. 40A. Conductive traces or interconnects 74 are formed partially (see FIG. 40G), or fully (not shown), within semicircular channel or grooves 60, giving conductive traces or interconnects 74 a half-circular shape within insulating layer 52. Conductive traces or interconnects 74 can extend above semi-circular channel or grooves 60, resulting in more of a full circular shape conductive traces or interconnects 74, if additional conductive material is deposited, and/or has higher viscosity and/or if curing is performed shortly after conductive material is applied. FIG. 40H is a cross-sectional view of integrated circuit (IC) die 18 attached, via die attach material 22, to a top surface of die attach pad 14 of pre-molded lead frame unit 46 along reference line W2-W2 in FIG. 40A.

Figure 40I:
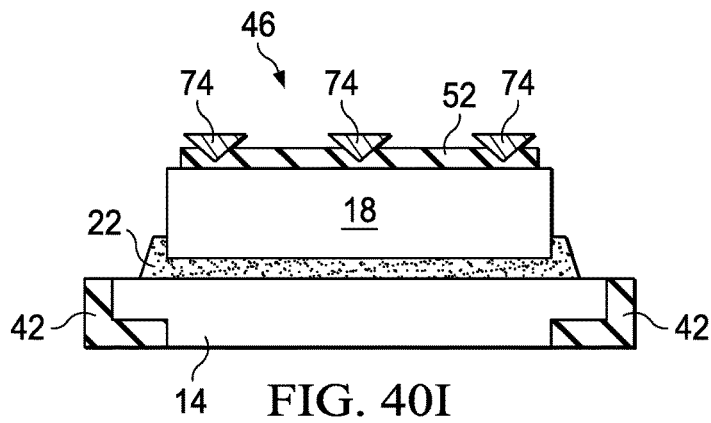
Figure 40J:
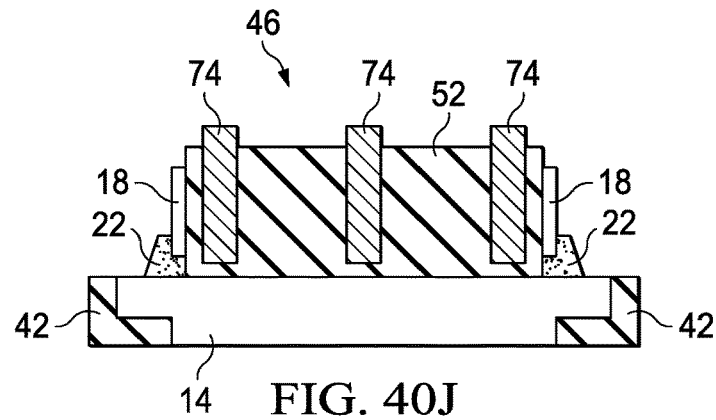

According to still another example, insulating layer 52 is a blanket layer with v-shaped channel or grooves 62 for subsequent conductive material to be deposited in from bond pads 50 on die 18 to leads 12. FIG. 40I is a cross-sectional view of integrated circuit (IC) die 18 attached, via die attach material 22, to a top surface of die attach pad 14 of pre-molded lead frame unit 46 along reference line M2-M2 in FIG. 40A. Conductive traces or interconnects 74 are formed partially (see FIG. 40I), or fully (not shown), within v-shaped channel or grooves 62, giving conductive traces or interconnects 74 a v-shaped appearance within insulating layer 52. Conductive traces or interconnects 74 can extend above v-shaped channel or grooves 62, resulting in taller v-shaped conductive traces or interconnects 74, if additional conductive material is deposited, and/or has higher viscosity and/or if curing is performed shortly after conductive material is applied. FIG. 40J is a cross-sectional view of integrated circuit (IC) die 18 attached, via die attach material 22, to a top surface of die attach pad 14 of pre-molded lead frame unit 46 along reference line W2-W2 in FIG. 40A.

Figure 41A:
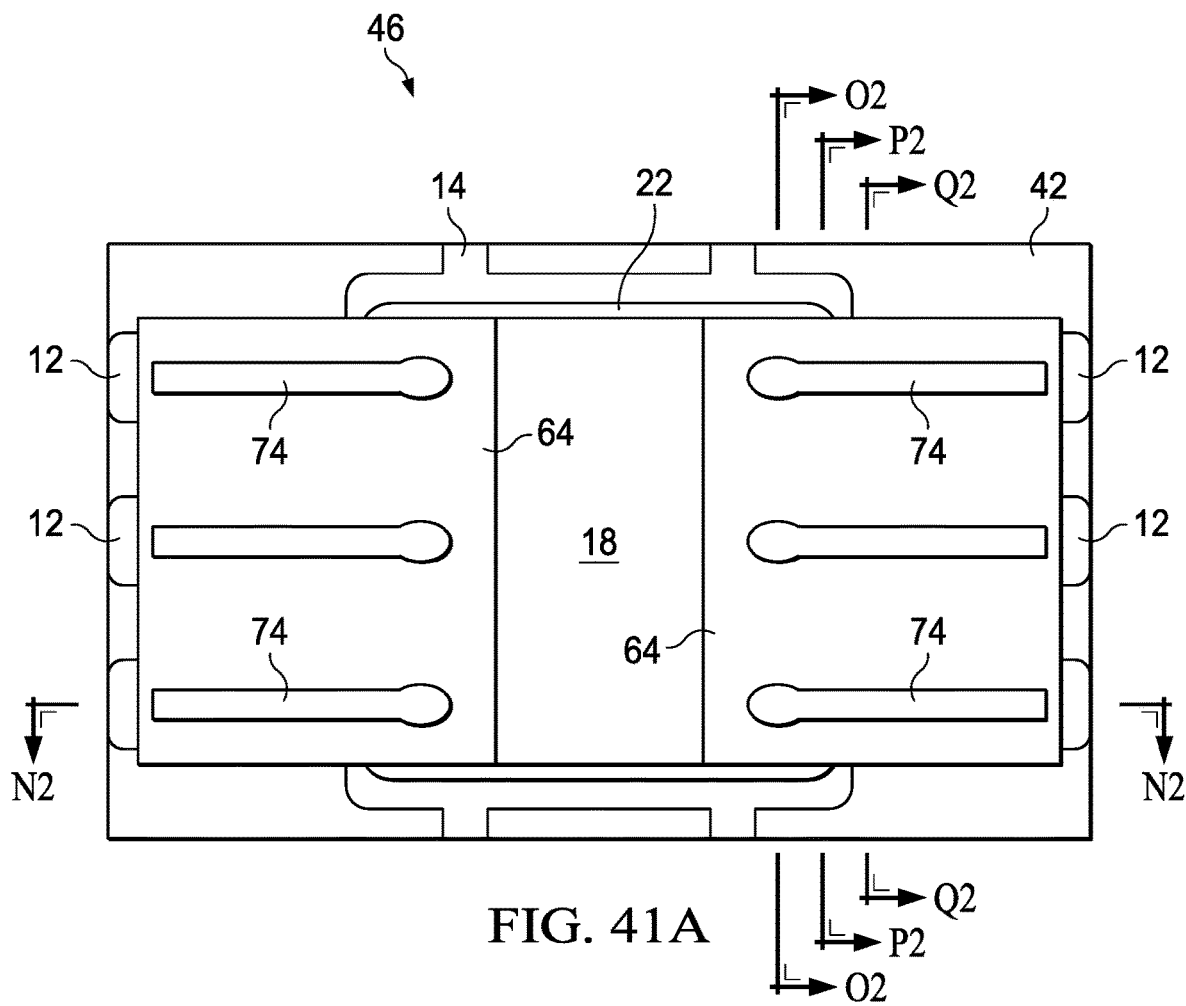
FIG. 41A is a top view of an electronic assembly undergoing fabrication according to the example method 500 of FIG. 5 with the implementation at 512, wherein multiple electrically conductive traces or interconnects 74 are printed or formed on two spaced apart half-blanket insulating layers 64 (e.g., FIGS. 27A-27J) applied as foundation layers, each spanning a top surface of a portion of lead fingers 12 in pre-molded lead frame 46, across pre-mold 42, up one side of die 18, across a portion of the top of die 18 just past bond pads 50 on die 18.

FIG. 41A shows example where multiple electrically conductive traces or interconnects 74 are printed or formed on two spaced apart half-blanket insulating layers 64 (e.g., FIGS. 27A-27J) applied as foundation layers, each spanning a top surface of a portion of lead fingers 12 in pre-molded lead frame 46, across pre-mold 42, up one side of die 18, across a portion of the top of die 18 just past bond pads 50 on die 18 (e.g., at 512 in FIG. 5). In one example one end of each electrically conductive trace or interconnect 74 extends down through a respective through-hole or void 54 in one of the half-blanket insulating layers 64 and to a bond pad 50 on die 18 and another opposite end of the electrically conductive trace or interconnect 74 extends down through a through-hole or void 56 to a top surface of a corresponding lead 12 on lead frame 46. In another example a solder ball, solder paste or other electrically conductive material is printed or deposited in through-hole or voids 54 & 56 prior to conductive trace or interconnect being printed or deposited (not shown). In this example, one end of electrically conductive trace or interconnect 74 extends to the solder ball, solder paste or other electrically conductive material in through-hole or void 54 and the other end of electrically conductive trace or interconnect 74 extends to the solder ball, solder paste or other electrically conductive material in through-hole or void 54. The above steps are repeated to connect each of the remaining bond pads 50 on die 18 to a top surface of a corresponding respective lead 12 of lead frame 46. Optionally electrically conductive trace or interconnect 74 can be cured after each layer of conductive material is applied (e.g., at 902 in FIG. 9), or after multiple layers of conductive material are applied.

Each conductive trace or interconnect 74 follows the topology of one of insulating layers 64 which follows the contours of the topology on lead frame 46 and die 18, while smoothing the turns in the Z axis. As can be seen in FIG. 41A, each of the interconnects 74 couples a bond pad 50 on die 18 to a corresponding lead 12 on pre-molded lead frame 46. In the example of FIG. 41A, an electrically conductive trace or interconnect 74 couples each of the six bond pads 50 on die 18 to a corresponding one of the six leads on pre-molded lead frame 46. Each electrically conductive trace or interconnect 74 can be formed or deposited using one of the previously discussed printing techniques. Each electrically conductive trace or interconnect 74 can be formed from a conductive ink(s), conductive polymers(s), metal filled epoxy(s), sintering metallic powder, liquid assisted sintering particles, solder paste, etc. It is preferred that the selected conductive material have a modulus less than 3.4 GPa and more preferred less than 2 GPa be used, to avoid undue stress on the assembly. A thickness of the conductive layer 74 can be in the range of about 2 µm to 35 µm. A more preferred range is about 2 µm to not more than 20 µm, and still more preferred in a range from about 2 µm to about 10 µm. When inkjet printing is employed, the inkjet solvent deposition material has a solvent, the initial thickness, after the solvent dissipates, the remaining material forms the electrically conductive trace or interconnect 74 at a reduced thickness. To achieve the desired thickness, multiple inkjet depositions can be performed (e.g., at 1002 in FIG. 10). Inkjet deposition allows precise placement of material by using "drop on demand" (DOD) technology, where a reservoir of the liquid has a nozzle and a small volume of the liquid is forced from the nozzle in response to an electrical signal. The liquid forms a drop as it falls vertically onto a surface.

Figure 41B:
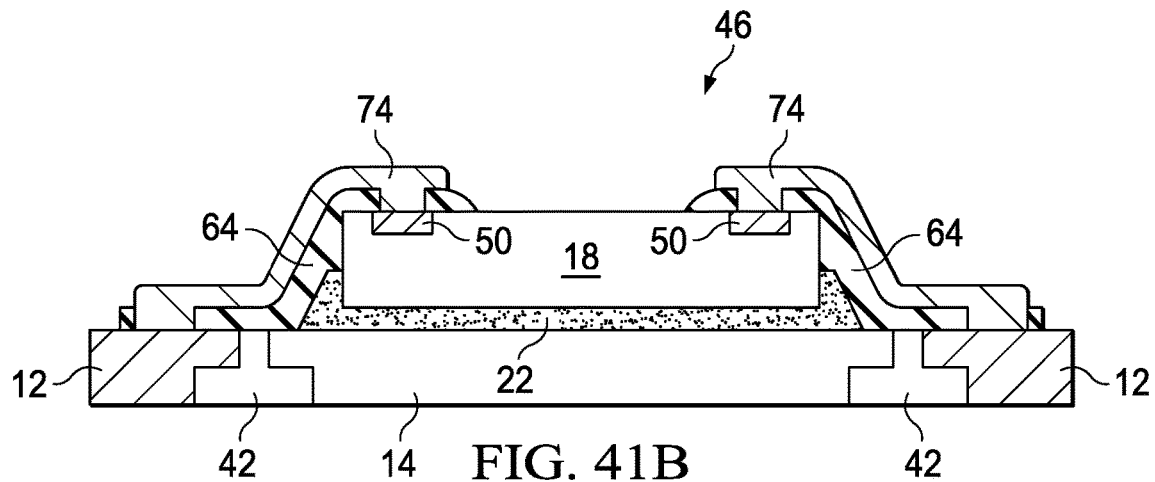
FIGS. 41B-41J are cross-sectional views of the electronic assembly of FIG. 41A along various reference lines.

The precision of the inkjet deposition tool allows deposition of the liquid material in some areas and not in others as the tool traverses across the surface (or if the tool is fixed, as the surface moves beneath the tool). Because the conductive material can be very accurately placed even in small areas, no etch or material removal step is needed to remove material after the inkjet deposition. To achieve the desired thickness of conductive trace or interconnect 74, a single deposition can be performed or multiple inkjet depositions can be performed (e.g., at 1002 in FIG. 10). A single pass deposition is more preferred to increase manufacturing throughput and reduces costs but may not produce as accurate and/or desirable results as multiple pass deposition. As additional inkjet materials are developed, a reduction in the amount of solvent can reduce the initial thickness needed and thereby reduce the need for multiple pass depositions. FIG. 41B is a cross-sectional view of FIG. 41A along reference line N2-N2.

Figure 41C:
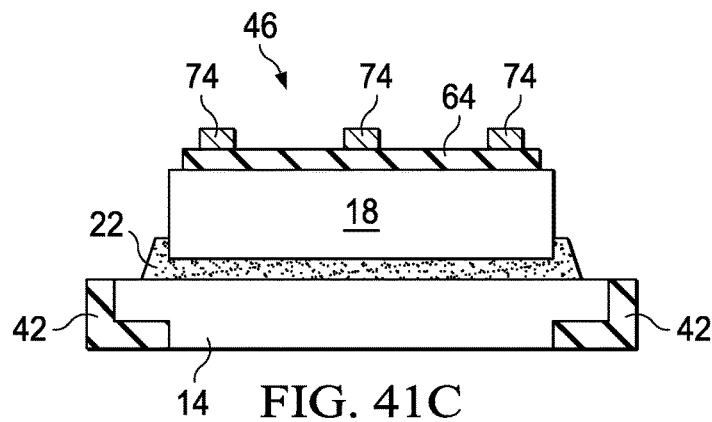
Figure 41D:
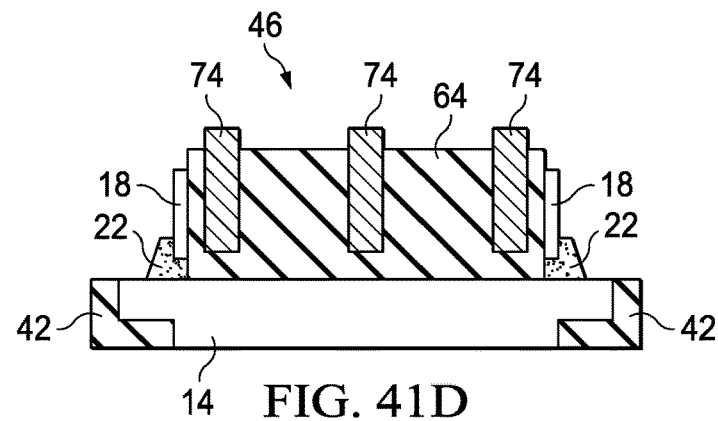
Figure 41E:
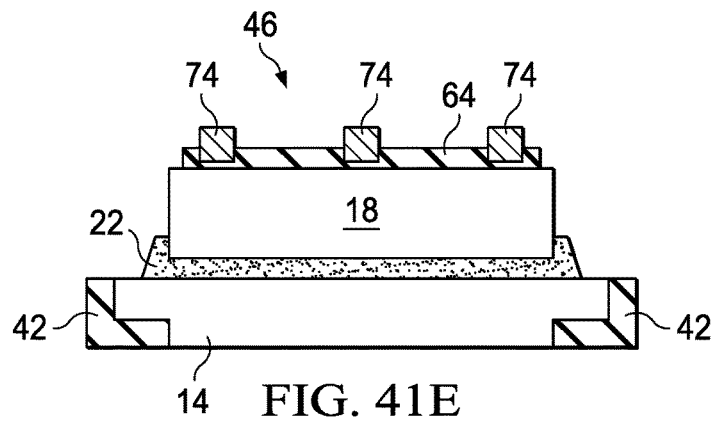
Figure 41F:
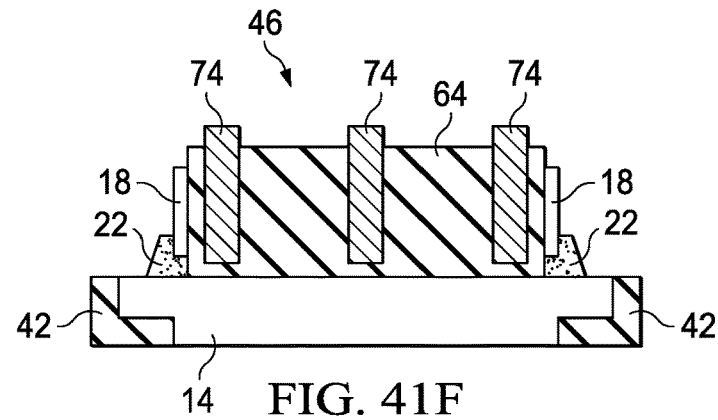

According to one example, multiple conductive traces or interconnects 74 are formed on top of each half-blanket blanket insulating layer 64 which comprises no channel or grooves for conductive traces or interconnects 74 to be deposited in from bond pads 50 on die 18 to leads 12. FIG. 41C is a cross-sectional view of integrated circuit (IC) die 18 attached, via die attach material 22, to a top surface of die attach pad 14 of pre-molded lead frame unit 46 along reference line P2-P2 in FIG. 41A. FIG. 41D is a cross-sectional view of integrated circuit (IC) die 18 attached, via die attach material 22, to a top surface of die attach pad 14 of pre-molded lead frame unit 46 along reference line Q2-Q2 in FIG. 41A, which shows each insulating layer 64 extending down a vertical side of die 18 to die pad 46 with conductive traces or interconnects 74 on top of an insulating layer 64. Since there is no channel or groove in insulating layers 64 (e.g., FIGS. 41C & 41D) to contain interconnects 74, the shape of the resulting conductive traces or interconnects 74 could be just about any shape including square, rectangular, half-circular or v-shaped depending on the type, amount and viscosity of the conductive material printed or deposited as well as the number of layers and curing applied to the layers According to another example, half blanket insulating layers 64 include rectangular channel or grooves 58 for subsequent conductive material to be deposited in from bond pads 50 on die 18 to leads 12. FIG. 41E is a cross-sectional view of integrated circuit (IC) die 18 attached, via die attach material 22, to a top surface of die attach pad 14 of pre-molded lead frame unit 46 along reference line P2-P2 in FIG. 41A. Conductive traces or interconnects 74 are formed partially (see FIG. 41E), or fully (not shown), within rectangular channel or grooves 58, giving conductive traces or interconnects 74 a rectangular shape. A portion of conductive traces or interconnects 74 can extend above rectangular channel or grooves 58 if additional conductive material is deposited, and/or has higher viscosity and/or if curing is performed shortly after conductive material is applied. FIG. 41F is a cross-sectional view of integrated circuit (IC) die 18 attached, via die attach material 22, to a top surface of die attach pad 14 of pre-molded lead frame unit 46 along reference line Q2-Q2 in FIG. 41A, which shows insulating layer 64 extending down a vertical side of die 18 to die pad 46.

Figure 41G:
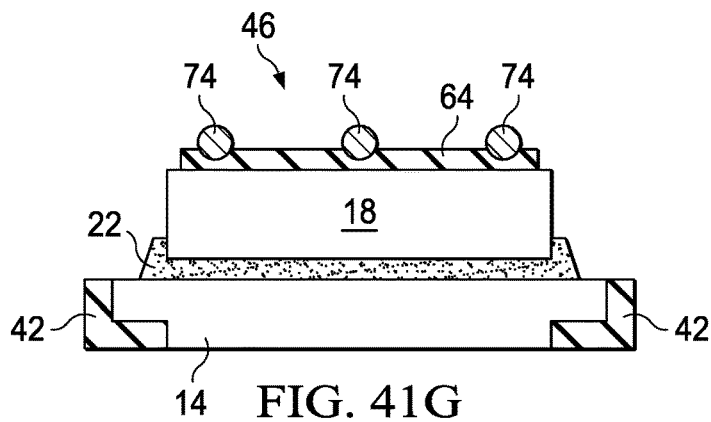
Figure 41H:
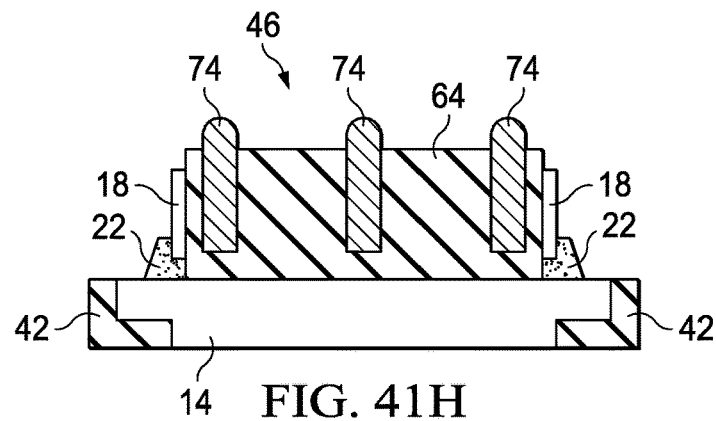

According to yet another example, insulating layers 64 include semi-circular (i.e., half-circle) channel or grooves 60 for subsequent conductive material to be deposited from bond pads 50 on die 18 to leads 12. FIG. 41G is a cross-sectional view of integrated circuit (IC) die 18 attached, via die attach material 22, to a top surface of die attach pad 14 of pre-molded lead frame unit 46 along reference line P2-P2 in FIG. 41A. Conductive traces or interconnects 74 are formed partially (see FIG. 41G), or fully (not shown), within semicircular channel or grooves 60, giving conductive traces or interconnects 74 a half-circular shape. Conductive traces or interconnects 74 can extend above semi-circular channel or grooves 60, resulting in more of a full circular shape conductive traces or interconnects 74, if additional conductive material is deposited, and/or has higher viscosity and/or if curing is performed shortly after conductive material is applied. FIG. 41H is a cross-sectional view of integrated circuit (IC) die 18 attached, via die attach material 22, to a top surface of die attach pad 14 of pre-molded lead frame unit 46 along reference line Q2-Q2 in FIG. 41A.

Figure 41I:
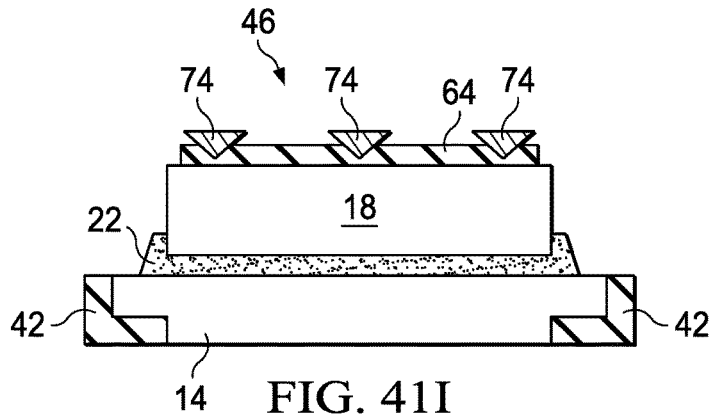
Figure 41J:
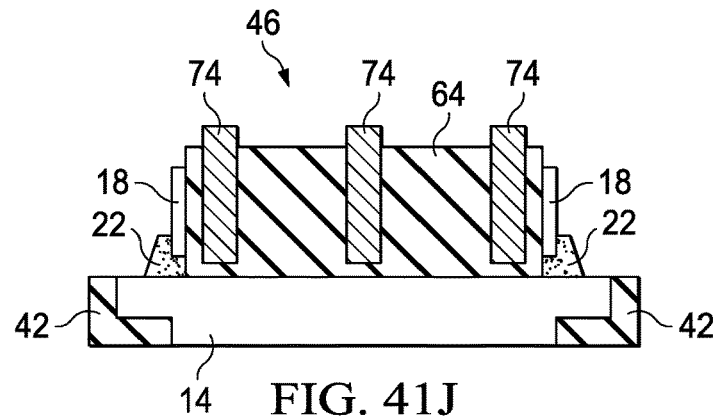

According to still another example, insulating layers 64 include v-shaped channel or grooves 62 for subsequent conductive material to be deposited in from bond pads 50 on die 18 to leads 12. FIG. 41I is a cross-sectional view of integrated circuit (IC) die 18 attached, via die attach material 22, to a top surface of die attach pad 14 of pre-molded lead frame unit 46 along reference line P2-P2 in FIG. 41A. Conductive traces or interconnects 74 are formed partially (see FIG. 41I), or fully (not shown), within v-shaped channel or grooves 62, giving conductive traces or interconnects 74 a v-shaped appearance. Conductive traces or interconnects 74 can extend above v-shaped channel or grooves 62, resulting in taller v-shaped conductive traces or interconnects 74, if additional conductive material is deposited, and/or has higher viscosity and/or if curing is performed shortly after conductive material is applied. FIG. 41J is a cross-sectional view of integrated circuit (IC) die 18 attached, via die attach material 22, to a top surface of die attach pad 14 of pre-molded lead frame unit 46 along reference line Q2-Q2 in FIG. 41A.

Figure 42A:
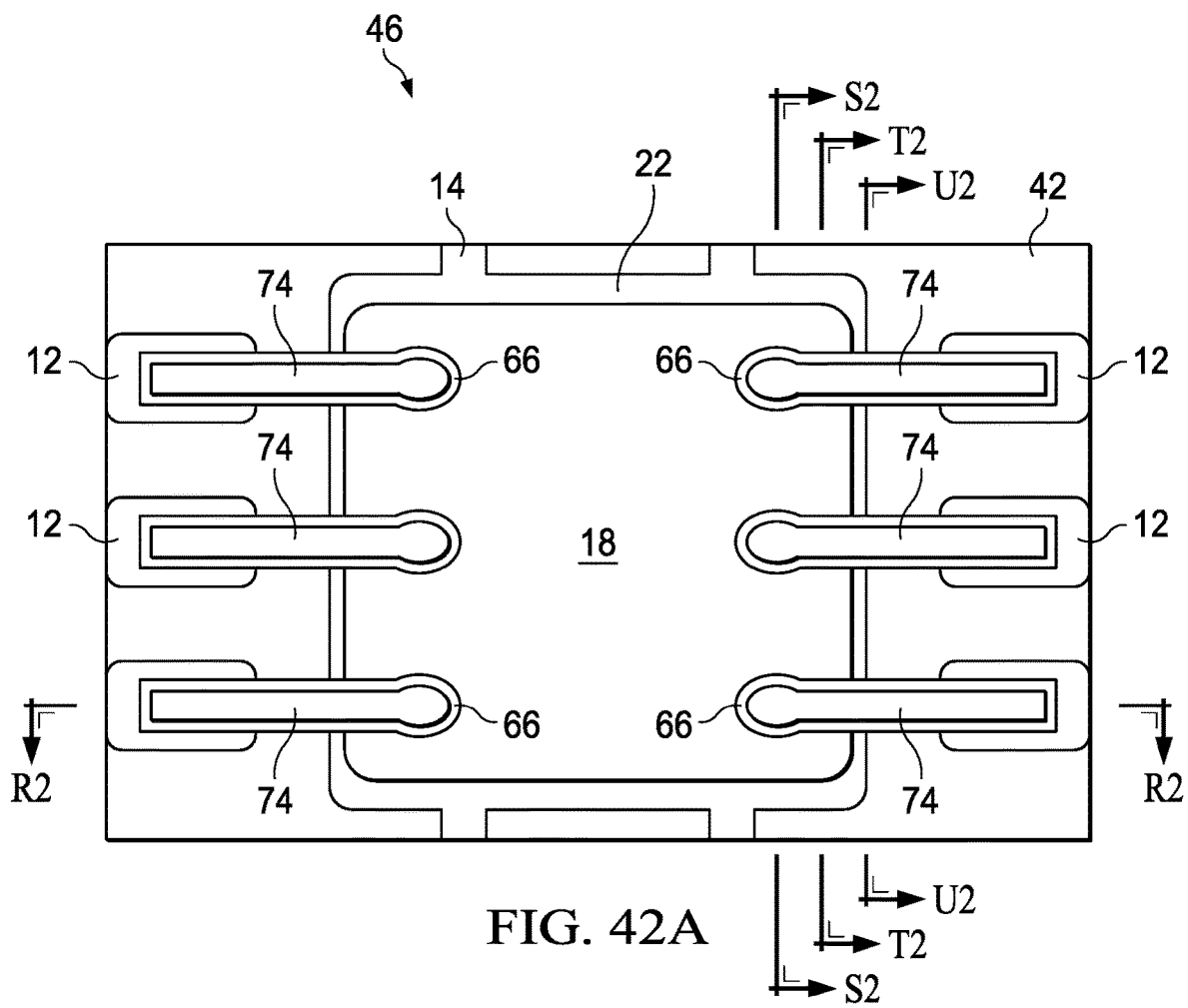
FIG. 42A is a top view of an electronic assembly undergoing fabrication according to the example method 500 of FIG. 5 with the implementation at 512, wherein an electrically conductive layer 74 is printed or formed on individual insulating layers 66 (e.g., FIGS. 28A-28J) applied as foundation layers, each spanning a top surface of a portion of lead fingers 12 in pre-molded lead frame 46, across pre-mold 42, up one side of die 18, across a portion of the top of die 18 just past bond pads 50 on die 18.

FIG. 42A shows an example where an electrically conductive layer 74 is printed or formed on individual insulating layers 66 (e.g., FIGS. 28A-28J) applied as foundation layers, each spanning a top surface of a portion of lead fingers 12 in pre-molded lead frame 46, across pre-mold 42, up one side of die 18, across a portion of the top of die 18 just past bond pads 50 on die 18 (e.g., at 512 in FIG. 5). In one example one end of each electrically conductive trace or interconnect 74 extends down through a respective through-hole or void 54 in individual insulating layer 66 and to a bond pad 50 on die 18 and another opposite end of each electrically conductive trace or interconnect 74 extends down through a respective through-hole or void 56 to a top surface of a corresponding lead 12 on lead frame 46. In another example a solder ball, solder paste or other electrically conductive material is printed or deposited in through-hole or voids 54 & 56 prior to conductive trace or interconnect being printed or deposited (not shown). In this example, one end of electrically conductive trace or interconnect 74 extends to the solder ball, solder paste or other electrically conductive material in through-hole or void 54 and the other end of electrically conductive trace or interconnect 74 extends to the solder ball, solder paste or other electrically conductive material in through-hole or void 54. The above steps are repeated to connect each of the remaining bond pads 50 on die 18 to a top surface of a corresponding respective lead 12 of lead frame 46. Optionally electrically conductive trace or interconnect 74 can be cured after each layer of conductive material is applied (e.g., at 902 in FIG. 9), or after multiple layers of conductive material are applied.

Each conductive trace or interconnect 74 follows the topology of an individual insulating layer 66 which follows the contours of the topology on lead frame 46 and die 18, while smoothing the turns in the Z axis. As can be seen in FIG. 42A, each of the interconnects 74 couples a bond pad 50 on die 18 to a corresponding lead 12 on pre-molded lead frame 46. In the example of FIG. 42A, an electrically conductive trace or interconnect 74 couples each of the six bond pads 50 on die 18 to a corresponding one of the six leads on pre-molded lead frame 46. Each electrically conductive trace or interconnect 74 can be formed or deposited using one of multiple printing techniques previously identified. Each electrically conductive trace or interconnect 74 can be formed from a conductive ink(s), conductive polymers(s), metal filled epoxy(s), sintering metallic powder, liquid assisted sintering particles, solder paste, etc. It is preferred that the selected conductive material have a modulus less than 3.4 GPa and more preferred less than 2 GPa be used, to avoid undue stress on the assembly. A thickness of the conductive layer 74 can be in the range of about 2 μm to 35 μm. A more preferred range is about 2 μm to not more than 20 μm, and still more preferred in a range from about 2 μm to about 10 μm. When inkjet printing is employed the inkjet solvent deposition material has a solvent, the initial thickness, after the solvent dissipates, the remaining material forms the electrically conductive trace or interconnect 74 at a reduced thickness. To achieve the desired thickness, multiple inkjet depositions can be performed (e.g., at 1002 in FIG. 10). Inkjet deposition allows precise placement of material by using "drop on demand" (DOD) technology, where a reservoir of the liquid has a nozzle and a small volume of the liquid is forced from the nozzle in response to an electrical signal. The liquid forms a drop as it falls vertically onto a surface.

Figure 42B:
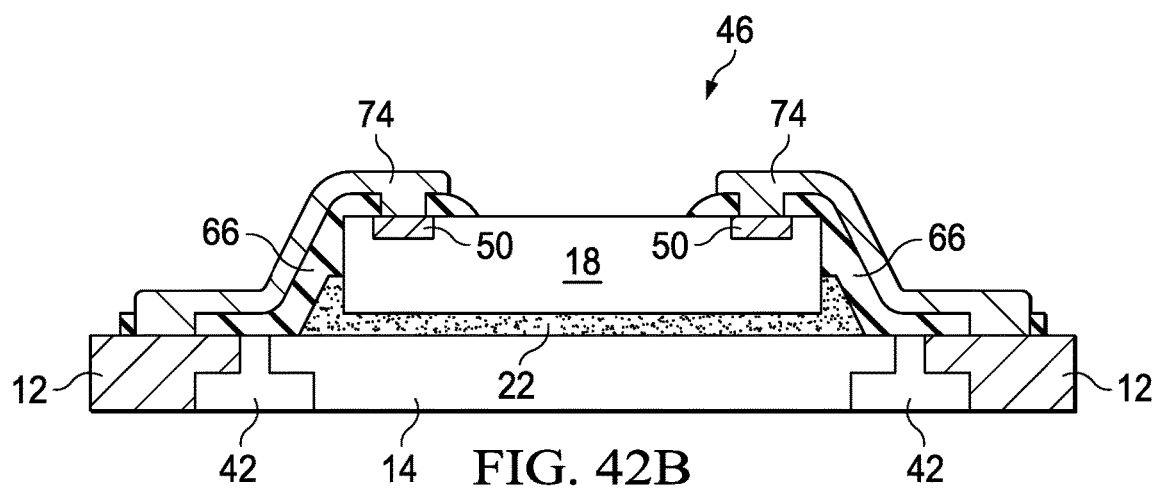
FIGS. 42B-42J are cross-sectional views of the electronic assembly of FIG. 42A along various reference lines.

The precision of the inkjet deposition tool allows deposition of the liquid material in some areas and not in others as the tool traverses across the surface (or if the tool is fixed, as the surface moves beneath the tool). Because the conductive material can be very accurately placed even in small areas, no etch or material removal step is needed to remove material after the inkjet deposition. To achieve the desired thickness of conductive trace or interconnect 74, a single deposition can be performed or multiple inkjet depositions can be performed (e.g., at 1002 in FIG. 10). A single pass deposition is more preferred to increase manufacturing throughput and reduces costs but may not produce as accurate and/or desirable result as multiple pass deposition. As additional inkjet materials are developed, a reduction in the amount of solvent can reduce the initial thickness needed and thereby reduce the need for multiple pass depositions. FIG. 42B is a cross-sectional view of FIG. 42A along reference line R2-R2.

Figure 42C:
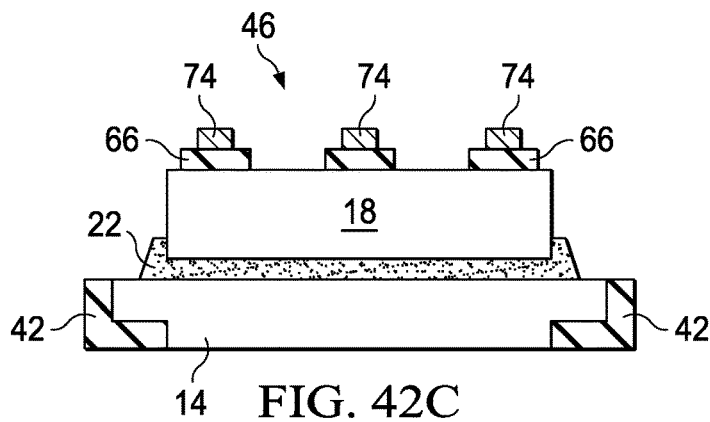
Figure 42D:
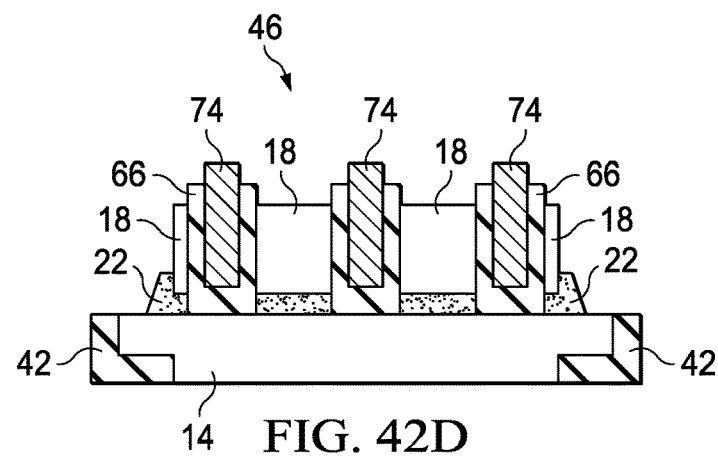
Figure 42E:
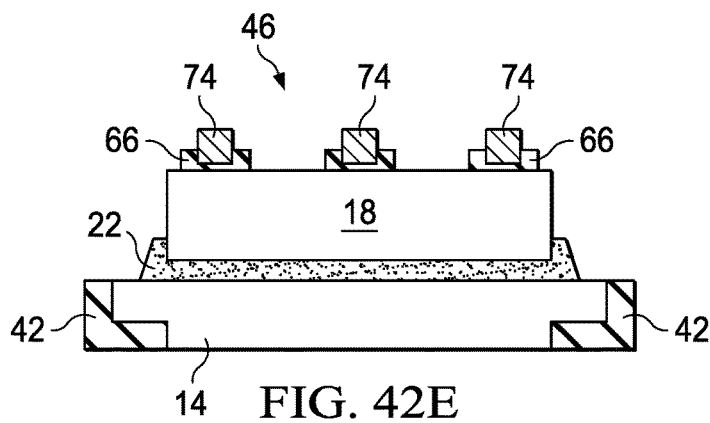
Figure 42F:
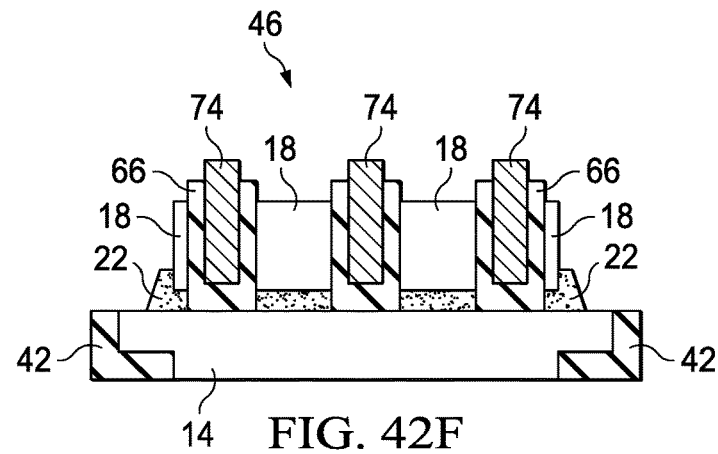

According to one example, each of multiple conductive traces or interconnects 74 are formed on top of a respective insulating layer 66 which comprises no channel or grooves for conductive traces or interconnects 74 to be deposited from bond pads 50 on die 18 to leads 12. FIG. 42C is a cross-sectional view of integrated circuit (IC) die 18 attached, via die attach material 22, to a top surface of die attach pad 14 of pre-molded lead frame unit 46 along reference line T2-T2 in FIG. 42A. FIG. 42D is a cross-sectional view of integrated circuit (IC) die 18 attached, via die attach material 22, to a top surface of die attach pad 14 of pre-molded lead frame unit 46 along reference line U2-U2 in FIG. 42A, which shows each insulating layer 66 extending down a vertical side of die 18 to die pad 46 with a conductive trace or interconnect 74 on top of each insulating layer 66. Since there is no channel or groove in insulating layers 66 (e.g., FIGS. 42C & 42D) to contain interconnects 74, the shape of the resulting conductive traces or interconnects 74 could be just about any shape including square, rectangular, half-circular, or v-shaped, depending on the type, amount and viscosity of the conductive material printed or deposited as well as the number of layers and curing applied to the layers According to another example, individual insulating layers 66 each include a rectangular channel or groove 58 for subsequent conductive material to be deposited in from bond pads 50 on die 18 to leads 12. FIG. 42E is a cross-sectional view of integrated circuit (IC) die 18 attached, via die attach material 22, to a top surface of die attach pad 14 of pre-molded lead frame unit 46 along reference line T2-T2 in FIG. 42A. Conductive traces or interconnects 74 are formed partially (see FIG. 50E), or fully (not shown), within rectangular channel or grooves 58, giving conductive traces or interconnects 74 a rectangular shape. A portion of conductive traces or interconnects 74 can extend above rectangular channel or grooves 58 if additional conductive material is deposited, and/or has higher viscosity and/or if curing is performed shortly after conductive material is applied. FIG. 42F is a cross-sectional view of integrated circuit (IC) die 18 attached, via die attach material 22, to a top surface of die attach pad 14 of pre-molded lead frame unit 46 along reference line U2-U2 in FIG. 42A, which shows individual insulating layers 66 extending down a vertical side of die 18 to die pad 46.

Figure 42G:
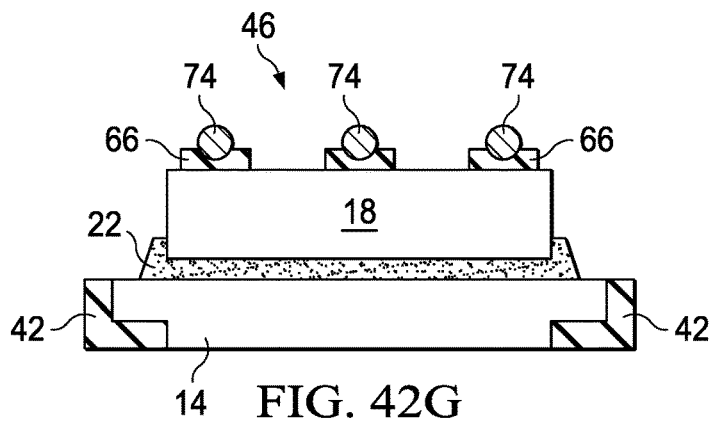
Figure 42H:
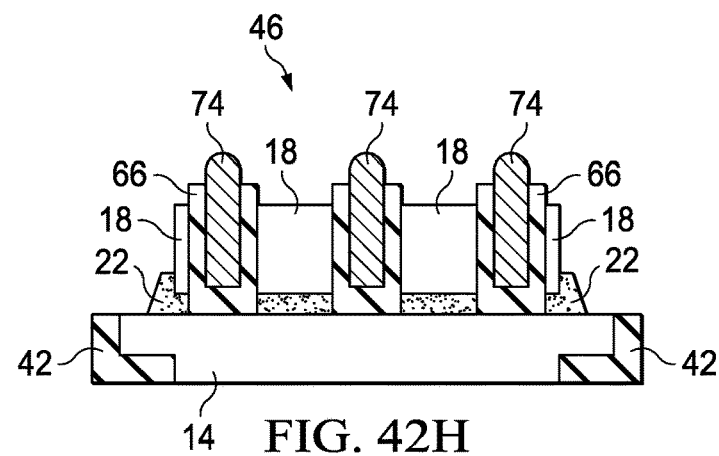

According to yet another example, insulating layers 66 include semi-circular (i.e., half-circle) channel or grooves 60 for subsequent conductive material to be deposited in from bond pads 50 on die 18 to leads 12. FIG. 42G is a cross-sectional view of integrated circuit (IC) die 18 attached, via die attach material 22, to a top surface of die attach pad 14 of pre-molded lead frame unit 46 along reference line T2-T2 in FIG. 42A. Conductive traces or interconnects 74 are formed partially (see FIG. 42G), or fully (not shown), within semicircular channel or grooves 60, giving conductive traces or interconnects 74 a half-circular shape. Conductive traces or interconnects 74 can extend above semi-circular channel or grooves 60, resulting in more of a full circular shape conductive traces or interconnects 74, if additional conductive material is deposited, and/or has higher viscosity and/or if curing is performed shortly after conductive material is applied. FIG. 42H is a cross-sectional view of integrated circuit (IC) die 18 attached, via die attach material 22, to a top surface of die attach pad 14 of pre-molded lead frame unit 46 along reference line U2-U2 in FIG. 42A.

Figure 42I:
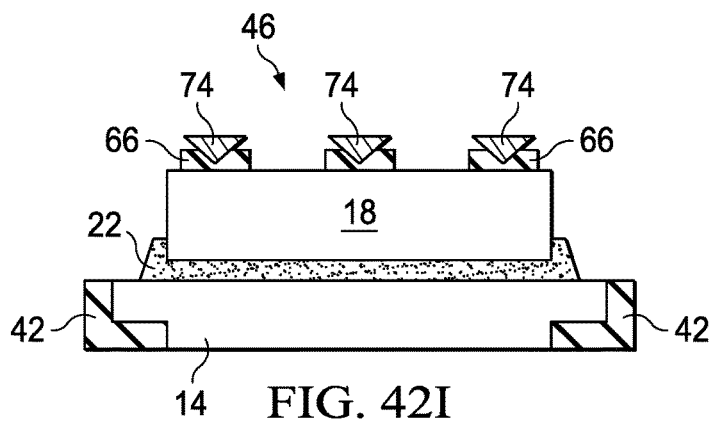
Figure 42J:
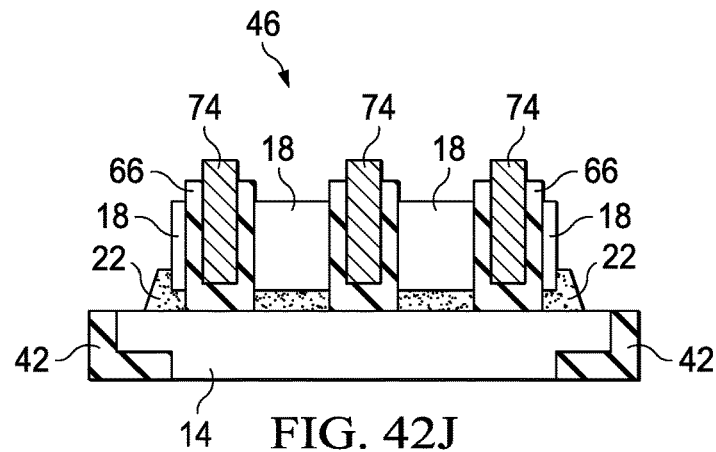

According to still another example, individual insulating layers 66 include v-shaped channel or grooves 62 for subsequent conductive material to be deposited from bond pads 50 on die 18 to leads 12. FIG. 42I is a cross-sectional view of integrated circuit (IC) die 18 attached, via die attach material 22, to a top surface of die attach pad 14 of pre-molded lead frame unit 46 along reference line T2-T2 in FIG. 42A. Conductive traces or interconnects 74 are formed partially (see FIG. 50I), or fully (not shown), within v-shaped channel or grooves 62, giving conductive traces or interconnects 74 a v-shaped appearance. Conductive traces or interconnects 74 can extend above v-shaped channel or grooves 62, resulting in taller v-shaped conductive traces or interconnects 74, if additional conductive material is deposited, and/or has higher viscosity and/or if curing is performed shortly after conductive material is applied. FIG. 42J is a cross-sectional view of integrated circuit (IC) die 18 attached, via die attach material 22, to a top surface of die attach pad 14 of pre-molded lead frame unit 46 along reference line U2-U2 in FIG. 42A.

FIGS. 43A-43L show another example, in which a non-screen printing process 1000 is performed using a print head 68 that is controlled to translate along a controlled lateral direction or path 71 while directing electrically conductive material along a vertical direction 73 to get a desired contour of conductive trace or interconnect 74 (e.g., in FIGS. 40A-40J) on blanket insulating layer 52, on half-blanket insulating layers 64 (e.g., in FIGS. 41A-41J), or on individual insulating layers 66 (e.g., in FIGS. 42A-42J). In one example, the process is performed with an inkjet print head 68 having position control apparatus such as servo controls configured to translate, and control the position of, the print head 68 in three dimensions (e.g., the X and Y directions shown in the figures and an orthogonal Z direction out of the page in FIGS. 43A-43L). In one implementation, the printing system translates the print head 68 in an X-Z plane while controlling the Y direction spacing between the top side of lead frame 46, die 18 and the print head 68. The printing system in one example also controls the delivery of electrically conductive material from a nozzle of the print head to turn the printing on and off, for example, to facilitate precise, high resolution control over locations where the electrically conductive material is printed and where it is not printed. In addition, the non-screen printing process 1000 provides control over the deposited electrically conductive material thickness (e.g., in the Y direction) through one or more of deposition rate and controlling the time the print head 68 is positioned over a particular area of lead frame 46 and/or die 18. This facilitates printing electrically conductive material to different thicknesses at different locations in certain implementations.

Figure 43A:
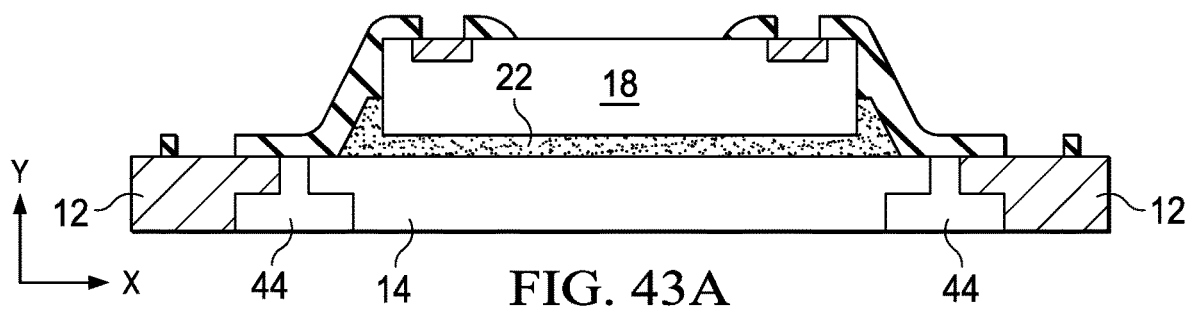
FIG. 43A shows a die 18 attached to a pre-molded lead frame 46 prior to applying insulating material for a second insulating layer.
Figure 43B:
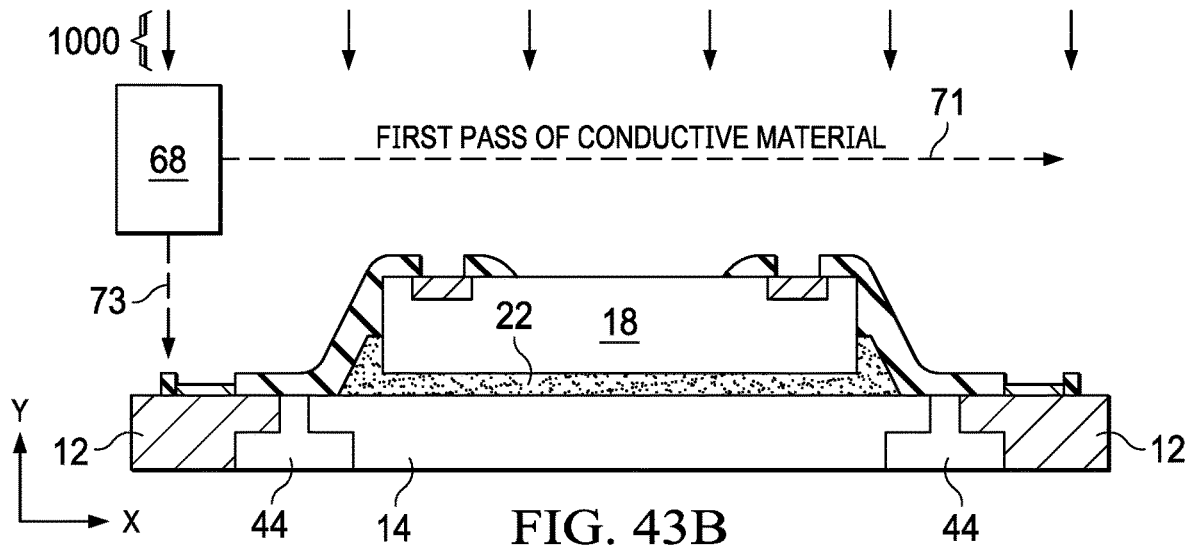
FIGS. 43B-43L show the results of multiple sequential passes of printing electrically conductive material by print head 68 onto foundation insulating layers.
Figure 43C:
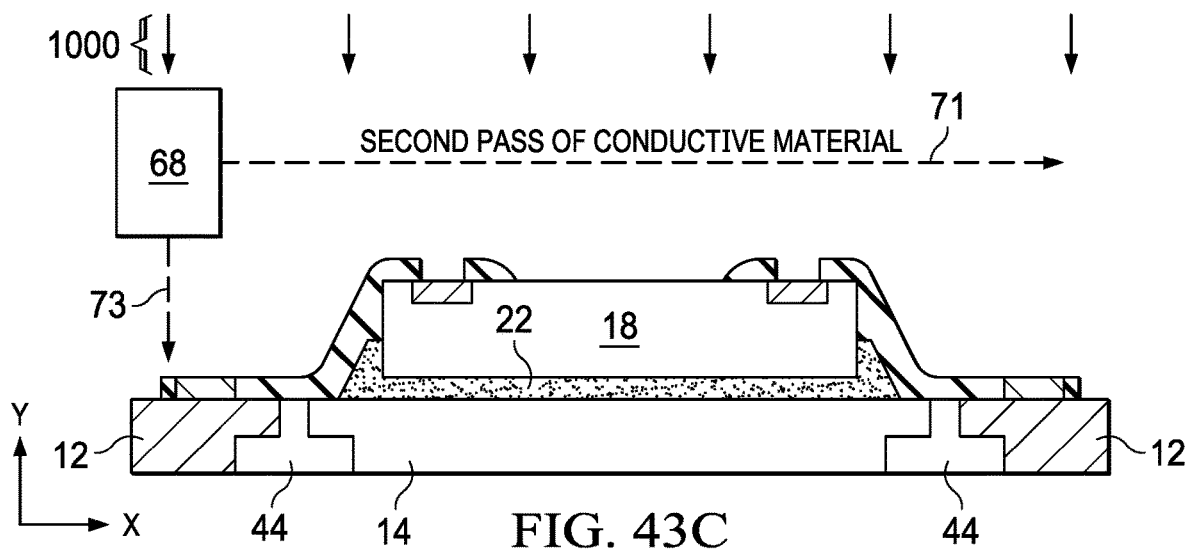
Figure 43D:
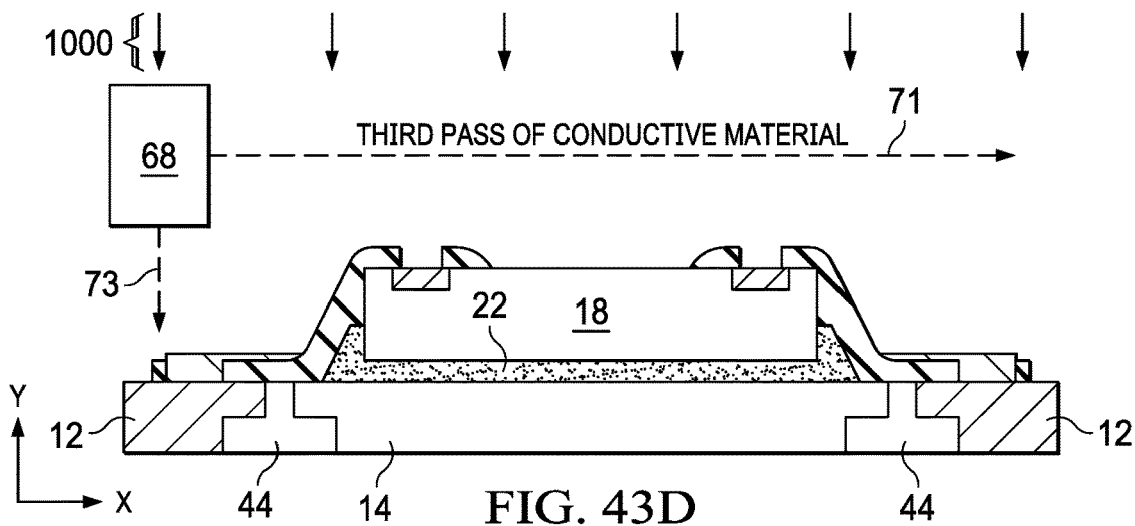
Figure 43E:
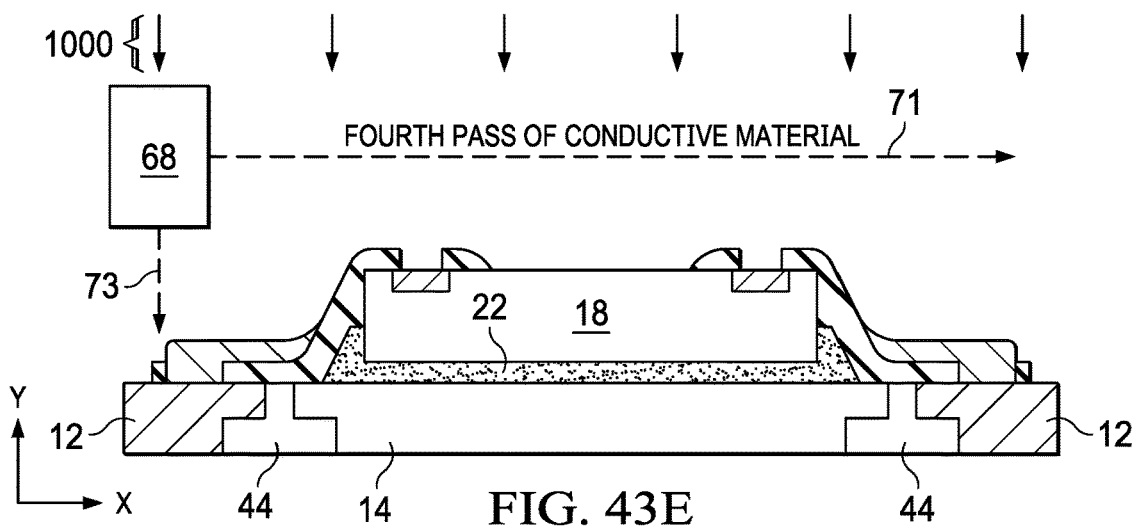
Figure 43F:
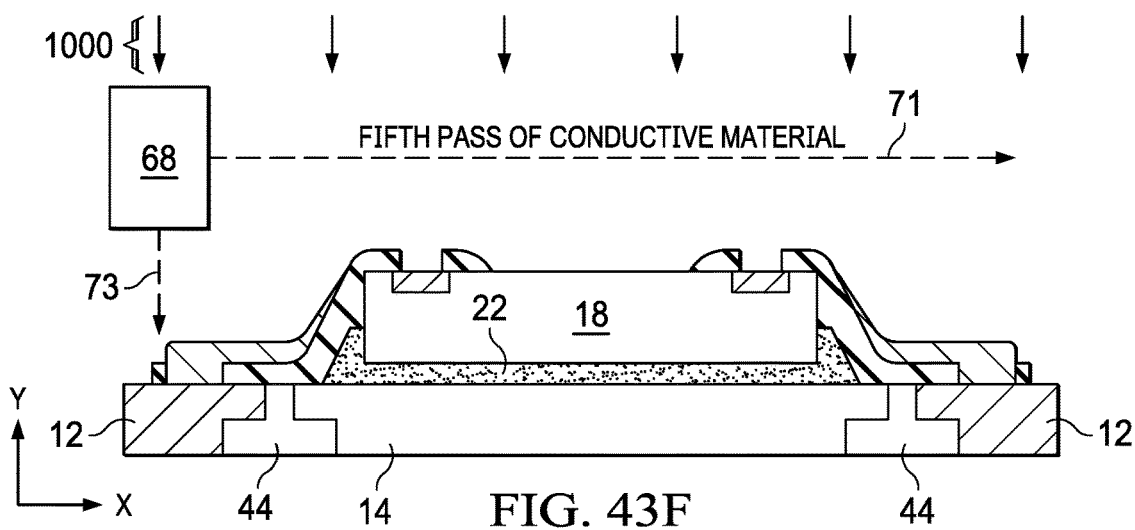
Figure 43G:
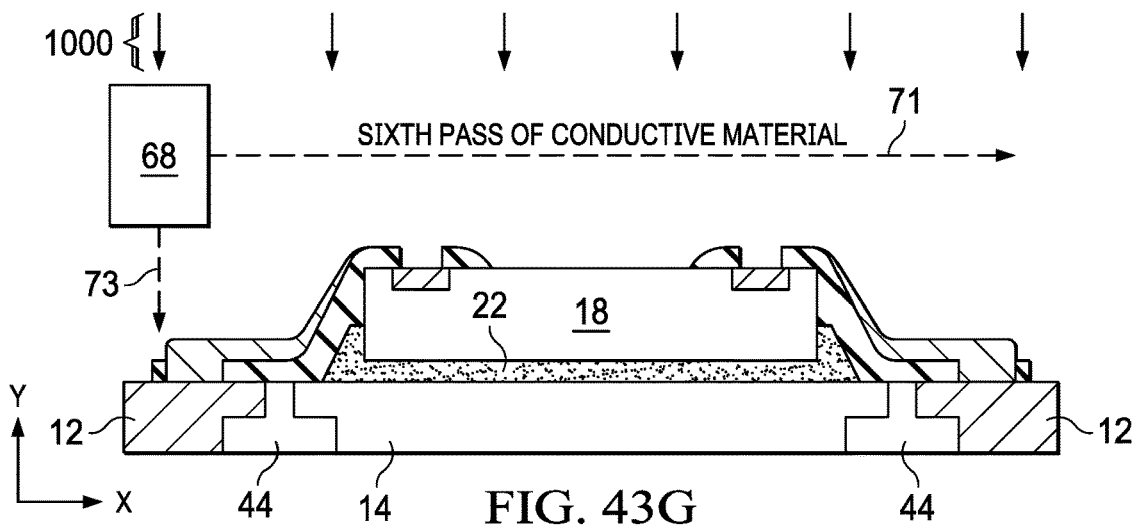
Figure 43H:
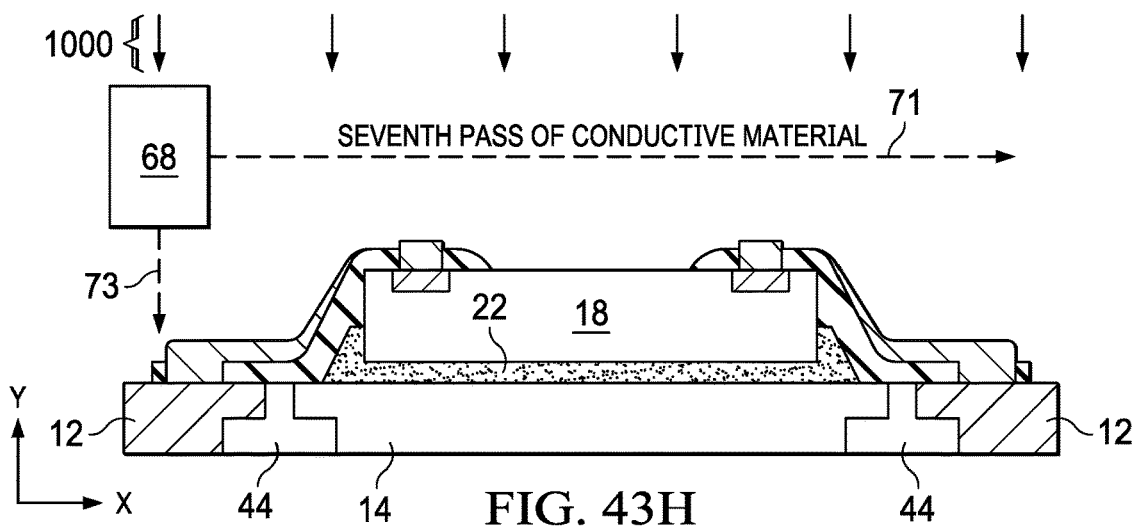
Figure 43I:
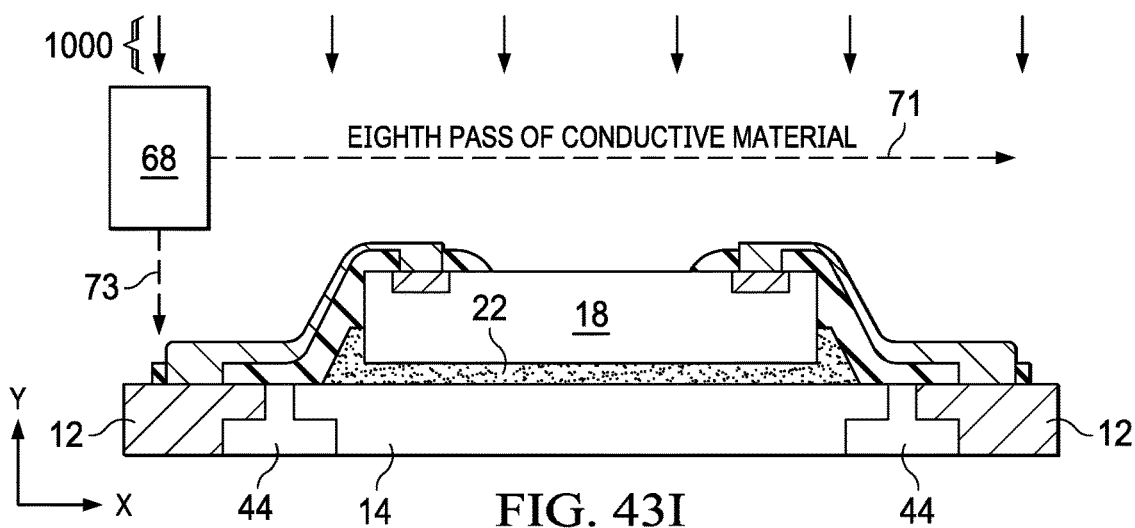
Figure 43J:
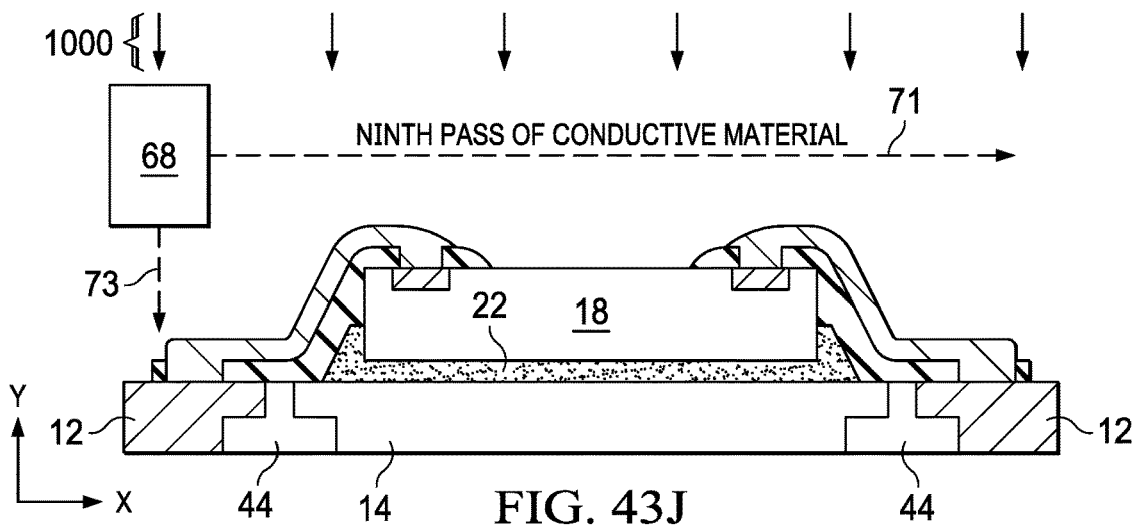
Figure 43K:
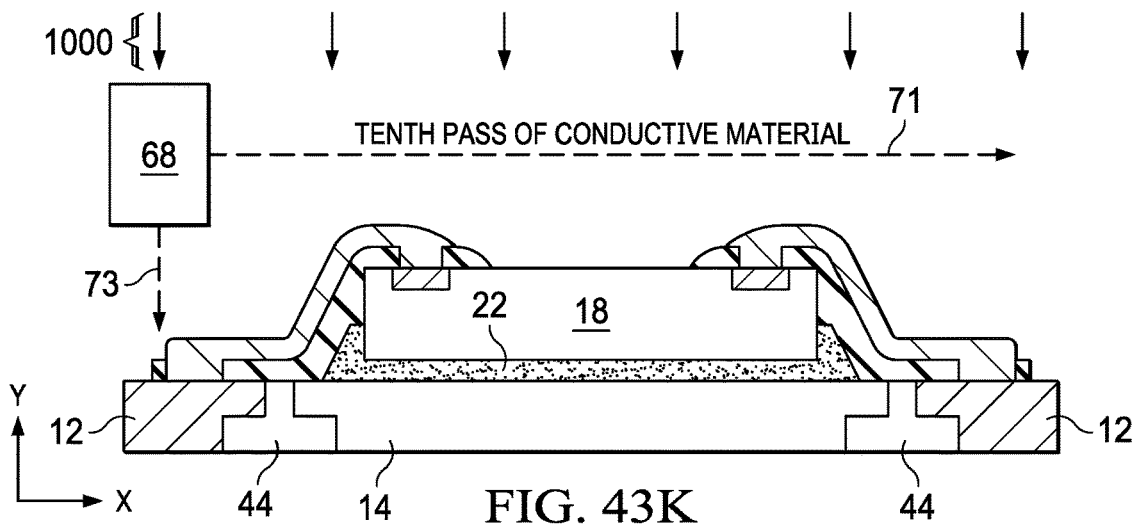
Figure 43L:
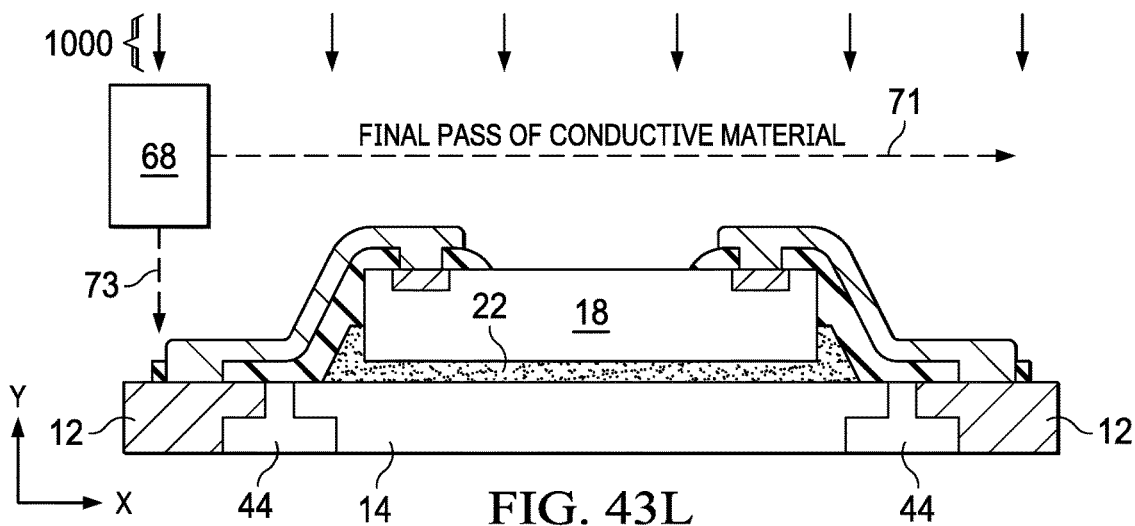
Figure 44A:
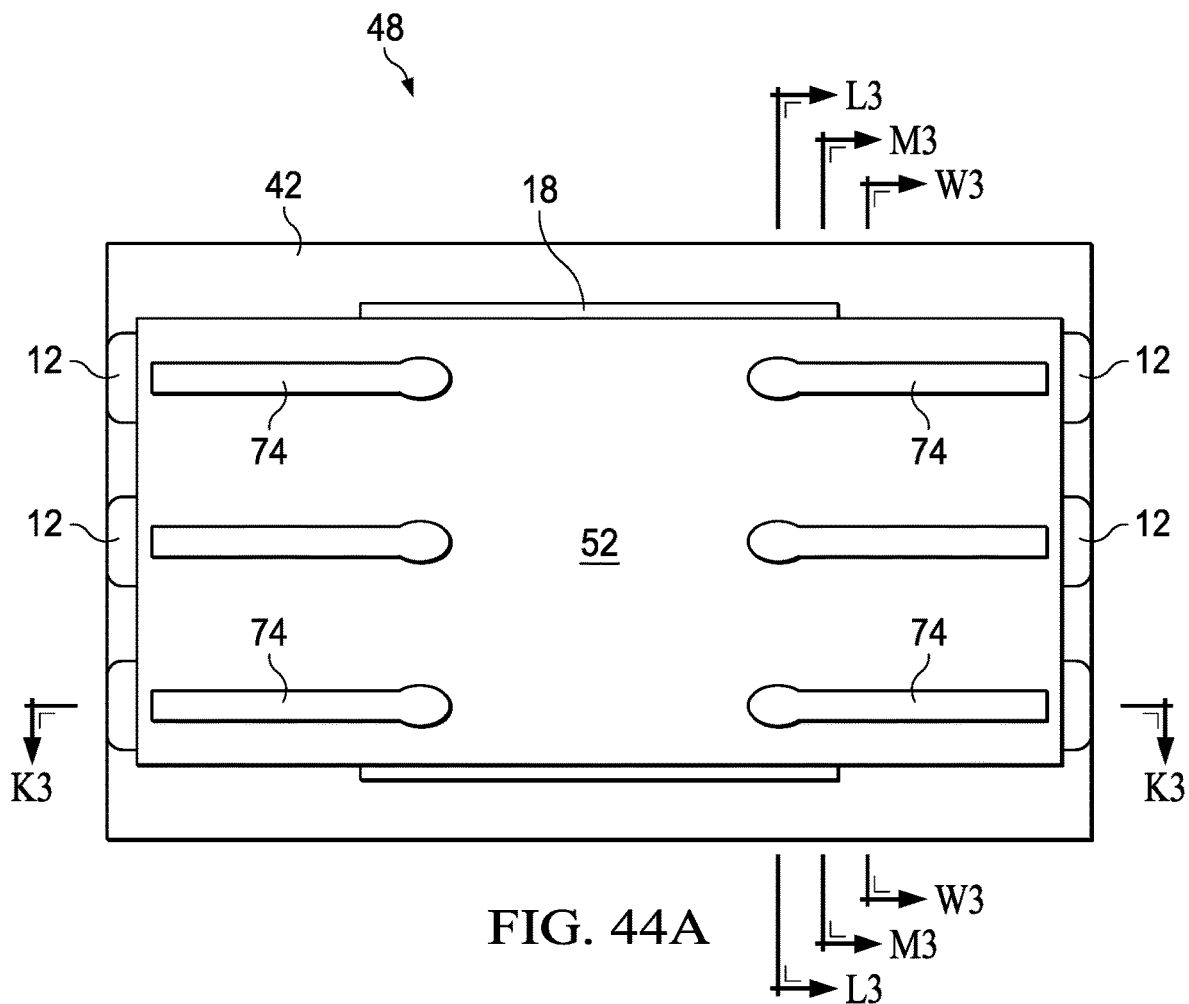
FIG. 44A is a top view of an electronic assembly undergoing fabrication according to the example method 500 of FIG. 5 with the implementation at 512, wherein multiple electrically conductive traces or interconnects 74 are printed or formed on blanket insulating layer 52 (e.g., FIGS. 36A-36J), each conductive trace or interconnect being between a respective bond pad 50 of die 18 and a corresponding top surface of a respective lead 12 of pre-molded lead frame 48.
Figure 44B:
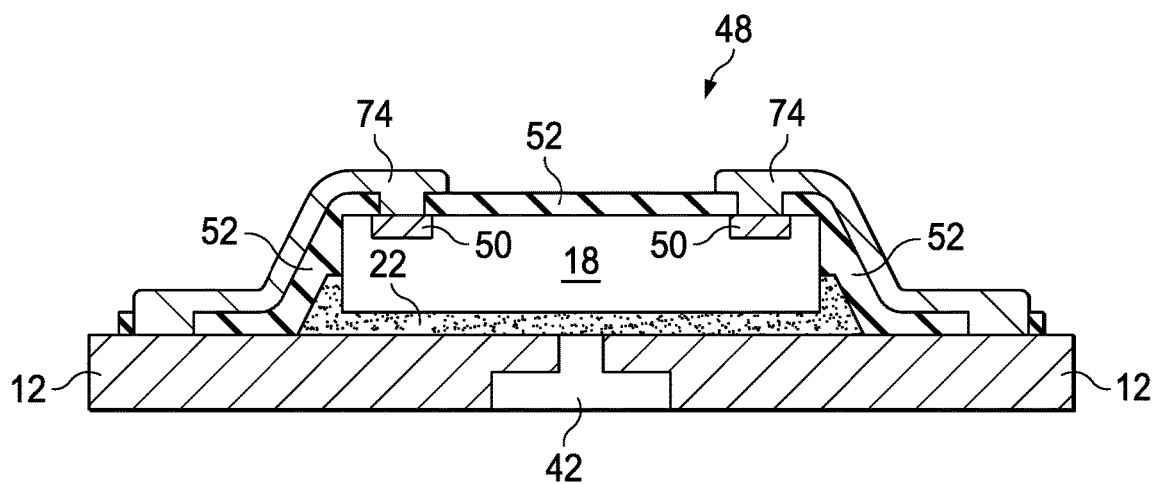
FIG. 44B is a cross-sectional view of the electronic assembly of FIG. 44A along reference line K3-K3.
Figure 45A:
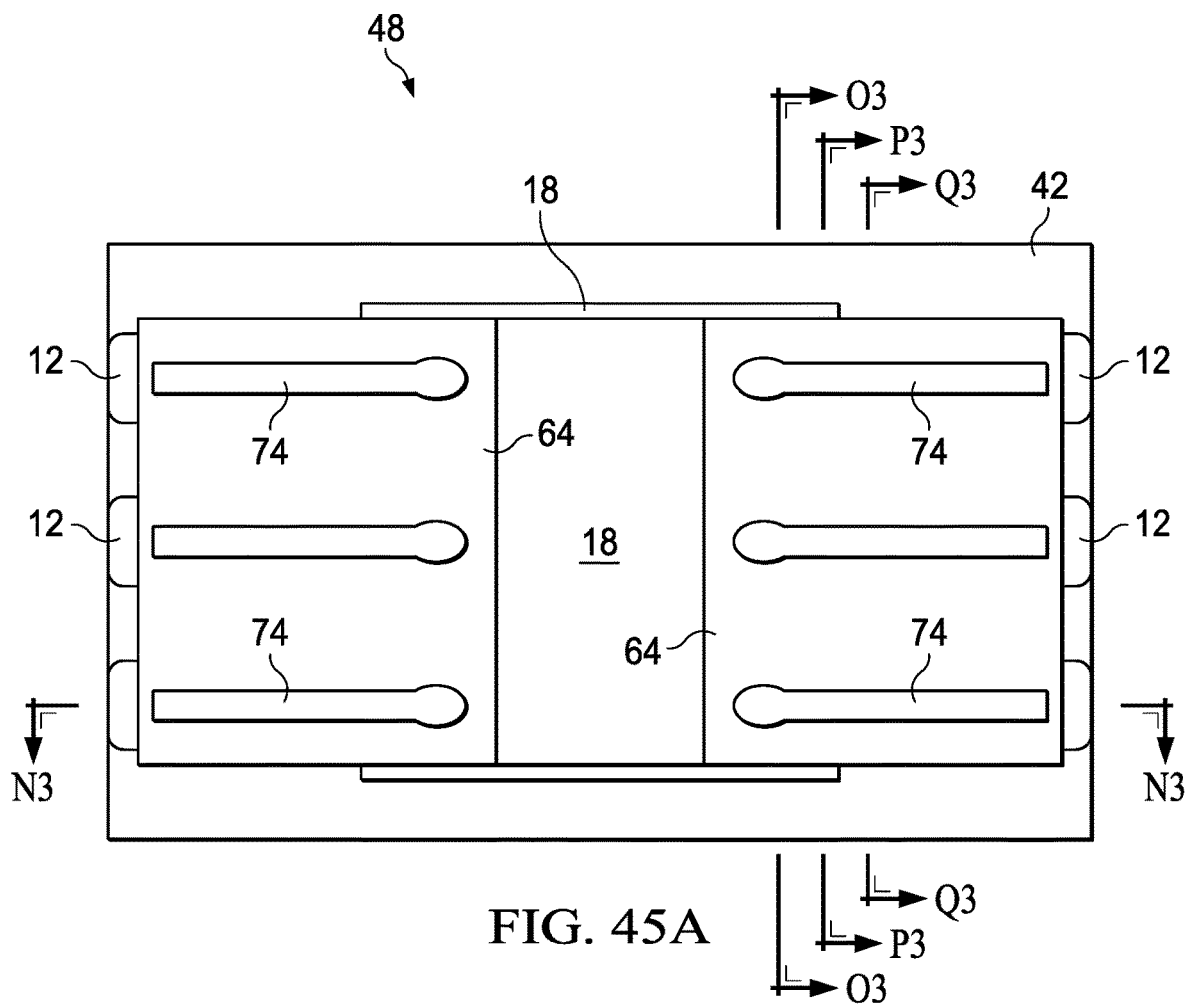
FIG. 45A is a top view of an electronic assembly undergoing fabrication according to the example method 500 of FIG. 5 with the implementation at 512, wherein multiple electrically conductive traces or interconnects 74 are printed or formed on two spaced apart half-blanket insulating layers 64 (e.g., FIGS. 38A & 38B) applied as foundation layers, each spanning a top surface of a portion of lead fingers 12 in pre-molded lead frame 48, across pre-mold 42, up one side of die 18, across a portion of the top of die 18 just past bond pads 50 on die 18.
Figure 45B:
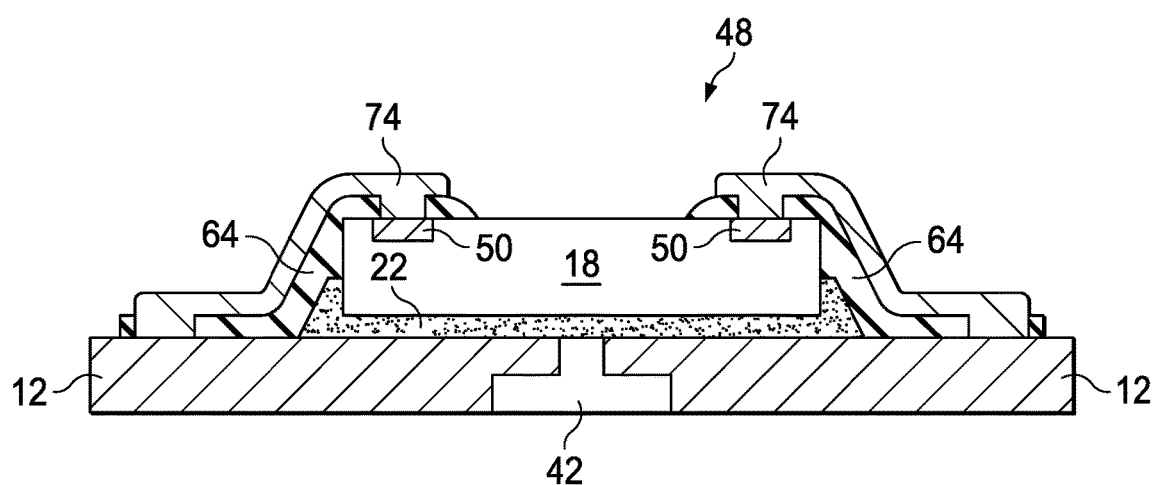
FIG. 45B is a cross-sectional view of the electronic assembly of FIG. 45A along reference line N3-N3.
Figure 46A:
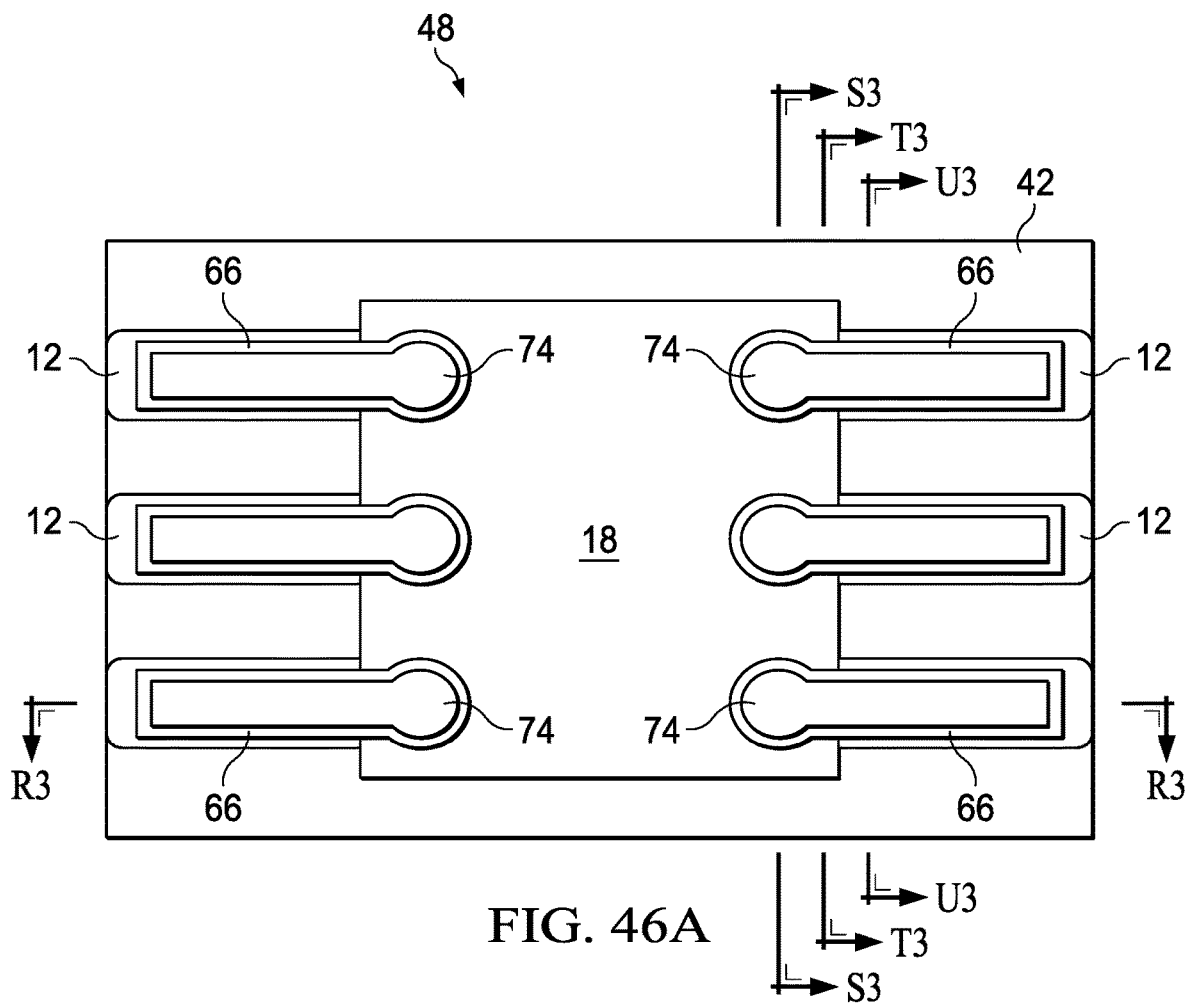
FIG. 46A is a top view of an electronic assembly undergoing fabrication according to the example method 500 of FIG. 5 with the implementation at 512, wherein an electrically conductive layer 74 is printed or formed on individual insulating layers 66 (e.g., FIGS. 46A & 46B) applied as foundation layers, each spanning a top surface of a portion of lead fingers 12 in pre-molded lead frame 48, across pre-mold 42, up one side of die 18, across a portion of the top of die 18 just past bond pads 50 on die 18.
Figure 46B:
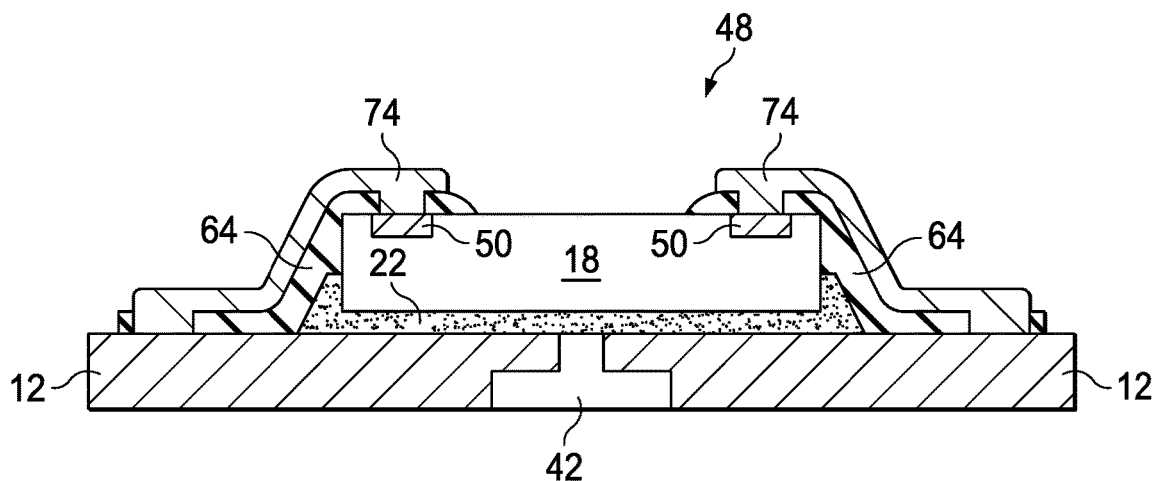
FIG. 46B is a cross-sectional view of the electronic assembly of FIG. 46A along reference lines R3-R3.

To get the desired contour of the electrically conductive trace or interconnects 74 along the non-horizontal surfaces, electrically conductive material can be formed or applied in multiple passes with each pass dispensing viscus material onto Z dimension at only desired X-Y location. Viscosity of material and exposure to temperature, light, or gas can keep the partially hardened material in place. FIG. 43A shows a die 18 attached to a pre-molded lead frame 46 prior to applying electrically conductive material. FIG. 43B shows the result of a first pass of printing electrically conductive material by print head 68. FIG. 43C shows the result of a second pass of printing electrically conductive material by print head 68. FIG. 43D shows the result of a third pass of printing electrically conductive material by print head 68. FIG. 43E shows the result of a fourth pass of printing electrically conductive material by print head 68. FIG. 43F shows the result of a fifth pass of printing electrically conductive material by print head 68. FIG. 43G shows the result of a sixth pass of printing electrically conductive material by print head 68. FIG. 43H shows the result of a seventh pass of printing electrically conductive material by print head 68. FIG. 43I shows the result of an eighth pass of printing electrically conductive material by print head 68. FIG. 43J shows the result of a ninth pass of printing electrically conductive material by print head 68. FIG. 43K shows the result of a tenth pass of printing electrically conductive material by print head 68. FIG. 43L shows the result of a final pass of printing electrically conductive material by print head 68. While FIGS. 43B-43L show a total of eleven passes of printing electrically conductive material by print head 68, more or fewer could be used in practice depending on many factors including the type of electrically conductive material used, viscosity of the electrically conductive material, desired thickness of the electrically conductive material, desired resolution of control of the deposition of the electrically conductive material, etc.

FIGS. 45A, 44B, 45A, 45B, 46A & 46B show alternative chip-on-lead (COL) packaged electronic devices. A significant difference between the alternative chip-on-lead (COL) packaged electronic devices and the previously discussed devices is in a COL device, lead frame 46 which has a die attach pad 14 & leads 12 which are spaced from the die attach pad, is replaced with a lead frame that contains leads but no die attach pad. In the case of a COL device, a semiconductor die is attached directly to, and is supported by, the leads rather than a die attach pad, such as die attach pad 14. The actual steps for fabricating the COL devices are otherwise substantially similar to the fabrication previously discussed for devices having a die attach pad with leads spaced apart from the die attach pad (see FIGS. 40A-43L) and will not be repeated herein.

Second or Cover Insulating Layer(s)

FIGS. 47A-56L show an electronic assembly undergoing fabrication according to the example method 500 of FIG. 5 with the implementation at 514. In the examples, a second or cover insulating layer(s) is applied on exposed portions of the conductive trace(s) or interconnect(s) (74) and any exposed portion(s) of the base or foundation insulating layer(s) (52, 64, 66) adjacent the conductive layer sufficient so that each conductive trace or interconnect is wrapped between a base or foundation insulating layer and a second or cover insulating layer thus protecting the conductive trace or interconnect from shorting and/or other structural damage such as structural stress related to coefficient of thermal expansion. The second or cover insulating layer(s) is preferred, but not required, to be of similar material as the base or foundation insulating layer(s).

Blanket Cover Insulating Layer Over Blanket Base or Foundation Insulating Layer

Figure 47A:
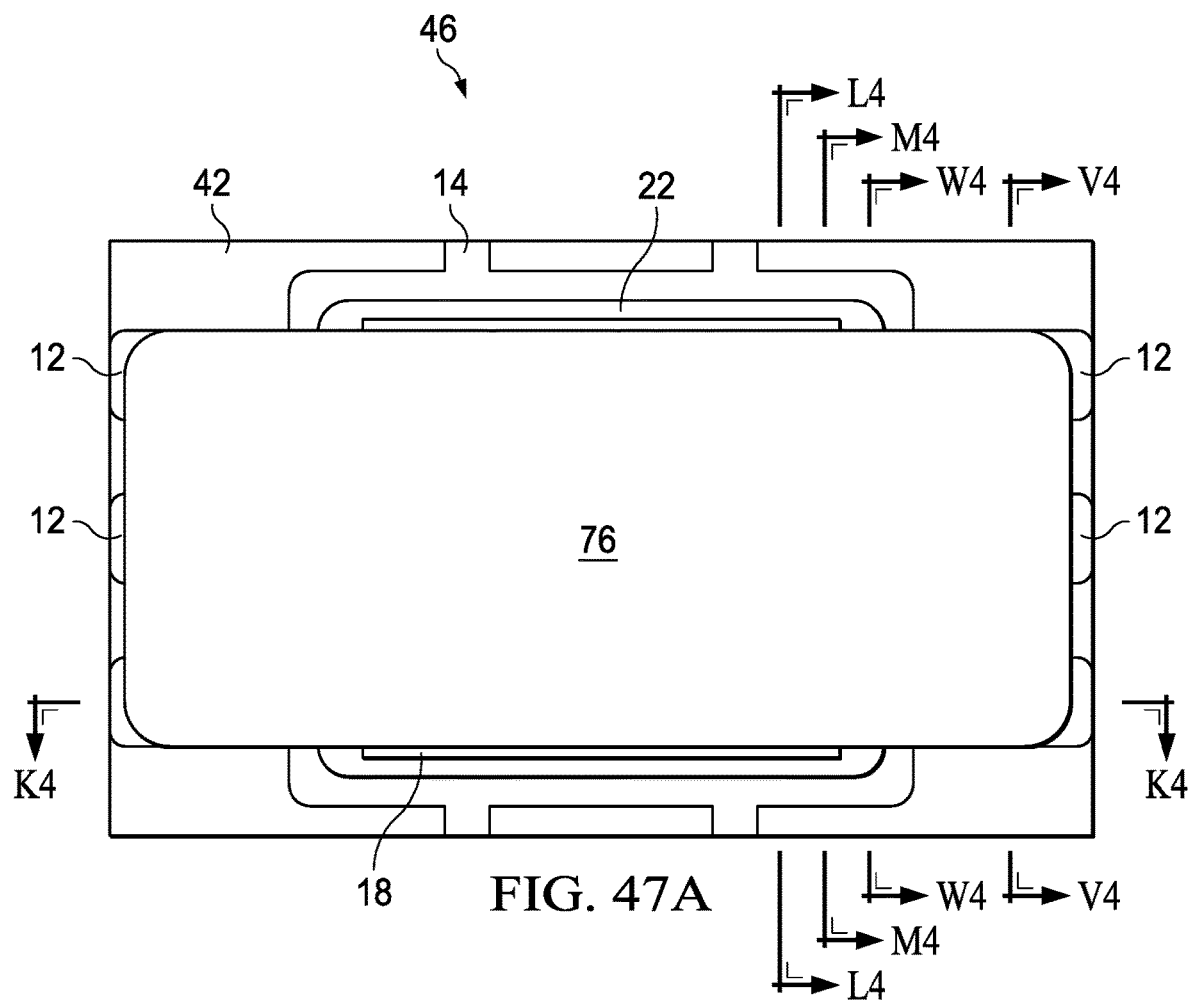
FIG. 47A is a top view of an electronic assembly undergoing fabrication according to the example method 500 of FIG. 5 with the implementation at 514, wherein a second insulating layer, e.g., a blanket cover insulating layer, 76 is printed, deposited, formed or otherwise applied over exposed portions of blanket base or foundation insulating layer 52, and exposed portions of conductive traces or interconnects 74 on base or foundation insulating layer 52 (see FIGS. 40A & 40B), which spans a portion of a top surface of lead fingers 12 in pre-molded lead frame 46, across pre-mold 42, up one side of die 18, across the top of die 18, down an opposite side of die 18, across pre-mold 42 on an opposite side of pre-molded lead frame 46 and to a portion of a top surface of lead fingers 12 on the opposite side of pre-molded lead frame 46.

FIG. 47A shows a second insulating layer, e.g., a blanket cover insulating layer, 76 is printed, deposited, formed or otherwise applied over exposed portions of blanket base or foundation insulating layer 52, and exposed portions of conductive traces or interconnects 74 on base or foundation insulating layer 52 (see FIGS. 40A & 40B), which spans a portion of a top surface of lead fingers 12 in pre-molded lead frame 46, across pre-mold 42, up one side of die 18, across the top of die 18, down an opposite side of die 18, across pre-mold 42 on an opposite side of pre-molded lead frame 46 and to a portion of a top surface of lead fingers 12 on the opposite side of pre-molded lead frame 46 (e.g., at 514 in FIG. 5). Optionally blanket cover insulating layer 76 can be cured at this time, or later with additional layers. A polymer, epoxy, silicon, mold, or other insulators can be used for blanket cover insulating layer 76. Blanket cover insulating layer 76 follows the contours of the topology on blanket base or foundation insulating layer 52 and the conductive traces or interconnects 74 formed on blanket base or foundation insulating layer 52, at least sufficiently to ensure that all conductive traces or interconnects 74 are wrapped or sealed between blanket base or foundation insulating layer 52 and blanket cover insulating layer 76. As can be seen in FIG. 47A, blanket cover insulating layer 76 covers blanket base or foundation insulating layer 52, which covers the top surface of die 18 and side surfaces of die 18 which are adjacent bond pads 50 and conductive traces or interconnects 74 on blanket base or foundation insulating layer 52. Blanket cover insulating layer 76 can be formed or deposited using one of multiple techniques such as screen-printing, photolithography and etching, CVD, PVD, vacuum evaporation, inkjet printing, spray coating, microdispensing, aerosol jet, ElectroHydroDynamic (EHD) techniques with the appropriate insulating properties.

If inkjet printing is used, blanket cover insulating layer 76 can be formed from an inkjet deposition compatible polymer such as a polyimide ink, a thermally curable epoxy-based polymer ink, and a UV-curable acrylate ink. It is preferred that a polymer with a modulus less than 3.4 GPa and more preferred less than 2 GPa be used, to avoid undue stress on the assembly. A thickness of the blanket cover insulating layer 76 can be in the range of about 2 μm to 35 μm. A more preferred range is about 2 μm to not more than 20 μm, and still more preferred in a range from about 2 μm to about 10 μm. Because the inkjet solvent deposition material has a solvent, the initial thickness, after the solvent dissipates, the remaining material forms the insulating layer at a reduced thickness. To achieve the desired thickness, multiple inkjet depositions can be performed (e.g., at 1302 in FIG. 13). Inkjet deposition allows precise placement of material by using "drop on demand" (DOD) technology, where a reservoir of the liquid has a nozzle and a small volume of the liquid is forced from the nozzle in response to an electrical signal. The liquid forms a drop as it falls vertically onto a surface.

Figure 47B:
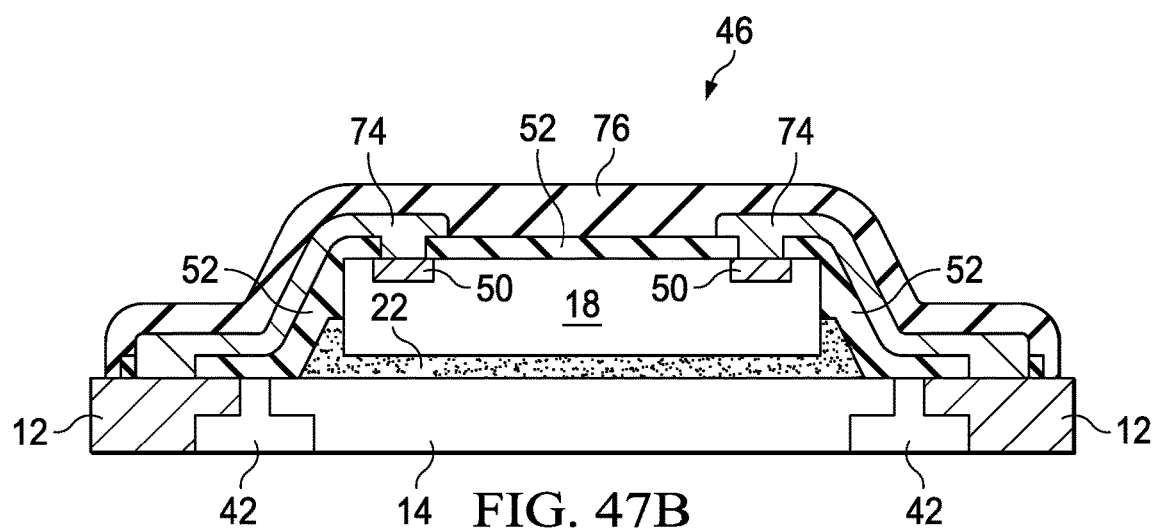
FIGS. 47B-47R are cross-sectional views of the electronic assembly of FIG. 56A along various reference lines.

The precision of the inkjet deposition tool allows deposition of the liquid material in some areas and not in others as the tool traverses across the surface (or if the tool is fixed, as the surface moves beneath the tool). Because the insulating material can be very accurately placed even in small areas, no etch or material removal step is needed to remove material after the inkjet deposition. A single pass deposition increases manufacturing throughput and reduces costs but may not produce the more accurate and/or desirable results from multiple pass deposition. As additional inkjet materials are developed, a reduction in the amount of solvent can reduce the initial thickness needed and thereby reduce the need for multiple pass depositions. FIG. 47B is a cross-sectional view of integrated circuit (IC) die 18 attached, via die attach material 22, to a top surface of die attach pad 14 of pre-molded lead frame unit 46 along reference line K4-K4 in FIG. 47A. The orientation of blanket base or foundation insulating layer 52, conductive trace or interconnects 74 and blanket cover insulating layer 76 is also shown in FIG. 47A.

Figure 47C:
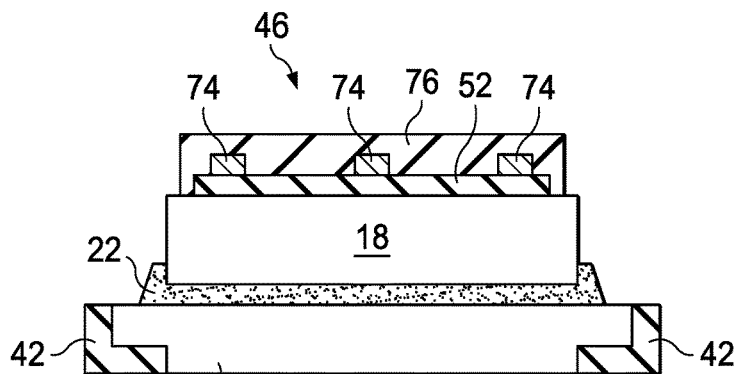
Figure 47D:
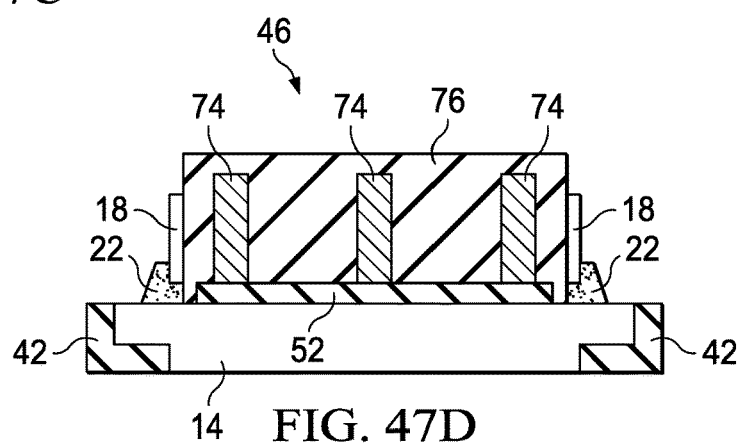
Figure 47E:
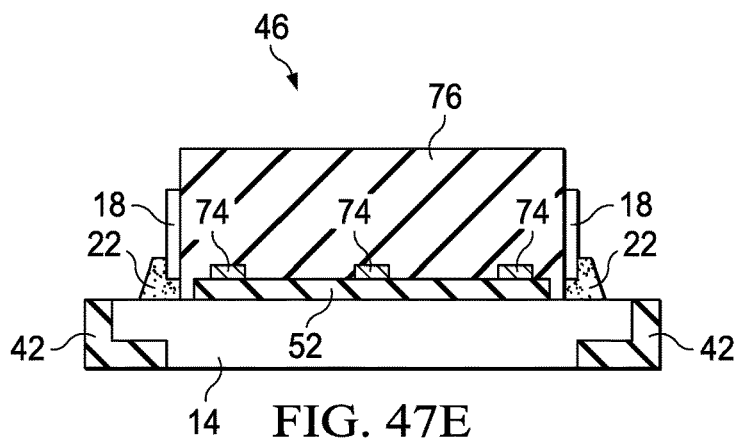
Figure 47F:
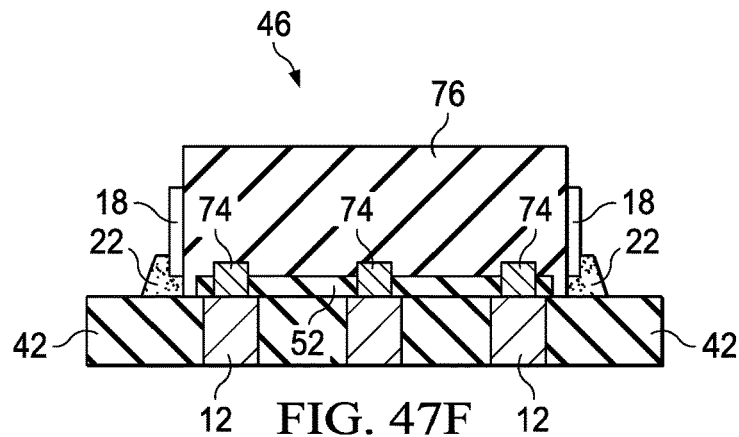

FIG. 47C is a cross-sectional view of integrated circuit (IC) die 18 attached, via die attach material 22, to a top surface of die attach pad 14 of pre-molded lead frame unit 46 along reference line L4-L4 in FIG. 47A, according to one example. In FIG. 47C blanket cover insulating layer 76 is shown covering the top and side surfaces of blanket base or foundation insulating layer 52. However, some examples may not require blanket cover insulating layer 76 to extend laterally beyond side surfaces of blanket base or foundation insulating layer 52 when conductive trace or interconnects 74 are otherwise sealed within blanket base or foundation insulating layer 52 and blanket cover insulating layer 76. FIG. 47D is a cross-sectional view of integrated circuit (IC) die 18 attached, via die attach material 22, to a top surface of die attach pad 14 of pre-molded lead frame unit 46 along reference line M4-M4 in FIG. 47A, which shows the blanket base or foundation insulating layer 52, conductive trace or interconnects 74 and blanket cover insulating layer 76 extending down a vertical side of die 18 to die pad 46. FIG. 47E is a cross-sectional view of integrated circuit (IC) die 18 attached, via die attach material 22, to a top surface of die attach pad 14 of pre-molded lead frame unit 46 along reference line W4-W4 in FIG. 47A, which shows conductive trace or interconnects 74, now horizontally oriented on blanket base or foundation insulating layer 52, as conductive trace or interconnects 74 prepare to extend horizontally to leads 12. FIG. 47F is a cross-sectional view of integrated circuit (IC) die 18 attached, via die attach material 22, to a top surface of die attach pad 14 of pre-molded lead frame unit 46 along reference line V4-V4 in FIG. 47A, which shows a distal end of each conductive trace or interconnect 74 as it extends down through a through hole or void 56 in blanket base or foundation layer 52 to contact an upper surface of a respective lead 12.

Figure 47G:
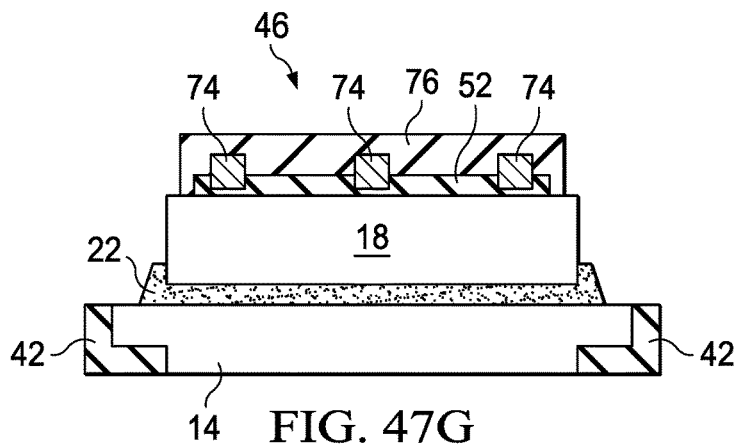
Figure 47H:
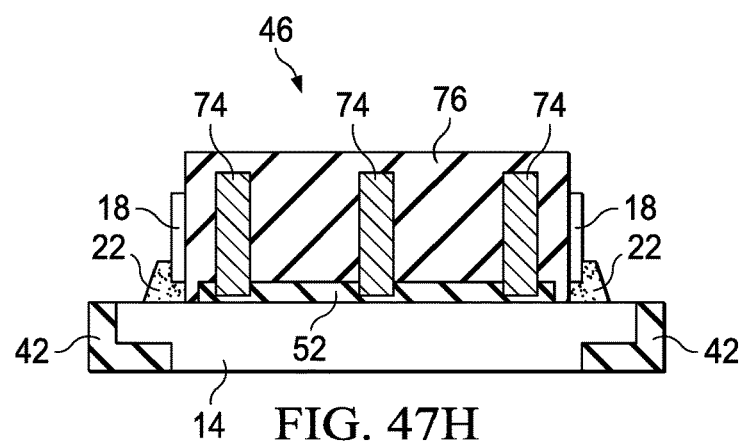
Figure 47I:
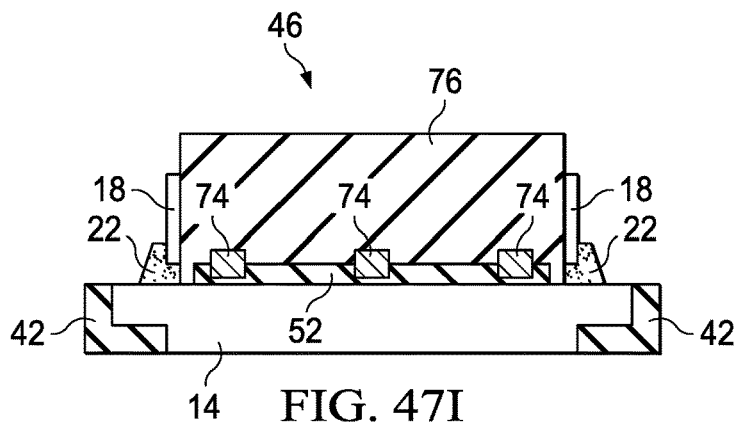
Figure 47J:
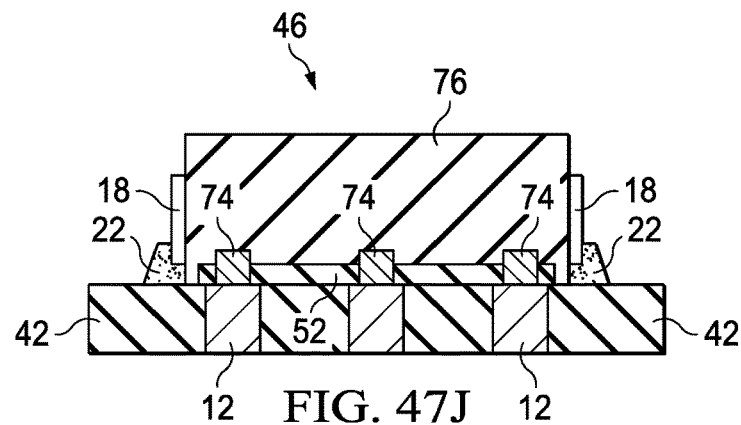

FIG. 47G is a cross-sectional view of integrated circuit (IC) die 18 attached, via die attach material 22, to a top surface of die attach pad 14 of pre-molded lead frame unit 46 along reference line L4-L4 in FIG. 47A. In this example, blanket base or foundation insulating layer 52 includes rectangular channel or grooves 58 filled with conductive material (e.g., conductive trace or interconnect 74) from bond pads 50 on die 18 to leads 12. In FIG. 47G blanket cover insulating layer 76 is shown covering the top and side surfaces of blanket base or foundation insulating layer 52. However, some examples may not require blanket cover insulating layer 76 to extend laterally beyond side surfaces of blanket base or foundation insulating layer 52 when conductive trace or interconnects 74 are otherwise sealed within blanket base or foundation insulating layer 52 and blanket cover insulating layer 76. FIG. 47H is a cross-sectional view of integrated circuit (IC) die 18 attached, via die attach material 22, to a top surface of die attach pad 14 of pre-molded lead frame unit 46 along reference line M4-M4 in FIG. 47A, which shows the blanket base or foundation insulating layer 52, conductive trace or interconnects 74 and blanket cover insulating layer 76 extending down a vertical side of die 18 to die pad 46. FIG. 47I is a cross-sectional view of integrated circuit (IC) die 18 attached, via die attach material 22, to a top surface of die attach pad 14 of pre-molded lead frame unit 46 along reference line W4-W4 in FIG. 47A, which shows conductive trace or interconnects 74, now horizontally oriented on blanket base or foundation insulating layer 52, as conductive trace or interconnects 74 prepare to extend horizontally to leads 12. FIG. 47J is a cross-sectional view of integrated circuit (IC) die 18 attached, via die attach material 22, to a top surface of die attach pad 14 of pre-molded lead frame unit 46 along reference line V4-V4 in FIG. 47A, which shows a distal end of each conductive trace or interconnect 74 as it extends down through a through hole or void 56 in blanket base or foundation layer 52 to contact an upper surface of a respective lead 12.

Figure 47K:
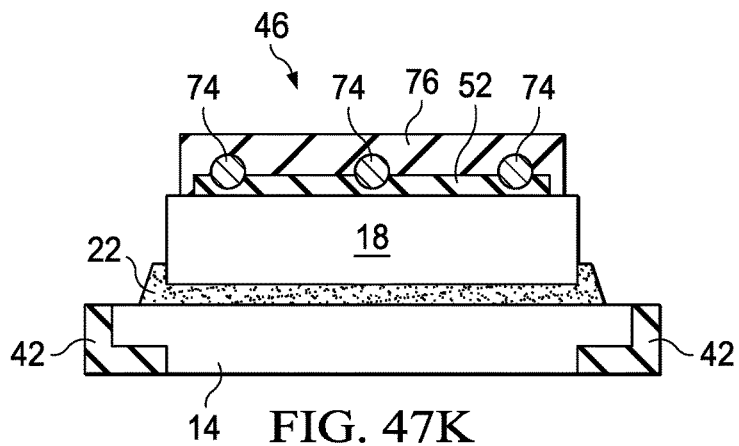
Figure 47L:
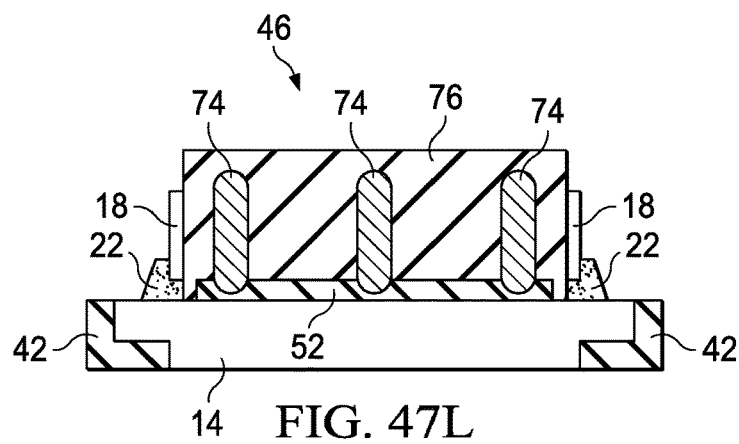
Figure 47M:
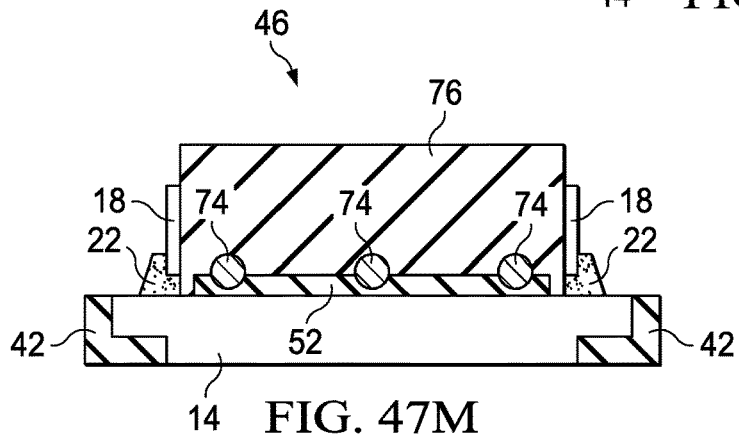
Figure 47N:
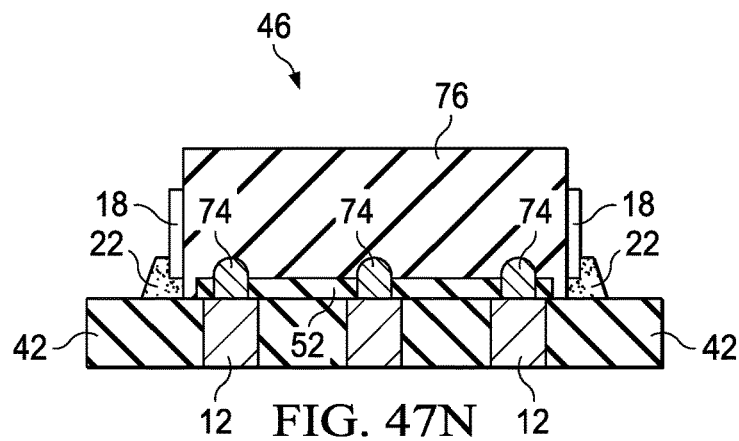

FIG. 47K is a cross-sectional view of integrated circuit (IC) die 18 attached, via die attach material 22, to a top surface of die attach pad 14 of pre-molded lead frame unit 46 along reference line L4-L4 in FIG. 47A. In this example, blanket base or foundation insulating layer 52 includes semi-circular channel or grooves 60 filled with conductive material (e.g., conductive trace or interconnect 74) from bond pads 50 on die 18 to leads 12. In FIG. 47K blanket cover insulating layer 76 is shown covering the top and side surfaces of blanket base or foundation insulating layer 52. However, some examples may not require blanket cover insulating layer 76 to extend laterally beyond side surfaces of blanket base or foundation insulating layer 52 when conductive trace or interconnects 74 are otherwise sealed within blanket base or foundation insulating layer 52 and blanket cover insulating layer 76. FIG. 47L is a cross-sectional view of integrated circuit (IC) die 18 attached, via die attach material 22, to a top surface of die attach pad 14 of pre-molded lead frame unit 46 along reference line M4-M4 in FIG. 47A, which shows the blanket base or foundation insulating layer 52, conductive trace or interconnects 74 and blanket cover insulating layer 76 extending down a vertical side of die 18 to die pad 46. FIG. 47M is a cross-sectional view of integrated circuit (IC) die 18 attached, via die attach material 22, to a top surface of die attach pad 14 of pre-molded lead frame unit 46 along reference line W4-W4 in FIG. 47A, which shows conductive trace or interconnects 74, now horizontally oriented on blanket base or foundation insulating layer 52, as conductive trace or interconnects 74 prepare to extend horizontally to leads 12. FIG. 47N is a cross-sectional view of integrated circuit (IC) die 18 attached, via die attach material 22, to a top surface of die attach pad 14 of pre-molded lead frame unit 46 along reference line V4-V4 in FIG. 47A, which shows a distal end of each conductive trace or interconnect 74 as it extends down through a through hole or void 56 in blanket base or foundation layer 52 to contact an upper surface of a respective lead 12.

Figure 47O:
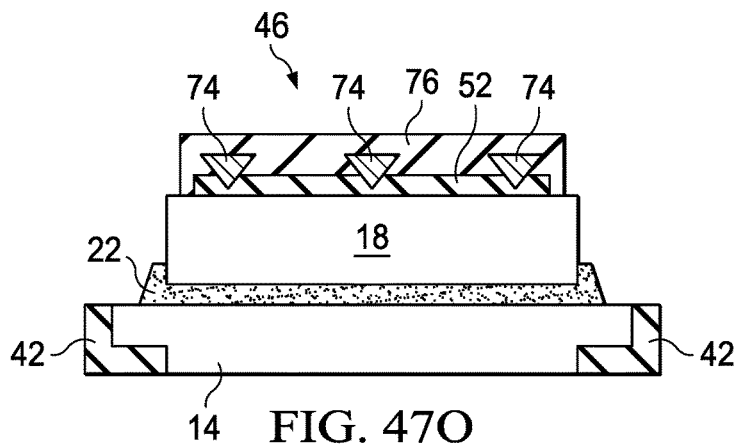
Figure 47P:
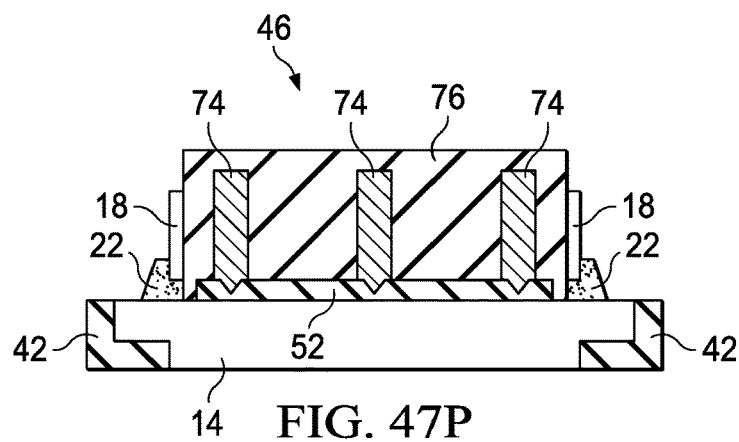
Figure 47Q:
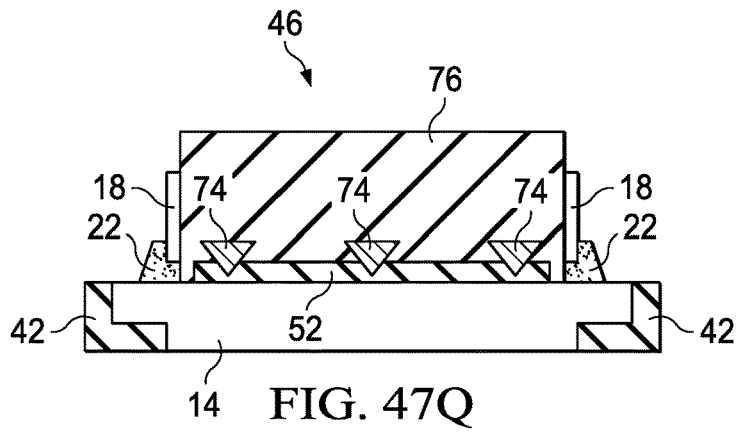
Figure 47R:
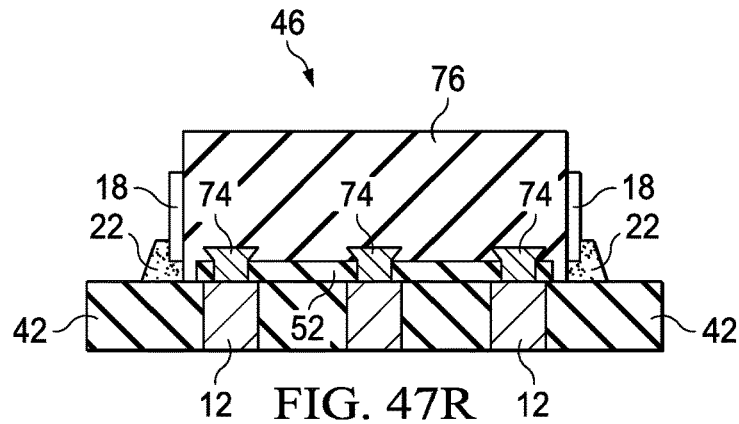

FIG. 47O is a cross-sectional view of integrated circuit (IC) die 18 attached, via die attach material 22, to a top surface of die attach pad 14 of pre-molded lead frame unit 46 along reference line L4-L4 in FIG. 47A. In this example, blanket base or foundation insulating layer 52 includes v-shaped channel or grooves 62 filled with conductive material (e.g., conductive trace or interconnect 74) from bond pads 50 on die 18 to leads 12. In FIG. 47O blanket cover insulating layer 76 is shown covering the top and side surfaces of blanket base or foundation insulating layer 52. However, some examples may not require blanket cover insulating layer 76 to extend laterally beyond side surfaces of blanket base or foundation insulating layer 52 when conductive trace or interconnects 74 are otherwise sealed within blanket base or foundation insulating layer 52 and blanket cover insulating layer 76. FIG. 47P is a cross-sectional view of integrated circuit (IC) die 18 attached, via die attach material 22, to a top surface of die attach pad 14 of pre-molded lead frame unit 46 along reference line M4-M4 in FIG. 47A, which shows the blanket base or foundation insulating layer 52, conductive trace or interconnects 74 and blanket cover insulating layer 76 extending down a vertical side of die 18 to die pad 46. FIG. 47Q is a cross-sectional view of integrated circuit (IC) die 18 attached, via die attach material 22, to a top surface of die attach pad 14 of pre-molded lead frame unit 46 along reference line W4-W4 in FIG. 47A, which shows conductive trace or interconnects 74, now horizontally oriented on blanket base or foundation insulating layer 52, as conductive trace or interconnects 74 prepare to extend horizontally to leads 12. FIG. 47R is a cross-sectional view of integrated circuit (IC) die 18 attached, via die attach material 22, to a top surface of die attach pad 14 of pre-molded lead frame unit 46 along reference line V4-V4 in FIG. 47A, which shows a distal end of each conductive trace or interconnect 74 as it extends down through a through hole or void 56 in blanket base or foundation layer 52 to contact an upper surface of a respective lead 12.

Figure 48A:
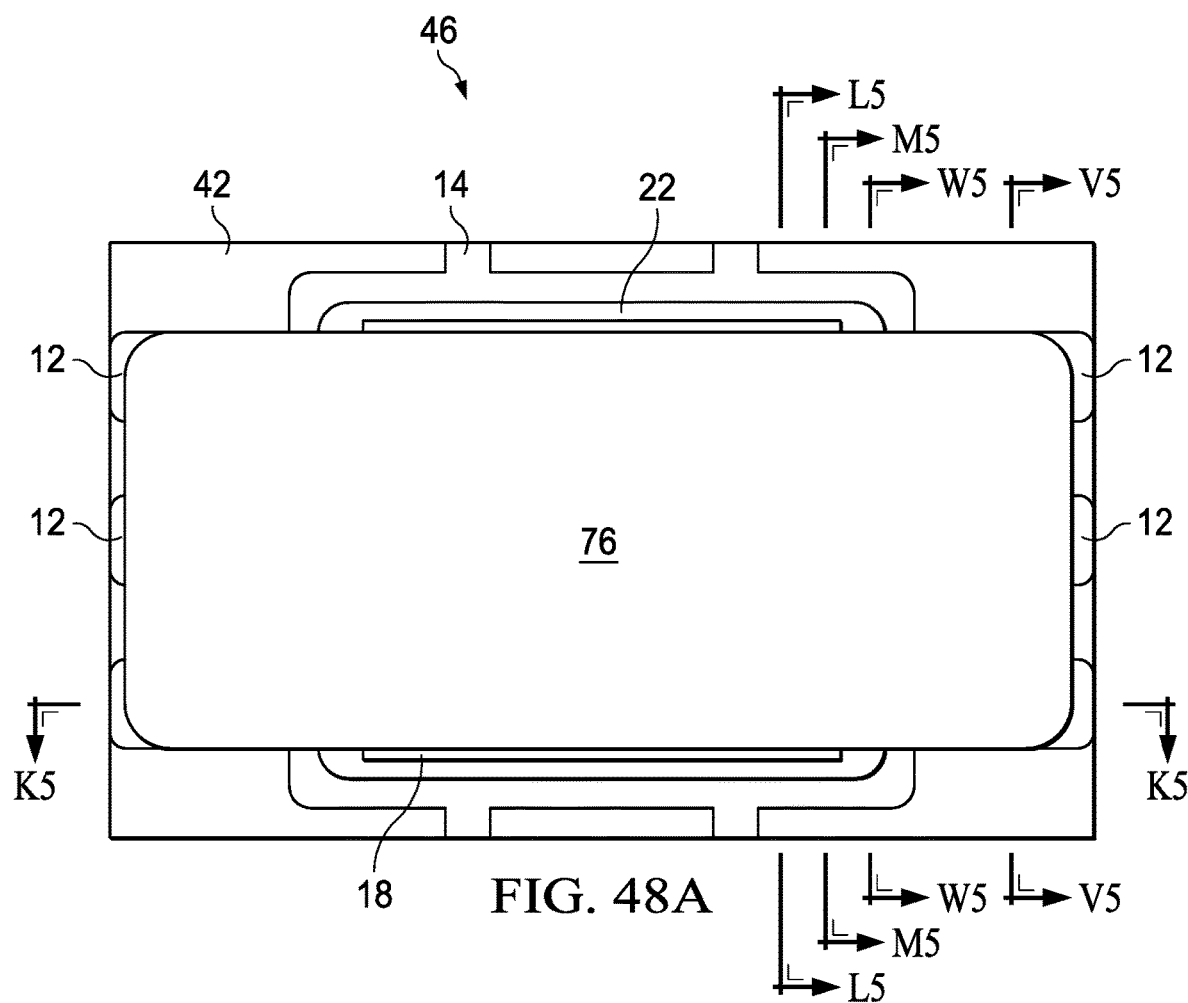
FIG. 48A is a top view of an electronic assembly undergoing fabrication according to the example method 500 of FIG. 5 with the implementation at 514, wherein a second insulating layer, e.g., a blanket cover insulating layer, 76 is printed, deposited, formed or otherwise applied over exposed portions of half-blanket base or foundation insulating layers 64, and exposed portions of conductive traces or interconnects 74 on half-blanket base or foundation insulating layers 66 (see FIGS. 41A & 41B), each spanning a portion of a top surface of lead fingers 12 in pre-molded lead frame 46, across pre-mold 42, up one side of die 18, across a portion of the top of die 18 just beyond the bond pads 50 closest to the side of die 18 upon which the respective half-blanket base or foundation insulating layer 64 is adjacent.

Blanket Cover Insulating Layer Over Half-Blanket Base or Foundation Insulating Layers FIG. 48A shows a second insulating layer, e.g., a blanket cover insulating layer, 76 is printed, deposited, formed or otherwise applied over exposed portions of half-blanket base or foundation insulating layers 64, and exposed portions of conductive traces or interconnects 74 on half-blanket base or foundation insulating layers 66 (see FIGS. 41A & 41B), each spanning a portion of a top surface of lead fingers 12 in pre-molded lead frame 46, across pre-mold 42, up one side of die 18, across a portion of the top of die 18 just beyond the bond pads 50 closest to the side of die 18 upon which the respective half-blanket base or foundation insulating layer 64 is adjacent (e.g., at 514 in FIG. 5). An area on top of die 18 between the half-blanket base or foundation insulating layers 64 remains uncovered by any base or foundation layer. Optionally blanket cover insulating layer 76 can be cured at this time, or later with additional layers. A polymer, epoxy, silicon, mold, or other insulators can be used for blanket cover insulating layer 76. Blanket cover insulating layer 76 follows the contours of the topology on half-blanket base or foundation insulating layers 66 and the conductive traces or interconnects 74 formed on the half-blanket base or foundation insulating layers 64, at least sufficiently to ensure that all conductive traces or interconnects 74 are wrapped or sealed between half-blanket base or foundation insulating layers 64 and blanket cover insulating layer 76. As can be seen in FIG. 48A, blanket cover insulating layer 76 covers half-blanket base or foundation insulating layers 64, conductive traces or interconnects 74 on half-blanket base or foundation insulating layers 66 and the uninsulated portion of the top of die 18 between half-blanket base or foundation insulating layers 64. And while this example shows two half-blanket base or foundation insulating layers 64, more than two layers can be used with each accommodating more than one conductive trace or interconnect 74. Blanket cover insulating layer 76 can be formed or deposited using one of multiple techniques such as screen-printing, photolithography and etching, CVD, PVD, vacuum evaporation, inkjet printing, spray coating, microdispensing, aerosol jet, ElectroHydroDynamic (EHD) techniques with the appropriate insulating properties.

If inkjet printing is used, blanket cover insulating layer 76 can be formed from an inkjet deposition compatible polymer such as a polyimide ink, a thermally curable epoxy-based polymer ink, and a UV-curable acrylate ink. It is preferred that a polymer with a modulus less than 3.4 GPa and more preferred less than 2 GPa be used, to avoid undue stress on the assembly. A thickness of the blanket cover insulating layer 76 can be in the range of about 2 µm to 35 µm. A more preferred range is about 2 µm to not more than 20 µm, and still more preferred in a range from about 2 µm to about 10 µm. Because the inkjet solvent deposition material has a solvent, the initial thickness, after the solvent dissipates, the remaining material forms the insulating layer at a reduced thickness. To achieve the desired thickness, multiple inkjet depositions can be performed (e.g., at 1302 in FIG. 13). Inkjet deposition allows precise placement of material by using "drop on demand" (DOD) technology, where a reservoir of the liquid has a nozzle and a small volume of the liquid is forced from the nozzle in response to an electrical signal. The liquid forms a drop as it falls vertically onto a surface.

Figure 48B:
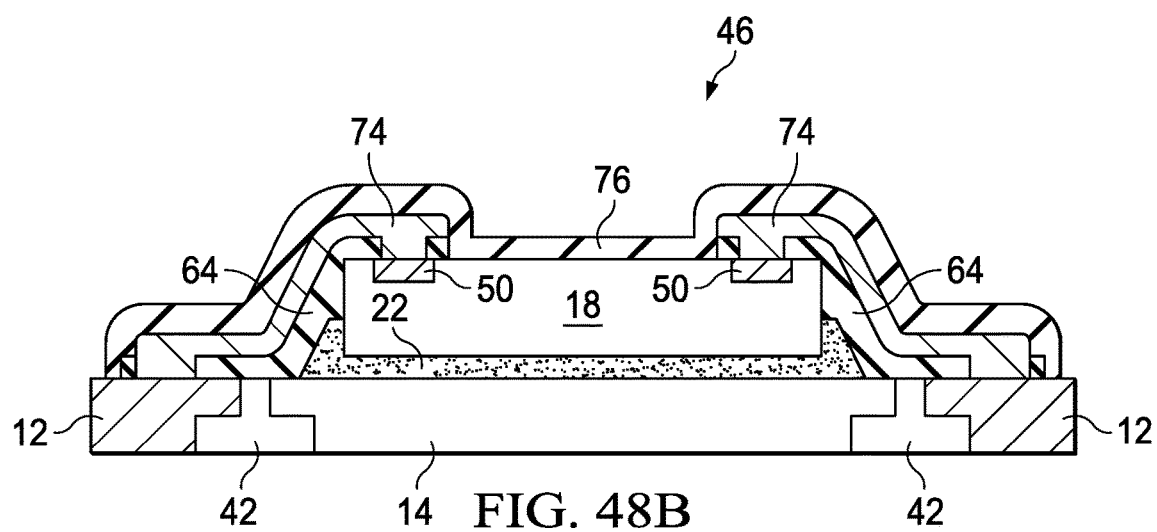
FIGS. 48B-48R are cross-sectional views of the electronic assembly of FIG. 48A along various reference lines.

The precision of the inkjet deposition tool allows deposition of the liquid material in some areas and not in others as the tool traverses across the surface (or if the tool is fixed, as the surface moves beneath the tool). Because the insulating material can be very accurately placed even in small areas, no etch or material removal step is needed to remove material after the inkjet deposition. A single pass deposition increases manufacturing throughput and reduces costs but may not produce the more accurate and/or desirable results from multiple pass deposition. As additional inkjet materials are developed, a reduction in the amount of solvent can reduce the initial thickness needed and thereby reduce the need for multiple pass depositions. FIG. 48B is a cross-sectional view of integrated circuit (IC) die 18 attached, via die attach material 22, to a top surface of die attach pad 14 of pre-molded lead frame unit 46 along reference line K5-K5 in FIG. 48A. The orientation of half-blanket base or foundation insulating layers 64, conductive trace or interconnects 74 and blanket cover insulating layer 76 is also shown in FIG. 48A.

Figure 48C:
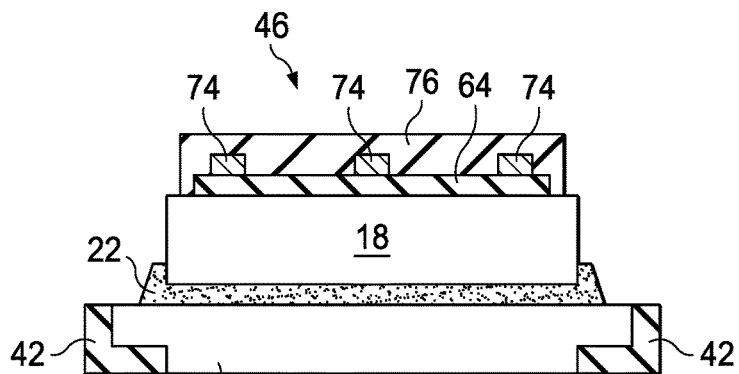
Figure 48D:
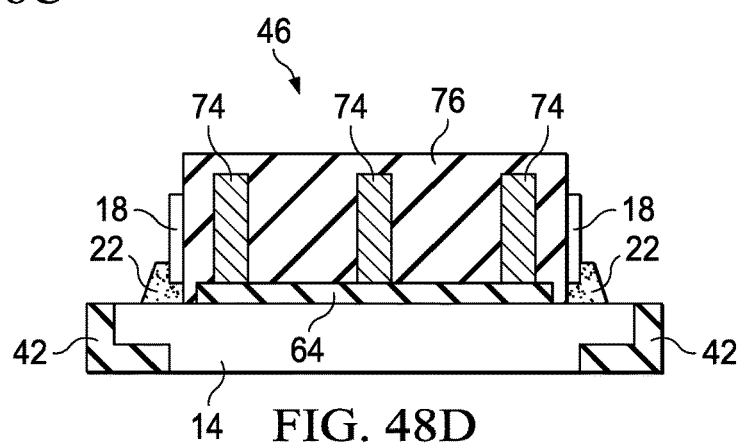
Figure 48E:
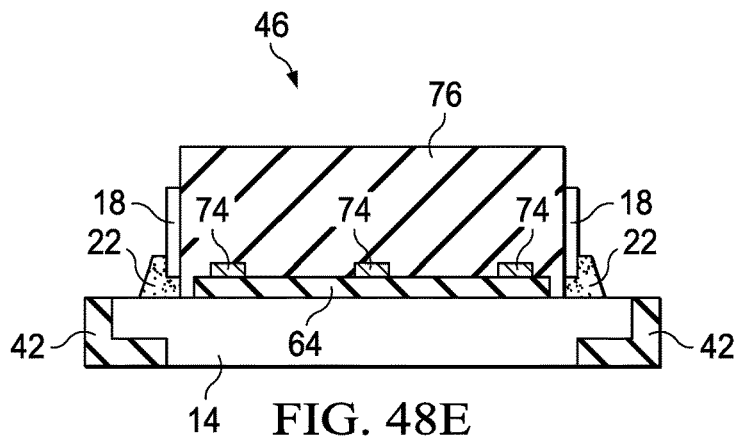
Figure 48F:
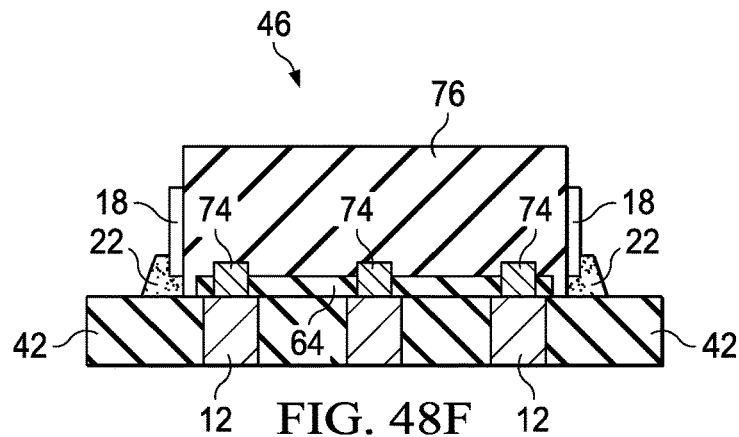

FIG. 48C is a cross-sectional view of integrated circuit (IC) die 18 attached, via die attach material 22, to a top surface of die attach pad 14 of pre-molded lead frame unit 46 along reference line L5-L5 in FIG. 48A, according to one example. In FIG. 48C blanket cover insulating layer 76 is shown covering the top and side surfaces of half-blanket base or foundation insulating layers 64. However, some examples may not require blanket cover insulating layer 76 to extend laterally beyond side surfaces of half-blanket base or foundation insulating layers 64 when conductive trace or interconnects 74 are otherwise sealed within half-blanket base or foundation insulating layers 64 and blanket cover insulating layer 76. FIG. 48D is a cross-sectional view of integrated circuit (IC) die 18 attached, via die attach material 22, to a top surface of die attach pad 14 of pre-molded lead frame unit 46 along reference line M5-M5 in FIG. 48A, which shows one of the half-blanket base or foundation insulating layers 64, conductive trace or interconnects 74 and blanket cover insulating layer 76 extending down a vertical side of die 18 to die pad 46. FIG. 48E is a cross-sectional view of integrated circuit (IC) die 18 attached, via die attach material 22, to a top surface of die attach pad 14 of pre-molded lead frame unit 46 along reference line W5-W5 in FIG. 48A, which shows conductive trace or interconnects 74, now horizontally oriented on a half-blanket base or foundation insulating layer 64, as conductive trace or interconnects 74 prepare to extend horizontally to leads 12. FIG. 48F is a cross-sectional view of integrated circuit (IC) die 18 attached, via die attach material 22, to a top surface of die attach pad 14 of pre-molded lead frame unit 46 along reference line V5-V5 in FIG. 48A, which shows a distal end of each conductive trace or interconnect 74 as it extends down through a through hole or void 56 in a half-blanket base or foundation layer 64 to contact an upper surface of a respective lead 12.

Figure 48G:
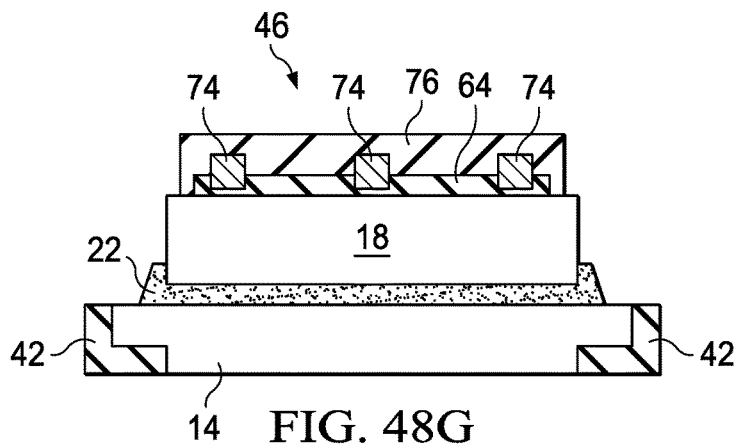
Figure 48H:
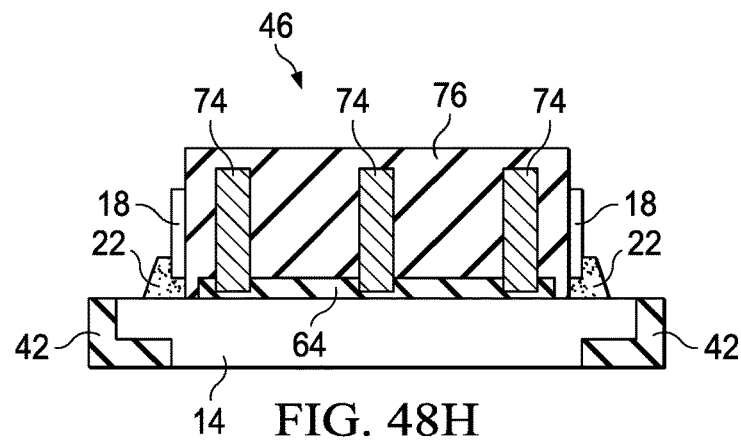
Figure 48I:
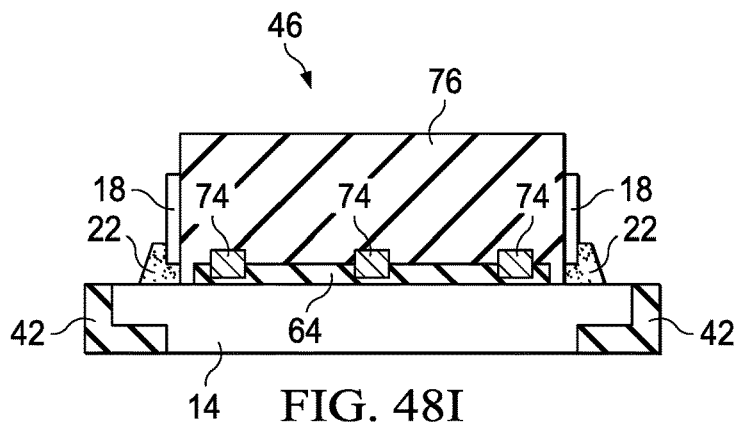
Figure 48J:
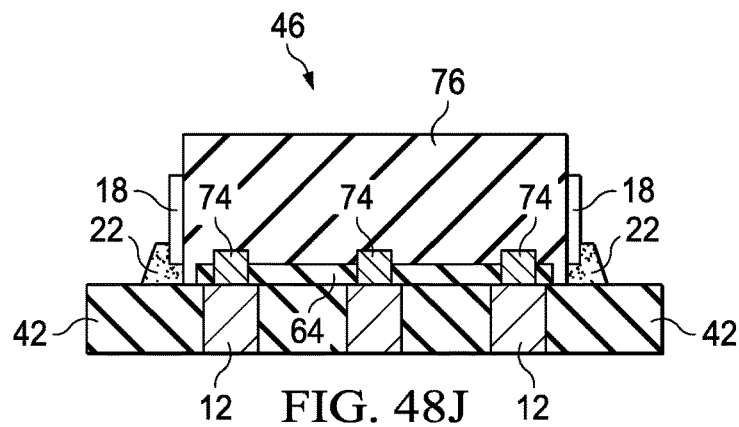

FIG. 48G is a cross-sectional view of integrated circuit (IC) die 18 attached, via die attach material 22, to a top surface of die attach pad 14 of pre-molded lead frame unit 46 along reference line L5-L5 in FIG. 48A. In this example, each half-blanket base or foundation insulating layer 64 includes rectangular channel or grooves 58 filled with conductive material (e.g., conductive trace or interconnect 74) from bond pads 50 on die 18 to leads 12. In FIG. 48G blanket cover insulating layer 76 is shown covering the top and side surfaces of half-blanket base or foundation insulating layer 64. However, some examples may not require blanket cover insulating layer 76 to extend laterally beyond side surfaces of half-blanket base or foundation insulating layers 64 when conductive trace or interconnects 74 are otherwise sealed within half-blanket base or foundation insulating layers 64 and blanket cover insulating layer 76. FIG. 48H is a cross-sectional view of integrated circuit (IC) die 18 attached, via die attach material 22, to a top surface of die attach pad 14 of pre-molded lead frame unit 46 along reference line M5-M5 in FIG. 48A, which shows a half-blanket base or foundation insulating layer 64, conductive trace or interconnects 74 and blanket cover insulating layer 76 extending down a vertical side of die 18 to die pad 46. FIG. 48I is a cross-sectional view of integrated circuit (IC) die 18 attached, via die attach material 22, to a top surface of die attach pad 14 of pre-molded lead frame unit 46 along reference line W5-W5 in FIG. 48A, which shows conductive trace or interconnects 74, now horizontally oriented on a half-blanket base or foundation insulating layer 64, as conductive trace or interconnects 74 prepare to extend horizontally to leads 12. FIG. 48J is a cross-sectional view of integrated circuit (IC) die 18 attached, via die attach material 22, to a top surface of die attach pad 14 of pre-molded lead frame unit 46 along reference line V5-V5 in FIG. 48A, which shows a distal end of each conductive trace or interconnect 74 as it extends down through a through hole or void 56 in a half-blanket base or foundation layer 64 to contact an upper surface of a respective lead 12.

Figure 48K:
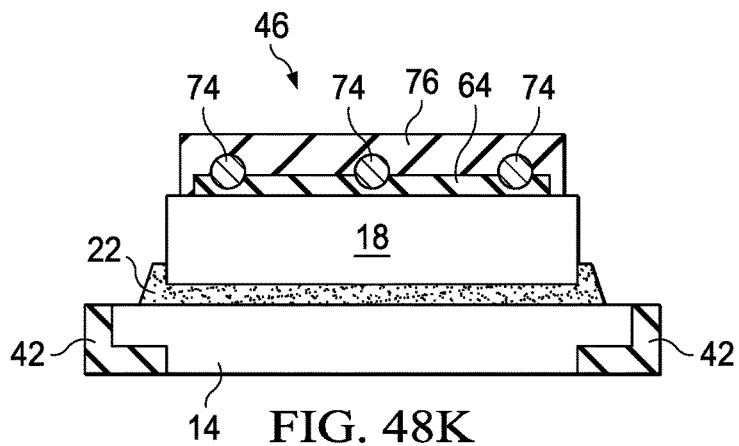
Figure 48L:
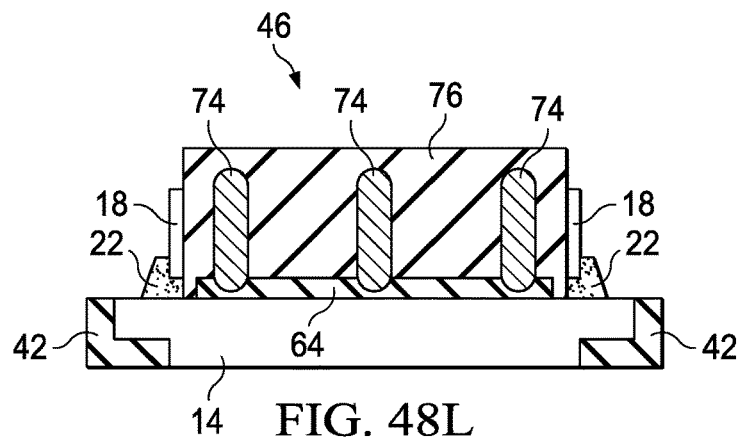
Figure 48M:
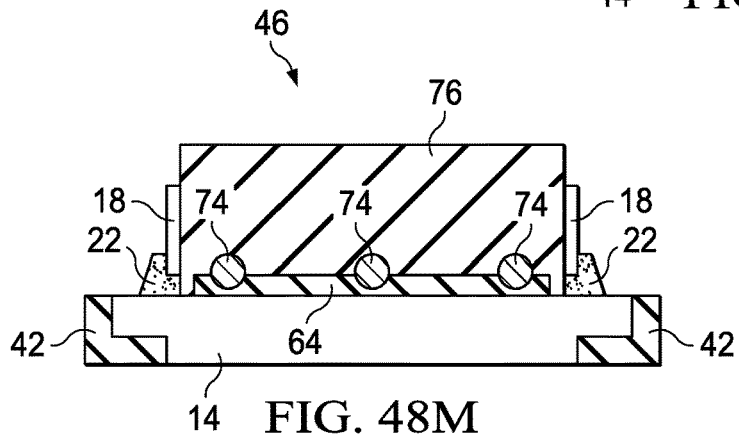
Figure 48N:
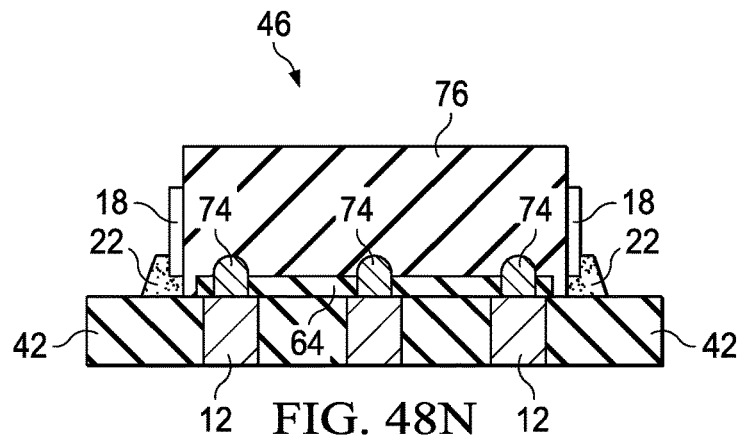

FIG. 48K is a cross-sectional view of integrated circuit (IC) die 18 attached, via die attach material 22, to a top surface of die attach pad 14 of pre-molded lead frame unit 46 along reference line L5-L5 in FIG. 48A. In this example, half-blanket base or foundation insulating layers 64 include semi-circular channel or grooves 60 filled with conductive material (e.g., conductive trace or interconnect 74) from bond pads 50 on die 18 to leads 12. In FIG. 48K blanket cover insulating layer 76 is shown covering the top and side surfaces of a half-blanket base or foundation insulating layer 64. However, some examples may not require blanket cover insulating layer 76 to extend laterally beyond side surfaces of half-blanket base or foundation insulating layers 64 when conductive trace or interconnects 74 are otherwise sealed within half-blanket base or foundation insulating layers 64 and blanket cover insulating layer 76. FIG. 48L is a cross-sectional view of integrated circuit (IC) die 18 attached, via die attach material 22, to a top surface of die attach pad 14 of pre-molded lead frame unit 46 along reference line M5-M5 in FIG. 48A, which shows a half-blanket base or foundation insulating layer 64, conductive trace or interconnects 74 and blanket cover insulating layer 76 extending down a vertical side of die 18 to die pad 46. FIG. 48M is a cross-sectional view of integrated circuit (IC) die 18 attached, via die attach material 22, to a top surface of die attach pad 14 of pre-molded lead frame unit 46 along reference line W5-W5 in FIG. 48A, which shows conductive trace or interconnects 74, now horizontally oriented on a half-blanket base or foundation insulating layer 64, as conductive trace or interconnects 74 prepare to extend horizontally to leads 12. FIG. 48N is a cross-sectional view of integrated circuit (IC) die 18 attached, via die attach material 22, to a top surface of die attach pad 14 of pre-molded lead frame unit 46 along reference line V5-V5 in FIG. 48A, which shows a distal end of each conductive trace or interconnect 74 as it extends down through a through hole or void 56 in a half-blanket base or foundation layer 64 to contact an upper surface of a respective lead 12.

Figure 48O:
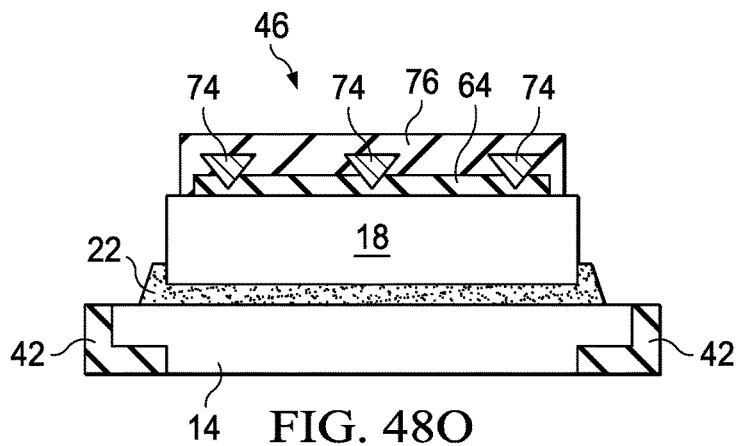
Figure 48P:
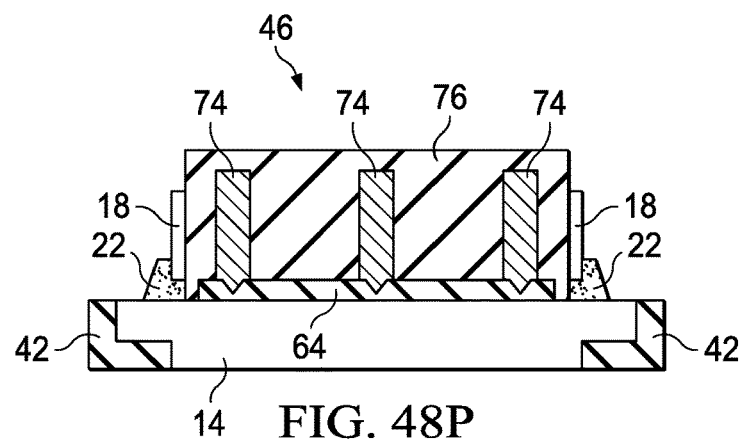
Figure 48Q:
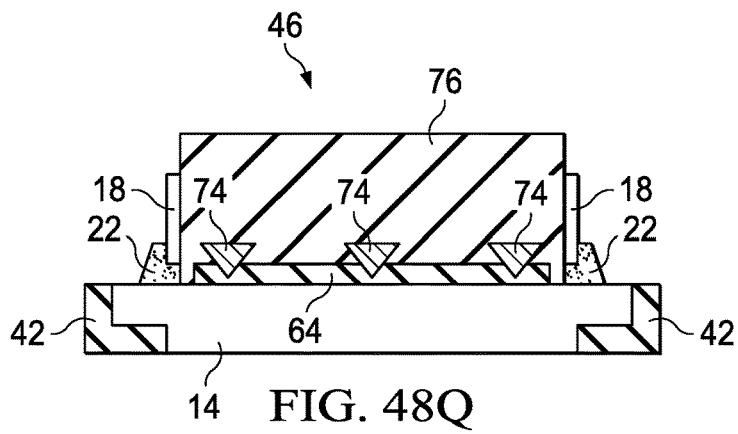
Figure 48R:
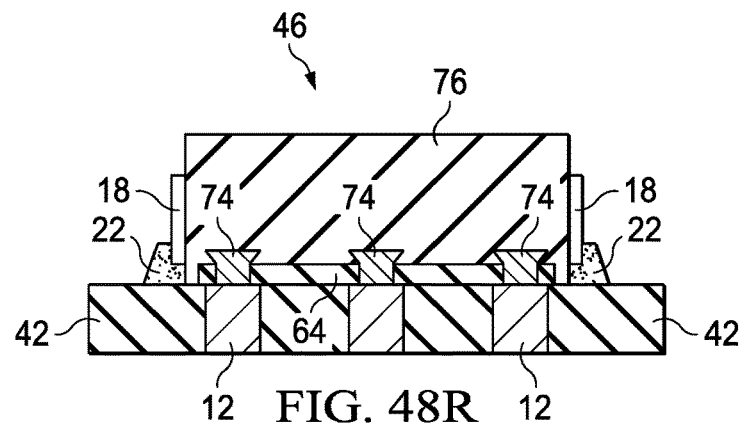

FIG. 48O is a cross-sectional view of integrated circuit (IC) die 18 attached, via die attach material 22, to a top surface of die attach pad 14 of pre-molded lead frame unit 46 along reference line L5-L5 in FIG. 48A. In this example, half-blanket base or foundation insulating layers 64 includes v-shaped channel or grooves 62 filled with conductive material (e.g., conductive trace or interconnect 74) from bond pads 50 on die 18 to leads 12. In FIG. 48O blanket cover insulating layer 76 is shown covering the top and side surfaces of a half-blanket base or foundation insulating layer 64. However, some examples may not require blanket cover insulating layer 76 to extend laterally beyond side surfaces of half-blanket base or foundation insulating layers 64 when conductive trace or interconnects 74 are otherwise sealed within half-blanket base or foundation insulating layer 64 and blanket cover insulating layer 76. FIG. 48P is a cross-sectional view of integrated circuit (IC) die 18 attached, via die attach material 22, to a top surface of die attach pad 14 of pre-molded lead frame unit 46 along reference line M5-M5 in FIG. 48A, which shows a half-blanket base or foundation insulating layer 64, conductive trace or interconnects 74 and blanket cover insulating layer 76 extending down a vertical side of die 18 to die pad 46. FIG. 48Q is a cross-sectional view of integrated circuit (IC) die 18 attached, via die attach material 22, to a top surface of die attach pad 14 of pre-molded lead frame unit 46 along reference line W5-W5 in FIG. 48A, which shows conductive trace or interconnects 74, now horizontally oriented on a half-blanket base or foundation insulating layer 64, as conductive trace or interconnects 74 prepare to extend horizontally to leads 12. FIG. 48R is a cross-sectional view of integrated circuit (IC) die 18 attached, via die attach material 22, to a top surface of die attach pad 14 of pre-molded lead frame unit 46 along reference line V5-V5 in FIG. 48A, which shows a distal end of each conductive trace or interconnect 74 as it extends down through a through hole or void 56 in a half-blanket base or foundation layer 64 to contact an upper surface of a respective lead 12.

Figure 49A:
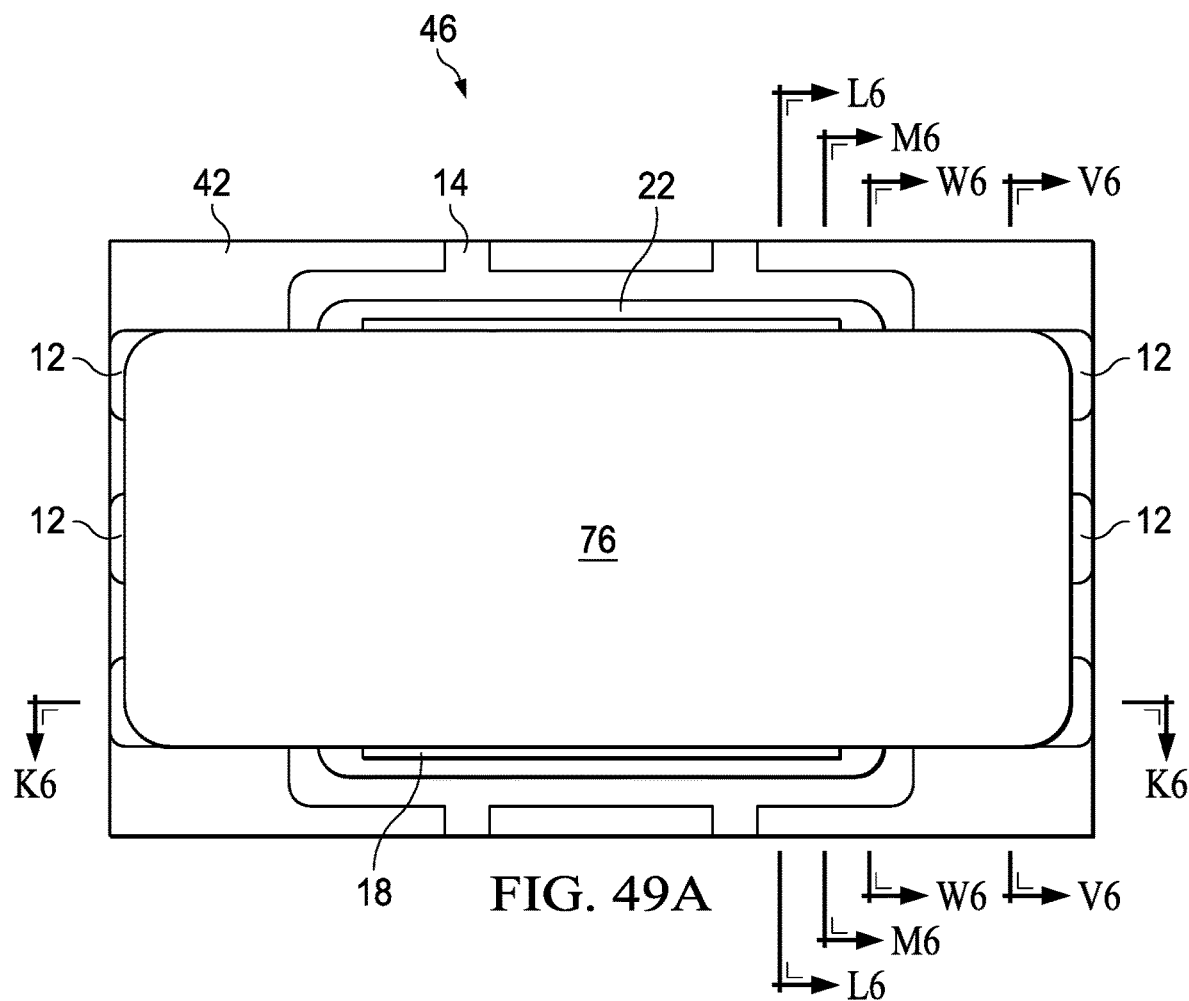
FIG. 49A is a top view of an electronic assembly undergoing fabrication according to the example method 500 of FIG. 5 with the implementation at 514, wherein a second insulating layer, e.g., a blanket cover insulating layer, 76 is printed, deposited, formed or otherwise applied over exposed portions of individual base or foundation insulating layers 66, and exposed portions of each conductive trace or interconnect 74 on an individual blanket base or foundation insulating layer 66 (see FIGS. 42A & 42B), each spanning a portion of a top surface of lead fingers 12 in pre-molded lead frame 46, across pre-mold 42, up one side of die 18, across a portion of the top of die 18 just beyond a bond pad 50 closest to the side of die 18 upon which the respective individual base or foundation insulating layer 66 is adjacent.

Blanket Cover Insulating Layer Over Individual Base or Foundation Insulating Layers FIG. 49A shows a second insulating layer, e.g., a blanket cover insulating layer, 76 is printed, deposited, formed or otherwise applied over exposed portions of individual base or foundation insulating layers 66, and exposed portions of each conductive trace or interconnect 74 on an individual blanket base or foundation insulating layer 66 (see FIGS. 42A & 42B), each spanning a portion of a top surface of lead fingers 12 in pre-molded lead frame 46, across pre-mold 42, up one side of die 18, across a portion of the top of die 18 just beyond a bond pad 50 closest to the side of die 18 upon which the respective individual base or foundation insulating layer 66 is adjacent (e.g., at 514 in FIG. 5). There remain multiple areas on top of die 18 between the individual base or foundation insulating layers 66 on each side of the top of the die and between the two rows of dies on the top side of the die remains uncovered by any base or foundation layer. Optionally blanket cover insulating layer 76 can be cured at this time, or later with additional layers. A polymer, epoxy, silicon, mold, or other insulators can be used for blanket cover insulating layer 76. Blanket cover insulating layer 76 follows the contours of the topology on individual base or foundation insulating layers 66 and the conductive traces or interconnects 74 formed on the individual base or foundation insulating layers 66, at least sufficiently to ensure that all conductive traces or interconnects 74 are wrapped or sealed between a respective individual base or foundation insulating layer 66 and blanket cover insulating layer 76. As can be seen in FIG. 49A, blanket cover insulating layer 76 covers all individual base or foundation insulating layers 66, conductive traces or interconnects 74 on half-blanket base or foundation insulating layers 66 and the uninsulated portion of the top of die 18 between individual base or foundation insulating layers 66. Blanket cover insulating layer 76 can be formed or deposited using one of multiple techniques such as screen-printing, photolithography and etching, CVD, PVD, vacuum evaporation, inkjet printing, spray coating, microdispensing, aerosol jet, ElectroHydroDynamic (EHD) techniques with the appropriate insulating properties.

If inkjet printing is used, blanket cover insulating layer 76 can be formed from an inkjet deposition compatible polymer such as a polyimide ink, a thermally curable epoxy-based polymer ink, and a UV-curable acrylate ink. It is preferred that a polymer with a modulus less than 3.4 GPa and more preferred less than 2 GPa be used, to avoid undue stress on the assembly. A thickness of the blanket cover insulating layer 76 can be in the range of about 2 µm to 35 µm. A more preferred range is about 2 µm to not more than 20 µm, and still more preferred in a range from about 2 µm to about 10 µm. Because the inkjet solvent deposition material has a solvent, the initial thickness, after the solvent dissipates, the remaining material forms the insulating layer at a reduced thickness. To achieve the desired thickness, multiple inkjet depositions can be performed (e.g., at 1302 in FIG. 13). Inkjet deposition allows precise placement of material by using "drop on demand" (DOD) technology, where a reservoir of the liquid has a nozzle and a small volume of the liquid is forced from the nozzle in response to an electrical signal. The liquid forms a drop as it falls vertically onto a surface.

Figure 49B:
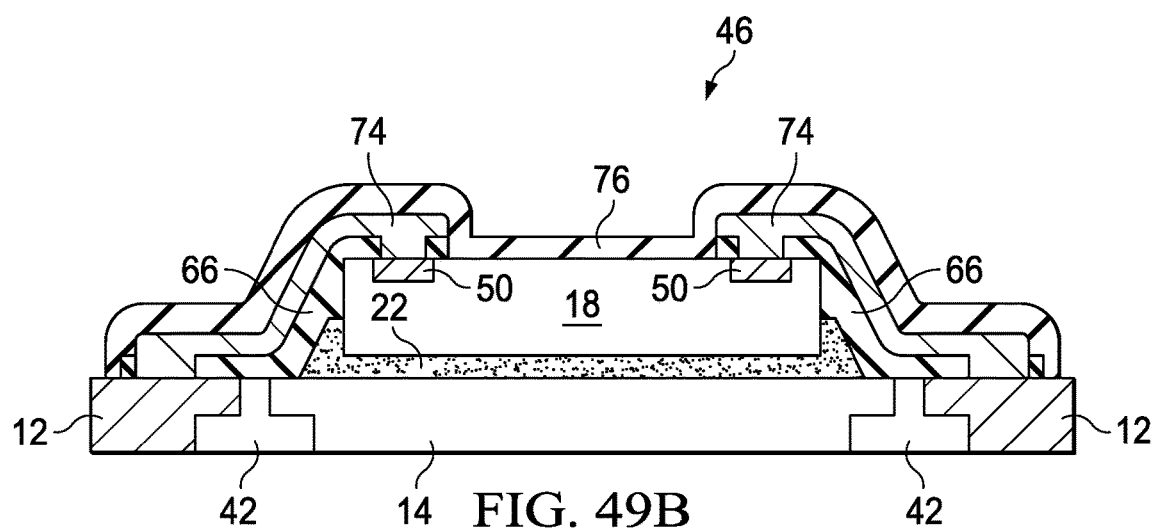
FIGS. 49B-49R are cross-sectional views of the electronic assembly of FIG. 49A along various reference lines.

The precision of the inkjet deposition tool allows deposition of the liquid material in some areas and not in others as the tool traverses across the surface (or if the tool is fixed, as the surface moves beneath the tool). Because the insulating material can be very accurately placed even in small areas, no etch or material removal step is needed to remove material after the inkjet deposition. A single pass deposition increases manufacturing throughput and reduces costs but may not produce the more accurate and/or desirable results from multiple pass deposition. As additional inkjet materials are developed, a reduction in the amount of solvent can reduce the initial thickness needed and thereby reduce the need for multiple pass depositions. FIG. 49B is a cross-sectional view of integrated circuit (IC) die 18 attached, via die attach material 22, to a top surface of die attach pad 14 of pre-molded lead frame unit 46 along reference line K6-K6 in FIG. 49A. The orientation of individual base or foundation insulating layers 66, conductive trace 9 interconnects 74 and blanket cover insulating layer 76 is also shown in FIG. 49A.

Figure 49C:
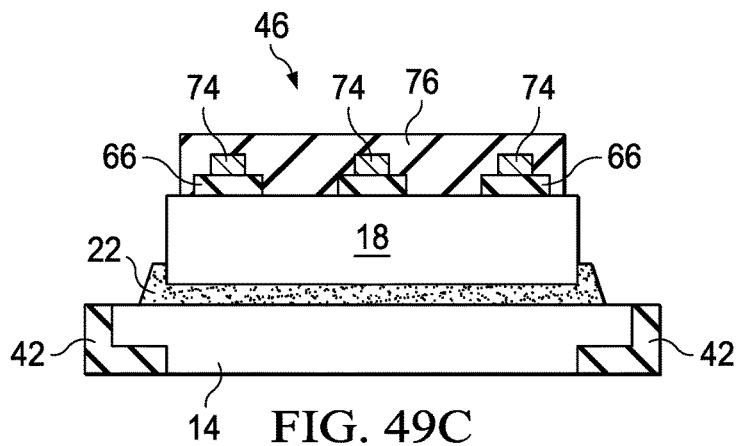
Figure 49D:
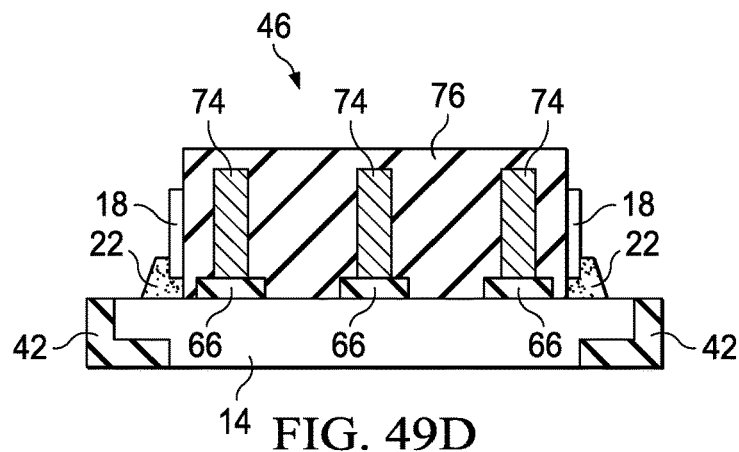
Figure 49E:
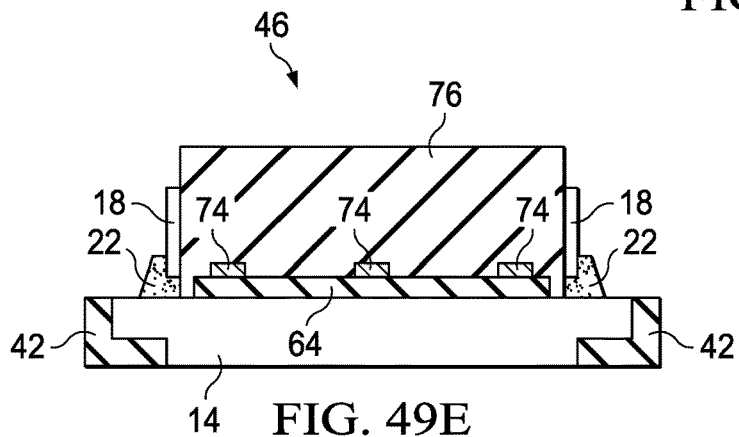
Figure 49F:
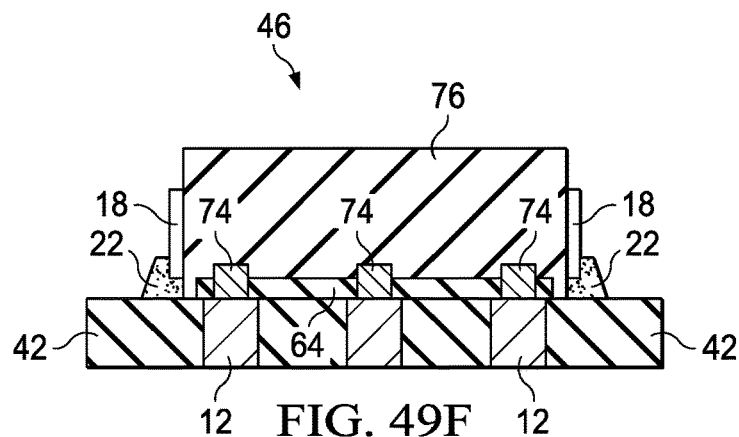

FIG. 49C is a cross-sectional view of integrated circuit (IC) die 18 attached, via die attach material 22, to a top surface of die attach pad 14 of pre-molded lead frame unit 46 along reference line L6-L6 in FIG. 49A, according to one example. In FIG. 49C blanket cover insulating layer 76 is shown covering the top and side surfaces of individual base or foundation insulating layers 66. FIG. 49D is a cross-sectional view of integrated circuit (IC) die 18 attached, via die attach material 22, to a top surface of die attach pad 14 of pre-molded lead frame unit 46 along reference line M6-M6 in FIG. 49A, which shows the individual base or foundation insulating layers 66 (three shown), conductive trace or interconnects 74 and blanket cover insulating layer 76 extending down a vertical side of die 18 to die pad 46. FIG. 49E is a cross-sectional view of integrated circuit (IC) die 18 attached, via die attach material 22, to a top surface of die attach pad 14 of pre-molded lead frame unit 46 along reference line W6-W6 in FIG. 49A, which shows conductive trace or interconnects 74, each now horizontally oriented on an individual base or foundation insulating layer 66, as conductive trace or interconnects 74 prepare to extend horizontally to leads 12. FIG. 49F is a cross-sectional view of integrated circuit (IC) die 18 attached, via die attach material 22, to a top surface of die attach pad 14 of pre-molded lead frame unit 46 along reference line V6-V6 in FIG. 49A, which shows a distal end of each conductive trace or interconnect 74 as it extends down through a through hole or void 56 in a respective base or foundation layer 66 to contact an upper surface of a respective lead 12.

Figure 49G:
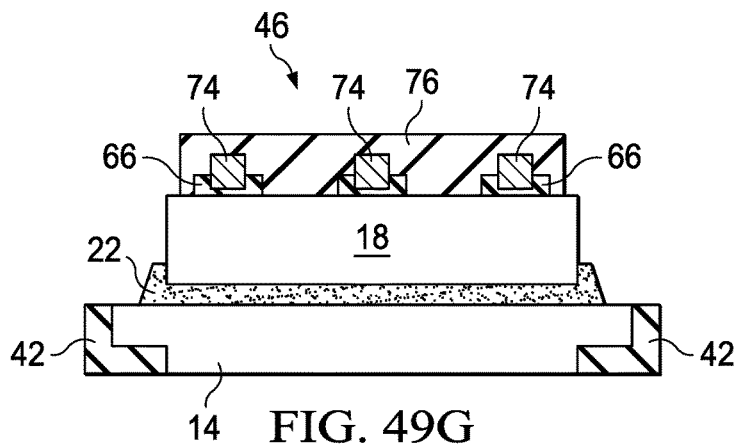
Figure 49H:
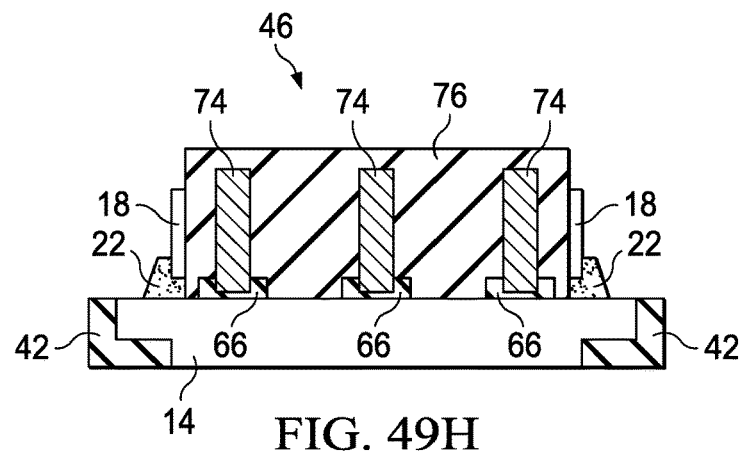
Figure 49I:
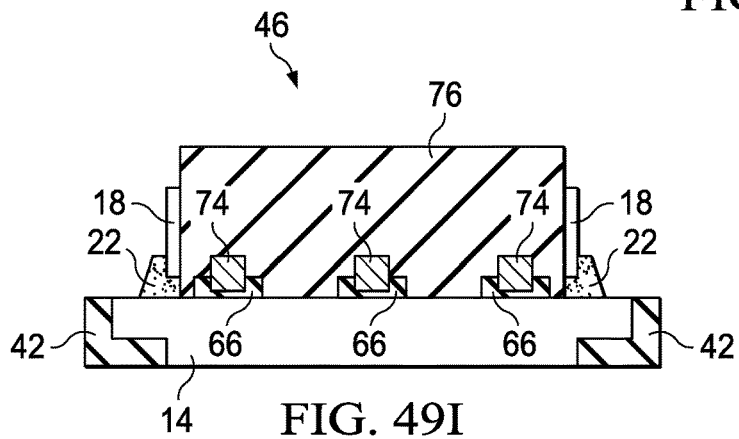
Figure 49J:
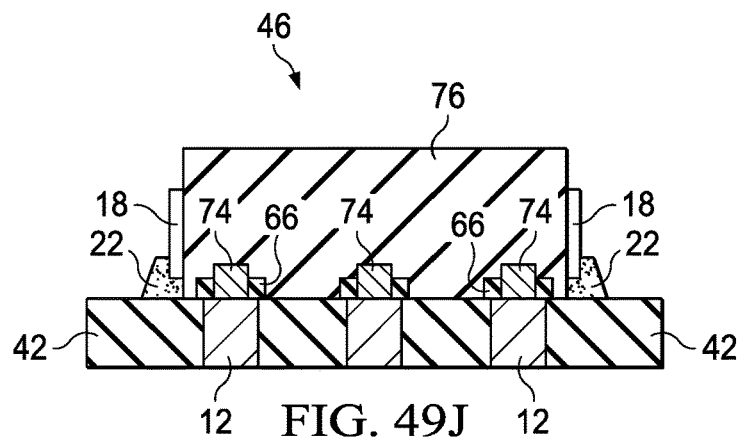

FIG. 49G is a cross-sectional view of integrated circuit (IC) die 18 attached, via die attach material 22, to a top surface of die attach pad 14 of pre-molded lead frame unit 46 along reference line L6-L6 in FIG. 49A. In this example, each individual base or foundation insulating layer 66 includes a rectangular channel or groove 58 filled with conductive material (e.g., conductive trace or interconnect 74) from a bond pad 50 on die 18 to a lead 12. In FIG. 49G blanket cover insulating layer 76 is shown covering the top and side surfaces of individual base or foundation insulating layer 66. FIG. 49H is a cross-sectional view of integrated circuit (IC) die 18 attached, via die attach material 22, to a top surface of die attach pad 14 of pre-molded lead frame unit 46 along reference line M6-M6 in FIG. 49A, which shows individual base or foundation insulating layers 66, conductive trace or interconnects 74 and blanket cover insulating layer 76 extending down a vertical side of die 18 to die pad 46. FIG. 49I is a cross-sectional view of integrated circuit (IC) die 18 attached, via die attach material 22, to a top surface of die attach pad 14 of pre-molded lead frame unit 46 along reference line W6-W6 in FIG. 49A, which shows conductive trace or interconnects 74, each now horizontally oriented on a respective base or foundation insulating layer 66, as conductive trace or interconnects 74 prepare to extend horizontally to leads 12. FIG. 49J is a cross-sectional view of integrated circuit (IC) die 18 attached, via die attach material 22, to a top surface of die attach pad 14 of pre-molded lead frame unit 46 along reference line V6-V6 in FIG. 49A, which shows a distal end of each conductive trace or interconnect 74 as it extends down through a through hole or void 56 in a respective base or foundation layer 66 to contact an upper surface of a respective lead 12.

Figure 49K:
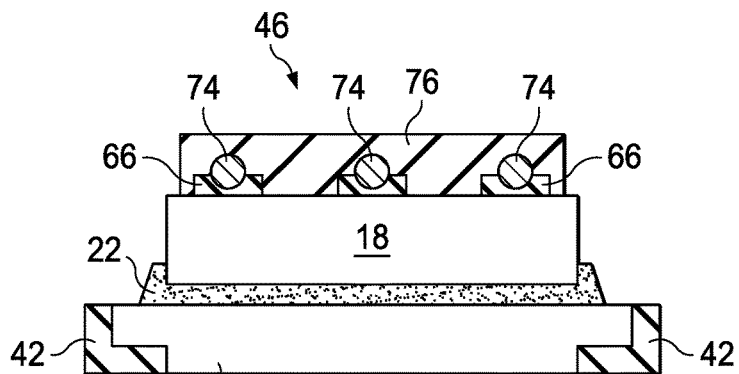
Figure 49L:
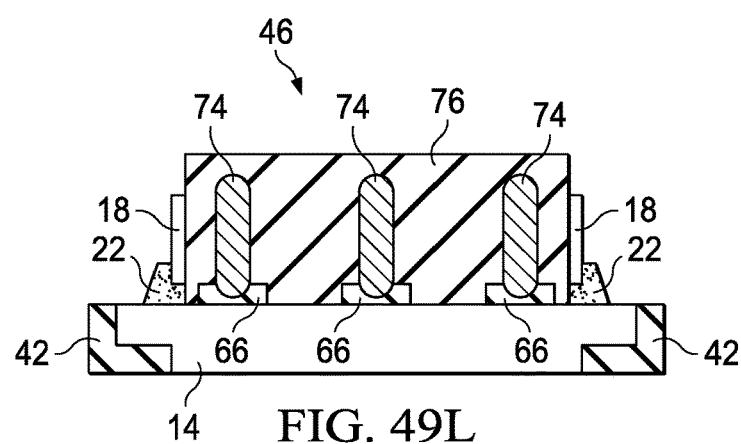
Figure 49M:
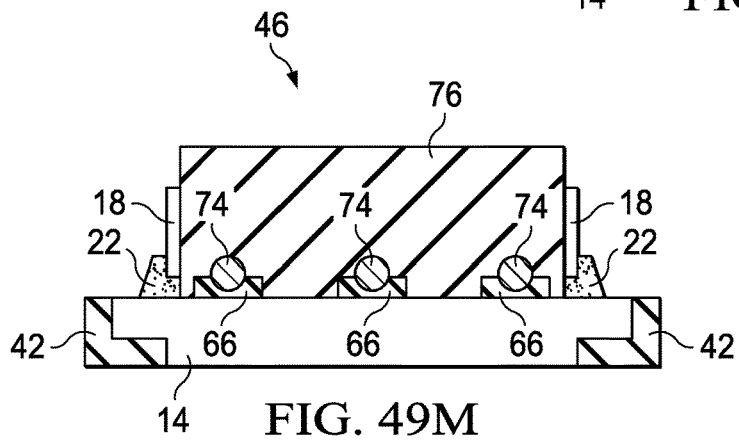
Figure 49N:
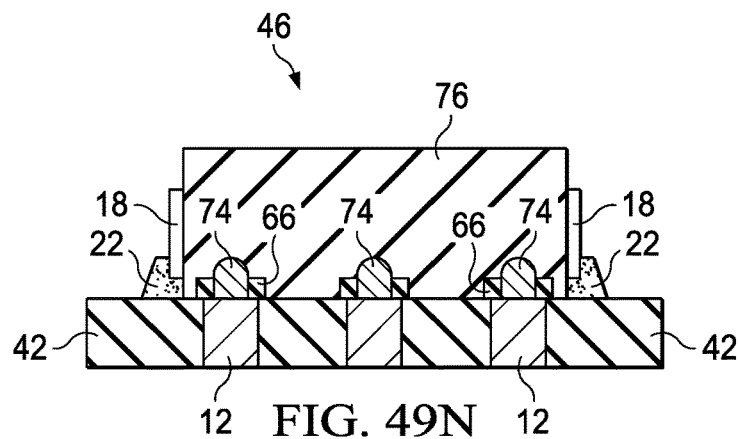

FIG. 49K is a cross-sectional view of integrated circuit (IC) die 18 attached, via die attach material 22, to a top surface of die attach pad 14 of pre-molded lead frame unit 46 along reference line L6-L6 in FIG. 49A. In this example, each individual base or foundation insulating layers 66 includes a semi-circular channel or groove 60 filled with conductive material (e.g., conductive trace or interconnect 74) from a bond pad 50 on die 18 to a lead 12. In FIG. 49K blanket cover insulating layer 76 is shown covering the top and side surfaces of individual base or foundation insulating layers 66. FIG. 49L is a cross-sectional view of integrated circuit (IC) die 18 attached, via die attach material 22, to a top surface of die attach pad 14 of pre-molded lead frame unit 46 along reference line M6-M6 in FIG. 49A, which shows individual base or foundation insulating layers 66, conductive trace or interconnects 74 and blanket cover insulating layer 76 extending down a vertical side of die 18 to die pad 46. FIG. 49M is a cross-sectional view of integrated circuit (IC) die 18 attached, via die attach material 22, to a top surface of die attach pad 14 of pre-molded lead frame unit 46 along reference line W6-W6 in FIG. 49A, which shows conductive trace or interconnects 74, each horizontally oriented on a respective base or foundation insulating layer 66, as conductive trace or interconnects 74 prepare to extend horizontally to leads 12. FIG. 49N is a cross-sectional view of integrated circuit (IC) die 18 attached, via die attach material 22, to a top surface of die attach pad 14 of pre-molded lead frame unit 46 along reference line V6-V6 in FIG. 49A, which shows a distal end of each conductive trace or interconnect 74 as it extends down through a through hole or void 56 in a respective individual base or foundation layer 66 to contact an upper surface of a respective lead 12.

Figure 49O:
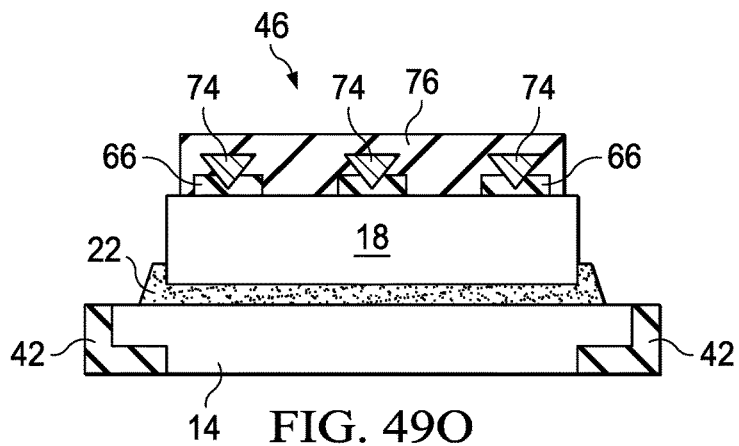
Figure 49P:
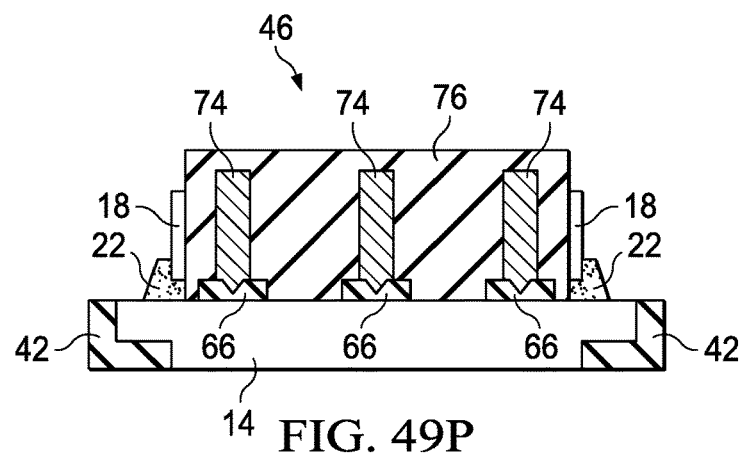
Figure 49Q:
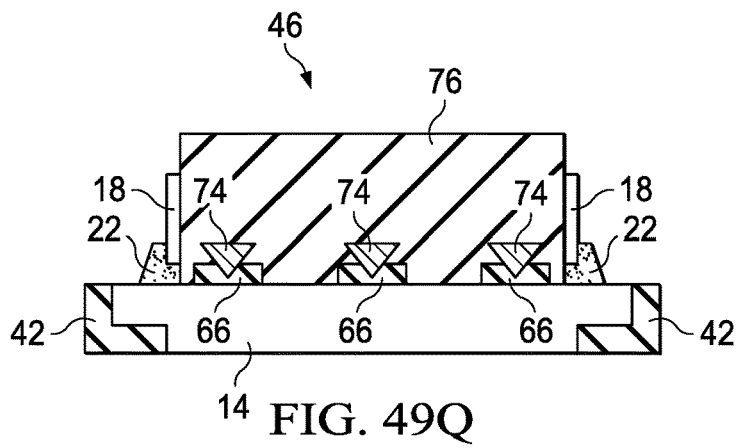
Figure 49R:
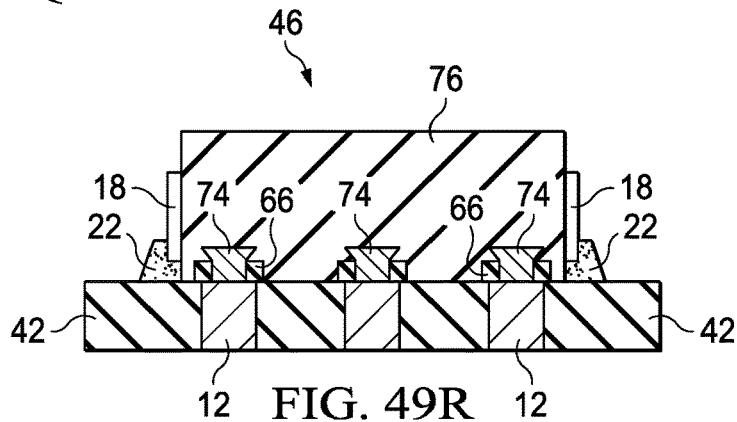

FIG. 49O is a cross-sectional view of integrated circuit (IC) die 18 attached, via die attach material 22, to a top surface of die attach pad 14 of pre-molded lead frame unit 46 along reference line L6-L6 in FIG. 49A. In this example, each base or foundation insulating layer 66 includes a v-shaped channel or groove 62 filled with conductive material (e.g., conductive trace or interconnect 74) from a bond pads 50 on die 18 to a lead 12. In FIG. 49O blanket cover insulating layer 76 is shown covering the top and side surfaces of the individual base or foundation insulating layers 66. FIG. 49P is a cross-sectional view of integrated circuit (IC) die 18 attached, via die attach material 22, to a top surface of die attach pad 14 of pre-molded lead frame unit 46 along reference line M6-M6 in FIG. 49A, which shows individual base or foundation insulating layers 66, conductive trace or interconnects 74 and blanket cover insulating layer 76 extending down a vertical side of die 18 to die pad 46. FIG. 49Q is a cross-sectional view of integrated circuit (IC) die 18 attached, via die attach material 22, to a top surface of die attach pad 14 of pre-molded lead frame unit 46 along reference line W6-W6 in FIG. 49A, which shows conductive trace or interconnects 74, now each horizontally oriented on a respective base or foundation insulating layer 66, as conductive trace or interconnects 74 prepare to extend horizontally to leads 12. FIG. 49R is a cross-sectional view of integrated circuit (IC) die 18 attached, via die attach material 22, to a top surface of die attach pad 14 of pre-molded lead frame unit 46 along reference line V6-V6 in FIG. 49A, which shows a distal end of each conductive trace or interconnect 74 as it extends down through a through hole or void 56 in a half-blanket base or foundation layer 64 to contact an upper surface of a respective lead 12.

Figure 50A:
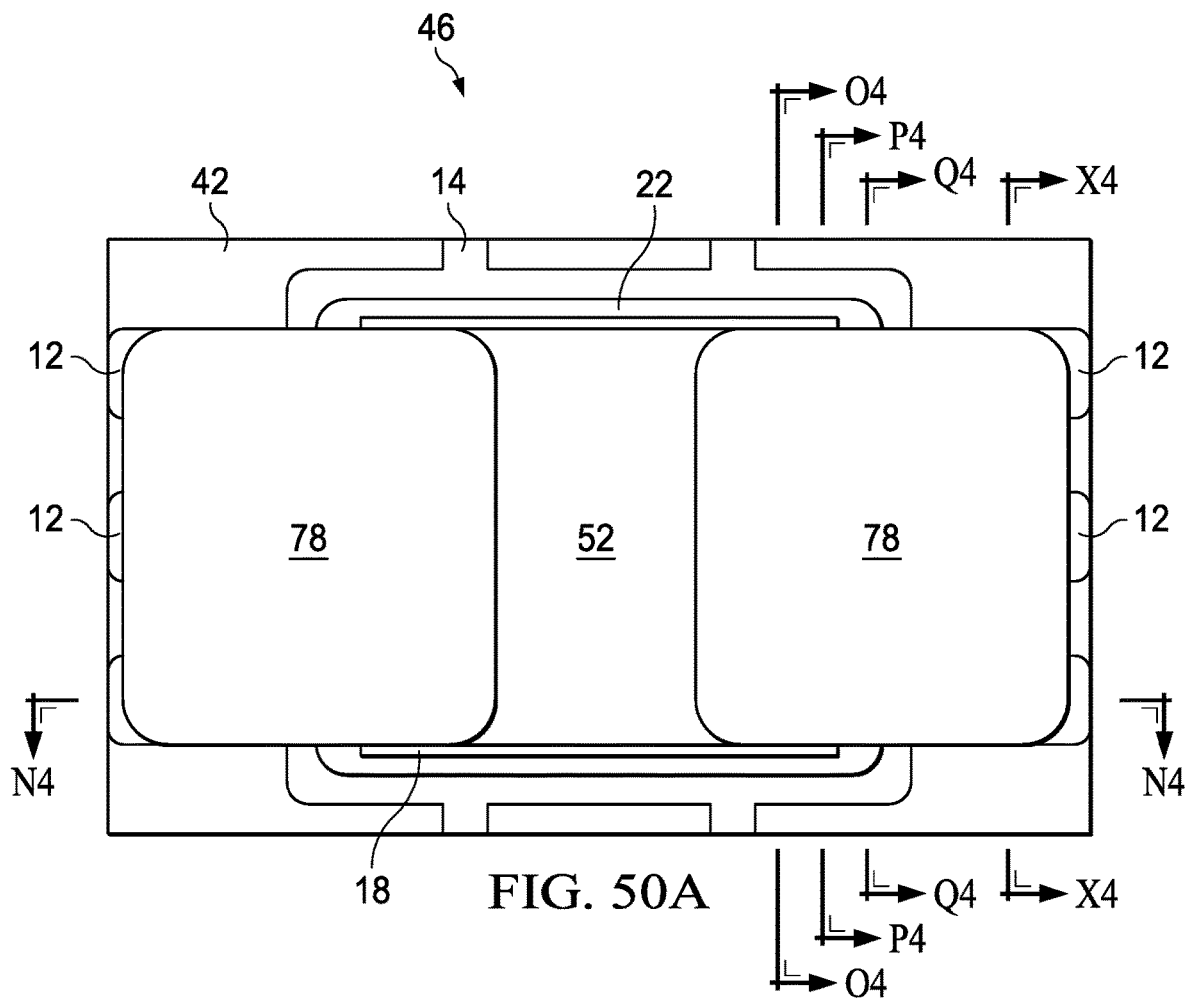
FIG. 50A is a top view of an electronic assembly undergoing fabrication according to the example method 500 of FIG. 5 with the implementation at 514, wherein two half-blanket cover insulating layers 78, each printed, deposited, formed or otherwise applied over an exposed portion of blanket base or foundation insulating layer 52, and exposed portions of conductive traces or interconnects 74 on base or foundation insulating layer 52 (see FIGS. 40A & 40B), which spans a portion of a top surface of lead fingers 12 in pre-molded lead frame 46, across pre-mold 42, up one side of die 18, across the top of die 18, down an opposite side of die 18, across pre-mold 42 on an opposite side of pre-molded lead frame 46 and to a portion of a top surface of lead fingers 12 on the opposite side of pre-molded lead frame 46.

Half-Blanket Cover Insulating Layers Over Blanket Base or Foundation Insulating Layer FIG. 50A shows two half-blanket cover insulating layers 78, each printed, deposited, formed or otherwise applied over an exposed portion of blanket base or foundation insulating layer 52, and exposed portions of conductive traces or interconnects 74 on base or foundation insulating layer 52 (see FIGS. 40A & 40B), which spans a portion of a top surface of lead fingers 12 in pre-molded lead frame 46, across pre-mold 42, up one side of die 18, across the top of die 18, down an opposite side of die 18, across pre-mold 42 on an opposite side of pre-molded lead frame 46 and to a portion of a top surface of lead fingers 12 on the opposite side of pre-molded lead frame 46 (e.g., at 514 in FIG. 5). Optionally half-blanket cover insulating layer 78 can be cured at this time, or later with additional layers. A polymer, epoxy, silicon, mold, or other insulators can be used for half-blanket cover insulating layer 78. Each half-blanket cover insulating layer 78 follows the contours of the topology on blanket base or foundation insulating layer 52 and the conductive traces or interconnects 74 formed on blanket base or foundation insulating layer 52, at least sufficiently to ensure that all conductive traces or interconnects 74 are wrapped or sealed between blanket base or foundation insulating layer 52 and each half-blanket cover insulating layer 78. As can be seen in FIG. 50A, each half-blanket cover insulating layer 78 covers a portion of blanket base or foundation insulating layer 52, which covers the top surface of die 18 and side surfaces of die 18 which are adjacent bond pads 50 and conductive traces or interconnects 74 on blanket base or foundation insulating layer 52. Half-blanket cover insulating layers 78 can be formed or deposited using one of multiple techniques such as screen-printing, photolithography and etching, CVD, PVD, vacuum evaporation, inkjet printing, spray coating, microdispensing, aerosol jet, ElectroHydroDynamic (EHD) techniques with the appropriate insulating properties.

If inkjet printing is used, half-blanket cover insulating layers 78 can be formed from an inkjet deposition compatible polymer such as a polyimide ink, a thermally curable epoxy-based polymer ink, and a UV-curable acrylate ink. It is preferred that a polymer with a modulus less than 3.4 GPa and more preferred less than 2 GPa be used, to avoid undue stress on the assembly. A thickness of the blanket cover insulating layer 76 can be in the range of about 2 μm to 35 μm. A more preferred range is about 2 μm to not more than 20 μm, and still more preferred in a range from about 2 μm to about 10 μm. Because the inkjet solvent deposition material has a solvent, the initial thickness, after the solvent dissipates, the remaining material forms the insulating layer at a reduced thickness. To achieve the desired thickness, multiple inkjet depositions can be performed (e.g., at 1302 in FIG. 13). Inkjet deposition allows precise placement of material by using "drop on demand" (DOD) technology, where a reservoir of the liquid has a nozzle and a small volume of the liquid is forced from the nozzle in response to an electrical signal. The liquid forms a drop as it falls vertically onto a surface.

Figure 50B:
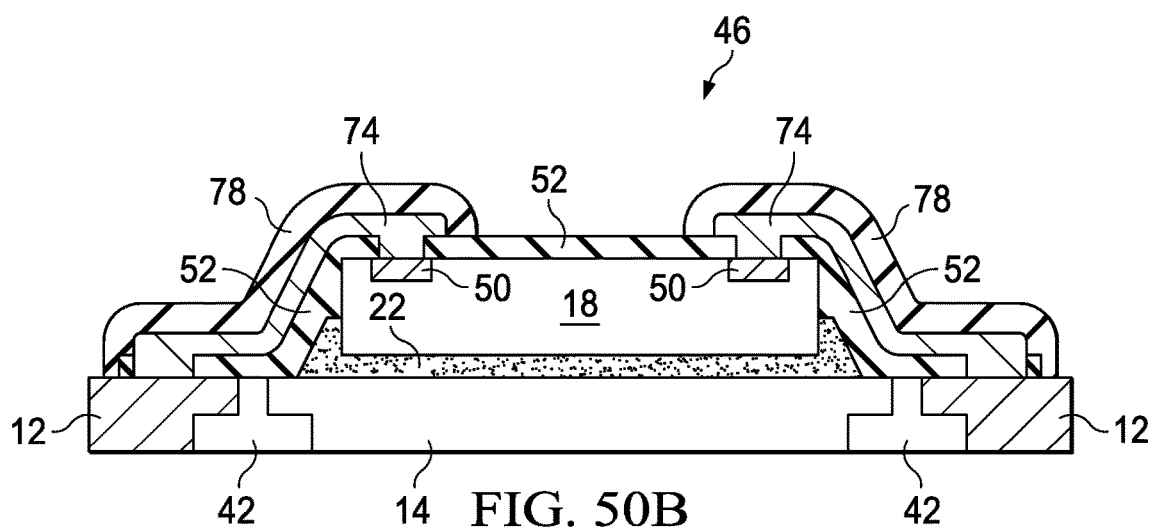
FIGS. 50B-50R are cross-sectional views of the electronic assembly of FIG. 50A along various reference lines.

The precision of the inkjet deposition tool allows deposition of the liquid material in some areas and not in others as the tool traverses across the surface (or if the tool is fixed, as the surface moves beneath the tool). Because the insulating material can be very accurately placed even in small areas, no etch or material removal step is needed to remove material after the inkjet deposition. A single pass deposition increases manufacturing throughput and reduces costs but may not produce the more accurate and/or desirable results from multiple pass deposition. As additional inkjet materials are developed, a reduction in the amount of solvent can reduce the initial thickness needed and thereby reduce the need for multiple pass depositions. FIG. 50B is a cross-sectional view of integrated circuit (IC) die 18 attached, via die attach material 22, to a top surface of die attach pad 14 of pre-molded lead frame unit 46 along reference line N4-N4 in FIG. 50A. The orientation of blanket base or foundation insulating layer 52, conductive trace or interconnects 74 and half-blanket cover insulating layers 78 is also shown in FIG. 50A.

Figure 50C:
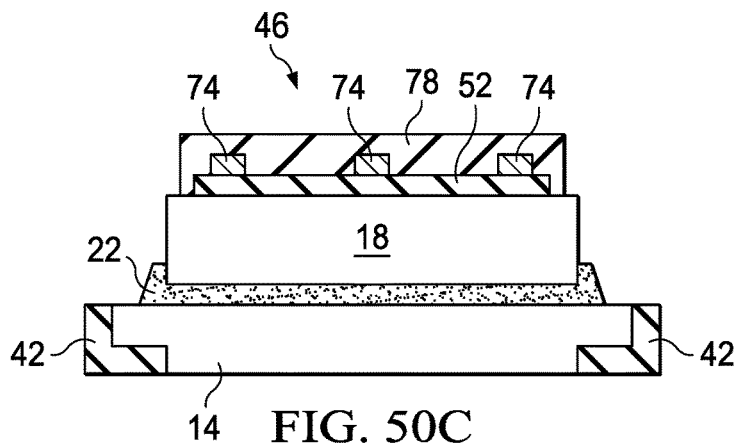
Figure 50D:
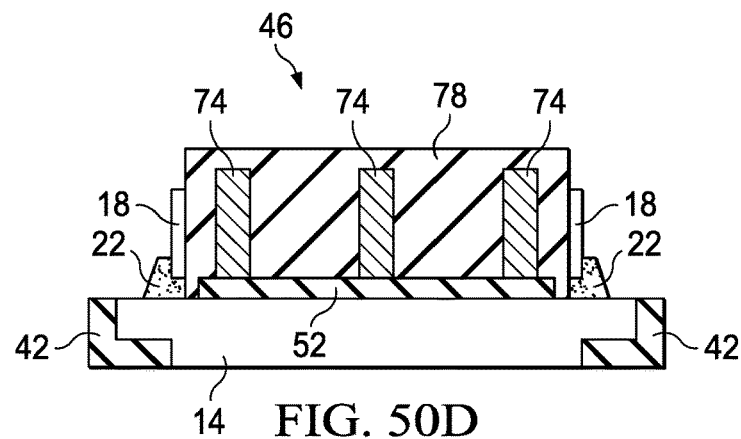
Figure 50E:
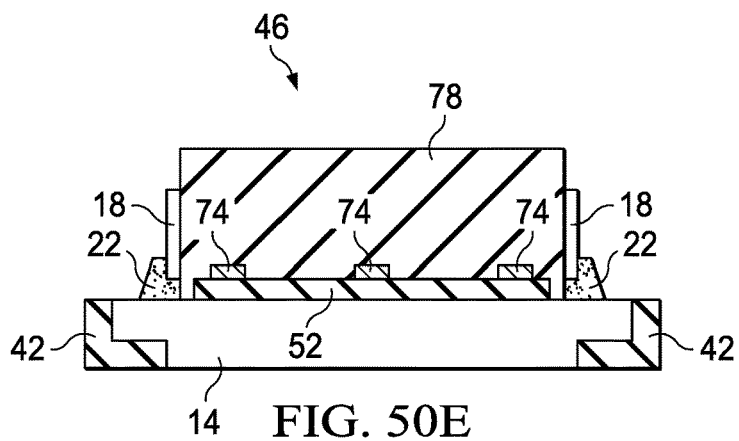
Figure 50F:
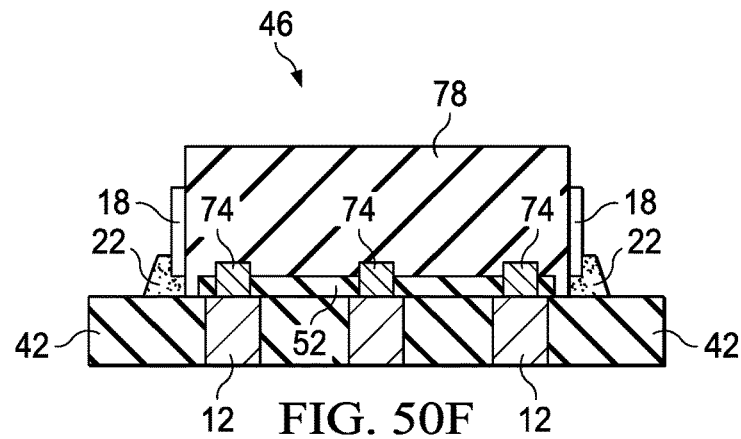

FIG. 50C is a cross-sectional view of integrated circuit (IC) die 18 attached, via die attach material 22, to a top surface of die attach pad 14 of pre-molded lead frame unit 46 along reference line O4-O4 in FIG. 50A, according to one example. In FIG. 50C a half-blanket cover insulating layer 78 is shown covering the top and side surfaces of a portion of blanket base or foundation insulating layer 52. However, some examples may not require half-blanket cover insulating layers 78 to extend laterally beyond side surfaces of blanket base or foundation insulating layer 52 when conductive trace or interconnects 74 are otherwise sealed within blanket base or foundation insulating layer 52 and each half-blanket cover insulating layer 78. FIG. 50D is a cross-sectional view of integrated circuit (IC) die 18 attached, via die attach material 22, to a top surface of die attach pad 14 of pre-molded lead frame unit 46 along reference line P4-P4 in FIG. 50A, which shows the blanket base or foundation insulating layer 52, conductive trace or interconnects 74 and a half-blanket cover insulating layer 78 extending down a vertical side of die 18 to die pad 46. FIG. 50E is a cross-sectional view of integrated circuit (IC) die 18 attached, via die attach material 22, to a top surface of die attach pad 14 of pre-molded lead frame unit 46 along reference line Q4-Q4 in FIG. 50A, which shows conductive trace or interconnects 74, now horizontally oriented on blanket base or foundation insulating layer 52, as conductive trace or interconnects 74 prepare to extend horizontally to leads 12. FIG. 50F is a cross-sectional view of integrated circuit (IC) die 18 attached, via die attach material 22, to a top surface of die attach pad 14 of pre-molded lead frame unit 46 along reference line X4-X4 in FIG. 50A, which shows a distal end of each conductive trace or interconnect 74 as it extends down through a through hole or void 56 in blanket base or foundation layer 52 to contact an upper surface of a respective lead 12.

Figure 50G:
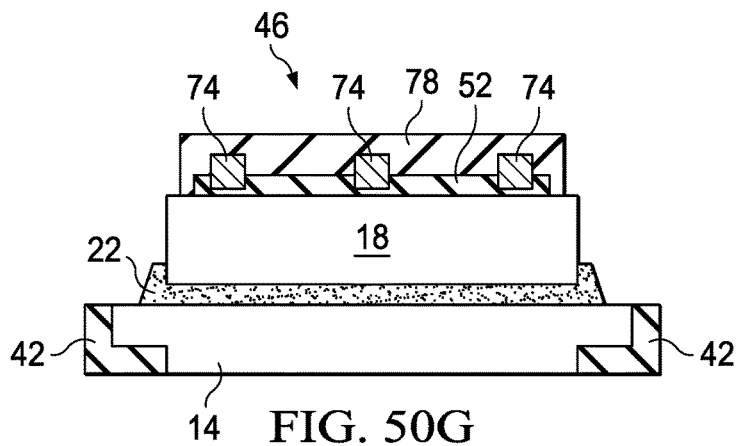
Figure 50H:
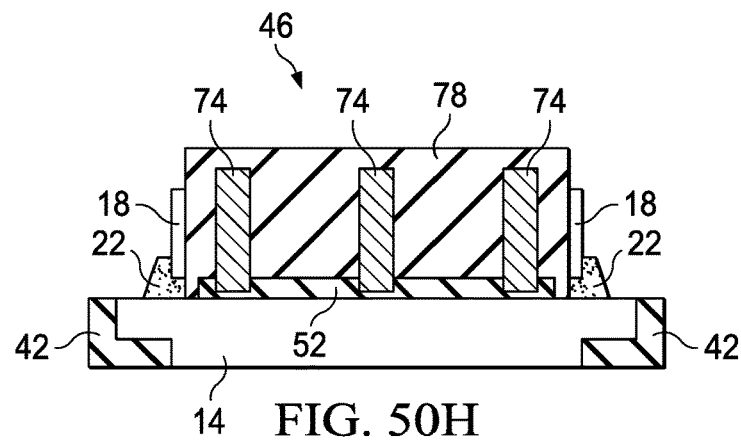
Figure 50I:
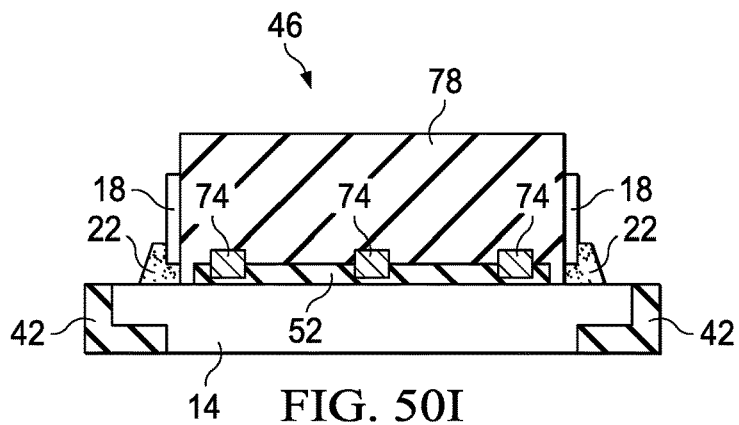
Figure 50J:
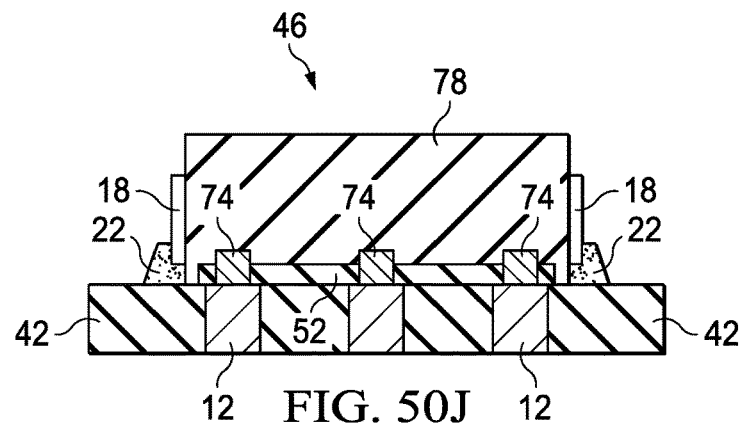

FIG. 50G is a cross-sectional view of integrated circuit (IC) die 18 attached, via die attach material 22, to a top surface of die attach pad 14 of pre-molded lead frame unit 46 along reference line O4-O4 in FIG. 50A. In this example, blanket base or foundation insulating layer 52 includes rectangular channel or grooves 58 filled with conductive material (e.g., conductive trace or interconnect 74) from bond pads 50 on die 18 to leads 12. In FIG. 50G a half-blanket cover insulating layer 78 is shown covering the top and side surfaces of a portion of blanket base or foundation insulating layer 52. However, some examples may not require half-blanket cover insulating layers 78 to extend laterally beyond side surfaces of blanket base or foundation insulating layer 52 when conductive trace or interconnects 74 are otherwise sealed within blanket base or foundation insulating layer 52 and a half-blanket cover insulating layer 78. FIG. 50H is a cross-sectional view of integrated circuit (IC) die 18 attached, via die attach material 22, to a top surface of die attach pad 14 of pre-molded lead frame unit 46 along reference line P4-P4 in FIG. 50A, which shows the blanket base or foundation insulating layer 52, conductive trace or interconnects 74 and a half-blanket cover insulating layer 78 extending down a vertical side of die 18 to die pad 46. FIG. 50I is a cross-sectional view of integrated circuit (IC) die 18 attached, via die attach material 22, to a top surface of die attach pad 14 of pre-molded lead frame unit 46 along reference line Q4-Q4 in FIG. 50A, which shows conductive trace or interconnects 74, now horizontally oriented on blanket base or foundation insulating layer 52, as conductive trace or interconnects 74 prepare to extend horizontally to leads 12. FIG. 50J is a cross-sectional view of integrated circuit (IC) die 18 attached, via die attach material 22, to a top surface of die attach pad 14 of pre-molded lead frame unit 46 along reference line X4-X4 in FIG. 50A, which shows a distal end of each conductive trace or interconnect 74 as it extends down through a through hole or void 56 in blanket base or foundation layer 52 to contact an upper surface of a respective lead 12.

Figure 50K:
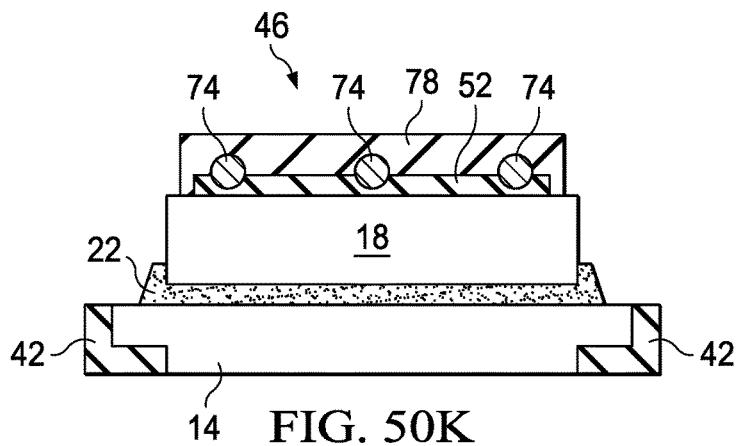
Figure 50L:
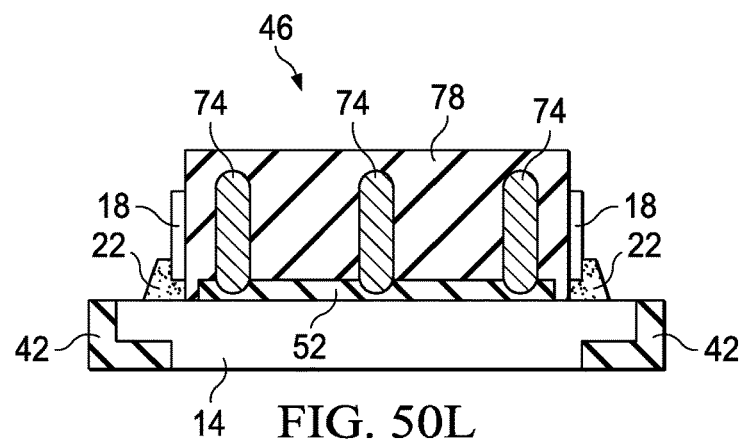
Figure 50M:
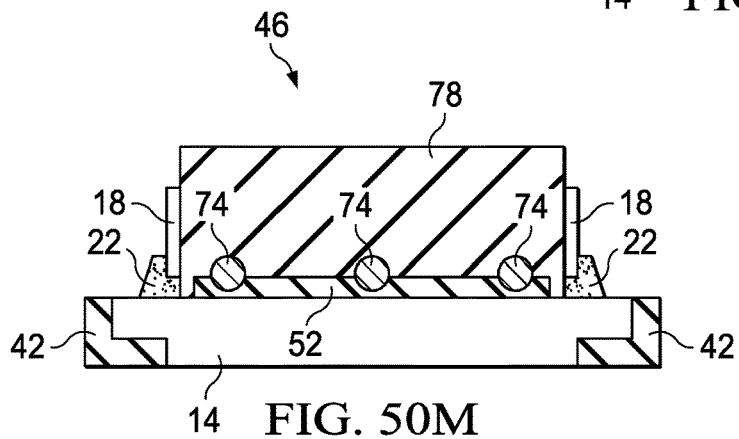
Figure 50N:
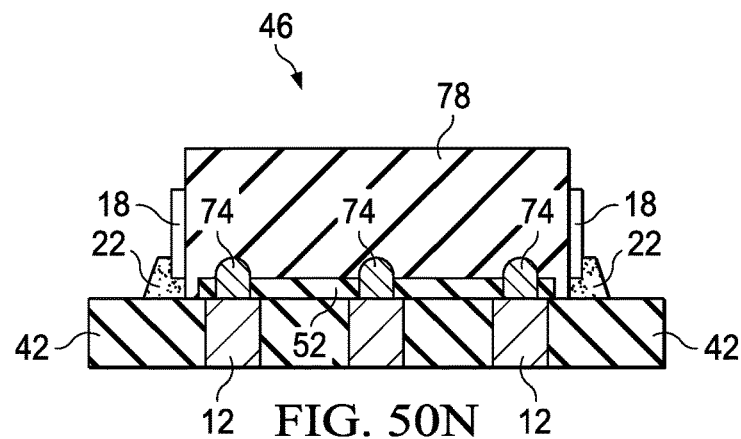

FIG. 50K is a cross-sectional view of integrated circuit (IC) die 18 attached, via die attach material 22, to a top surface of die attach pad 14 of pre-molded lead frame unit 46 along reference line O4-O4 in FIG. 50A. In this example, blanket base or foundation insulating layer 52 includes semi-circular channel or grooves 60 filled with conductive material (e.g., conductive trace or interconnect 74) from bond pads 50 on die 18 to leads 12. In FIG. 50K a half-blanket cover insulating layer 78 is shown covering a portion of the top and side surfaces of blanket base or foundation insulating layer 52. However, some examples may not require half-blanket cover insulating layers 78 to extend laterally beyond side surfaces of blanket base or foundation insulating layer 52 when conductive trace or interconnects 74 are otherwise sealed within blanket base or foundation insulating layer 52 and half-blanket cover insulating layers 78. FIG. 50L is a cross-sectional view of integrated circuit (IC) die 18 attached, via die attach material 22, to a top surface of die attach pad 14 of pre-molded lead frame unit 46 along reference line P4-P4 in FIG. 50A, which shows the blanket base or foundation insulating layer 52, conductive trace or interconnects 74 and a half-blanket cover insulating layer 78 extending down a vertical side of die 18 to die pad 46. FIG. 50M is a cross-sectional view of integrated circuit (IC) die 18 attached, via die attach material 22, to a top surface of die attach pad 14 of pre-molded lead frame unit 46 along reference line Q4-Q4 in FIG. 50A, which shows conductive trace or interconnects 74, now horizontally oriented on blanket base or foundation insulating layer 52, as conductive trace or interconnects 74 prepare to extend horizontally to leads 12. FIG. 50N is a cross-sectional view of integrated circuit (IC) die 18 attached, via die attach material 22, to a top surface of die attach pad 14 of pre-molded lead frame unit 46 along reference line X4-X4 in FIG. 590, which shows a distal end of each conductive trace or interconnect 74 as it extends down through a through hole or void 56 in blanket base or foundation layer 52 to contact an upper surface of a respective lead 12.

Figure 50O:
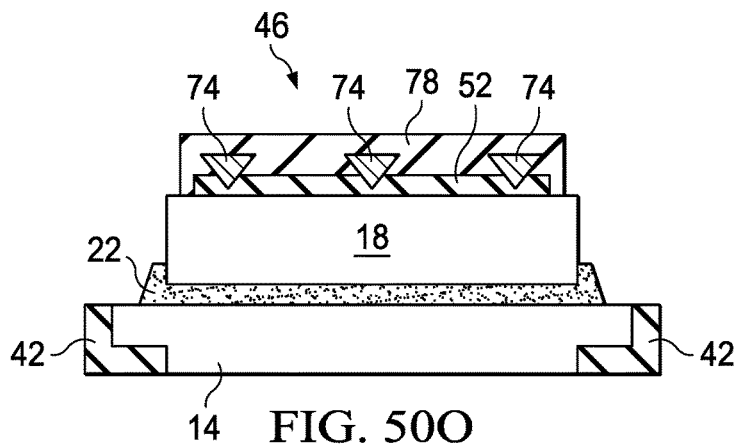
Figure 50P:
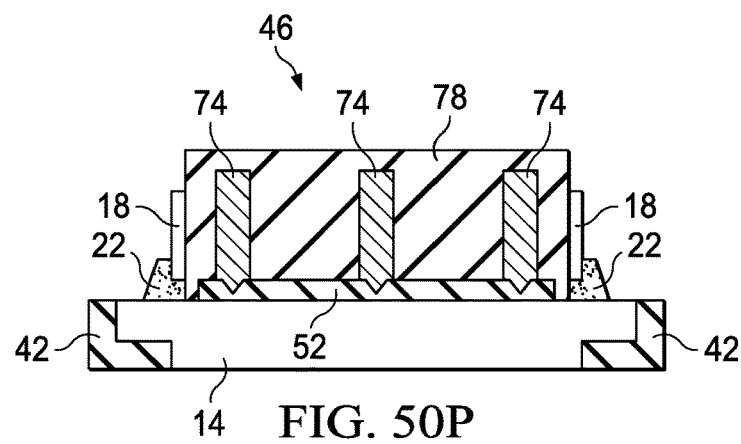
Figure 50Q:
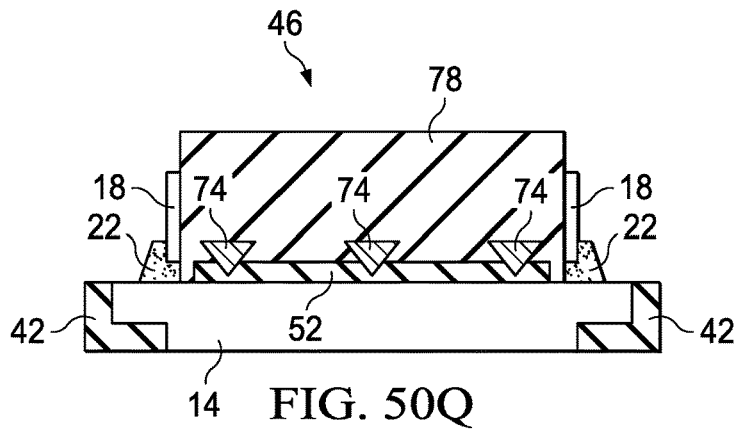
Figure 50R:
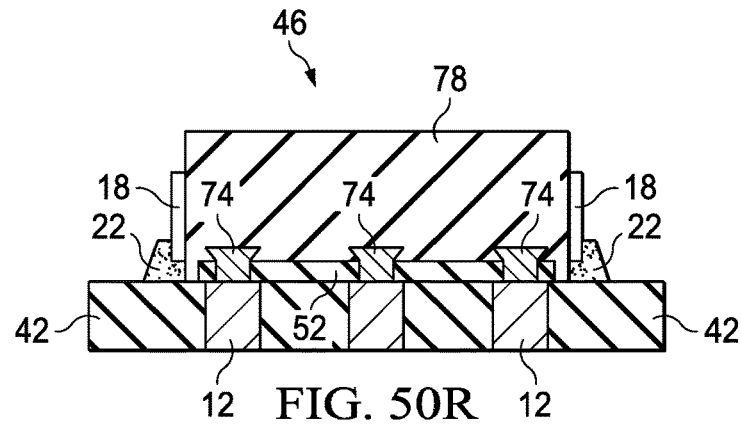

FIG. 50O is a cross-sectional view of integrated circuit (IC) die 18 attached, via die attach material 22, to a top surface of die attach pad 14 of pre-molded lead frame unit 46 along reference line O4-O4 in FIG. 50A. In this example, blanket base or foundation insulating layer 52 includes v-shaped channel or grooves 62 filled with conductive material (e.g., conductive trace or interconnect 74) from bond pads 50 on die 18 to leads 12. In FIG. 50O a half-blanket cover insulating layer 78 is shown covering the top and side surfaces of a portion of blanket base or foundation insulating layer 52. However, some examples may not require half-blanket cover insulating layers 78 to extend laterally beyond side surfaces of blanket base or foundation insulating layer 52 when conductive trace or interconnects 74 are otherwise sealed within blanket base or foundation insulating layer 52 and half-blanket cover insulating layers 78. FIG. 50P is a cross-sectional view of integrated circuit (IC) die 18 attached, via die attach material 22, to a top surface of die attach pad 14 of pre-molded lead frame unit 46 along reference line P4-P4 in FIG. 50A, which shows the blanket base or foundation insulating layer 52, conductive trace or interconnects 74 and a half-blanket cover insulating layer 78 extending down a vertical side of die 18 to die pad 46. FIG. 50Q is a cross-sectional view of integrated circuit (IC) die 18 attached, via die attach material 22, to a top surface of die attach pad 14 of pre-molded lead frame unit 46 along reference line Q4-Q4 in FIG. 50A, which shows conductive trace or interconnects 74, now horizontally oriented on blanket base or foundation insulating layer 52, as conductive trace or interconnects 74 prepare to extend horizontally to leads 12. FIG. 50R is a cross-sectional view of integrated circuit (IC) die 18 attached, via die attach material 22, to a top surface of die attach pad 14 of pre-molded lead frame unit 46 along reference line X4-X4 in FIG. 50A, which shows a distal end of each conductive trace or interconnect 74 as it extends down through a through hole or void 56 in blanket base or foundation layer 52 to contact an upper surface of a respective lead 12.

Figure 51A:
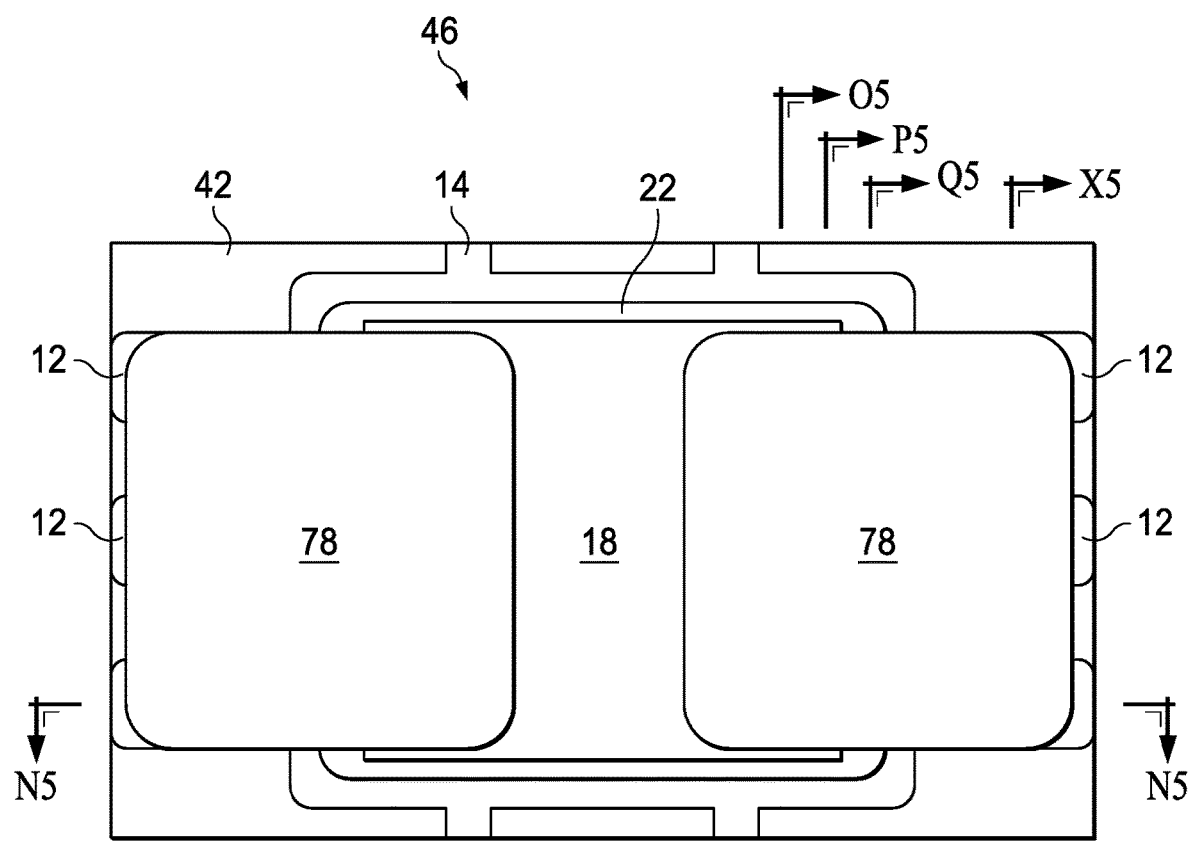
FIG. 51A is a top view of an electronic assembly undergoing fabrication according to the example method 500 of FIG. 5 with the implementation at 514, wherein two half-blanket cover insulating layers 78, each printed, deposited, formed or otherwise applied over exposed portions of a half-blanket base or foundation insulating layer 64, and exposed portions of conductive traces or interconnects 74 on half-blanket base or foundation insulating layers 66 (see FIGS. 41A & 41B), each spanning a portion of a top surface of lead fingers 12 in pre-molded lead frame 46, across pre-mold 42, up one side of die 18, across a portion of the top of die 18 just beyond the bond pads 50 closest to the side of die 18 upon which the respective half-blanket base or foundation insulating layer 64 is adjacent.
Figure 60A:
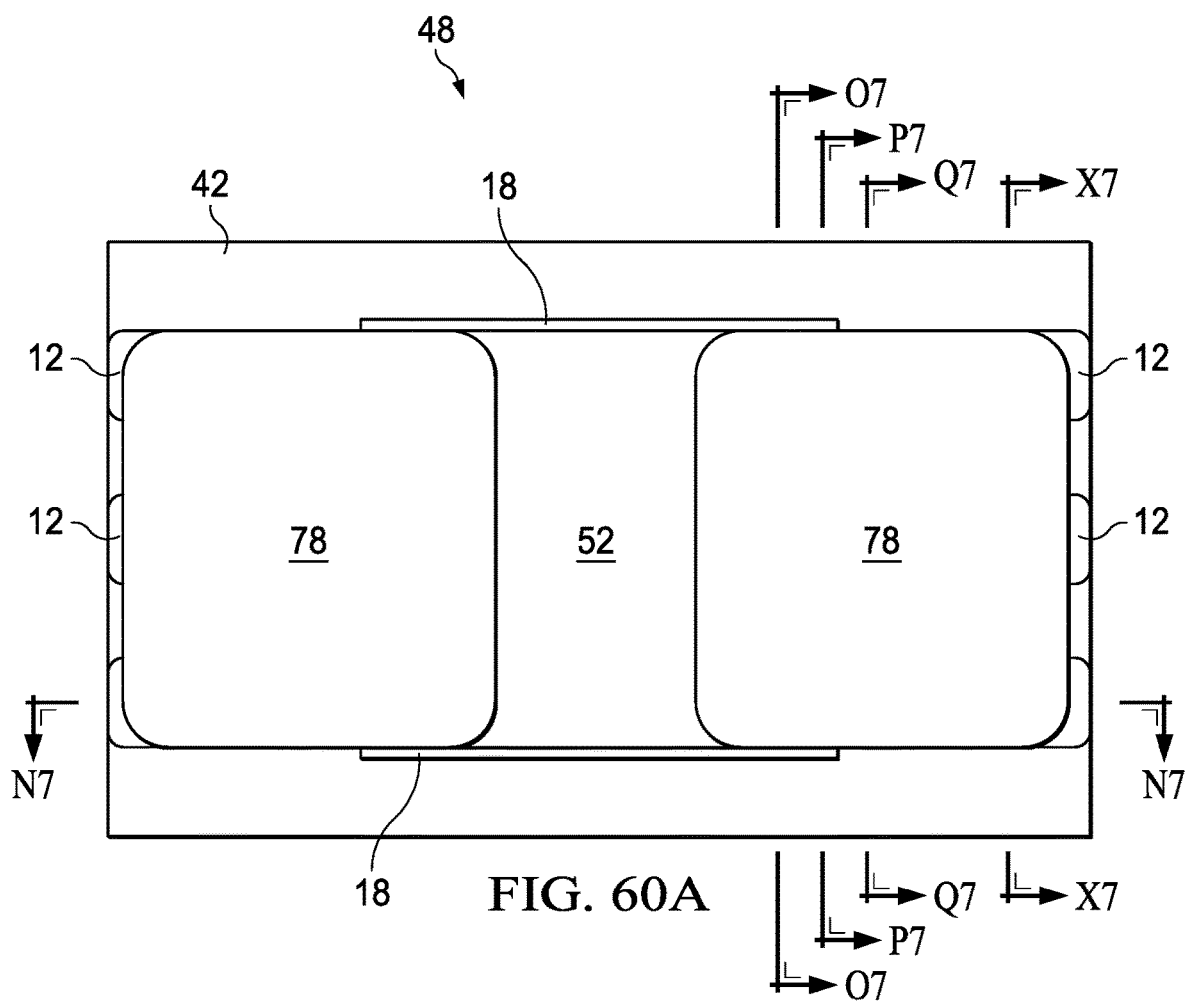
FIG. 60A is a top view of an electronic assembly undergoing fabrication according to the example method 500 of FIG. 5 with the implementation at 514, which includes two half-blanket cover insulating layers 78, each printed, deposited, formed or otherwise applied over an exposed portion of blanket base or foundation insulating layer 52, and exposed portions of conductive traces or interconnects 74 on base or foundation insulating layer 52 (see FIGS. 40A & 40B), which spans a portion of a top surface of lead fingers 12 in pre-molded lead frame 46, across pre-mold 42, up one side of die 18, across the top of die 18, down an opposite side of die 18, across pre-mold 42 on an opposite side of pre-molded lead frame 46 and to a portion of a top surface of lead fingers 12 on the opposite side of pre-molded lead frame 46.
Figure 60B:
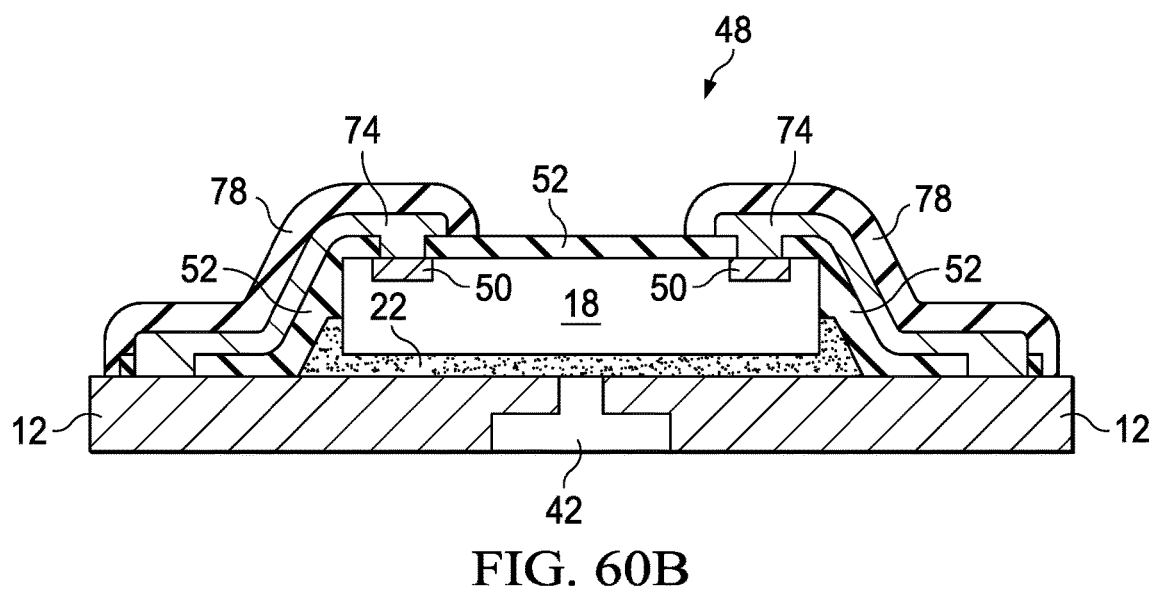
FIG. 60B is a cross-sectional view of the electronic assembly of FIG. 60A along reference line N7-N7.
Figure 61A:
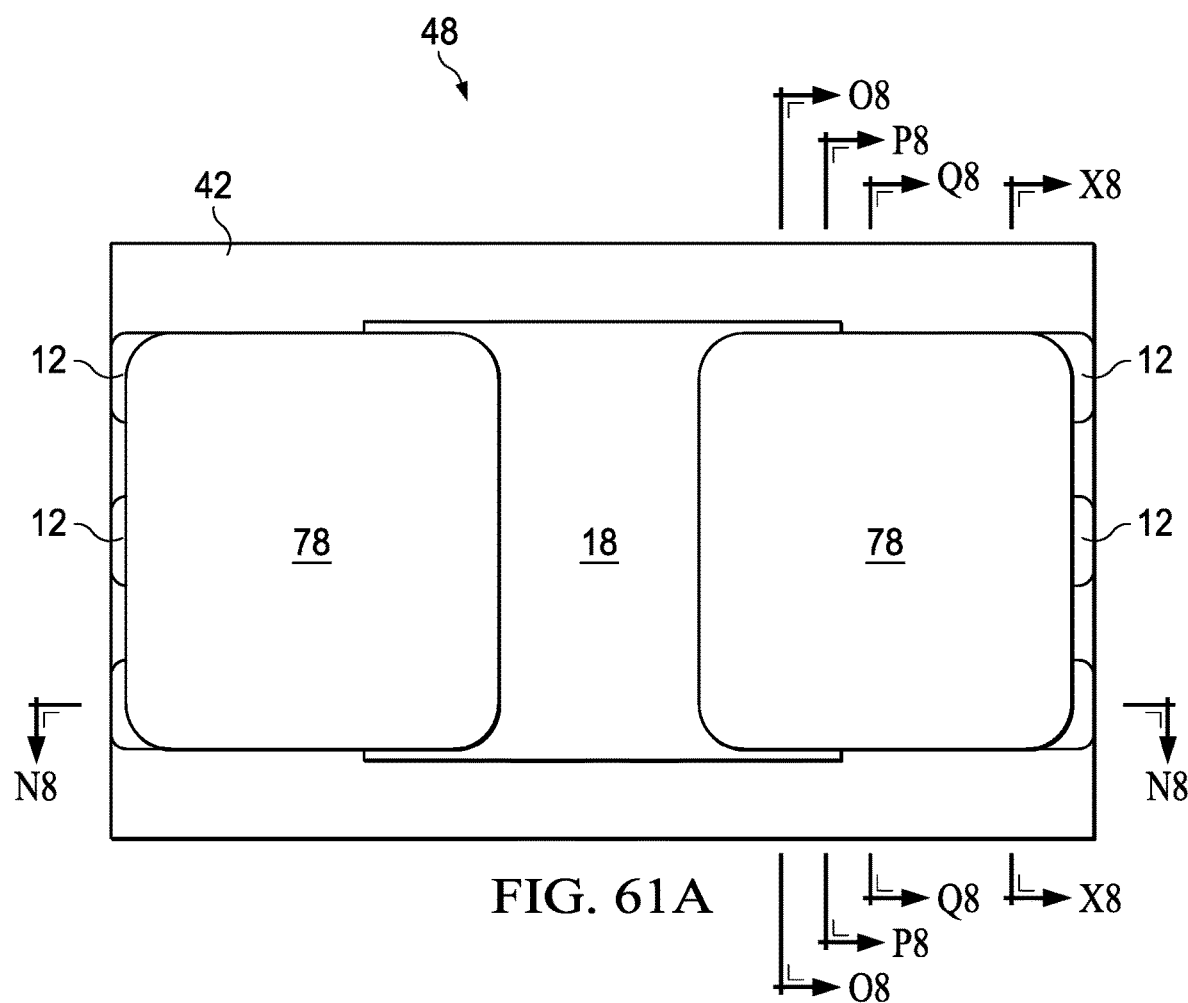
FIG. 61A is a top view of an electronic assembly undergoing fabrication according to the example method 500 of FIG. 5 with the implementation at 514, which includes two half-blanket cover insulating layers 78, each printed, deposited, formed or otherwise applied over exposed portions of a half-blanket base or foundation insulating layer 64, and exposed portions of conductive traces or interconnects 74 on half-blanket base or foundation insulating layers 66 (see FIGS. 41A & 41B), each spanning a portion of a top surface of lead fingers 12 in pre-molded lead frame 46, across pre-mold 42, up one side of die 18, across a portion of the top of die 18 just beyond the bond pads 50 closest to the side of die 18 upon which the respective half-blanket base or foundation insulating layer 64 is adjacent.
Figure 61B:
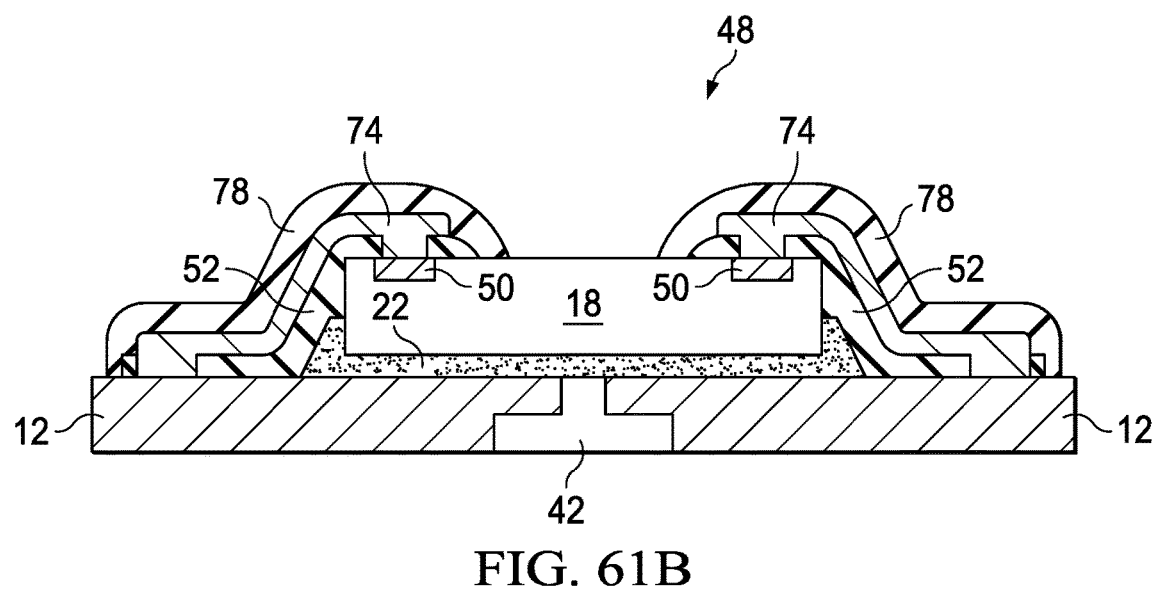
FIG. 61B is a cross-sectional views of the electronic assembly of FIG. 61A along various reference lines.
Figure 62A:
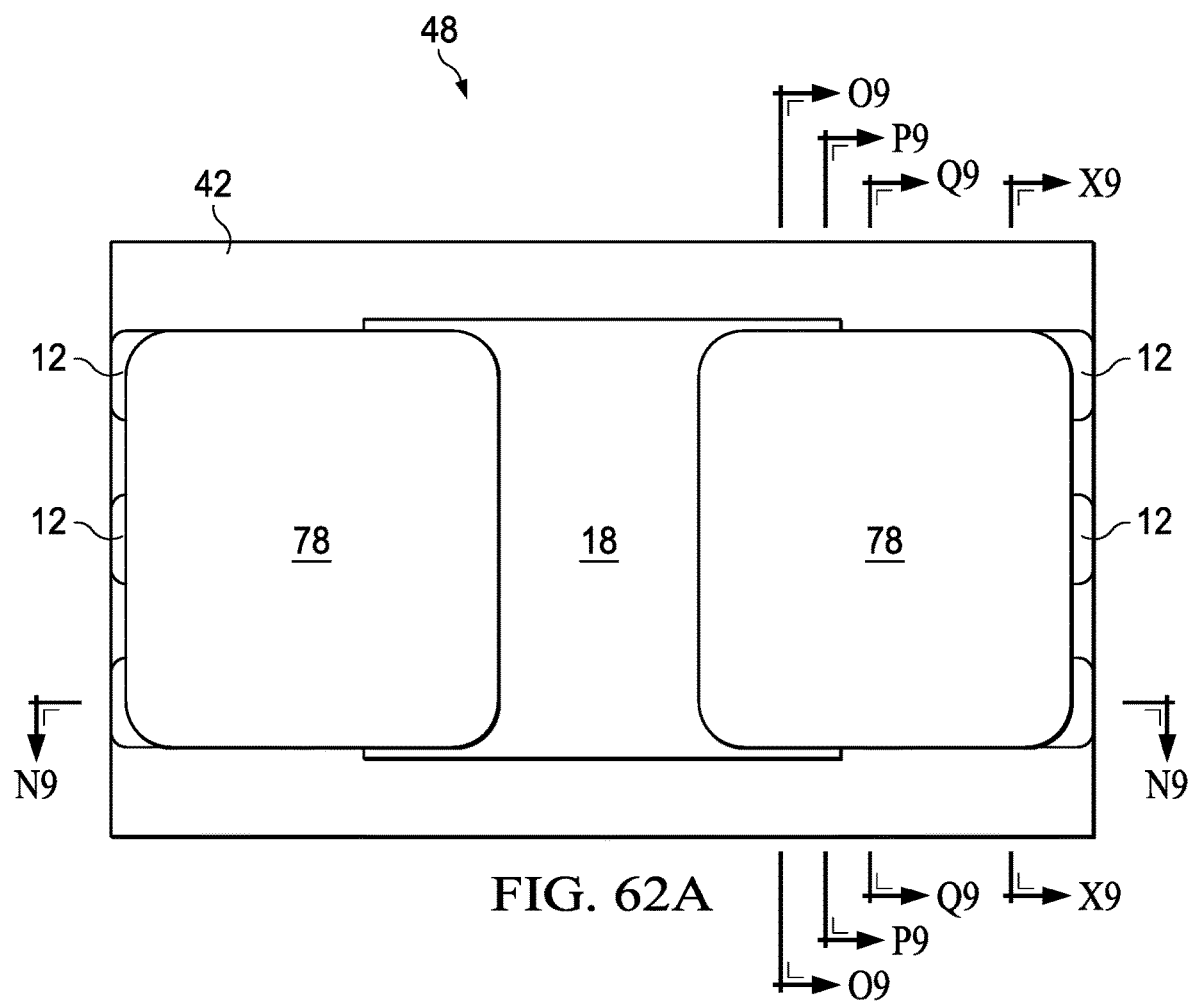
FIG. 62A is a top view of an electronic assembly undergoing fabrication according to the example method 500 of FIG. 5 with the implementation at 514, which includes two half-blanket cover insulating layers 76, each printed, deposited, formed or otherwise applied over exposed portions of individual base or foundation insulating layers 66, and exposed portions of each conductive trace or interconnect 74 on an individual blanket base or foundation insulating layer 66 (see FIGS. 42A & 42B), each spanning a portion of a top surface of lead fingers 12 in pre-molded lead frame 46, across pre-mold 42, up one side of die 18, across a portion of the top of die 18 just beyond a bond pad 50 closest to the side of die 18 upon which the respective individual base or foundation insulating layer 66 is adjacent.
Figure 62B:
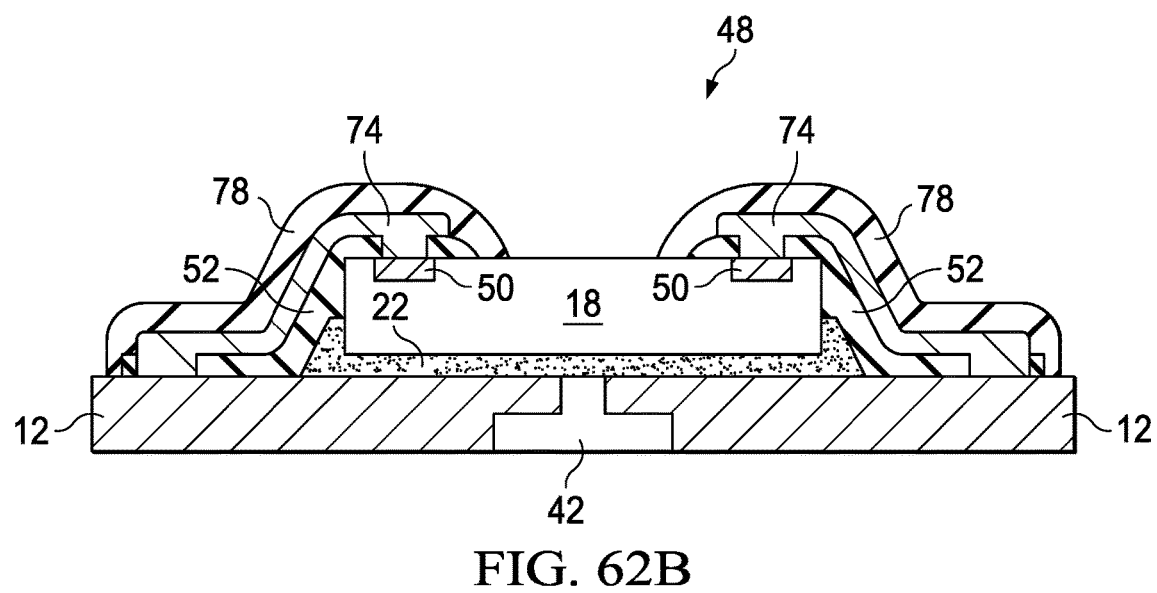
FIG. 62B is a cross-sectional view of the electronic assembly of FIG. 62A along reference lines N9-N9.
Figure 63A:
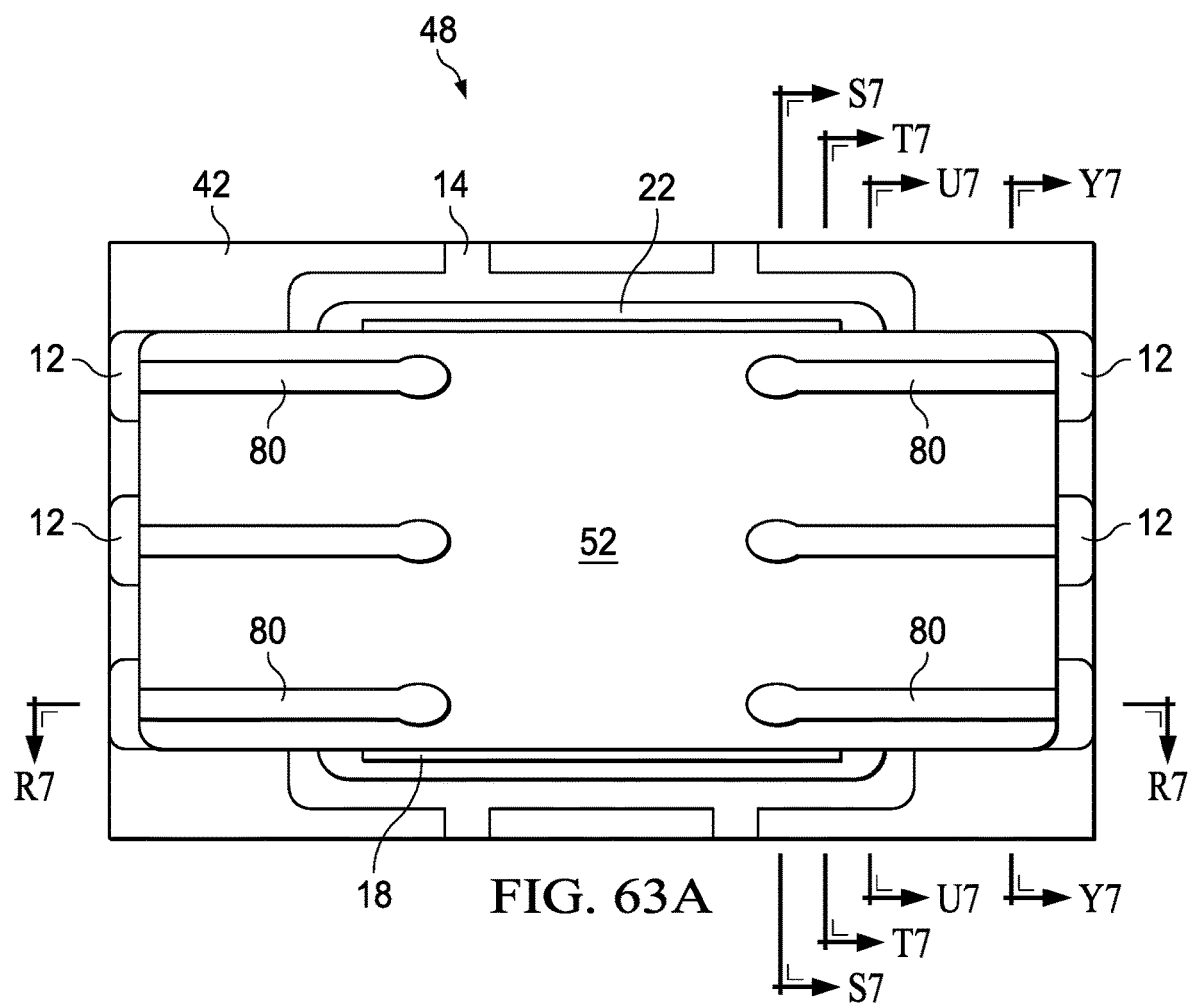
FIG. 63A is a top view of an electronic assembly undergoing fabrication according to the example method 500 of FIG. 5 with the implementation at 514, which includes individual cover insulating layers 80, each printed, deposited, formed or otherwise applied over an exposed portion of blanket base or foundation insulating layer 52, and exposed portions of conductive traces or interconnects 74 on base or foundation insulating layer 52 (see FIGS. 40A & 40B), which spans a portion of a top surface of lead fingers 12 in pre-molded lead frame 46, across pre-mold 42, up one side of die 18, across the top of die 18, down an opposite side of die 18, across pre-mold 42 on an opposite side of pre-molded lead frame 46 and to a portion of a top surface of lead fingers 12 on the opposite side of pre-molded lead frame 46.
Figure 63B:
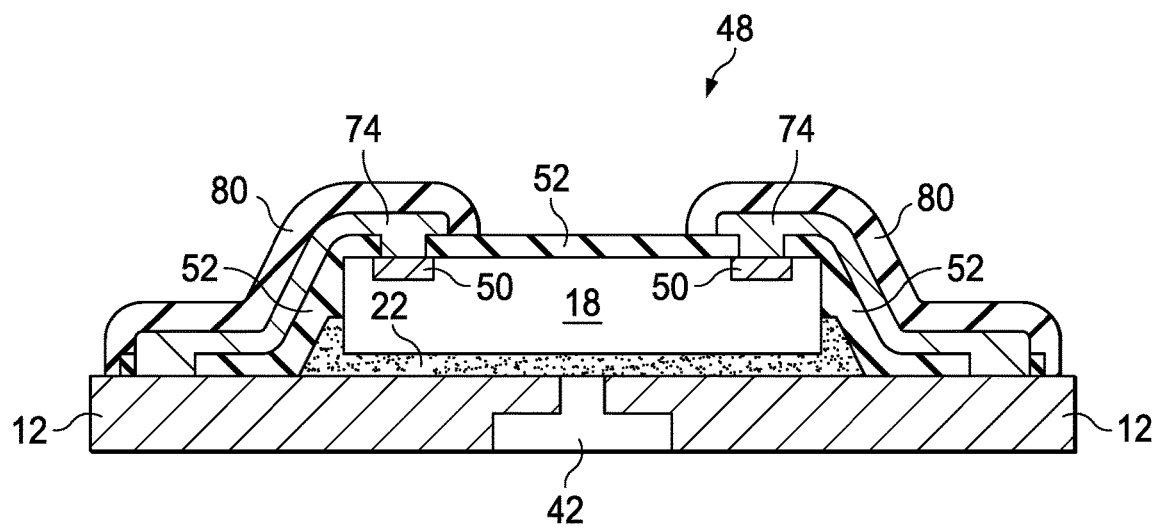
FIG. 63B is a cross-sectional view of the electronic assembly of FIG. 63A along various reference lines.
Figure 64A:
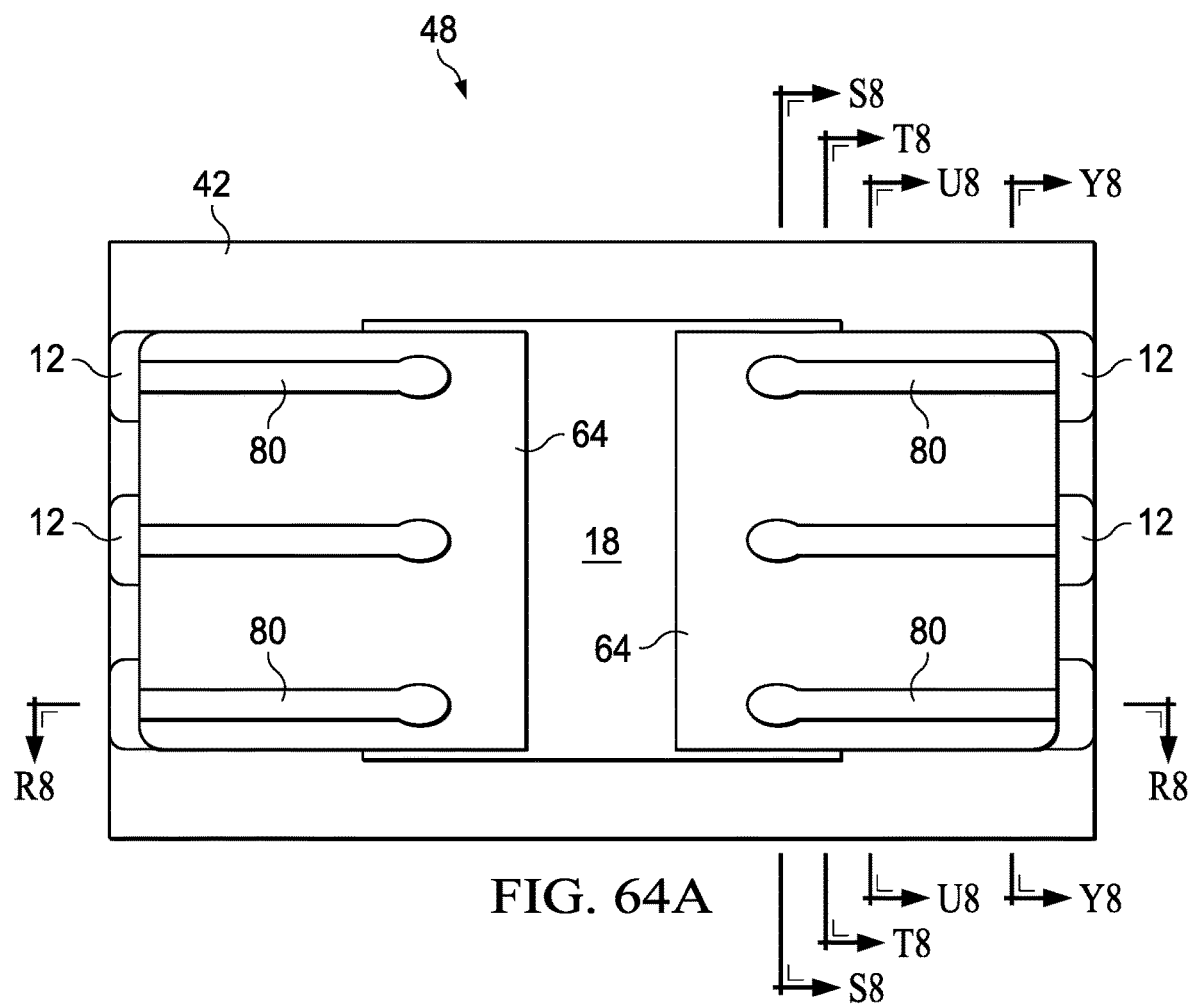
FIG. 64A is a top view of an electronic assembly undergoing fabrication according to the example method 500 of FIG. 5 with the implementation at 514, which includes individual cover insulating layers 80, each printed, deposited, formed or otherwise applied over exposed portions of a half-blanket base or foundation insulating layer 64, and exposed portions of conductive traces or interconnects 74 on half-blanket base or foundation insulating layers 66 (see FIGS. 41A & 41B), each spanning a portion of a top surface of lead fingers 12 in pre-molded lead frame 46, across pre-mold 42, up one side of die 18, across a portion of the top of die 18 just beyond the bond pads 50 closest to the side of die 18 upon which the respective half-blanket base or foundation insulating layer 64 is adjacent.
Figure 64B:
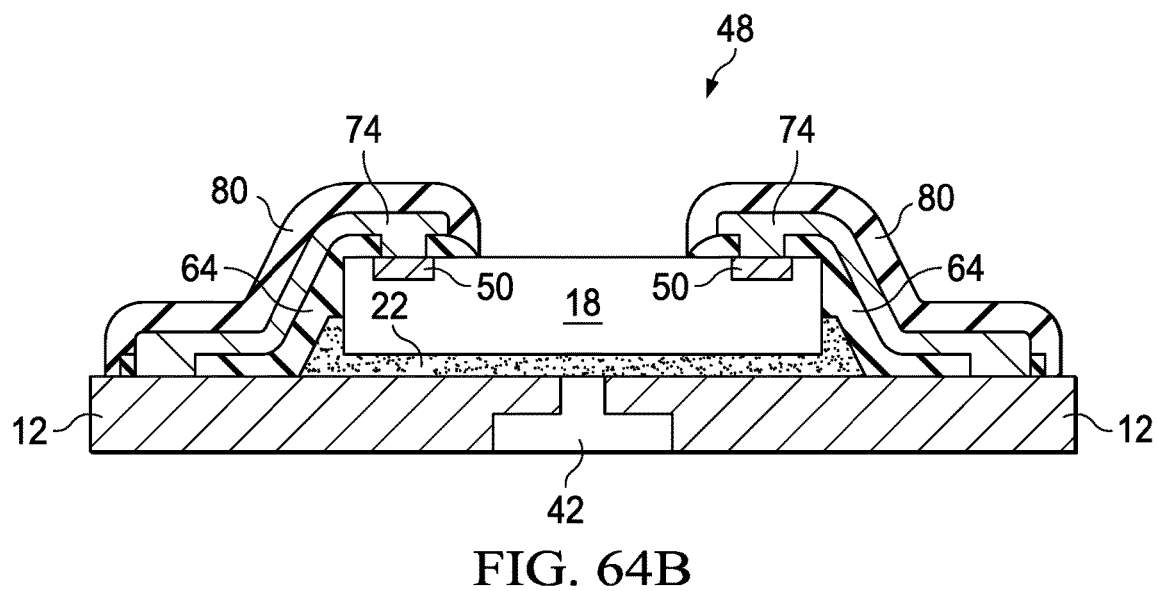
FIG. 64B is a cross-sectional view of the electronic assembly of FIG. 64A along reference lines R8-R8.
Figure 65A:
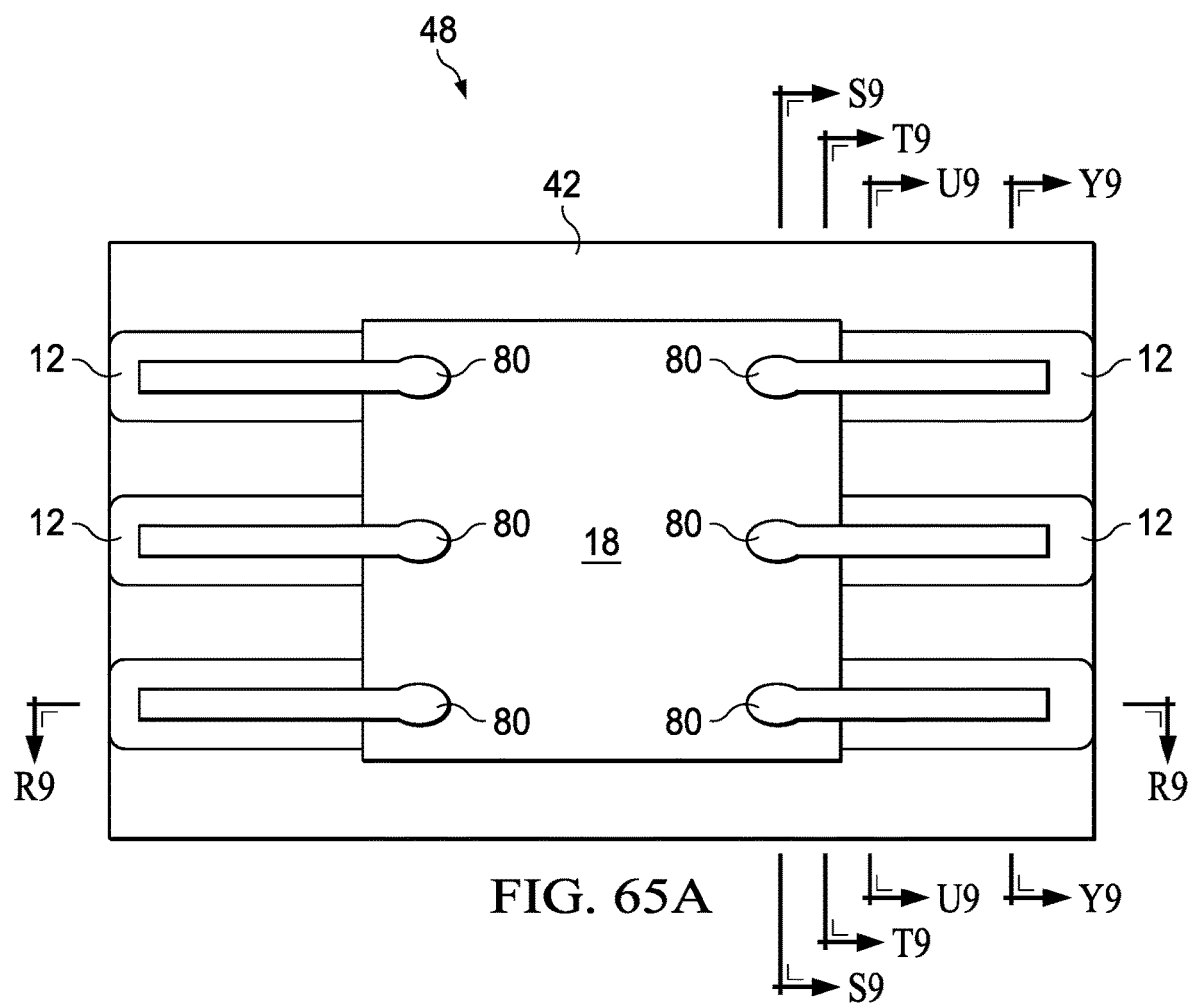
FIG. 65A is a top view of an electronic assembly undergoing fabrication according to the example method 500 of FIG. 5 with the implementation at 514, which includes individual cover insulating layers 80, each printed, deposited, formed or otherwise applied over exposed portions of individual base or foundation insulating layers 66, and exposed portions of each conductive trace or interconnect 74 on an individual blanket base or foundation insulating layer 66 (see FIGS. 42A & 42B), each spanning a portion of a top surface of lead fingers 12 in pre-molded lead frame 46, across pre-mold 42, up one side of die 18, across a portion of the top of die 18 just beyond a bond pad 50 closest to the side of die 18 upon which the respective individual base or foundation insulating layer 66 is adjacent.
Figure 65B:
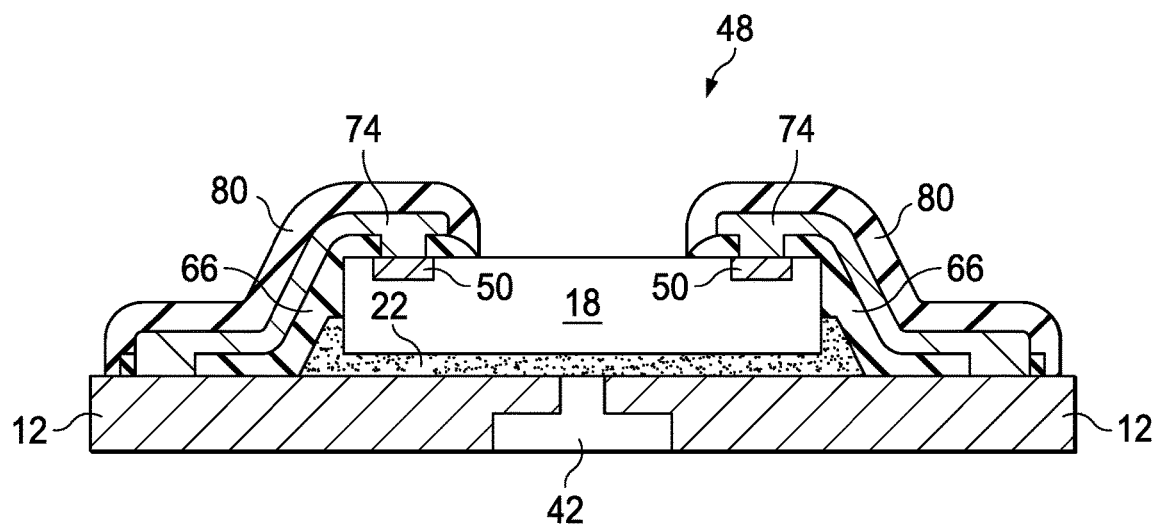
FIG. 65B is a cross-sectional views of the electronic assembly of FIG. 65A along reference lines R9-R9.

Half-Blanket Cover Insulating Layers Over Half-Blanket Base or Foundation Insulating Layers FIG. 51A shows two half-blanket cover insulating layers 78, each printed, deposited, formed or otherwise applied over exposed portions of a half-blanket base or foundation insulating layer 64, and exposed portions of conductive traces or interconnects 74 on half-blanket base or foundation insulating layers 66 (see FIGS. 41A & 41B), each spanning a portion of a top surface of lead fingers 12 in pre-molded lead frame 46, across pre-mold 42, up one side of die 18, across a portion of the top of die 18 just beyond the bond pads 50 closest to the side of die 18 upon which the respective half-blanket base or foundation insulating layer 64 is adjacent (e.g., at 514 in FIG. 5). An area on top of die 18 between the half-blanket base or foundation insulating layers 64 remains uncovered by any base or foundation layer. Optionally half-blanket cover insulating layers 78 can be cured at this time, or later with additional layers. A polymer, epoxy, silicon, mold, or other insulators can be used for half-blanket cover insulating layers 78. Each half-blanket cover insulating layer 78 follows the contours of the topology on a respective half-blanket base or foundation insulating layer 64 and the conductive traces or interconnects 74 formed on a respective half-blanket base or foundation insulating layer 64, at least sufficiently to ensure that all conductive traces or interconnects 74 are wrapped or sealed between a half-blanket base or foundation insulating layer 64 and a half-blanket cover insulating layer 78. As can be seen in FIG. 60A, each half-blanket cover insulating layer 78 covers a half-blanket base or foundation insulating layer 64, conductive traces or interconnects 74 on a half-blanket base or foundation insulating layer 64. And while this example shows two half-blanket cover insulating layers 78, each covering a respective half-blanket base or foundation insulating layer 64, more than two half-blanket cove insulating layer and half-blanket base or foundation insulating layer pair wrapping or enclosing more than one conductive trace or interconnect 74 could be used. Half-blanket cover insulating layers 78 can be formed or deposited using one of multiple techniques such as screen-printing, photolithography and etching, CVD, PVD, vacuum evaporation, inkjet printing, spray coating, microdispensing, aerosol jet, ElectroHydroDynamic (EHD) techniques with the appropriate insulating properties.

If inkjet printing is used, half-blanket cover insulating layers 78 can be formed from an inkjet deposition compatible polymer such as a polyimide ink, a thermally curable epoxy-based polymer ink, and a UV-curable acrylate ink. It is preferred that a polymer with a modulus less than 3.4 GPa and more preferred less than 2 GPa be used, to avoid undue stress on the assembly. A thickness of the blanket cover insulating layer 76 can be in the range of about 2 μm to 35 μm. A more preferred range is about 2 μm to not more than 20 μm, and still more preferred in a range from about 2 μm to about 10 μm. Because the inkjet solvent deposition material has a solvent, the initial thickness, after the solvent dissipates, the remaining material forms the insulating layer at a reduced thickness. To achieve the desired thickness, multiple inkjet depositions can be performed (e.g., at 1302 in FIG. 13). Inkjet deposition allows precise placement of material by using "drop on demand" (DOD) technology, where a reservoir of the liquid has a nozzle and a small volume of the liquid is forced from the nozzle in response to an electrical signal. The liquid forms a drop as it falls vertically onto a surface.

Figure 51B:
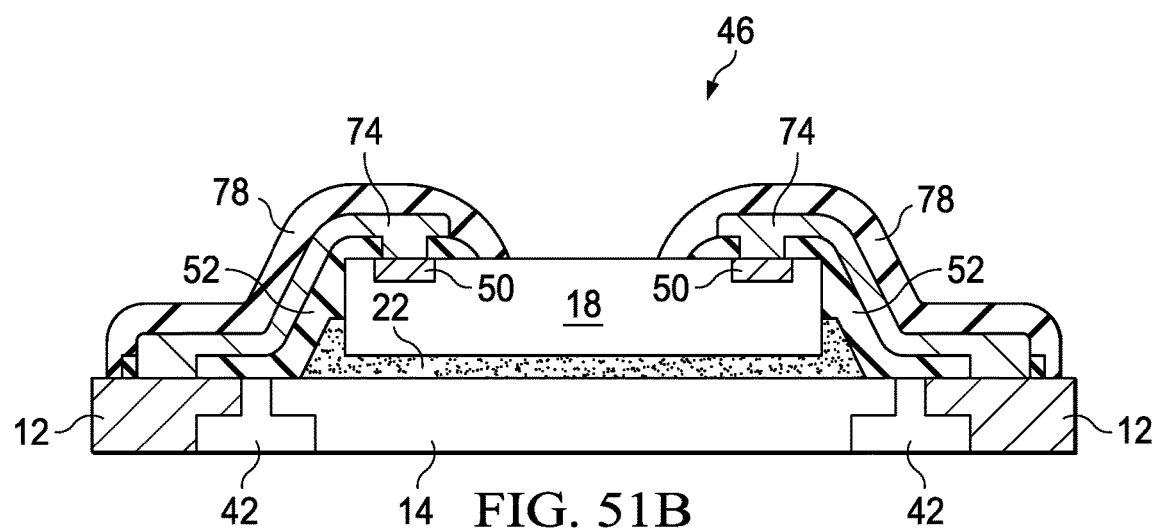
FIGS. 51B-51R are cross-sectional views of the electronic assembly of FIG. 51A along various reference lines.

The precision of the inkjet deposition tool allows deposition of the liquid material in some areas and not in others as the tool traverses across the surface (or if the tool is fixed, as the surface moves beneath the tool). Because the insulating material can be very accurately placed even in small areas, no etch or material removal step is needed to remove material after the inkjet deposition. A single pass deposition increases manufacturing throughput and reduces costs but may not produce the more accurate and/or desirable results from multiple pass deposition. As additional inkjet materials are developed, a reduction in the amount of solvent can reduce the initial thickness needed and thereby reduce the need for multiple pass depositions. FIG. 51B is a cross-sectional view of integrated circuit (IC) die 18 attached, via die attach material 22, to a top surface of die attach pad 14 of pre-molded lead frame unit 46 along reference line N5-N5 in FIG. 51A. The orientation of half-blanket base or foundation insulating layers 64, conductive trace or interconnects 74 and half-blanket cover insulating layers 78 is also shown in FIG. 51A.

Figure 51C:
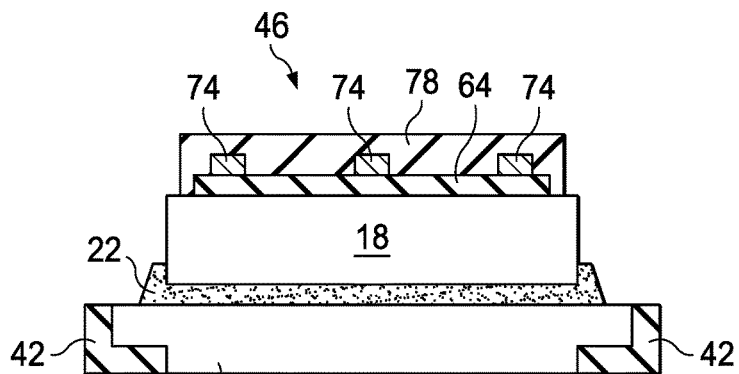
Figure 51D:
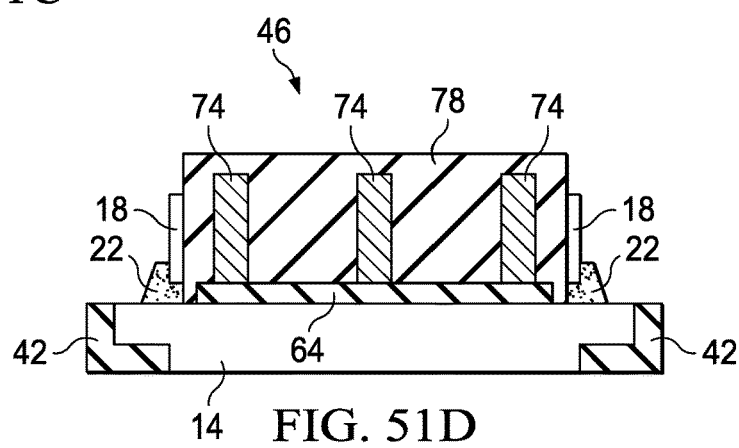
Figure 51E:
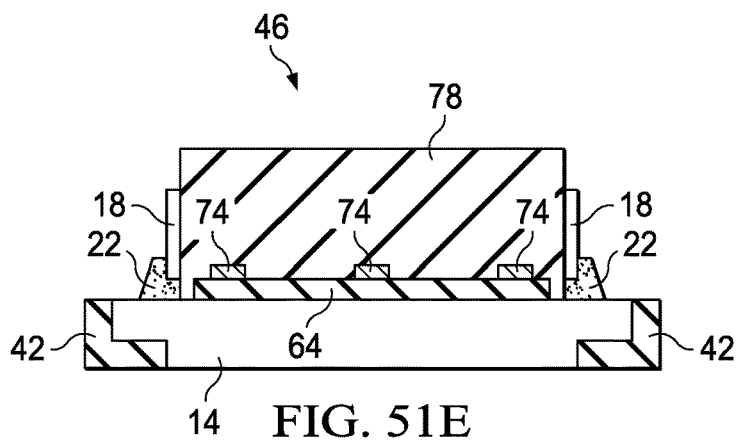
Figure 51F:
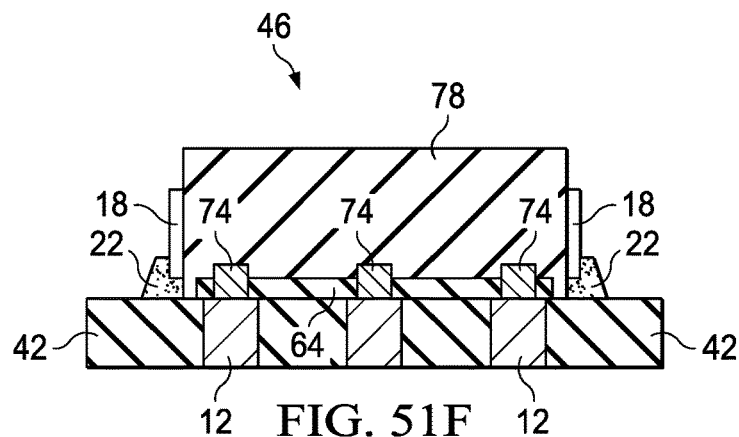

FIG. 51C is a cross-sectional view of integrated circuit (IC) die 18 attached, via die attach material 22, to a top surface of die attach pad 14 of pre-molded lead frame unit 46 along reference line O5-O5 in FIG. 51A, according to one example. In FIG. 51C a half-blanket cover insulating layer 78 is shown covering the top and side surfaces of a half-blanket base or foundation insulating layer 64. However, some examples may not require half-blanket cover insulating layers 78 to extend laterally beyond side surfaces of half-blanket base or foundation insulating layers 64 when conductive trace or interconnects 74 are otherwise sealed within half-blanket base or foundation insulating layers 64 and half-blanket cover insulating layers 78. FIG. 51D is a cross-sectional view of integrated circuit (IC) die 18 attached, via die attach material 22, to a top surface of die attach pad 14 of pre-molded lead frame unit 46 along reference line P5-P5 in FIG. 51A, which shows a half-blanket base or foundation insulating layers 64, conductive trace or interconnects 74 and a half-blanket cover insulating layer 78 extending down a vertical side of die 18 to die pad 46. FIG. 51E is a cross-sectional view of integrated circuit (IC) die 18 attached, via die attach material 22, to a top surface of die attach pad 14 of pre-molded lead frame unit 46 along reference line Q5-Q5 in FIG. 51A, which shows conductive trace or interconnects 74, now horizontally oriented on a half-blanket base or foundation insulating layer 64, as conductive trace or interconnects 74 prepare to extend horizontally to leads 12. FIG. 51F is a cross-sectional view of integrated circuit (IC) die 18 attached, via die attach material 22, to a top surface of die attach pad 14 of pre-molded lead frame unit 46 along reference line X5-X5 in FIG. 51A, which shows a distal end of each conductive trace or interconnect 74 as it extends down through a through hole or void 56 in a half-blanket base or foundation layer 64 to contact an upper surface of a respective lead 12.

Figure 51G:
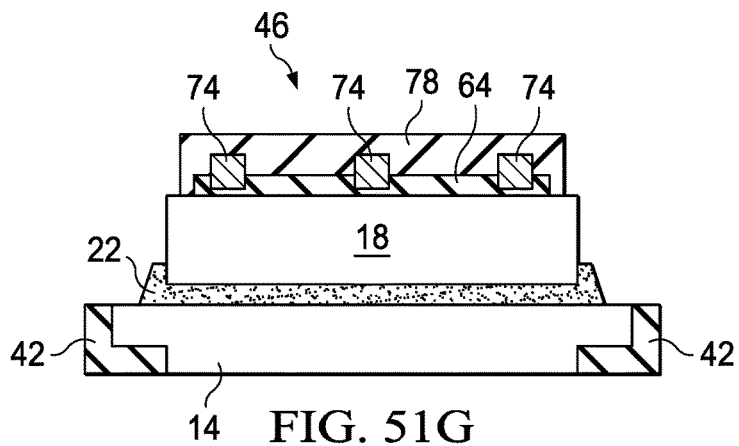
Figure 51H:
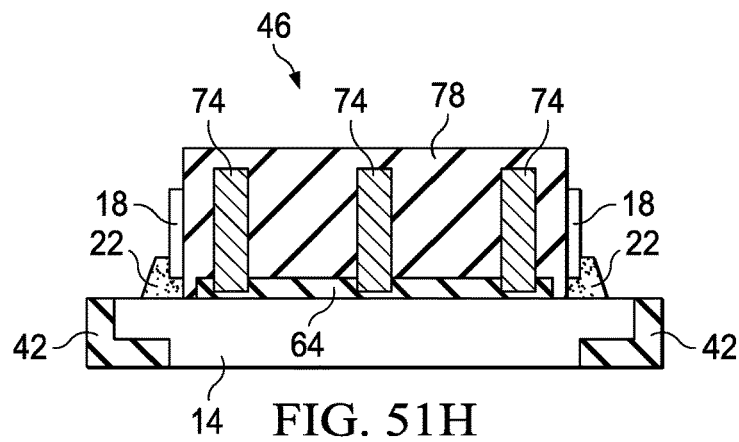
Figure 51I:
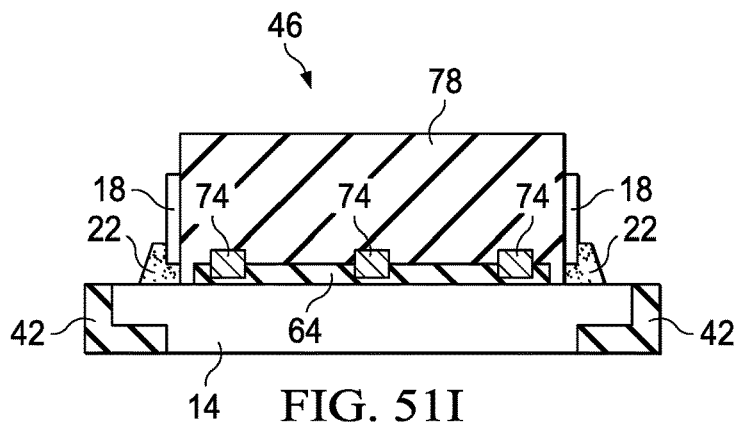
Figure 51J:
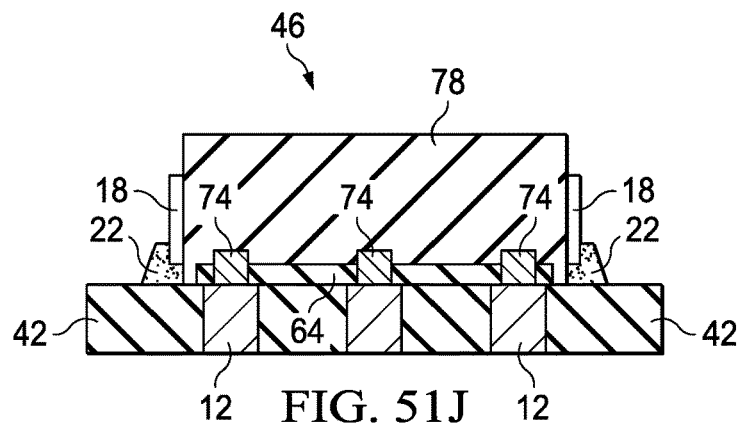

FIG. 51G is a cross-sectional view of integrated circuit (IC) die 18 attached, via die attach material 22, to a top surface of die attach pad 14 of pre-molded lead frame unit 46 along reference line O5-O5 in FIG. 51A. In this example, each half-blanket base or foundation insulating layer 64 includes rectangular channel or grooves 58 filled with conductive material (e.g., conductive trace or interconnect 74) from bond pads 50 on die 18 to leads 12. In FIG. 51G a half-blanket cover insulating layer 78 is shown covering the top and side surfaces of a half-blanket base or foundation insulating layer 64. However, some examples may not require half-blanket cover insulating layers 78 to extend laterally beyond side surfaces of half-blanket base or foundation insulating layers 64 when conductive trace or interconnects 74 are otherwise sealed within half-blanket base or foundation insulating layers 64 and half-blanket cover insulating layers 76. FIG. 51H is a cross-sectional view of integrated circuit (IC) die 18 attached, via die attach material 22, to a top surface of die attach pad 14 of pre-molded lead frame unit 46 along reference line P5-P5 in FIG. 51A, which shows a half-blanket base or foundation insulating layer 64, conductive trace or interconnects 74 and a half-blanket cover insulating layer 78 extending down a vertical side of die 18 to die pad 46. FIG. 51I is a cross-sectional view of integrated circuit (IC) die 18 attached, via die attach material 22, to a top surface of die attach pad 14 of pre-molded lead frame unit 46 along reference line Q5-Q5 in FIG. 51A, which shows conductive trace or interconnects 74, now horizontally oriented on a half-blanket base or foundation insulating layer 64, as conductive trace or interconnects 74 prepare to extend horizontally to leads 12. FIG. 51J is a cross-sectional view of integrated circuit (IC) die 18 attached, via die attach material 22, to a top surface of die attach pad 14 of pre-molded lead frame unit 46 along reference line X5-X5 in FIG. 51A, which shows a distal end of each conductive trace or interconnect 74 as it extends down through a through hole or void 56 in a half-blanket base or foundation layer 64 to contact an upper surface of a respective lead 12.

Figure 51K:
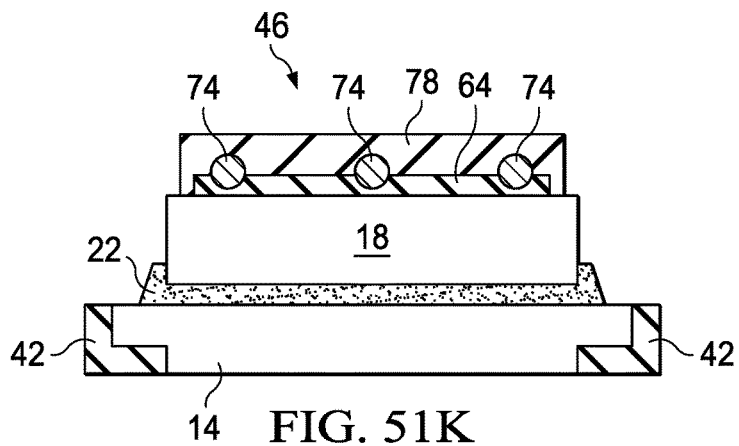
Figure 51L:
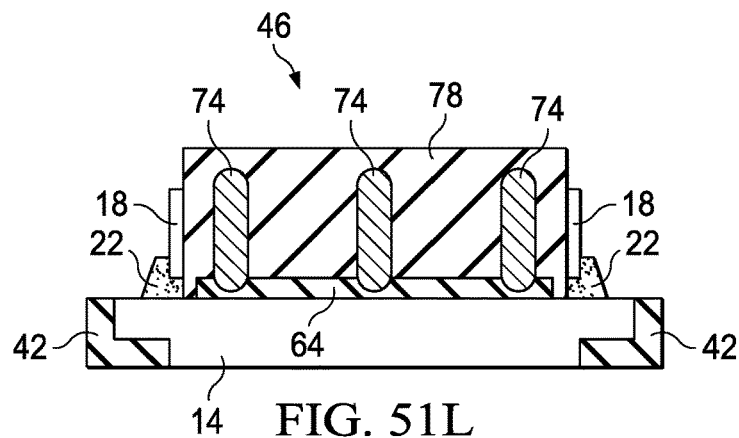
Figure 51M:
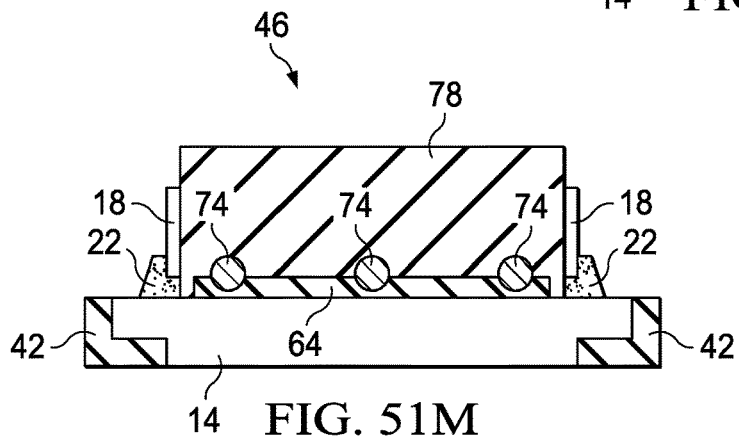
Figure 51N:
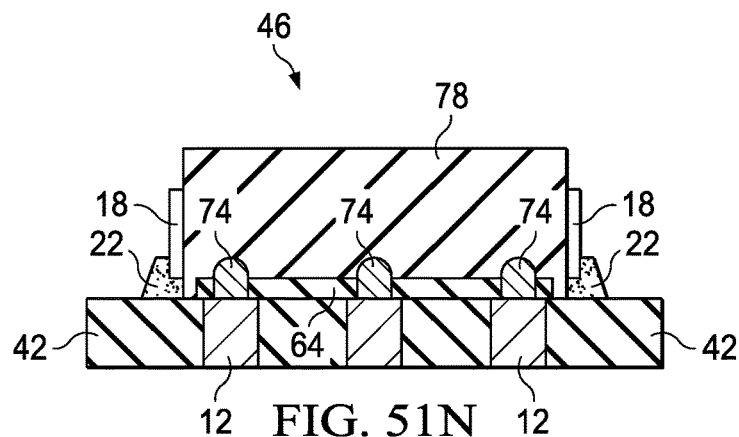

FIG. 51K is a cross-sectional view of integrated circuit (IC) die 18 attached, via die attach material 22, to a top surface of die attach pad 14 of pre-molded lead frame unit 46 along reference line O5-O5 in FIG. 51A. In this example, half-blanket base or foundation insulating layers 64 include semi-circular channel or grooves 60 filled with conductive material (e.g., conductive trace or interconnect 74) from bond pads 50 on die 18 to leads 12. In FIG. 51K a half-blanket cover insulating layer 78 is shown covering the top and side surfaces of a half-blanket base or foundation insulating layer 64. However, some examples may not require half-blanket cover insulating layers 78 to extend laterally beyond side surfaces of half-blanket base or foundation insulating layers 64 when conductive trace or interconnects 74 are otherwise sealed within half-blanket base or foundation insulating layers 64 and half-blanket cover insulating layers 78. FIG. 51L is a cross-sectional view of integrated circuit (IC) die 18 attached, via die attach material 22, to a top surface of die attach pad 14 of pre-molded lead frame unit 46 along reference line P5-P5 in FIG. 51A, which shows a half-blanket base or foundation insulating layer 64, conductive trace or interconnects 74 and a half-blanket cover insulating layer 78 extending down a vertical side of die 18 to die pad 46. FIG. 51M is a cross-sectional view of integrated circuit (IC) die 18 attached, via die attach material 22, to a top surface of die attach pad 14 of pre-molded lead frame unit 46 along reference line Q5-Q5 in FIG. 51A, which shows conductive trace or interconnects 74, now horizontally oriented on a half-blanket base or foundation insulating layer 64, as conductive trace or interconnects 74 prepare to extend horizontally to leads 12. FIG. 51N is a cross-sectional view of integrated circuit (IC) die 18 attached, via die attach material 22, to a top surface of die attach pad 14 of pre-molded lead frame unit 46 along reference line X5-X5 in FIG. 51A, which shows a distal end of each conductive trace or interconnect 74 as it extends down through a through hole or void 56 in a half-blanket base or foundation layer 64 to contact an upper surface of a respective lead 12.

Figure 51O:
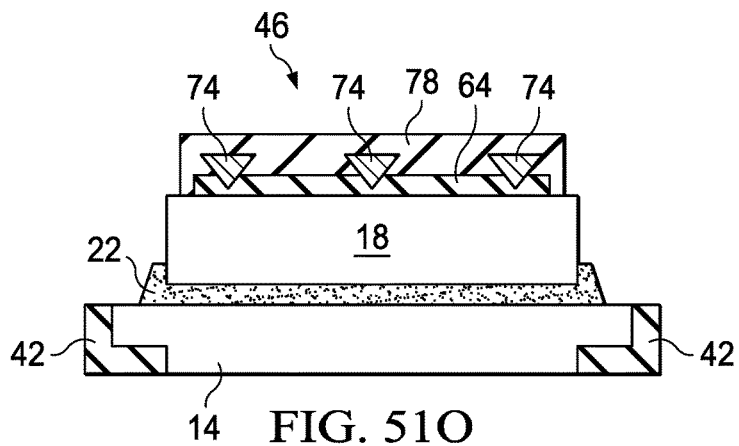
Figure 51P:
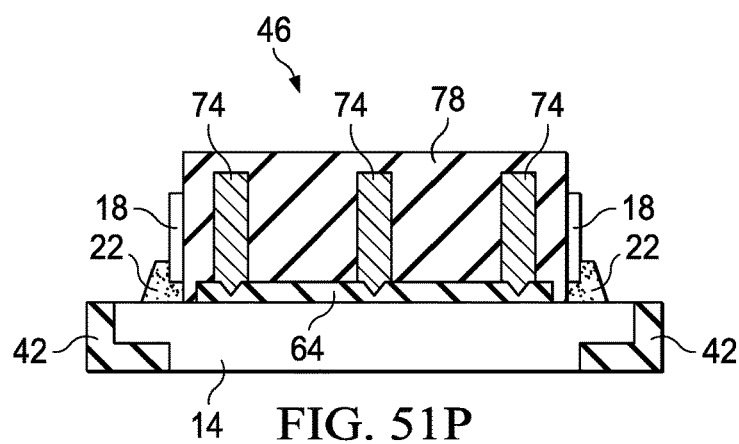
Figure 51Q:
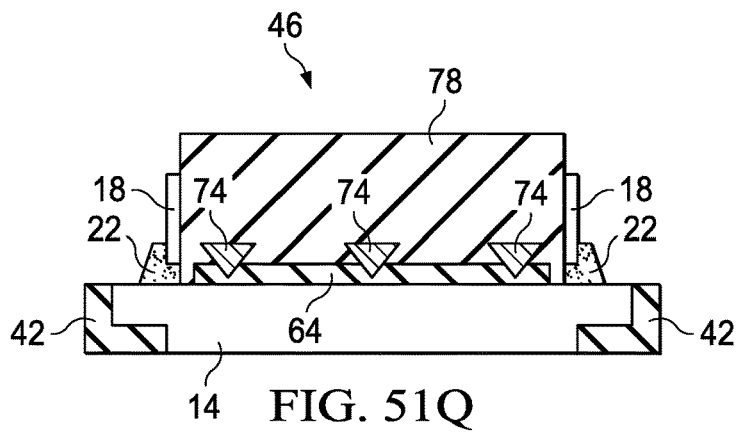
Figure 51R:
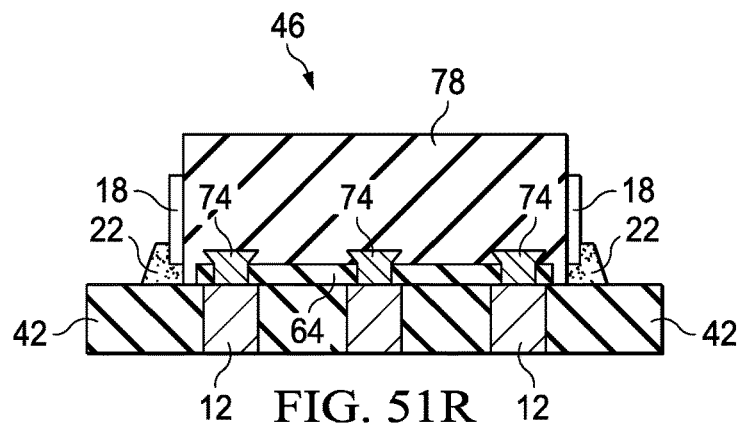

FIG. 51O is a cross-sectional view of integrated circuit (IC) die 18 attached, via die attach material 22, to a top surface of die attach pad 14 of pre-molded lead frame unit 46 along reference line O5-O5 in FIG. 51A. In this example, half-blanket base or foundation insulating layers 64 includes v-shaped channel or grooves 62 filled with conductive material (e.g., conductive trace or interconnect 74) from bond pads 50 on die 18 to leads 12. In FIG. 51O a half-blanket cover insulating layer 78 is shown covering the top and side surfaces of a half-blanket base or foundation insulating layer 64. However, some examples may not require blanket cover insulating layers 76 to extend laterally beyond side surfaces of half-blanket base or foundation insulating layers 64 when conductive trace or interconnects 74 are otherwise sealed within half-blanket base or foundation insulating layer 64 and half-blanket cover insulating layers 78. FIG. 51P is a cross-sectional view of integrated circuit (IC) die 18 attached, via die attach material 22, to a top surface of die attach pad 14 of pre-molded lead frame unit 46 along reference line P5-P5 in FIG. 51A, which shows a half-blanket base or foundation insulating layer 64, conductive trace or interconnects 74 and a half-blanket cover insulating layer 78 extending down a vertical side of die 18 to die pad 46. FIG. 51Q is a cross-sectional view of integrated circuit (IC) die 18 attached, via die attach material 22, to a top surface of die attach pad 14 of pre-molded lead frame unit 46 along reference line Q5-Q5 in FIG. 51A, which shows conductive trace or interconnects 74, now horizontally oriented on a half-blanket base or foundation insulating layer 64, as conductive trace or interconnects 74 prepare to extend horizontally to leads 12. FIG. 51R is a cross-sectional view of integrated circuit (IC) die 18 attached, via die attach material 22, to a top surface of die attach pad 14 of pre-molded lead frame unit 46 along reference line X5-X5 in FIG. 51A, which shows a distal end of each conductive trace or interconnect 74 as it extends down through a through hole or void 56 in a half-blanket base or foundation layer 64 to contact an upper surface of a respective lead 12.

Figure 52A:
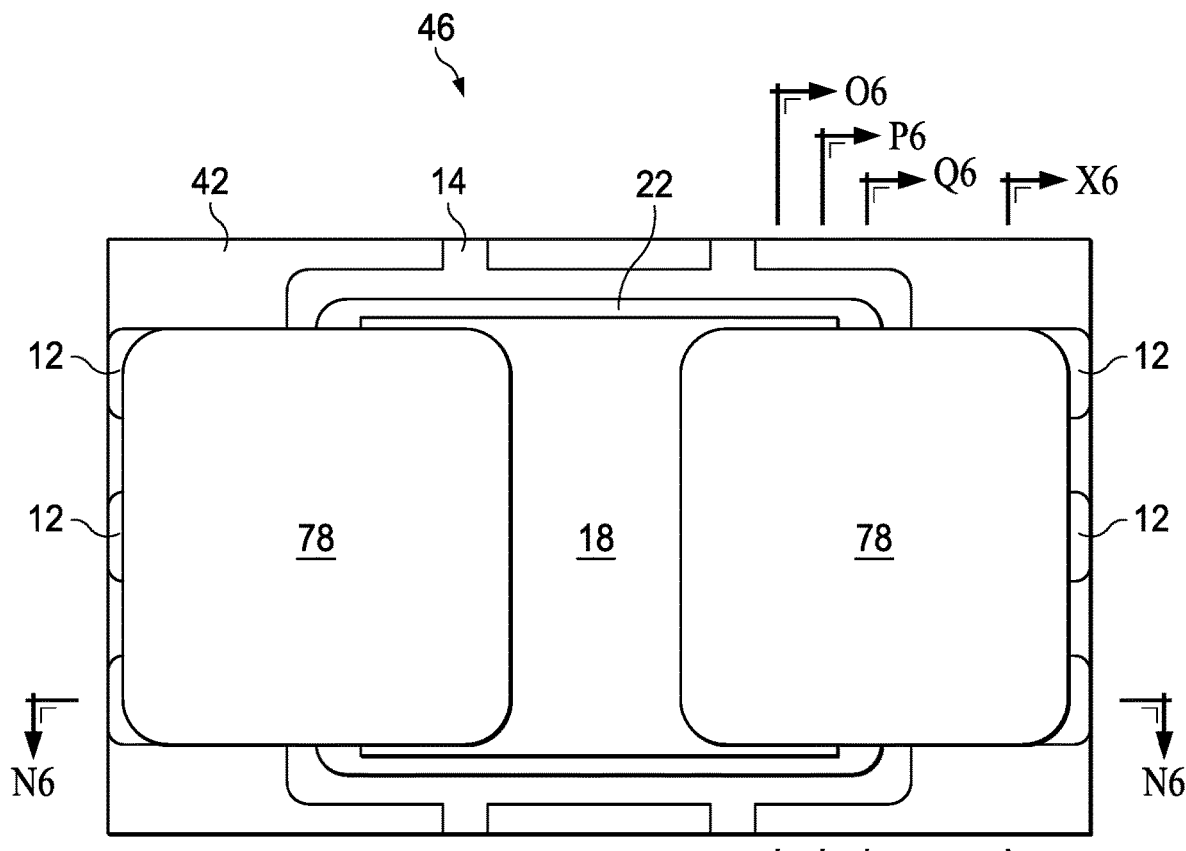
FIG. 52A is a top view of an electronic assembly undergoing fabrication according to the example method 500 of FIG. 5 with the implementation at 514, wherein two half-blanket cover insulating layers 76, each printed, deposited, formed or otherwise applied over exposed portions of individual base or foundation insulating layers 66, and exposed portions of each conductive trace or interconnect 74 on an individual blanket base or foundation insulating layer 66 (see FIGS. 42A & 42B), each spanning a portion of a top surface of lead fingers 12 in pre-molded lead frame 46, across pre-mold 42, up one side of die 18, across a portion of the top of die 18 just beyond a bond pad 50 closest to the side of die 18 upon which the respective individual base or foundation insulating layer 66 is adjacent.

Half-Blanket Cover Insulating Layer Over Individual Base or Foundation Insulating Layers FIG. 52A shows two half-blanket cover insulating layers 76, each printed, deposited, formed or otherwise applied over exposed portions of individual base or foundation insulating layers 66, and exposed portions of each conductive trace or interconnect 74 on an individual blanket base or foundation insulating layer 66 (see FIGS. 42A & 42B), each spanning a portion of a top surface of lead fingers 12 in pre-molded lead frame 46, across pre-mold 42, up one side of die 18, across a portion of the top of die 18 just beyond a bond pad 50 closest to the side of die 18 upon which the respective individual base or foundation insulating layer 66 is adjacent (e.g., at 514 in FIG. 5). There remain multiple areas on top of die 18 between the individual base or foundation insulating layers 66 on each side of the top of the die and between the two rows of dies on the top side of the die remains uncovered by any base or foundation layer. Optionally half-blanket cover insulating layers 78 can be cured at this time, or later with additional layers. A polymer, epoxy, silicon, mold, or other insulators can be used for half-blanket cover insulating layer 78. Half-blanket cover insulating layers 78 follows the contours of the topology on individual base or foundation insulating layers 66 and the conductive traces or interconnects 74 formed on the individual base or foundation insulating layers 66, at least sufficiently to ensure that all conductive traces or interconnects 74 are wrapped or sealed between a respective individual base or foundation insulating layer 66 and a half-blanket cover insulating layer 78. As can be seen in FIG. 52A, half-blanket cover insulating layer 78 covers multiple individual base or foundation insulating layers 66, conductive traces or interconnects 74 on half-blanket base or foundation insulating layers 66 and the uninsulated portion of the top of die 18 between individual base or foundation insulating layers 66. Half-blanket cover insulating layers 78 can be formed or deposited using one of multiple techniques such as screen-printing, photolithography and etching, CVD, PVD, vacuum evaporation, inkjet printing, spray coating, microdispensing, aerosol jet, ElectroHydroDynamic (EHD) techniques with the appropriate insulating properties.

If inkjet printing is used, blanket cover insulating layer 76 can be formed from an inkjet deposition compatible polymer such as a polyimide ink, a thermally curable epoxy-based polymer ink, and a UV-curable acrylate ink. It is preferred that a polymer with a modulus less than 3.4 GPa and more preferred less than 2 GPa be used, to avoid undue stress on the assembly. A thickness of the blanket cover insulating layer 76 can be in the range of about 2 μm to 35 μm. A more preferred range is about 2 μm to not more than 20 μm, and still more preferred in a range from about 2 μm to about 10 μm. Because the inkjet solvent deposition material has a solvent, the initial thickness, after the solvent dissipates, the remaining material forms the insulating layer at a reduced thickness. To achieve the desired thickness, multiple inkjet depositions can be performed (e.g., at 1302 in FIG. 13). Inkjet deposition allows precise placement of material by using "drop on demand" (DOD) technology, where a reservoir of the liquid has a nozzle and a small volume of the liquid is forced from the nozzle in response to an electrical signal. The liquid forms a drop as it falls vertically onto a surface.

Figure 52B:
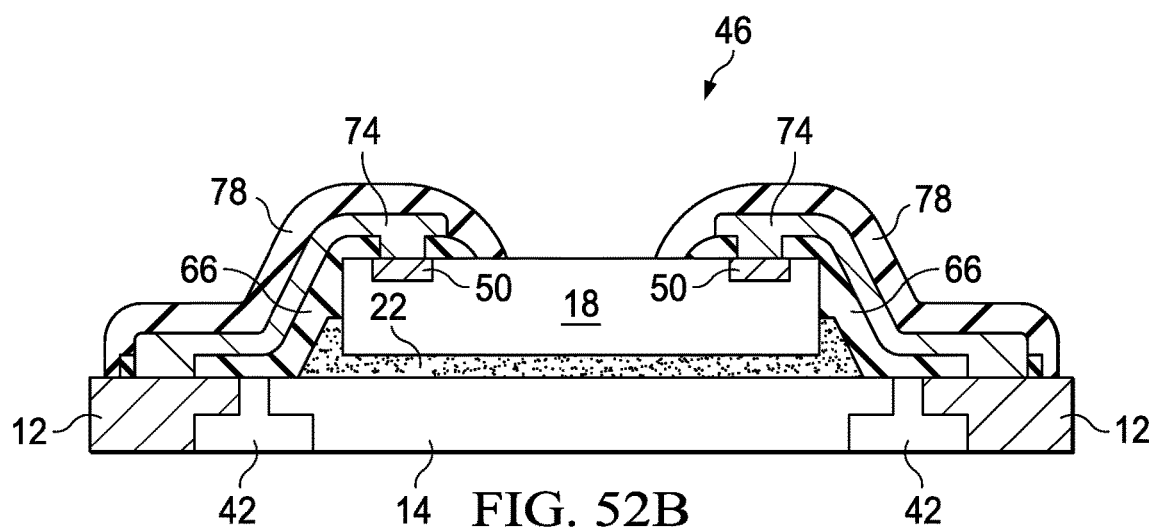
FIGS. 52B-52R are cross-sectional views of the electronic assembly of FIG. 52A along various reference lines.

The precision of the inkjet deposition tool allows deposition of the liquid material in some areas and not in others as the tool traverses across the surface (or if the tool is fixed, as the surface moves beneath the tool). Because the insulating material can be very accurately placed even in small areas, no etch or material removal step is needed to remove material after the inkjet deposition. A single pass deposition increases manufacturing throughput and reduces costs but may not produce the more accurate and/or desirable results from multiple pass deposition. As additional inkjet materials are developed, a reduction in the amount of solvent can reduce the initial thickness needed and thereby reduce the need for multiple pass depositions. FIG. 52B is a cross-sectional view of integrated circuit (IC) die 18 attached, via die attach material 22, to a top surface of die attach pad 14 of pre-molded lead frame unit 46 along reference line N6-N6 in FIG. 52A. The orientation of individual base or foundation insulating layers 66, conductive trace or interconnects 74 and half-blanket cover insulating layers 78 is also shown in FIG. 52A.

Figure 52C:
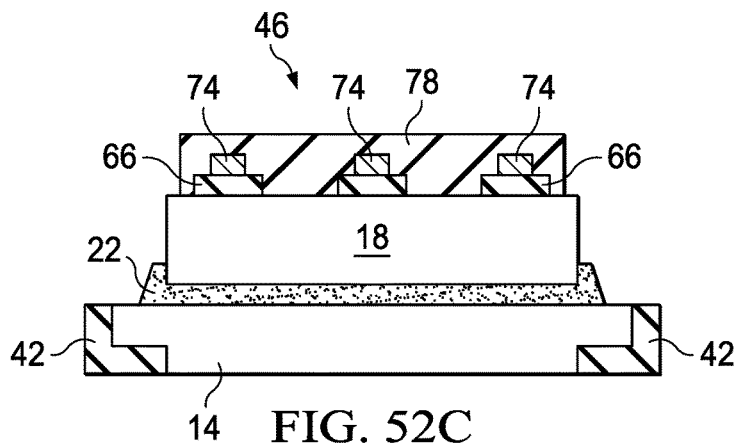
Figure 52D:
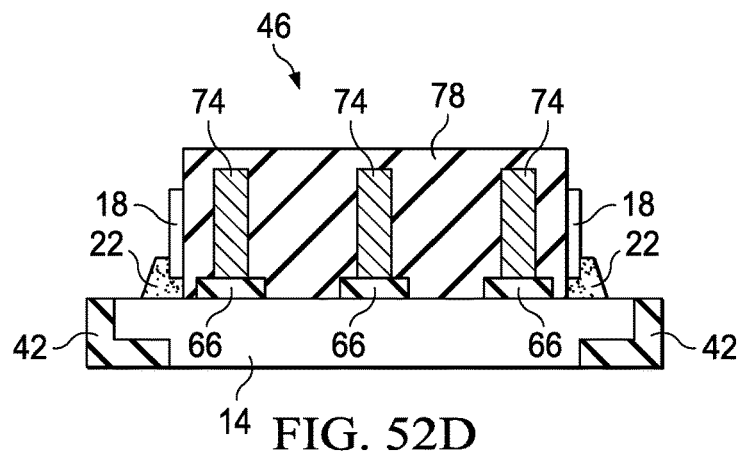
Figure 52E:
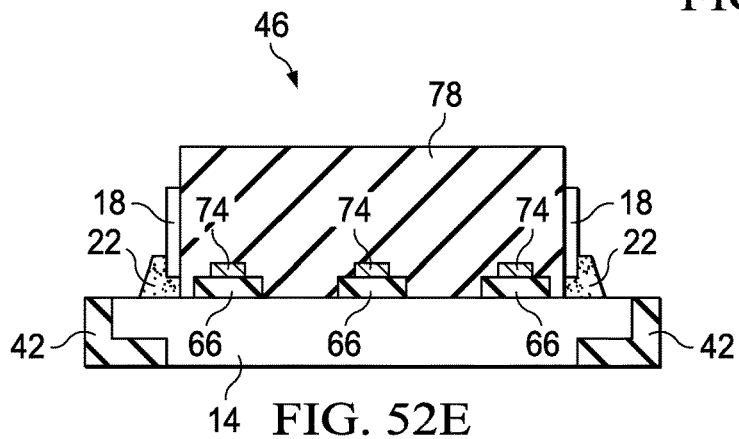
Figure 52F:
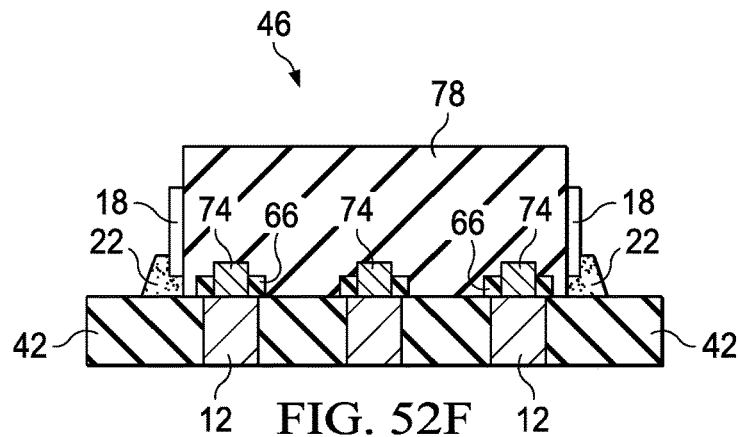

FIG. 52C is a cross-sectional view of integrated circuit (IC) die 18 attached, via die attach material 22, to a top surface of die attach pad 14 of pre-molded lead frame unit 46 along reference line O6-O6 in FIG. 52A, according to one example. In FIG. 52C a half-blanket cover insulating layer 78 is shown covering the top and side surfaces of individual base or foundation insulating layers 66. FIG. 52D is a cross-sectional view of integrated circuit (IC) die 18 attached, via die attach material 22, to a top surface of die attach pad 14 of pre-molded lead frame unit 46 along reference line P6-P6 in FIG. 52A, which shows the individual base or foundation insulating layers 66 (three shown), conductive trace or interconnects 74 and a half-blanket cover insulating layer 78 extending down a vertical side of die 18 to die pad 46. FIG. 52E is a cross-sectional view of integrated circuit (IC) die 18 attached, via die attach material 22, to a top surface of die attach pad 14 of pre-molded lead frame unit 46 along reference line Q6-Q6 in FIG. 52A, which shows conductive trace or interconnects 74, each now horizontally oriented on an individual base or foundation insulating layer 66, as conductive trace or interconnects 74 prepare to extend horizontally to leads 12. FIG. 52F is a cross-sectional view of integrated circuit (IC) die 18 attached, via die attach material 22, to a top surface of die attach pad 14 of pre-molded lead frame unit 46 along reference line X6-X6 in FIG. 52A, which shows a distal end of each conductive trace or interconnect 74 as it extends down through a through hole or void 56 in a respective individual base or foundation layer 66 to contact an upper surface of a respective lead 12.

Figure 52G:
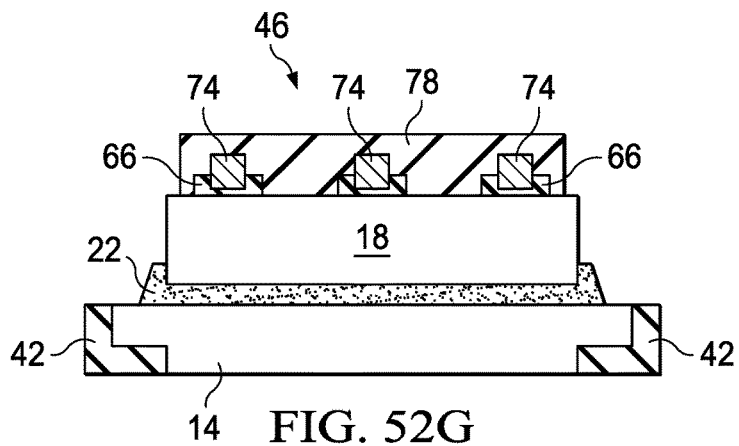

FIG. 52G is a cross-sectional view of integrated circuit (IC) die 18 attached, via die attach material 22, to a top surface of die attach pad 14 of pre-molded lead frame unit 46 along reference line O6-O6 in FIG. 52A.

Figure 52H:
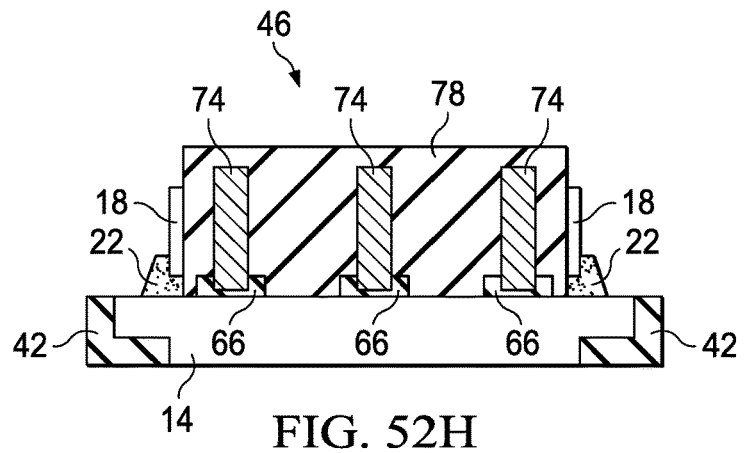

FIG. 52H is a cross-sectional view of integrated circuit (IC) die 18 attached, via die attach material 22, to a top surface of die attach pad 14 of pre-molded lead frame unit 46 along reference line P6-P6 in FIG. 52A, which shows individual base or foundation insulating layers 66, conductive trace or interconnects 74 and a half-blanket cover insulating layer 78 extending down a vertical side of die 18 to die pad 46.

Figure 52I:
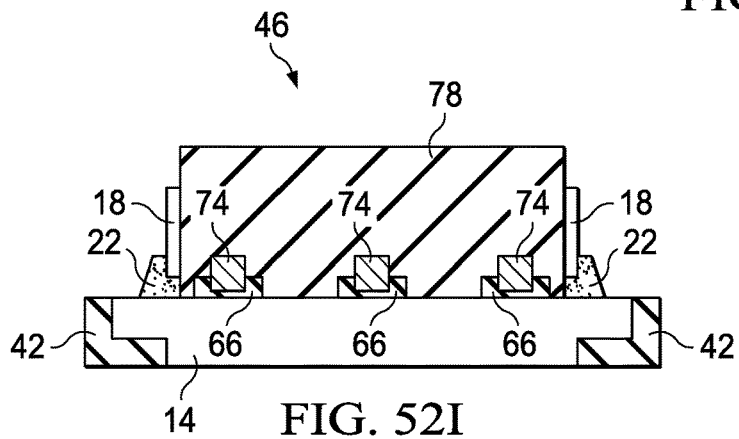
Figure 52J:
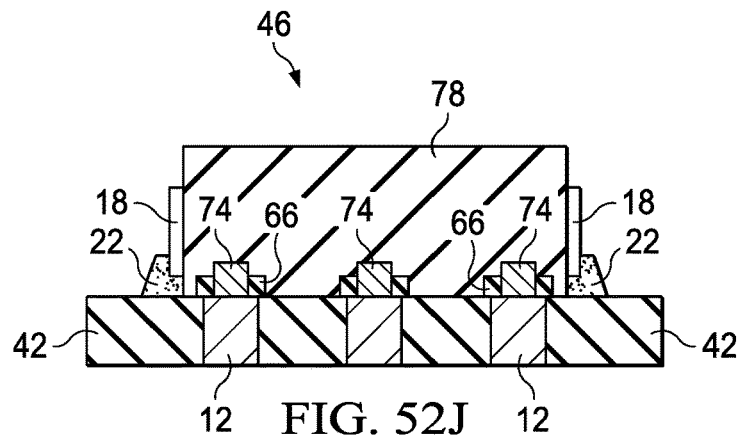

FIG. 52I is a cross-sectional view of integrated circuit (IC) die 18 attached, via die attach material 22, to a top surface of die attach pad 14 of pre-molded lead frame unit 46 along reference line Q6-Q6 in FIG. 52A, which shows conductive trace or interconnects 74, each now horizontally oriented on a respective individual base or foundation insulating layer 66, as conductive trace or interconnects 74 prepare to extend horizontally to leads 12. FIG. 52J is a cross-sectional view of integrated circuit (IC) die 18 attached, via die attach material 22, to a top surface of die attach pad 14 of pre-molded lead frame unit 46 along reference line X6-X6 in FIG. 52A, which shows a distal end of each conductive trace or interconnect 74 as it extends down through a through hole or void 56 in a respective individual base or foundation layer 66 to contact an upper surface of a respective lead 12.

Figure 52K:
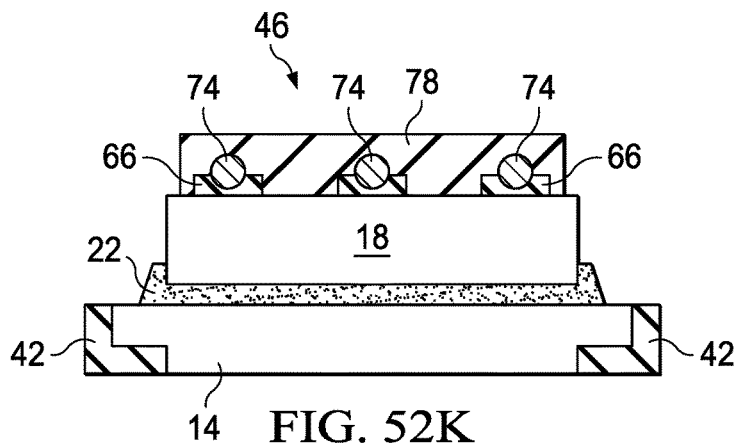
Figure 52L:
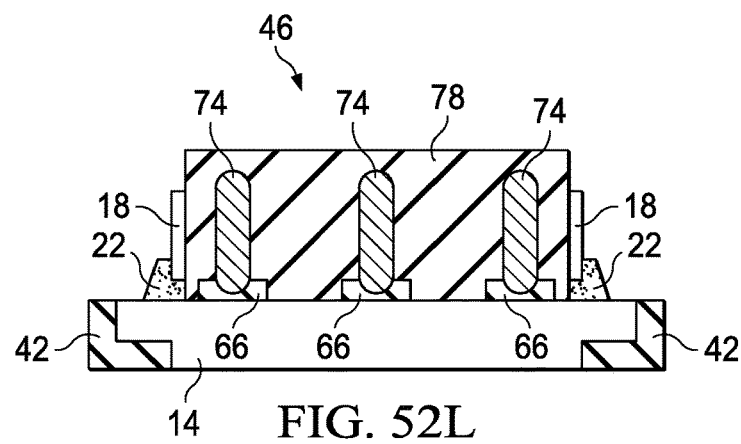
Figure 52M:
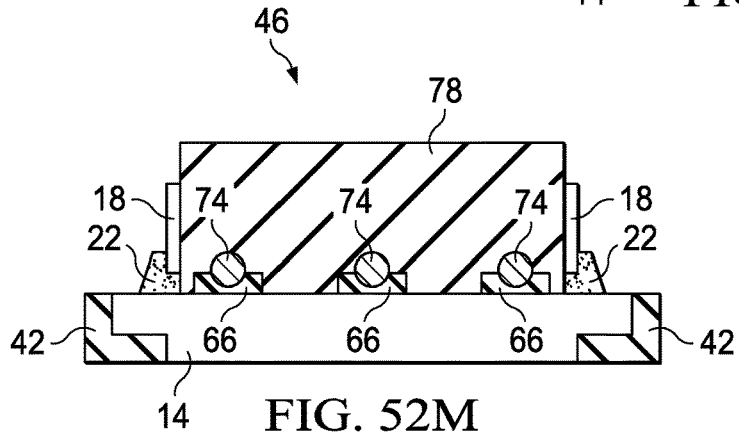
Figure 52N:
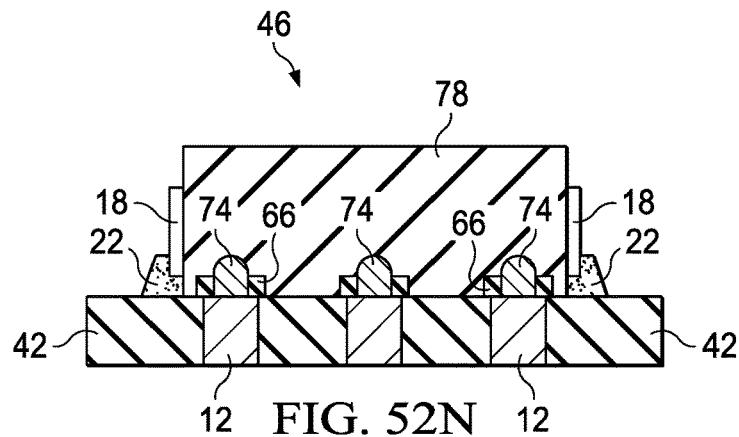

FIG. 52K is a cross-sectional view of integrated circuit (IC) die 18 attached, via die attach material 22, to a top surface of die attach pad 14 of pre-molded lead frame unit 46 along reference line O6-O6 in FIG. 52A. In this example, each individual base or foundation insulating layers 66 includes a semi-circular channel or groove 60 filled with conductive material (e.g., conductive trace or interconnect 74) from a bond pad 50 on die 18 to a lead 12. In FIG. 52K a half-blanket cover insulating layer 76 is shown covering the top and side surfaces of individual base or foundation insulating layers 66. FIG. 52L is a cross-sectional view of integrated circuit (IC) die 18 attached, via die attach material 22, to a top surface of die attach pad 14 of pre-molded lead frame unit 46 along reference line P6-P6 in FIG. 52A, which shows individual base or foundation insulating layers 66, conductive trace or interconnects 74 and a half-blanket cover insulating layer 78 extending down a vertical side of die 18 to die pad 46. FIG. 52M is a cross-sectional view of integrated circuit (IC) die 18 attached, via die attach material 22, to a top surface of die attach pad 14 of pre-molded lead frame unit 46 along reference line Q6-Q6 in FIG. 52A, which shows conductive trace or interconnects 74, each horizontally oriented on a respective individual base or foundation insulating layer 66, as conductive trace or interconnects 74 prepare to extend horizontally to leads 12. FIG. 52N is a cross-sectional view of integrated circuit (IC) die 18 attached, via die attach material 22, to a top surface of die attach pad 14 of pre-molded lead frame unit 46 along reference line X6-X6 in FIG. 52A, which shows a distal end of each conductive trace or interconnect 74 as it extends down through a through hole or void 56 in a respective individual base or foundation layer 66 to contact an upper surface of a respective lead 12.

Figure 52O:
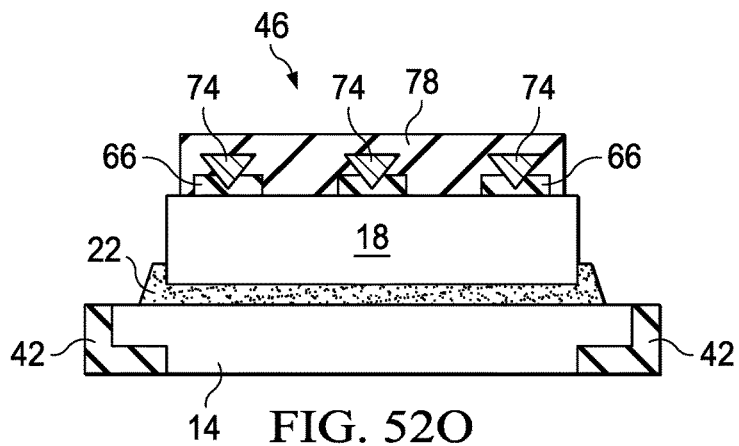
Figure 52P:
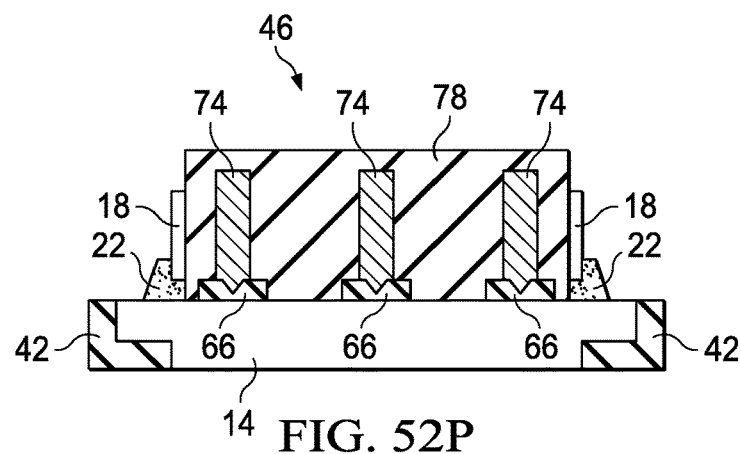
Figure 52Q:
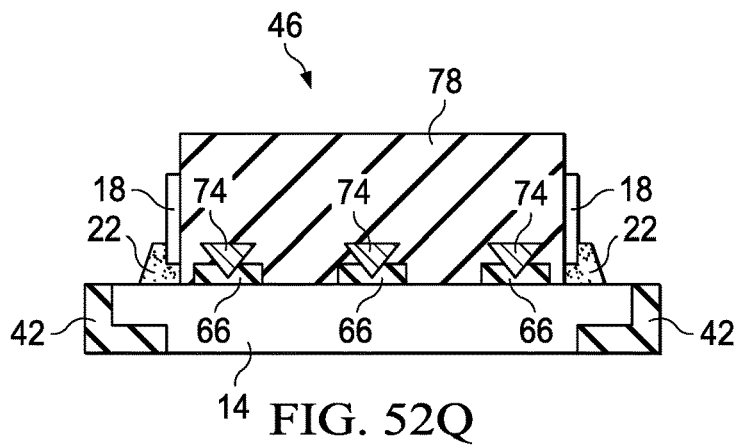
Figure 52R:
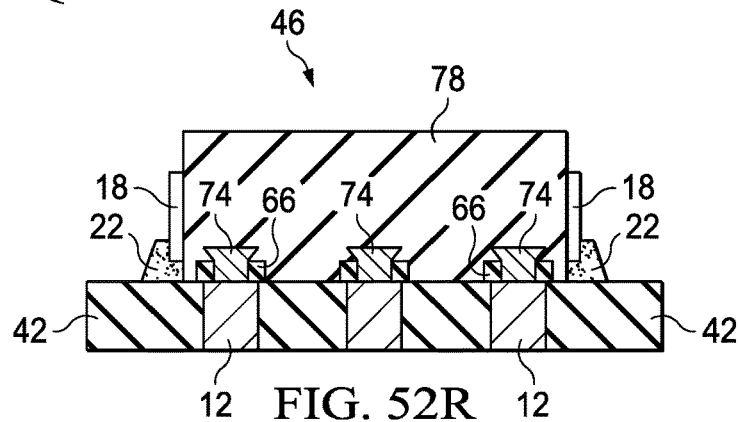

FIG. 52O is a cross-sectional view of integrated circuit (IC) die 18 attached, via die attach material 22, to a top surface of die attach pad 14 of pre-molded lead frame unit 46 along reference line O6-O6 in FIG. 52A. In this example, each base or foundation insulating layer 66 includes a v-shaped channel or groove 62 filled with conductive material (e.g., conductive trace or interconnect 74) from a bond pads 50 on die 18 to a lead 12. In FIG. 52O a half-blanket cover insulating layer 78 is shown covering the top and side surfaces of the individual base or foundation insulating layers 66. FIG. 52P is a cross-sectional view of integrated circuit (IC) die 18 attached, via die attach material 22, to a top surface of die attach pad 14 of pre-molded lead frame unit 46 along reference line P6-P6 in FIG. 52A, which shows individual base or foundation insulating layers 66, conductive trace or interconnects 74 and a half-blanket cover insulating layer 78 extending down a vertical side of die 18 to die pad 46. FIG. 52Q is a cross-sectional view of integrated circuit (IC) die 18 attached, via die attach material 22, to a top surface of die attach pad 14 of pre-molded lead frame unit 46 along reference line Q6-Q6 in FIG. 52A, which shows conductive trace or interconnects 74, now each horizontally oriented on a respective individual base or foundation insulating layer 66, as conductive trace or interconnects 74 prepare to extend horizontally to leads 12. FIG. 52R is a cross-sectional view of integrated circuit (IC) die 18 attached, via die attach material 22, to a top surface of die attach pad 14 of pre-molded lead frame unit 46 along reference line X6-X6 in FIG. 52A, which shows a distal end of each conductive trace or interconnect 74 as it extends down through a through hole or void 56 in an individual base or foundation layer 66 to contact an upper surface of a respective lead 12.

Figure 53A:
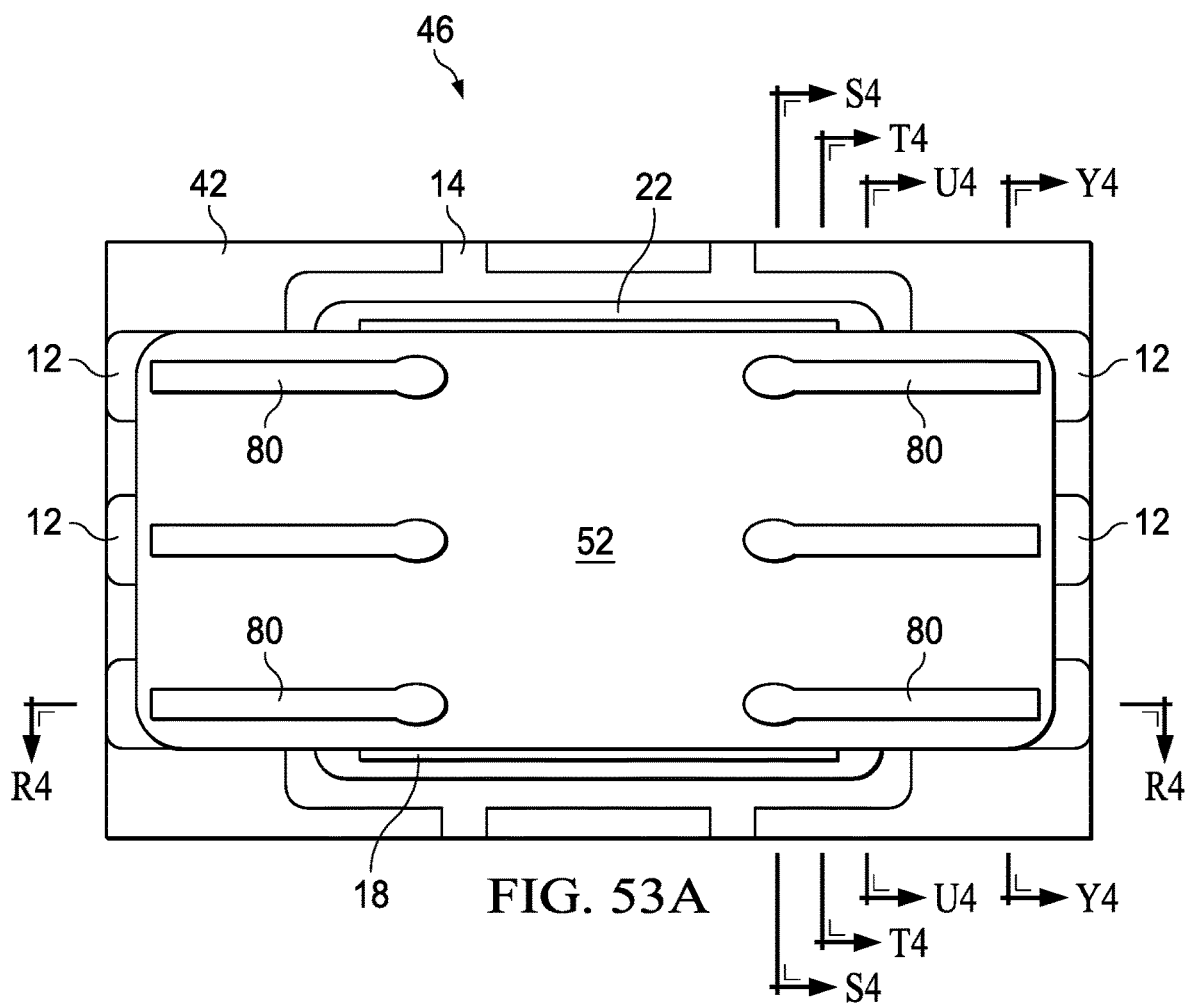
FIG. 53A is a top view of an electronic assembly undergoing fabrication according to the example method 500 of FIG. 5 with the implementation at 514, wherein individual cover insulating layers 80, each printed, deposited, formed or otherwise applied over an exposed portion of blanket base or foundation insulating layer 52, and exposed portions of conductive traces or interconnects 74 on base or foundation insulating layer 52 (see FIGS. 40A & 40B), which spans a portion of a top surface of lead fingers 12 in pre-molded lead frame 46, across pre-mold 42, up one side of die 18, across the top of die 18, down an opposite side of die 18, across pre-mold 42 on an opposite side of pre-molded lead frame 46 and to a portion of a top surface of lead fingers 12 on the opposite side of pre-molded lead frame 46.

Individual Cover Insulating Layers Over Blanket Base or Foundation Insulating Layer FIG. 53A shows individual cover insulating layers 80, each printed, deposited, formed or otherwise applied over an exposed portion of blanket base or foundation insulating layer 52, and exposed portions of conductive traces or interconnects 74 on base or foundation insulating layer 52 (see FIGS. 40A & 40B), which spans a portion of a top surface of lead fingers 12 in pre-molded lead frame 46, across pre-mold 42, up one side of die 18, across the top of die 18, down an opposite side of die 18, across pre-mold 42 on an opposite side of pre-molded lead frame 46 and to a portion of a top surface of lead fingers 12 on the opposite side of pre-molded lead frame 46 (e.g., at 514 in FIG. 5). Optionally individual cover insulating layers 80 can be cured at this time, or later with additional layers. A polymer, epoxy, silicon, mold, or other insulators can be used for individual cover insulating layers 80. Each individual cover insulating layer 80 follows the contours of the topology on blanket base or foundation insulating layer 52 and the conductive traces or interconnects 74 formed on blanket base or foundation insulating layer 52, at least sufficiently to ensure that all conductive traces or interconnects 74 are wrapped or sealed between blanket base or foundation insulating layer 52 and an individual cover insulating layer 80. As can be seen in FIG. 53A, each individual cover insulating layer 80 covers a portion of blanket base or foundation insulating layer 52, which covers the top surface of die 18 and side surfaces of die 18 which are adjacent bond pads 50 and conductive traces or interconnects 74 on blanket base or foundation insulating layer 52. Individual cover insulating layers 80 can be formed or deposited using one of multiple techniques such as screen-printing, photolithography and etching, CVD, PVD, vacuum evaporation, inkjet printing, spray coating, microdispensing, aerosol jet, ElectroHydroDynamic (EHD) techniques with the appropriate insulating properties.

If inkjet printing is used, individual cover insulating layers 80 can be formed from an inkjet deposition compatible polymer such as a polyimide ink, a thermally curable epoxy-based polymer ink, and a UV-curable acrylate ink. It is preferred that a polymer with a modulus less than 3.4 GPa and more preferred less than 2 GPa be used, to avoid undue stress on the assembly. A thickness of the blanket cover insulating layer 76 can be in the range of about 2 µm to 35 µm. A more preferred range is about 2 µm to not more than 20 µm, and still more preferred in a range from about 2 µm to about 10 µm. Because the inkjet solvent deposition material has a solvent, the initial thickness, after the solvent dissipates, the remaining material forms the insulating layer at a reduced thickness. To achieve the desired thickness, multiple inkjet depositions can be performed (e.g., at 1302 in FIG. 13). Inkjet deposition allows precise placement of material by using "drop on demand" (DOD) technology, where a reservoir of the liquid has a nozzle and a small volume of the liquid is forced from the nozzle in response to an electrical signal. The liquid forms a drop as it falls vertically onto a surface.

Figure 53B:
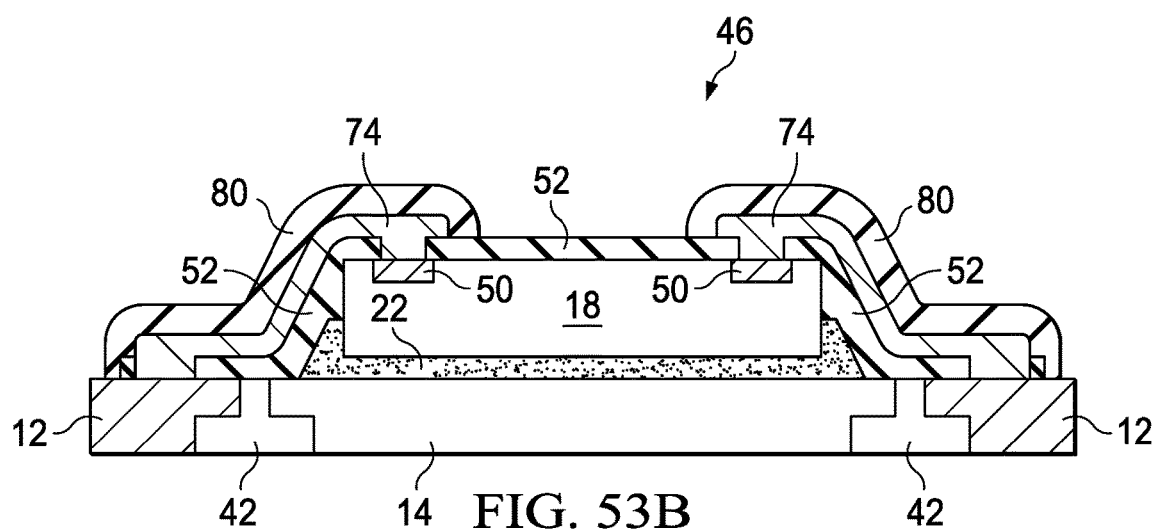
FIGS. 53B-53R are cross-sectional views of the electronic assembly of FIG. 53A along various reference lines.

The precision of the inkjet deposition tool allows deposition of the liquid material in some areas and not in others as the tool traverses across the surface (or if the tool is fixed, as the surface moves beneath the tool). Because the insulating material can be very accurately placed even in small areas, no etch or material removal step is needed to remove material after the inkjet deposition. A single pass deposition increases manufacturing throughput and reduces costs but may not produce the more accurate and/or desirable results from multiple pass deposition. As additional inkjet materials are developed, a reduction in the amount of solvent can reduce the initial thickness needed and thereby reduce the need for multiple pass depositions. FIG. 53B is a cross-sectional view of integrated circuit (IC) die 18 attached, via die attach material 22, to a top surface of die attach pad 14 of pre-molded lead frame unit 46 along reference line R4-R4 in FIG. 53A. The orientation of blanket base or foundation insulating layer 52, conductive trace or interconnects 74 and individual cover insulating layers 80 is also shown in FIG. 53A.

Figure 53C:
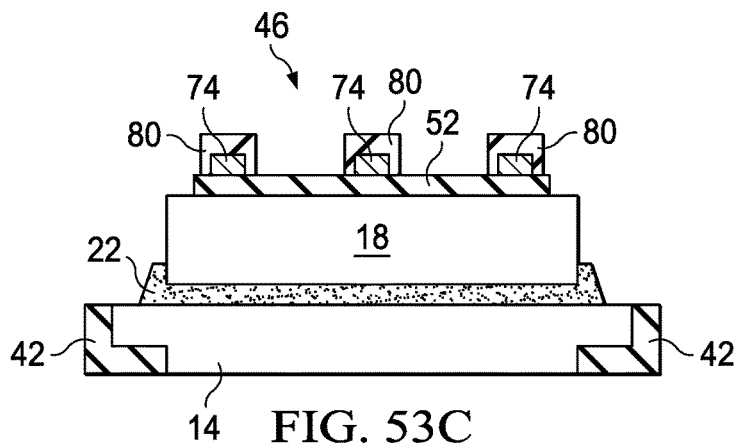
Figure 53D:
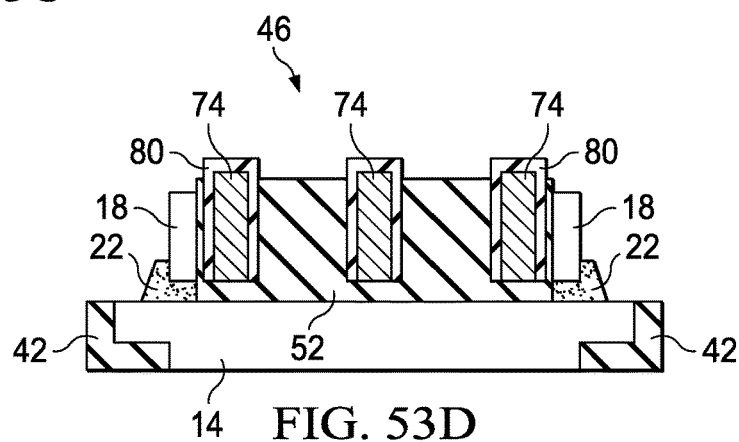
Figure 53E:
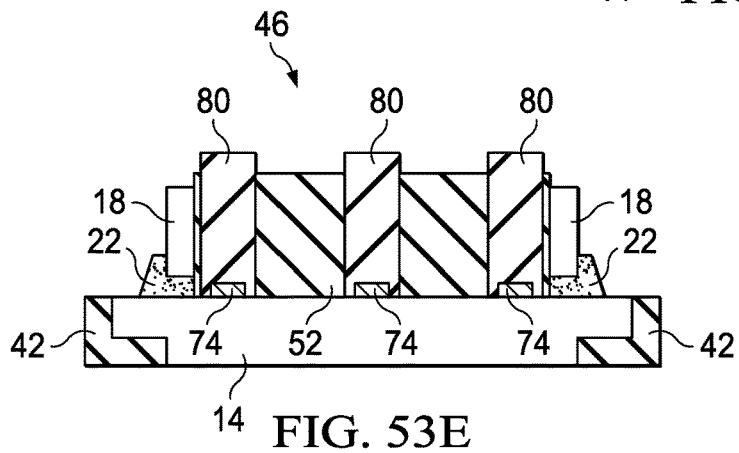
Figure 53F:
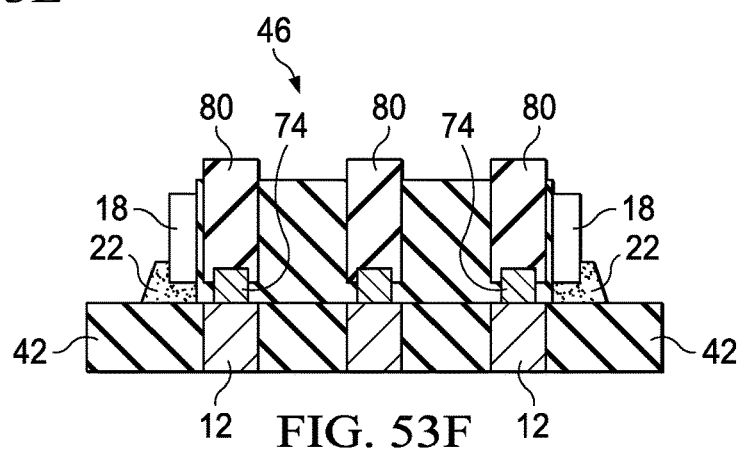

FIG. 53C is a cross-sectional view of integrated circuit (IC) die 18 attached, via die attach material 22, to a top surface of die attach pad 14 of pre-molded lead frame unit 46 along reference line S4-S4 in FIG. 53A, according to one example. In FIG. 53C individual cover insulating layers 78 are shown on top of blanket base or foundation insulating layer 52. Each individual cover insulating layer covers a respective conductive trace or interconnect on blanket base or foundation insulating layer 52. FIG. 53D is a cross-sectional view of integrated circuit (IC) die 18 attached, via die attach material 22, to a top surface of die attach pad 14 of pre-molded lead frame unit 46 along reference line T4-t4 in FIG. 53A, which shows the blanket base or foundation insulating layer 52, conductive trace or interconnects 74 and individual cover insulating layers 80 extending down a vertical side of die 18 to die pad 46. FIG. 53E is a cross-sectional view of integrated circuit (IC) die 18 attached, via die attach material 22, to a top surface of die attach pad 14 of pre-molded lead frame unit 46 along reference line U4-U4 in FIG. 53A, which shows conductive trace or interconnects 74, now horizontally oriented on blanket base or foundation insulating layer 52, as conductive trace or interconnects 74 prepare to extend horizontally to leads 12. FIG. 53F is a cross-sectional view of integrated circuit (IC) die 18 attached, via die attach material 22, to a top surface of die attach pad 14 of pre-molded lead frame unit 46 along reference line Y4-Y4 in FIG. 53A, which shows a distal end of each conductive trace or interconnect 74 as it extends down through a through hole or void 56 in blanket base or foundation layer 52 to contact an upper surface of a respective lead 12.

Figure 53G:
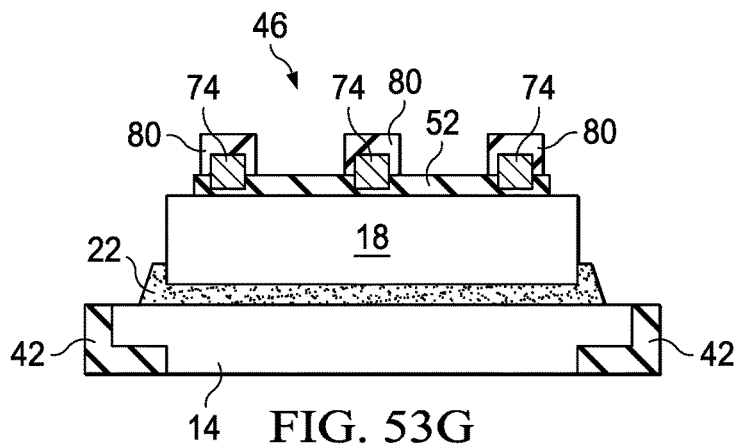
Figure 53H:
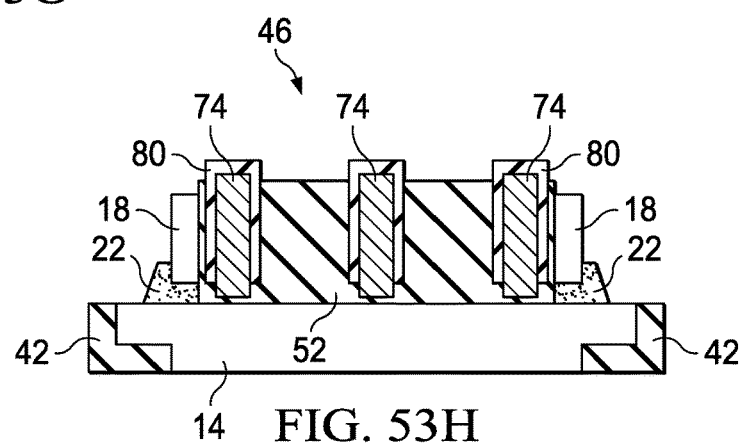
Figure 53I:
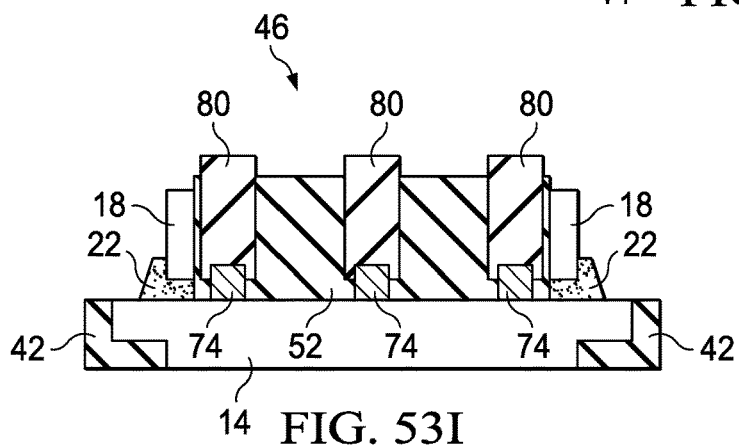
Figure 53J:
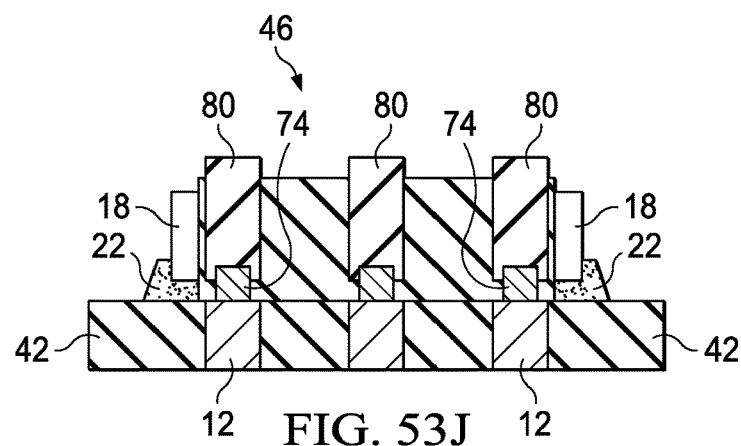

FIG. 53G is a cross-sectional view of integrated circuit (IC) die 18 attached, via die attach material 22, to a top surface of die attach pad 14 of pre-molded lead frame unit 46 along reference line S4-S4 in FIG. 53A. In this example, blanket base or foundation insulating layer 52 includes rectangular channel or grooves 58 filled with conductive material (e.g., conductive trace or interconnect 74) from bond pads 50 on die 18 to leads 12. In FIG. 53G individual cover insulating layers 78 are shown on top of blanket base or foundation insulating layer 52. Each individual cover insulating layer covers a respective conductive trace or interconnect 74. FIG. 53H is a cross-sectional view of integrated circuit (IC) die 18 attached, via die attach material 22, to a top surface of die attach pad 14 of pre-molded lead frame unit 46 along reference line T4-T4 in FIG. 53A, which shows the blanket base or foundation insulating layer 52, conductive trace or interconnects 74 and individual cover insulating layers 80 extending down a vertical side of die 18 to die pad 46. FIG. 53I is a cross-sectional view of integrated circuit (IC) die 18 attached, via die attach material 22, to a top surface of die attach pad 14 of pre-molded lead frame unit 46 along reference line U4-U4 in FIG. 53A, which shows conductive trace or interconnects 74, now horizontally oriented on blanket base or foundation insulating layer 52, as conductive trace or interconnects 74 prepare to extend horizontally to leads 12. FIG. 53J is a cross-sectional view of integrated circuit (IC) die 18 attached, via die attach material 22, to a top surface of die attach pad 14 of pre-molded lead frame unit 46 along reference line Y4-Y4 in FIG. 53A, which shows a distal end of each conductive trace or interconnect 74 as it extends down through a through hole or void 56 in blanket base or foundation layer 52 to contact an upper surface of a respective lead 12.

Figure 53K:
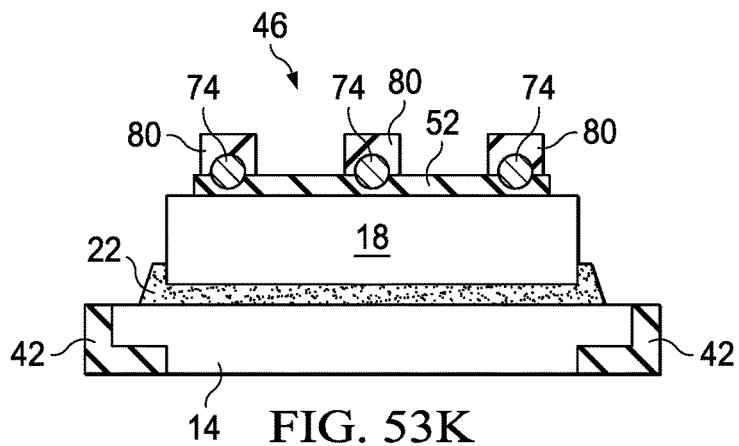
Figure 53L:
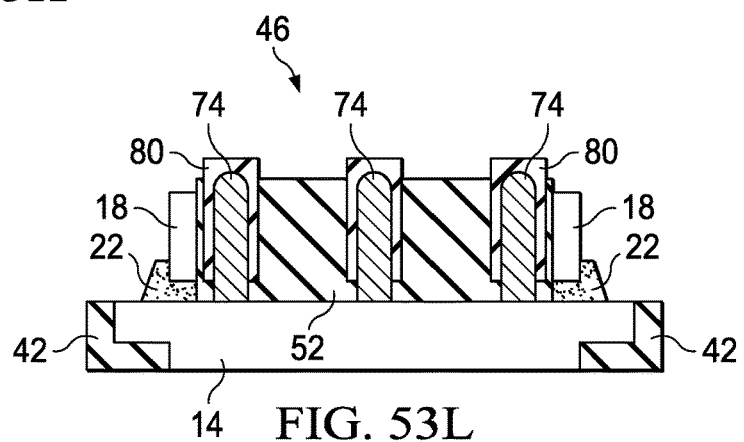
Figure 53M:
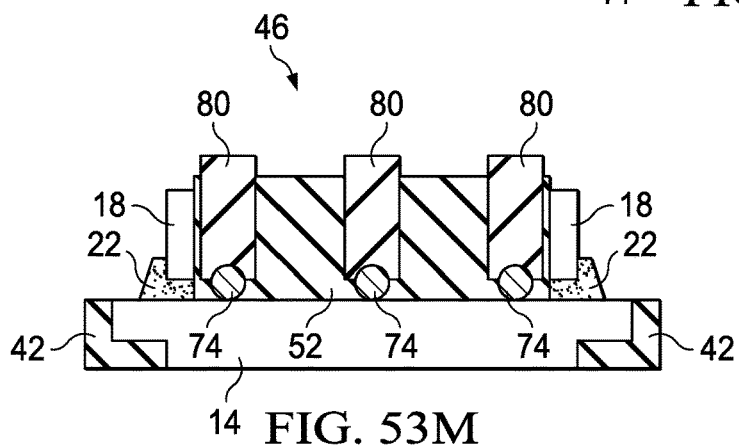
Figure 53N:
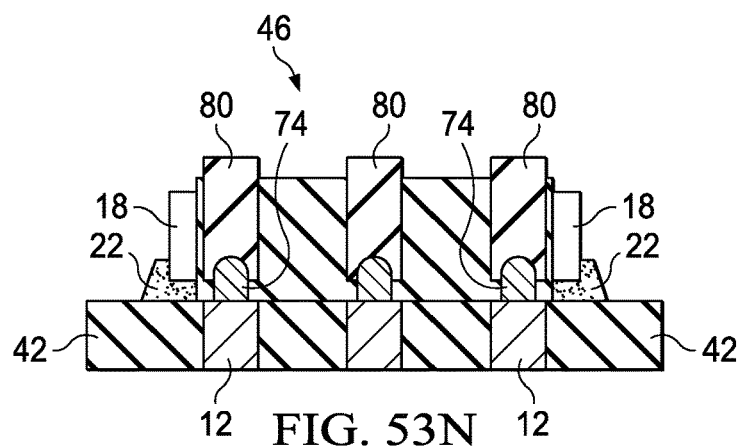

FIG. 53K is a cross-sectional view of integrated circuit (IC) die 18 attached, via die attach material 22, to a top surface of die attach pad 14 of pre-molded lead frame unit 46 along reference line S4-S4 in FIG. 53A. In this example, blanket base or foundation insulating layer 52 includes semi-circular channel or grooves 60 filled with conductive material (e.g., conductive trace or interconnect 74) from bond pads 50 on die 18 to leads 12. In FIG. 53K individual cover insulating layers 80 are shown each covering a conductive trace or interconnect 74 and a portion of blanket base or foundation insulating layer 52. FIG. 53L is a cross-sectional view of integrated circuit (IC) die 18 attached, via die attach material 22, to a top surface of die attach pad 14 of pre-molded lead frame unit 46 along reference line T4-T4 in FIG. 53A, which shows the blanket base or foundation insulating layer 52, conductive trace or interconnects 74 and individual cover insulating layers 80 extending down a vertical side of die 18 to die pad 46. FIG. 53M is a cross-sectional view of integrated circuit (IC) die 18 attached, via die attach material 22, to a top surface of die attach pad 14 of pre-molded lead frame unit 46 along reference line U4-U4 in FIG. 53A, which shows conductive trace or interconnects 74, now horizontally oriented on blanket base or foundation insulating layer 52, as conductive trace or interconnects 74 prepare to extend horizontally to leads 12. FIG. 53N is a cross-sectional view of integrated circuit (IC) die 18 attached, via die attach material 22, to a top surface of die attach pad 14 of pre-molded lead frame unit 46 along reference line Y4-Y4 in FIG. 53A, which shows a distal end of each conductive trace or interconnect 74 as it extends down through a through hole or void 56 in blanket base or foundation layer 52 to contact an upper surface of a respective lead 12.

Figure 53O:
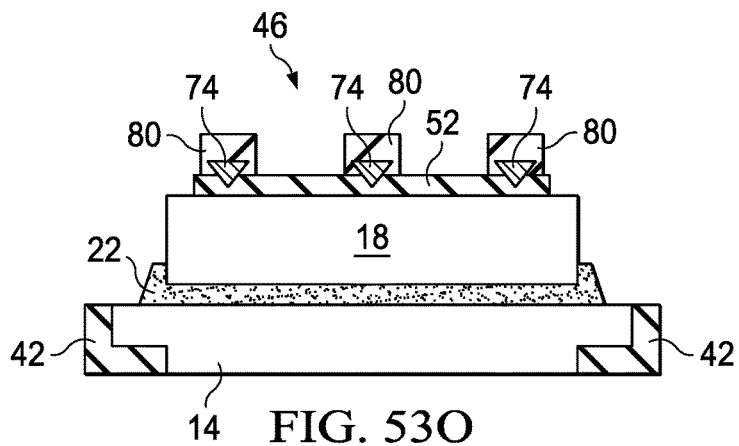
Figure 53P:
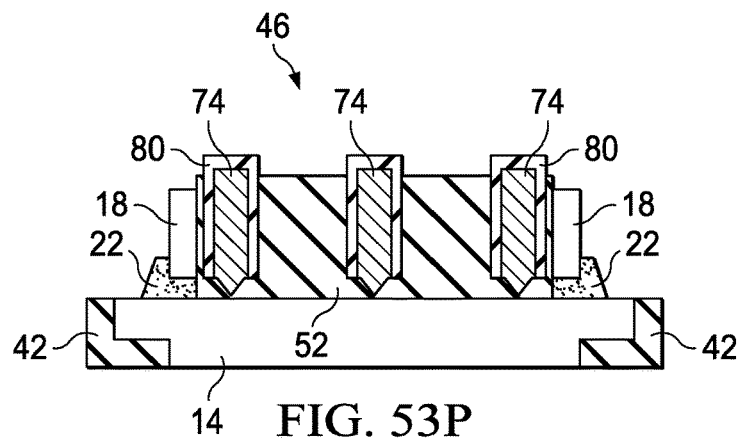
Figure 53Q:
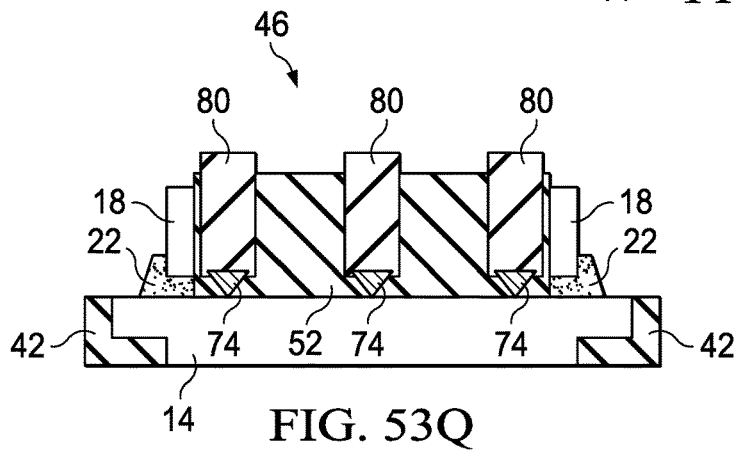
Figure 53R:
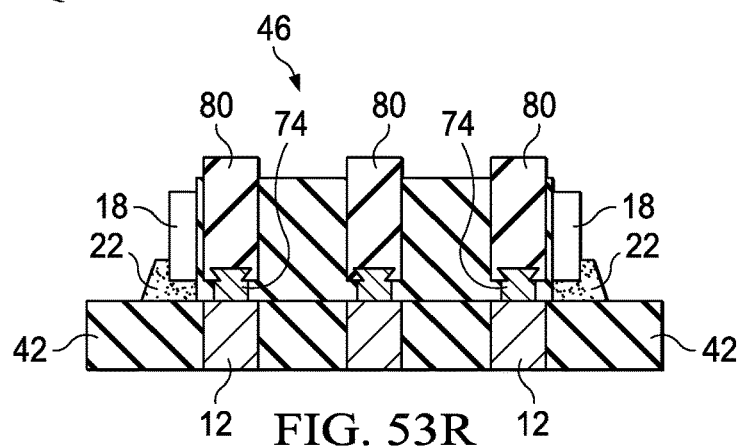

FIG. 53O is a cross-sectional view of integrated circuit (IC) die 18 attached, via die attach material 22, to a top surface of die attach pad 14 of pre-molded lead frame unit 46 along reference line S4-S4 in FIG. 53A. In this example, blanket base or foundation insulating layer 52 includes v-shaped channel or grooves 62 filled with conductive material (e.g., conductive trace or interconnect 74) from bond pads 50 on die 18 to leads 12. In FIG. 53O individual cover insulating layers 80 are each shown covering a conductive trace or interconnect 74 and a portion of blanket base or foundation insulating layer 52. FIG. 53P is a cross-sectional view of integrated circuit (IC) die 18 attached, via die attach material 22, to a top surface of die attach pad 14 of pre-molded lead frame unit 46 along reference line T4-T4 in FIG. 53A, which shows the blanket base or foundation insulating layer 52, conductive trace or interconnects 74 and individual cover insulating layers 80 extending down a vertical side of die 18 to die pad 46. FIG. 53Q is a cross-sectional view of integrated circuit (IC) die 18 attached, via die attach material 22, to a top surface of die attach pad 14 of pre-molded lead frame unit 46 along reference line U4-U4 in FIG. 53A, which shows conductive trace or interconnects 74, now horizontally oriented on blanket base or foundation insulating layer 52, as conductive trace or interconnects 74 prepare to extend horizontally to leads 12. FIG. 53R is a cross-sectional view of integrated circuit (IC) die 18 attached, via die attach material 22, to a top surface of die attach pad 14 of pre-molded lead frame unit 46 along reference line Y4-Y4 in FIG. 53A, which shows a distal end of each conductive trace or interconnect 74 as it extends down through a through hole or void 56 in blanket base or foundation layer 52 to contact an upper surface of a respective lead 12.

Figure 54A:
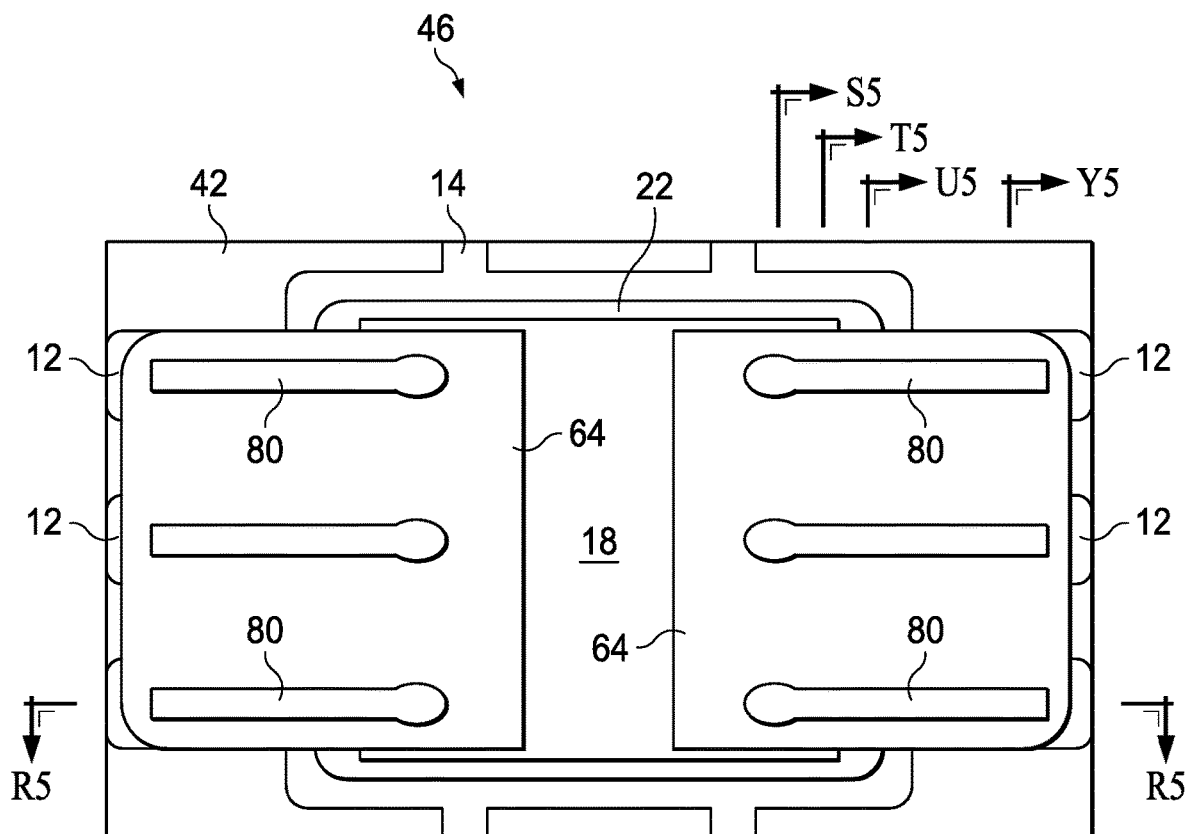
FIG. 54A is a top view of an electronic assembly undergoing fabrication according to the example method 500 of FIG. 5 with the implementation at 514, wherein individual cover insulating layers 80, each printed, deposited, formed or otherwise applied over exposed portions of a half-blanket base or foundation insulating layer 64, and exposed portions of conductive traces or interconnects 74 on half-blanket base or foundation insulating layers 66 (see FIGS. 41A & 41B), each spanning a portion of a top surface of lead fingers 12 in pre-molded lead frame 46, across pre-mold 42, up one side of die 18, across a portion of the top of die 18 just beyond the bond pads 50 closest to the side of die 18 upon which the respective half-blanket base or foundation insulating layer 64 is adjacent.

Individual Cover Insulating Layers Over Half-Blanket Base or Foundation Insulating Layers FIG. 54A shows individual cover insulating layers 80, each printed, deposited, formed or otherwise applied over exposed portions of a half-blanket base or foundation insulating layer 64, and exposed portions of conductive traces or interconnects 74 on half-blanket base or foundation insulating layers 66 (see FIGS. 41A & 41B), each spanning a portion of a top surface of lead fingers 12 in pre-molded lead frame 46, across pre-mold 42, up one side of die 18, across a portion of the top of die 18 just beyond the bond pads 50 closest to the side of die 18 upon which the respective half-blanket base or foundation insulating layer 64 is adjacent (e.g., at 514 in FIG. 5). An area on top of die 18 between the half-blanket base or foundation insulating layers 64 remains uncovered by any base or foundation layer. Optionally individual cover insulating layers 80 can be cured at this time, or later with additional layers. A polymer, epoxy, silicon, mold, or other insulators can be used for individual cover insulating layers 80. Each individual cover insulating layer 80 follows the contours of the topology on a respective half-blanket base or foundation insulating layer 64 and the conductive traces or interconnects 74 formed on a respective half-blanket base or foundation insulating layer 64, at least sufficiently to ensure that all conductive traces or interconnects 74 are wrapped or sealed between a half-blanket base or foundation insulating layer 64 and an individual cover insulating layer 80. As can be seen in FIG. 54A, each half-blanket cover insulating layer 80 covers a portion of a half-blanket base or foundation insulating layer 64 and a conductive trace or interconnect 74 on a half-blanket base or foundation insulating layer 64. Individual cover insulating layers 80 can be formed or deposited using one of multiple techniques such as screen-printing, photolithography and etching, CVD, PVD, vacuum evaporation, inkjet printing, spray coating, microdispensing, aerosol jet, ElectroHydroDynamic (EHD) techniques with the appropriate insulating properties.

If inkjet printing is used, individual cover insulating layers 80 can be formed from an inkjet deposition compatible polymer such as a polyimide ink, a thermally curable epoxy-based polymer ink, and a UV-curable acrylate ink. It is preferred that a polymer with a modulus less than 3.4 GPa and more preferred less than 2 GPa be used, to avoid undue stress on the assembly. A thickness of the blanket cover insulating layer 76 can be in the range of about 2 μm to 35 μm. A more preferred range is about 2 μm to not more than 20 μm, and still more preferred in a range from about 2 μm to about 10 μm. Because the inkjet solvent deposition material has a solvent, the initial thickness, after the solvent dissipates, the remaining material forms the insulating layer at a reduced thickness. To achieve the desired thickness, multiple inkjet depositions can be performed (e.g., at 1302 in FIG. 13). Inkjet deposition allows precise placement of material by using "drop on demand" (DOD) technology, where a reservoir of the liquid has a nozzle and a small volume of the liquid is forced from the nozzle in response to an electrical signal. The liquid forms a drop as it falls vertically onto a surface.

Figure 54B:
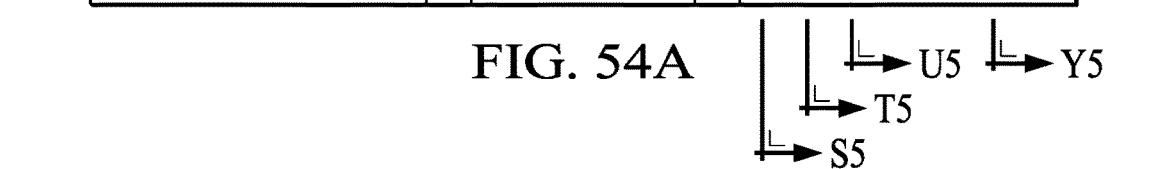
FIGS. 54B-54R are cross-sectional views of the electronic assembly of FIG. 54A along various reference lines.

The precision of the inkjet deposition tool allows deposition of the liquid material in some areas and not in others as the tool traverses across the surface (or if the tool is fixed, as the surface moves beneath the tool). Because the insulating material can be very accurately placed even in small areas, no etch or material removal step is needed to remove material after the inkjet deposition. A single pass deposition increases manufacturing throughput and reduces costs but may not produce the more accurate and/or desirable results from multiple pass deposition. As additional inkjet materials are developed, a reduction in the amount of solvent can reduce the initial thickness needed and thereby reduce the need for multiple pass depositions. FIG. 54B is a cross-sectional view of integrated circuit (IC) die 18 attached, via die attach material 22, to a top surface of die attach pad 14 of pre-molded lead frame unit 46 along reference line R5-R5 in FIG. 54A. The orientation of half-blanket base or foundation insulating layers 64, conductive trace or interconnects 74 and individual cover insulating layers 80 is also shown in FIG. 54A.

Figure 54C:
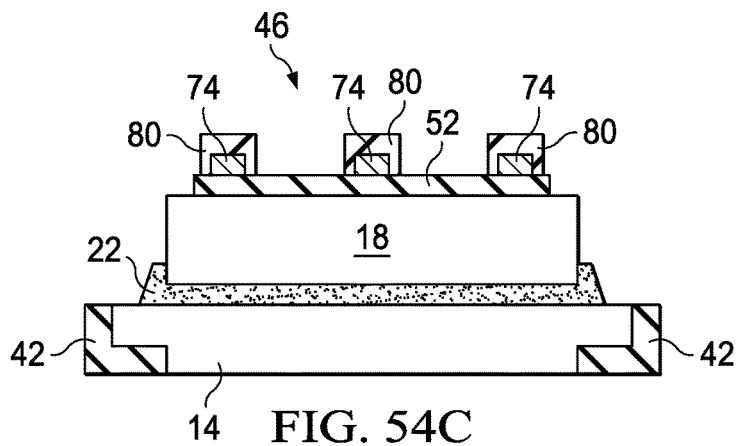
Figure 54D:
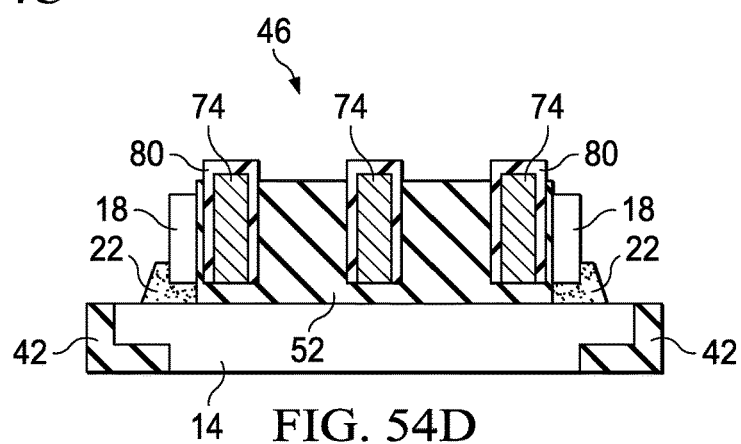
Figure 54E:
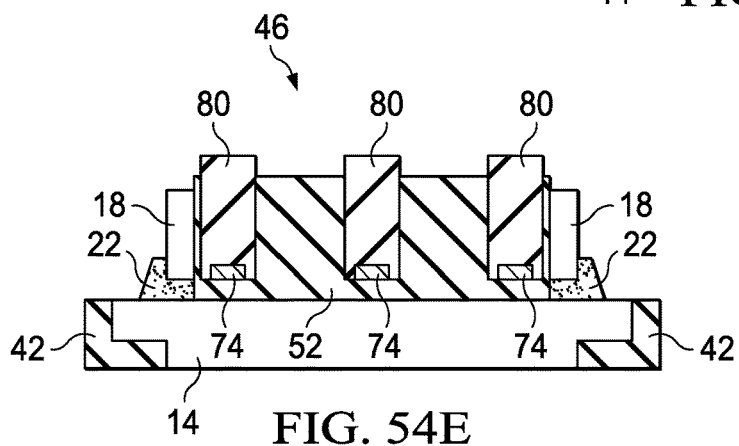
Figure 54F:
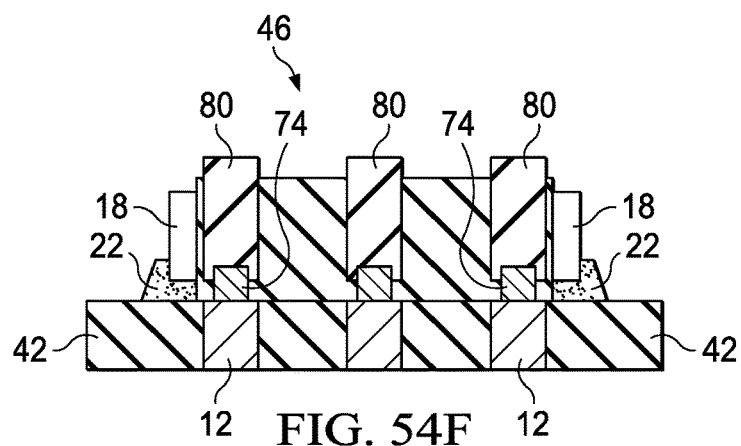

FIG. 54C is a cross-sectional view of integrated circuit (IC) die 18 attached, via die attach material 22, to a top surface of die attach pad 14 of pre-molded lead frame unit 46 along reference line S5-S5 in FIG. 54A, according to one example. In FIG. 54C individual cover insulating layers 80 are shown covering a portion of a half-blanket base or foundation insulating layer 64. FIG. 54D is a cross-sectional view of integrated circuit (IC) die 18 attached, via die attach material 22, to a top surface of die attach pad 14 of pre-molded lead frame unit 46 along reference line T5-T5 in FIG. 54A, which shows a half-blanket base or foundation insulating layers 64, conductive trace or interconnects 74 and individual cover insulating layers 80 extending down a vertical side of die 18 to die pad 46. FIG. 54E is a cross-sectional view of integrated circuit (IC) die 18 attached, via die attach material 22, to a top surface of die attach pad 14 of pre-molded lead frame unit 46 along reference line U5-U5 in FIG. 54A, which shows conductive trace or interconnects 74, now horizontally oriented on a half-blanket base or foundation insulating layer 64, as conductive trace or interconnects 74 prepare to extend horizontally to leads 12. FIG. 54F is a cross-sectional view of integrated circuit (IC) die 18 attached, via die attach material 22, to a top surface of die attach pad 14 of pre-molded lead frame unit 46 along reference line Y5-Y5 in FIG. 54A, which shows a distal end of each conductive trace or interconnect 74 as it extends down through a through hole or void 56 in a half-blanket base or foundation layer 64 to contact an upper surface of a respective lead 12.

Figure 54G:
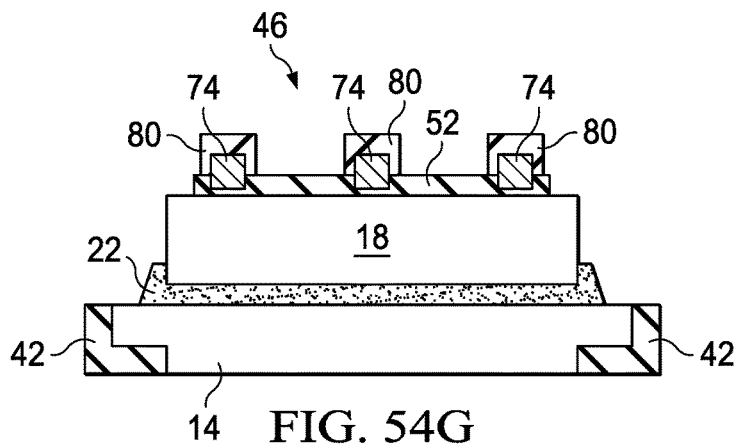
Figure 54H:
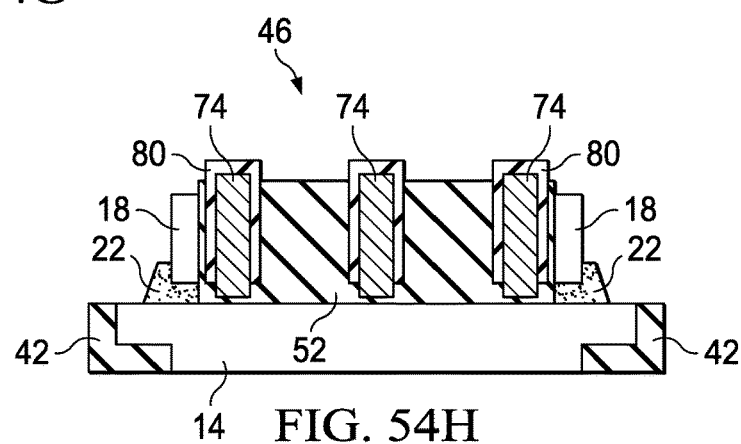
Figure 54I:
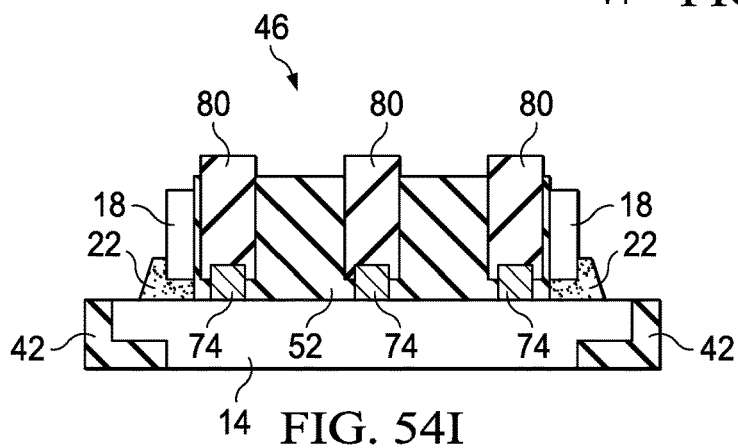
Figure 54J:
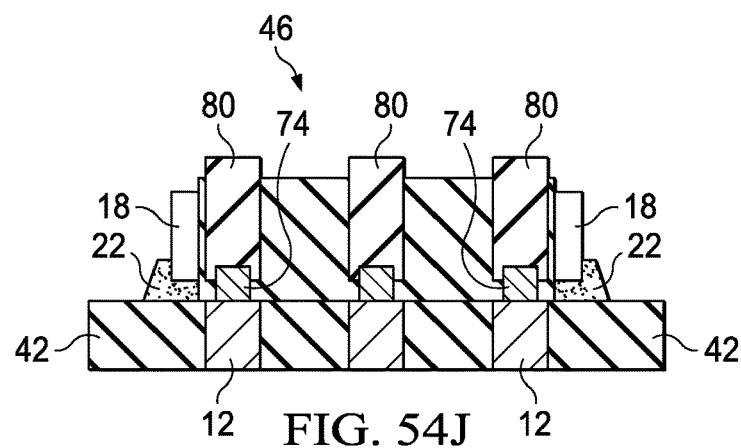

FIG. 54G is a cross-sectional view of integrated circuit (IC) die 18 attached, via die attach material 22, to a top surface of die attach pad 14 of pre-molded lead frame unit 46 along reference line S5-S5 in FIG. 54A. In this example, each half-blanket base or foundation insulating layer 64 includes rectangular channel or grooves 58 filled with conductive material (e.g., conductive trace or interconnect 74) from bond pads 50 on die 18 to leads 12. In FIG. 54G individual insulating layers 80 are shown covering a portion of a half-blanket base or foundation insulating layer 64. FIG. 54H is a cross-sectional view of integrated circuit (IC) die 18 attached, via die attach material 22, to a top surface of die attach pad 14 of pre-molded lead frame unit 46 along reference line T5-T5 in FIG. 54A, which shows a half-blanket base or foundation insulating layer 64, conductive trace or interconnects 74 and individual cover insulating layers 80 extending down a vertical side of die 18 to die pad 46. FIG. 54I is a cross-sectional view of integrated circuit (IC) die 18 attached, via die attach material 22, to a top surface of die attach pad 14 of pre-molded lead frame unit 46 along reference line U5-U5 in FIG. 54A, which shows conductive trace or interconnects 74, now horizontally oriented on a half-blanket base or foundation insulating layer 64, as conductive trace or interconnects 74 prepare to extend horizontally to leads 12. FIG. 54J is a cross-sectional view of integrated circuit (IC) die 18 attached, via die attach material 22, to a top surface of die attach pad 14 of pre-molded lead frame unit 46 along reference line Y5-Y5 in FIG. 54A, which shows a distal end of each conductive trace or interconnect 74 as it extends down through a through hole or void 56 in a half-blanket base or foundation layer 64 to contact an upper surface of a respective lead 12.

Figure 54K:
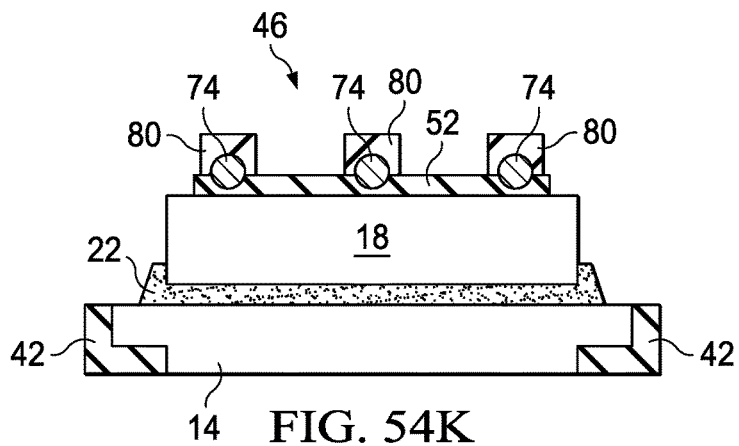
Figure 54L:
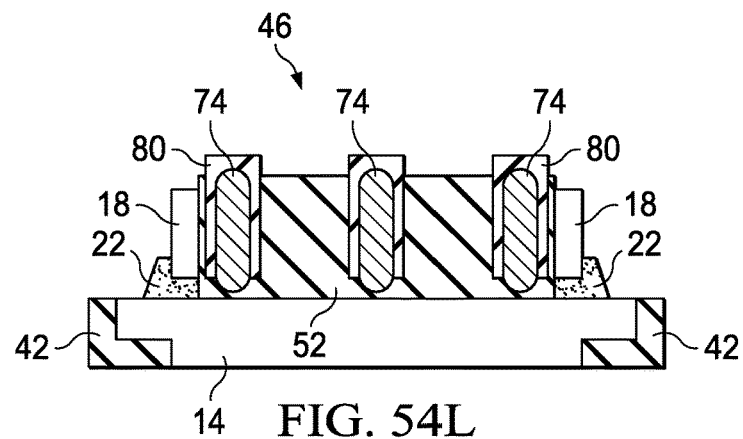
Figure 54M:
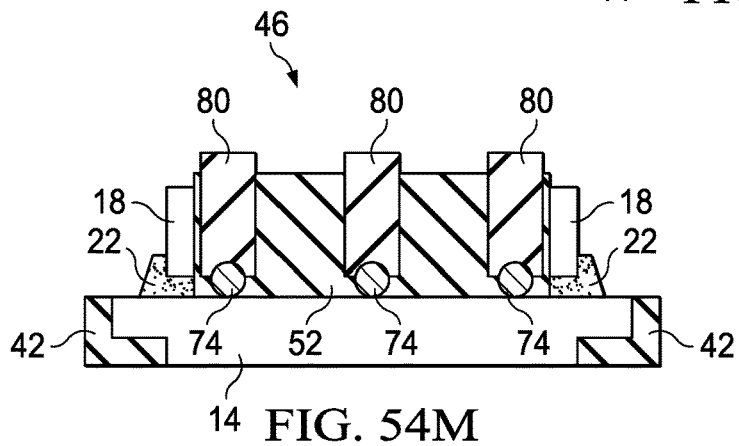
Figure 54N:
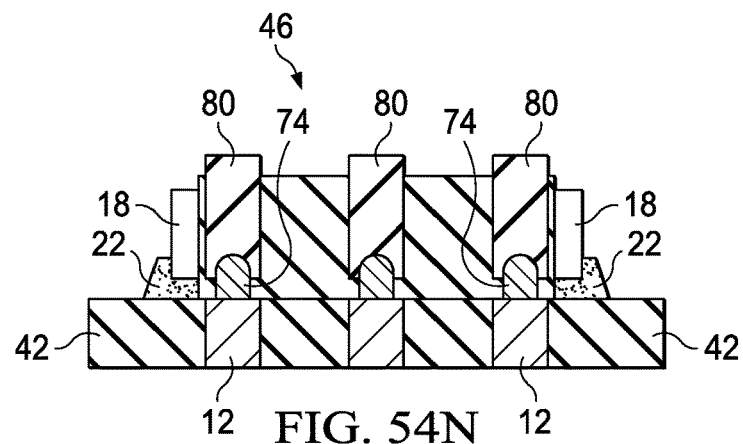

FIG. 54K is a cross-sectional view of integrated circuit (IC) die 18 attached, via die attach material 22, to a top surface of die attach pad 14 of pre-molded lead frame unit 46 along reference line S5-S5 in FIG. 54A. In this example, half-blanket base or foundation insulating layers 64 include semi-circular channel or grooves 60 filled with conductive material (e.g., conductive trace or interconnect 74) from bond pads 50 on die 18 to leads 12. In FIG. 54K individual cover insulating layers 80 are shown covering a portion of half-blanket base or foundation insulating layer 64 conductive traces or interconnects 74. FIG. 54L is a cross-sectional view of integrated circuit (IC) die 18 attached, via die attach material 22, to a top surface of die attach pad 14 of pre-molded lead frame unit 46 along reference line T5-T5 in FIG. 54A, which shows a half-blanket base or foundation insulating layer 64, conductive trace or interconnects 74 and individual cover insulating layers 80 extending down a vertical side of die 18 to die pad 46. FIG. 54M is a cross-sectional view of integrated circuit (IC) die 18 attached, via die attach material 22, to a top surface of die attach pad 14 of pre-molded lead frame unit 46 along reference line U5-U5 in FIG. 54A, which shows conductive trace or interconnects 74, now horizontally oriented on a half-blanket base or foundation insulating layer 64, as conductive trace or interconnects 74 prepare to extend horizontally to leads 12. FIG. 54N is a cross-sectional view of integrated circuit (IC) die 18 attached, via die attach material 22, to a top surface of die attach pad 14 of pre-molded lead frame unit 46 along reference line Y5-Y5 in FIG. 54A, which shows a distal end of each conductive trace or interconnect 74 as it extends down through a through hole or void 56 in a half-blanket base or foundation layer 64 to contact an upper surface of a respective lead 12.

Figure 54O:
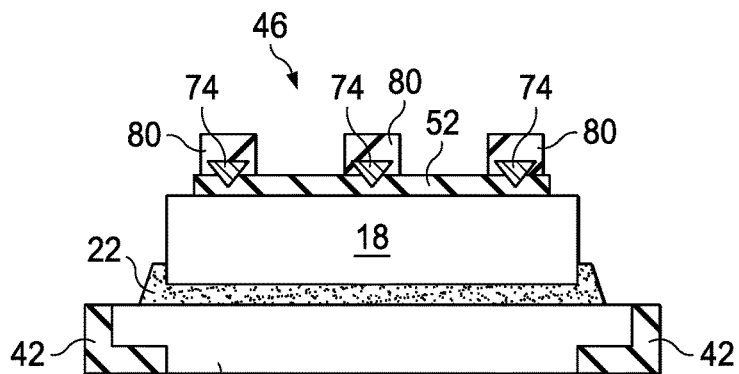
Figure 54P:
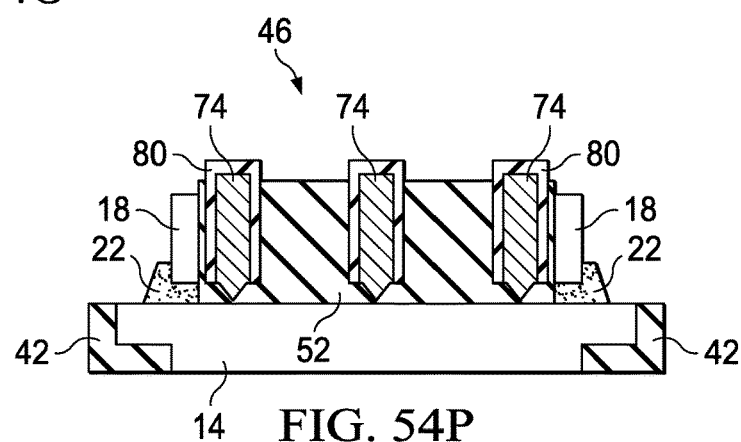
Figure 54Q:
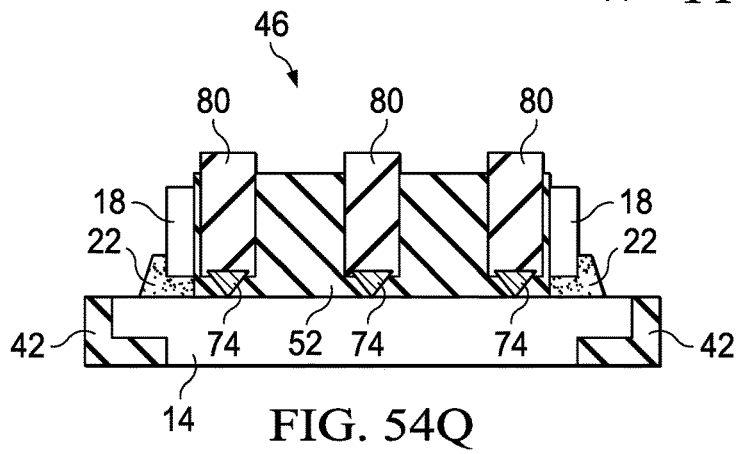
Figure 54R:
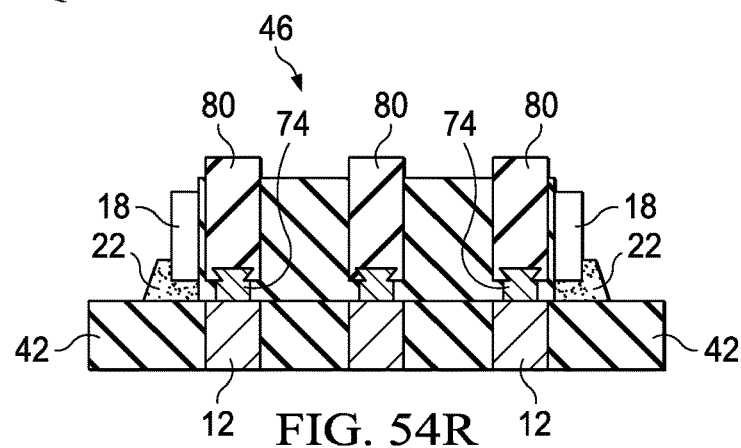

FIG. 54O is a cross-sectional view of integrated circuit (IC) die 18 attached, via die attach material 22, to a top surface of die attach pad 14 of pre-molded lead frame unit 46 along reference line S5-S5 in FIG. 54A. In this example, half-blanket base or foundation insulating layers 64 includes v-shaped channel or grooves 62 filled with conductive material (e.g., conductive trace or interconnect 74) from bond pads 50 on die 18 to leads 12. In FIG. 54O individual cover insulating layers 80 are shown covering a portion of a half-blanket base or foundation insulating layer 64. FIG. 54P is a cross-sectional view of integrated circuit (IC) die 18 attached, via die attach material 22, to a top surface of die attach pad 14 of pre-molded lead frame unit 46 along reference line T5-T5 in FIG. 54A, which shows a half-blanket base or foundation insulating layer 64, conductive trace or interconnects 74 and individual cover insulating layers 80 extending down a vertical side of die 18 to die pad 46. FIG. 54Q is a cross-sectional view of integrated circuit (IC) die 18 attached, via die attach material 22, to a top surface of die attach pad 14 of pre-molded lead frame unit 46 along reference line U5-U5 in FIG. 54A, which shows conductive trace or interconnects 74, now horizontally oriented on a half-blanket base or foundation insulating layer 64, as conductive trace or interconnects 74 prepare to extend horizontally to leads 12. FIG. 54R is a cross-sectional view of integrated circuit (IC) die 18 attached, via die attach material 22, to a top surface of die attach pad 14 of pre-molded lead frame unit 46 along reference line Y5-Y5 in FIG. 54A, which shows a distal end of each conductive trace or interconnect 74 as it extends down through a through hole or void 56 in a half-blanket base or foundation layer 64 to contact an upper surface of a respective lead 12.

Figure 55A:
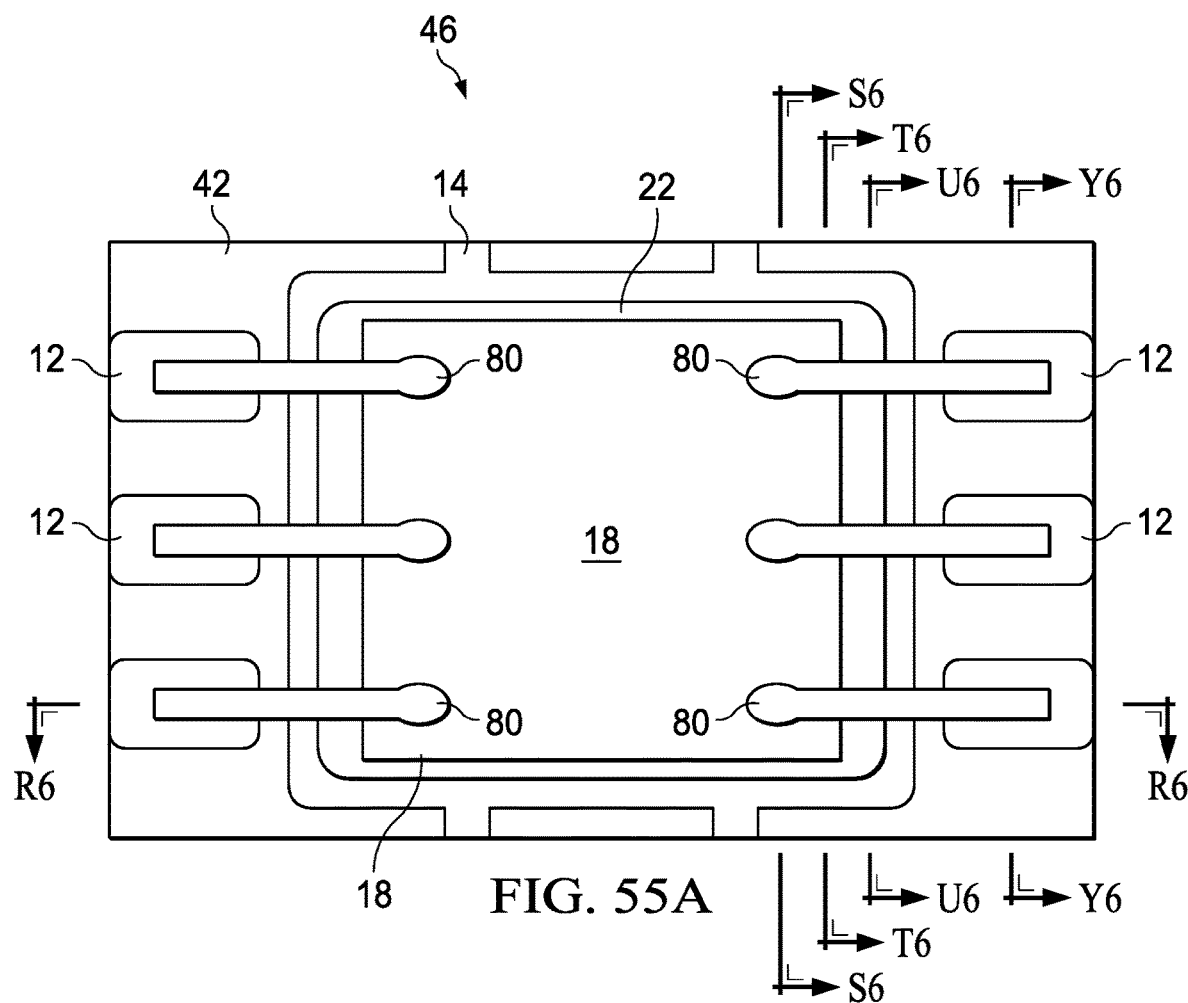
FIG. 55A is a top view of an electronic assembly undergoing fabrication according to the example method 500 of FIG. 5 with the implementation at 514, wherein individual cover insulating layers 80, each printed, deposited, formed or otherwise applied over exposed portions of individual base or foundation insulating layers 66, and exposed portions of each conductive trace or interconnect 74 on an individual blanket base or foundation insulating layer 66 (see FIGS. 42A & 42B), each spanning a portion of a top surface of lead fingers 12 in pre-molded lead frame 46, across pre-mold 42, up one side of die 18, across a portion of the top of die 18 just beyond a bond pad 50 closest to the side of die 18 upon which the respective individual base or foundation insulating layer 66 is adjacent.

Individual Cover Insulating Layers Over Individual Base or Foundation Insulating Layers FIG. 55A shows individual cover insulating layers 80, each printed, deposited, formed or otherwise applied over exposed portions of individual base or foundation insulating layers 66, and exposed portions of each conductive trace or interconnect 74 on an individual blanket base or foundation insulating layer 66 (see FIGS. 42A & 42B), each spanning a portion of a top surface of lead fingers 12 in pre-molded lead frame 46, across pre-mold 42, up one side of die 18, across a portion of the top of die 18 just beyond a bond pad 50 closest to the side of die 18 upon which the respective individual base or foundation insulating layer 66 is adjacent (e.g., at 514 in FIG. 5). There remain multiple areas on top of die 18 between the individual base or foundation insulating layers 66 on each side of the top of the die and between the two rows of dies on the top side of the die remains uncovered by any base or foundation layer. Optionally individual cover insulating layers 80 can be cured at this time, or later with additional layers. A polymer, epoxy, silicon, mold, or other insulators can be used for individual cover insulating layers 80. Individual cover insulating layers 80 follows the contours of the topology on individual base or foundation insulating layers 66 and the conductive traces or interconnects 74 formed on the individual base or foundation insulating layers 66, at least sufficiently to ensure that each conductive trace or interconnect 74 is wrapped or sealed between a respective individual base or foundation insulating layer 66 and an individual cover insulating layer 80. As can be seen in FIG. 55A, individual cover insulating layers 80 each cover an individual base or foundation insulating layer 66 and the conductive trace or interconnect 74 printed or formed thereon. Individual cover insulating layers 80 can be formed or deposited using one of multiple techniques such as screen-printing, photolithography and etching, CVD, PVD, vacuum evaporation, inkjet printing, spray coating, microdispensing, aerosol jet, ElectroHydroDynamic (EHD) techniques with the appropriate insulating properties.

If inkjet printing is used, individual cover insulating layers 80 can be formed from an inkjet deposition compatible polymer such as a polyimide ink, a thermally curable epoxy-based polymer ink, and a UV-curable acrylate ink. It is preferred that a polymer with a modulus less than 3.4 GPa and more preferred less than 2 GPa be used, to avoid undue stress on the assembly. A thickness of the blanket cover insulating layer 76 can be in the range of about 2 µm to 35 µm. A more preferred range is about 2 µm to not more than 20 µm, and still more preferred in a range from about 2 µm to about 10 µm. Because the inkjet solvent deposition material has a solvent, the initial thickness, after the solvent dissipates, the remaining material forms the insulating layer at a reduced thickness. To achieve the desired thickness, multiple inkjet depositions can be performed (e.g., at 1302 in FIG. 13). Inkjet deposition allows precise placement of material by using "drop on demand" (DOD) technology, where a reservoir of the liquid has a nozzle and a small volume of the liquid is forced from the nozzle in response to an electrical signal. The liquid forms a drop as it falls vertically onto a surface.

Figure 55B:
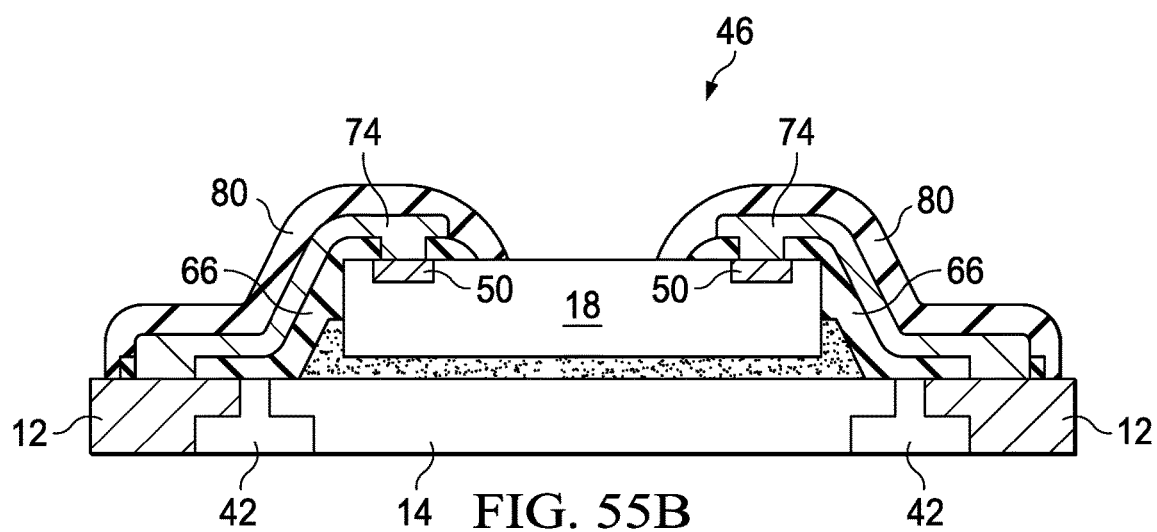
FIGS. 55B-55R are cross-sectional views of the electronic assembly of FIG. 55A along various reference lines.

The precision of the inkjet deposition tool allows deposition of the liquid material in some areas and not in others as the tool traverses across the surface (or if the tool is fixed, as the surface moves beneath the tool). Because the insulating material can be very accurately placed even in small areas, no etch or material removal step is needed to remove material after the inkjet deposition. A single pass deposition increases manufacturing throughput and reduces costs but may not produce the more accurate and/or desirable results from multiple pass deposition. As additional inkjet materials are developed, a reduction in the amount of solvent can reduce the initial thickness needed and thereby reduce the need for multiple pass depositions. FIG. 55B is a cross-sectional view of integrated circuit (IC) die 18 attached, via die attach material 22, to a top surface of die attach pad 14 of pre-molded lead frame unit 46 along reference line R6-R6 in FIG. 55A. The orientation of individual base or foundation insulating layers 66, conductive trace or interconnects 74 and individual cover insulating layers 80 is also shown in FIG. 55A.

Figure 55C:
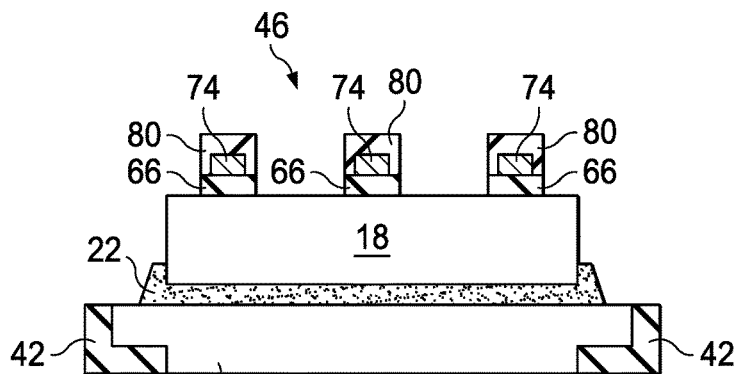
Figure 55D:
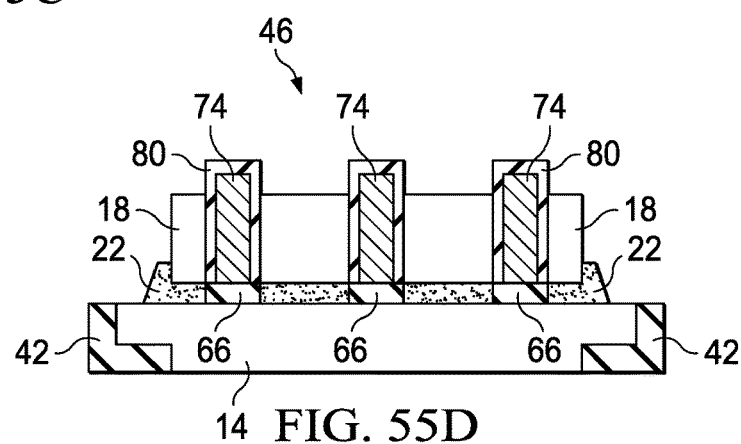
Figure 55E:
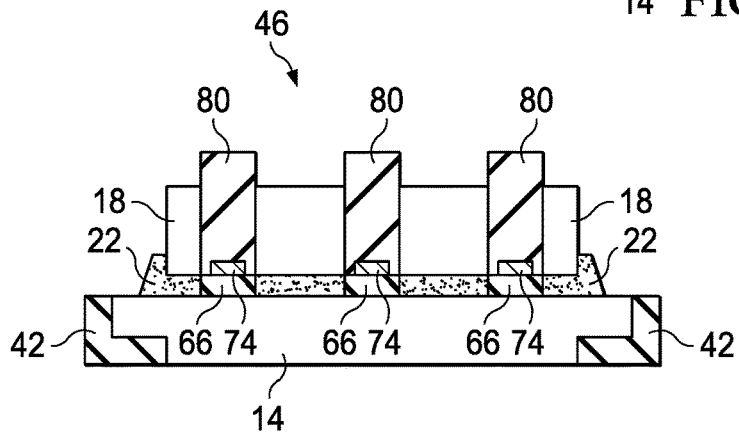
Figure 55F:
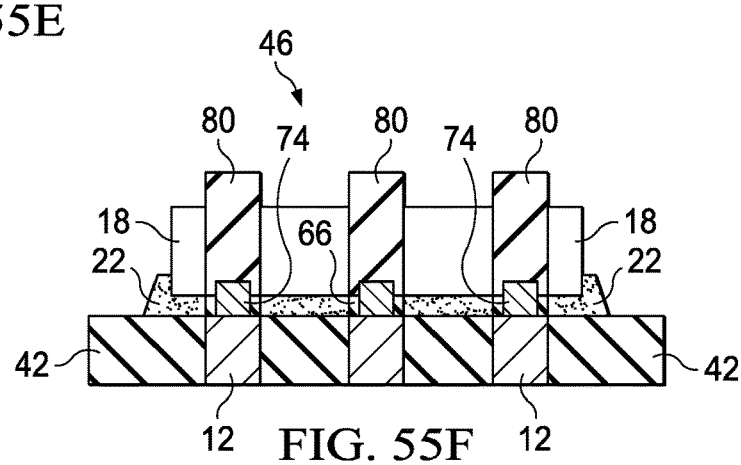

FIG. 55C is a cross-sectional view of integrated circuit (IC) die 18 attached, via die attach material 22, to a top surface of die attach pad 14 of pre-molded lead frame unit 46 along reference line S6-S6 in FIG. 55A, according to one example. In FIG. 55C individual cover insulating layers 80 are each shown covering an individual base or foundation insulating layers 66. FIG. 55D is a cross-sectional view of integrated circuit (IC) die 18 attached, via die attach material 22, to a top surface of die attach pad 14 of pre-molded lead frame unit 46 along reference line T6-T6 in FIG. 55A, which shows the individual base or foundation insulating layers 66 (three shown), conductive trace or interconnects 74 and individual cover insulating layers 80 (three shown) extending down a vertical side of die 18 to die pad 46. FIG. 55E is a cross-sectional view of integrated circuit (IC) die 18 attached, via die attach material 22, to a top surface of die attach pad 14 of pre-molded lead frame unit 46 along reference line U6-U6 in FIG. 55A, which shows conductive trace or interconnects 74, each now horizontally oriented on an individual base or foundation insulating layer 66, as conductive trace or interconnects 74 prepare to extend horizontally to leads 12. FIG. 55F is a cross-sectional view of integrated circuit (IC) die 18 attached, via die attach material 22, to a top surface of die attach pad 14 of pre-molded lead frame unit 46 along reference line Y6-Y6 in FIG. 55A, which shows a distal end of each conductive trace or interconnect 74 as it extends down through a through hole or void 56 in a respective individual base or foundation layer 66 to contact an upper surface of a respective lead 12.

Figure 55G:
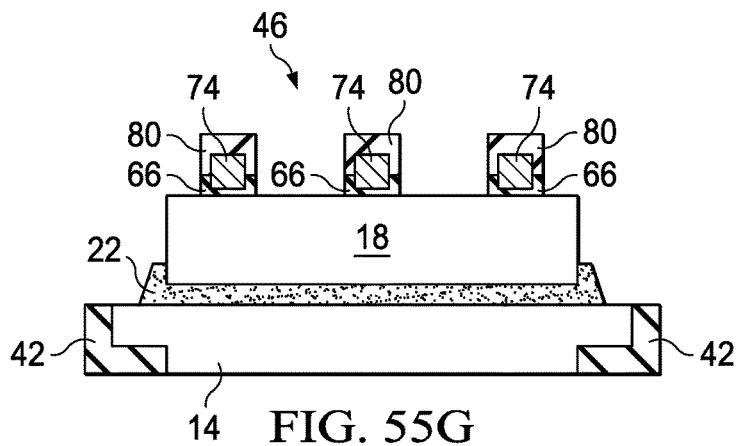
Figure 55H:
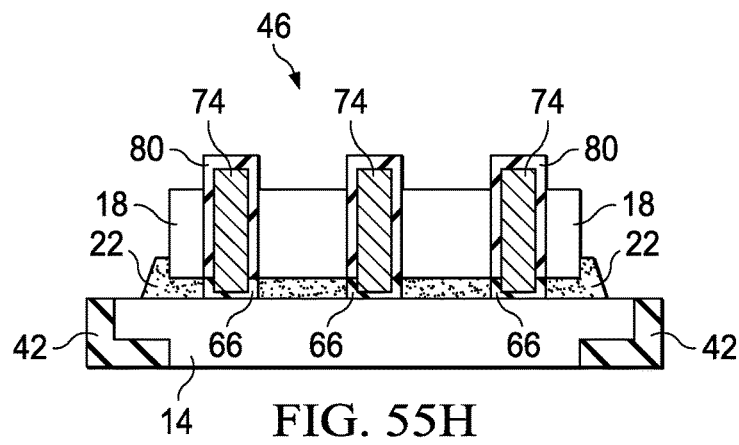
Figure 55I:
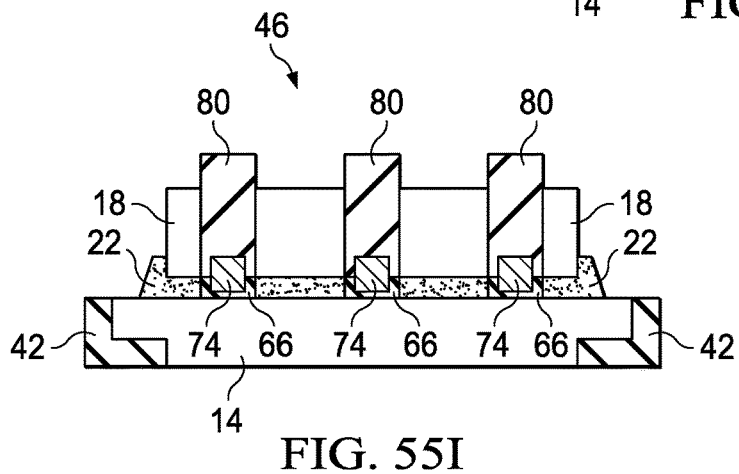
Figure 55J:
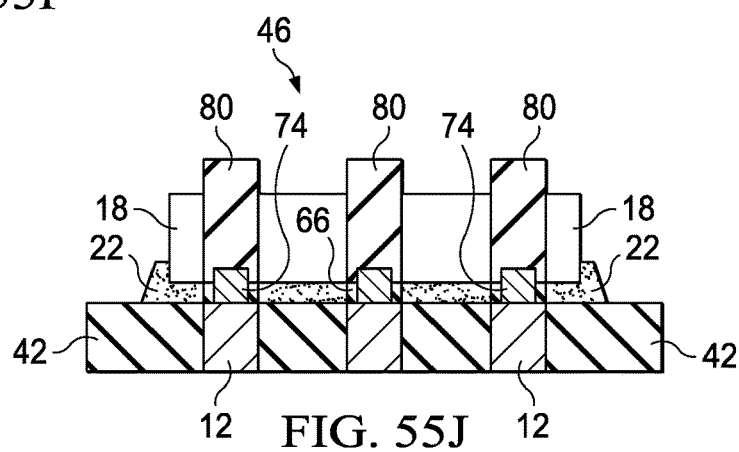

FIG. 55G is a cross-sectional view of integrated circuit (IC) die 18 attached, via die attach material 22, to a top surface of die attach pad 14 of pre-molded lead frame unit 46 along reference line S6-S6 in FIG. 55A. In this example, each individual base or foundation insulating layer 66 includes a rectangular channel or groove 58 filled with conductive material (e.g., conductive trace or interconnect 74) from a bond pad 50 on die 18 to a lead 12. FIG. 55H is a cross-sectional view of integrated circuit (IC) die 18 attached, via die attach material 22, to a top surface of die attach pad 14 of pre-molded lead frame unit 46 along reference line T6-T6 in FIG. 55A, which shows individual base or foundation insulating layers 66, conductive trace or interconnects 74 and individual cover insulating layers 80 extending down a vertical side of die 18 to die pad 46. FIG. 55I is a cross-sectional view of integrated circuit (IC) die 18 attached, via die attach material 22, to a top surface of die attach pad 14 of pre-molded lead frame unit 46 along reference line U6-U6 in FIG. 55A, which shows conductive trace or interconnects 74, each now horizontally oriented on a respective individual base or foundation insulating layer 66, as conductive trace or interconnects 74 prepare to extend horizontally to leads 12. FIG. 55J is a cross-sectional view of integrated circuit (IC) die 18 attached, via die attach material 22, to a top surface of die attach pad 14 of pre-molded lead frame unit 46 along reference line Y6-Y6 in FIG. 55A, which shows a distal end of each conductive trace or interconnect 74 as it extends down through a through hole or void 56 in a respective individual base or foundation layer 66 to contact an upper surface of a respective lead 12.

Figure 55K:
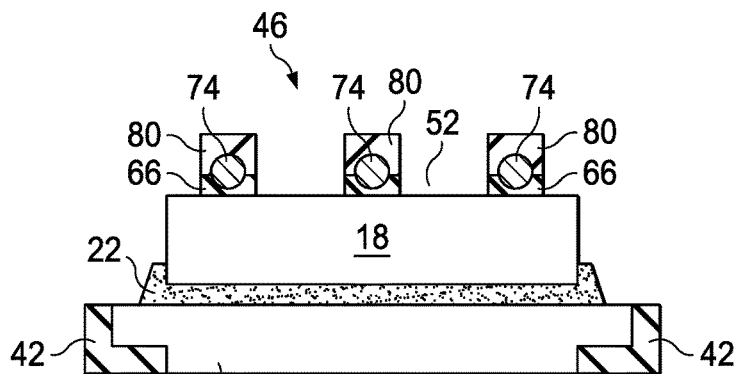
Figure 55L:
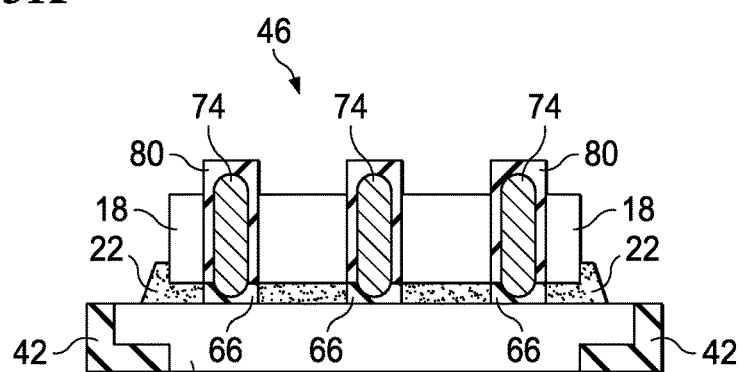
Figure 55M:
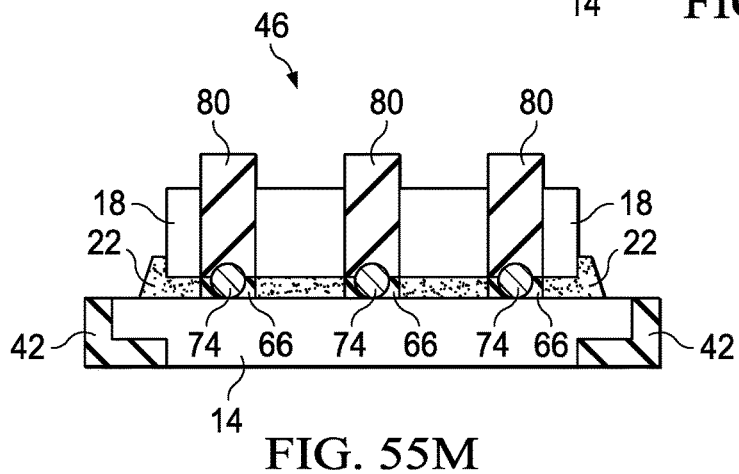
Figure 55N:
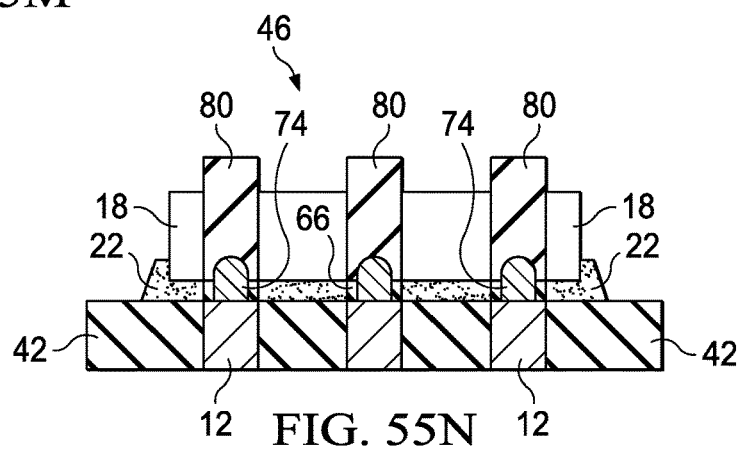

FIG. 55K is a cross-sectional view of integrated circuit (IC) die 18 attached, via die attach material 22, to a top surface of die attach pad 14 of pre-molded lead frame unit 46 along reference line S6-S6 in FIG. 55A. In this example, each individual base or foundation insulating layers 66 includes a semi-circular channel or groove 60 filled with conductive material (e.g., conductive trace or interconnect 74) from a bond pad 50 on die 18 to a lead 12. In FIG. 55K each individual cover insulating layer 80 is shown covering an individual base or foundation insulating layers 66. FIG. 55L is a cross-sectional view of integrated circuit (IC) die 18 attached, via die attach material 22, to a top surface of die attach pad 14 of pre-molded lead frame unit 46 along reference line T6-T6 in FIG. 55A, which shows individual base or foundation insulating layers 66, conductive trace or interconnects 74 and individual cover insulating layers 80 extending down a vertical side of die 18 to die pad 46. FIG. 55M is a cross-sectional view of integrated circuit (IC) die 18 attached, via die attach material 22, to a top surface of die attach pad 14 of pre-molded lead frame unit 46 along reference line U6-U6 in FIG. 55A, which shows conductive trace or interconnects 74, each horizontally oriented on a respective individual base or foundation insulating layer 66, as conductive trace or interconnects 74 prepare to extend horizontally to leads 12. FIG. 55N is a cross-sectional view of integrated circuit (IC) die 18 attached, via die attach material 22, to a top surface of die attach pad 14 of pre-molded lead frame unit 46 along reference line Y6-Y6 in FIG. 55A, which shows a distal end of each conductive trace or interconnect 74 as it extends down through a through hole or void 56 in a respective individual base or foundation layer 66 to contact an upper surface of a respective lead 12.

Figure 55O:
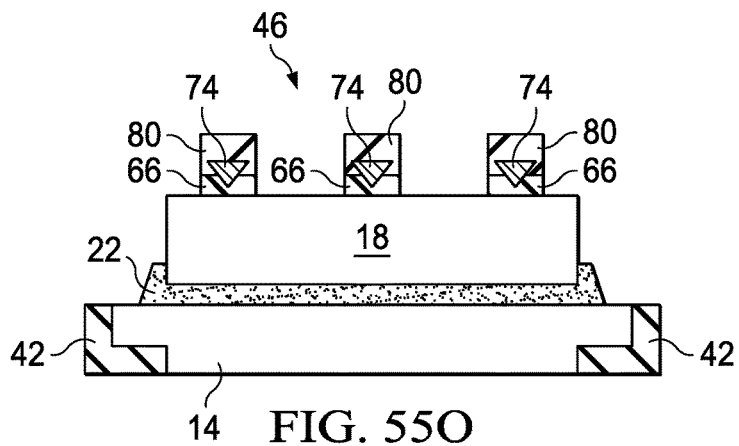
Figure 55P:
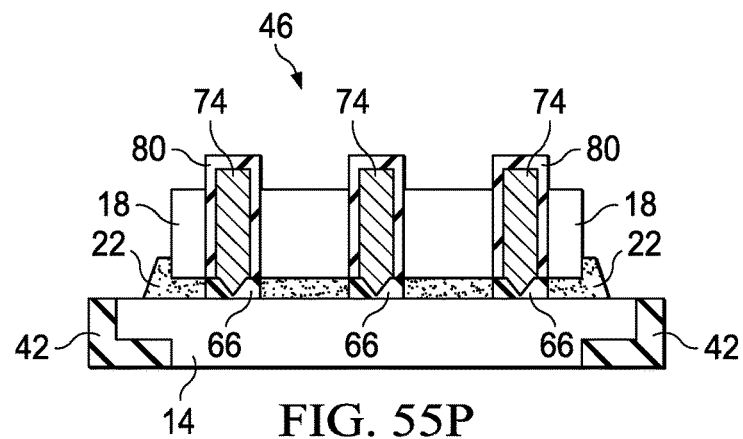
Figure 55Q:
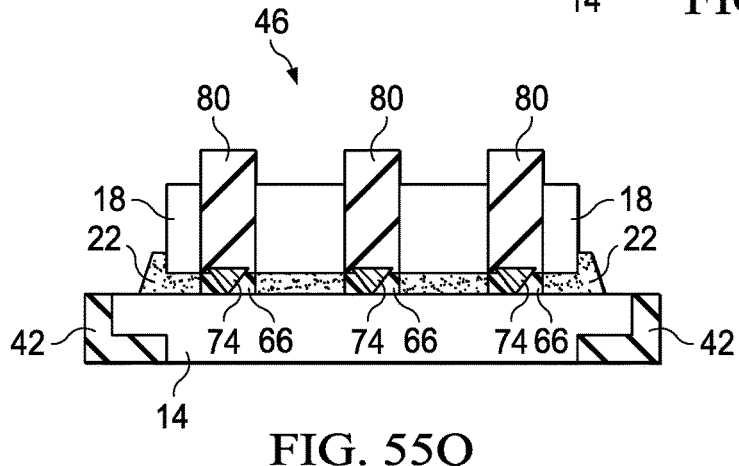
Figure 55R:
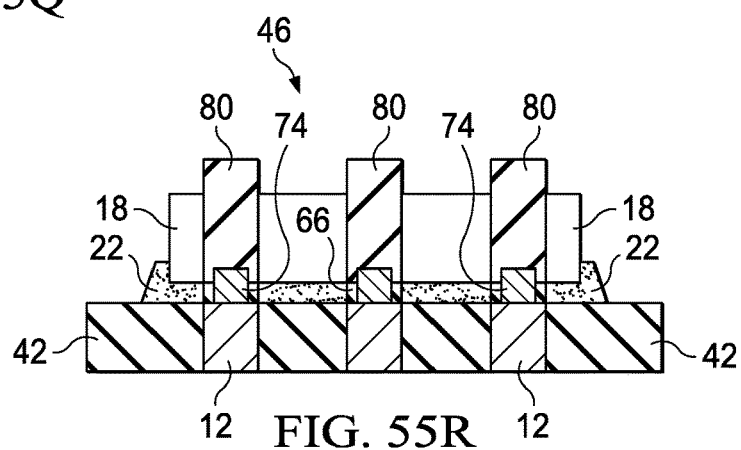

FIG. 55O is a cross-sectional view of integrated circuit (IC) die 18 attached, via die attach material 22, to a top surface of die attach pad 14 of pre-molded lead frame unit 46 along reference line S6-S6 in FIG. 55A. In this example, each base or foundation insulating layer 66 includes a v-shaped channel or groove 62 filled with conductive material (e.g., conductive trace or interconnect 74) from a bond pads 50 on die 18 to a lead 12. In FIG. 55O each individual cover insulating layer 80 is shown covering an individual base or foundation insulating layer 66. FIG. 55P is a cross-sectional view of integrated circuit (IC) die 18 attached, via die attach material 22, to a top surface of die attach pad 14 of pre-molded lead frame unit 46 along reference line T6-T6 in FIG. 55A, which shows individual base or foundation insulating layers 66, conductive trace or interconnects 74 and individual cover insulating layers 80 extending down a vertical side of die 18 to die pad 46. FIG. 55Q is a cross-sectional view of integrated circuit (IC) die 18 attached, via die attach material 22, to a top surface of die attach pad 14 of pre-molded lead frame unit 46 along reference line U6-U6 in FIG. 55A, which shows conductive trace or interconnects 74, now each horizontally oriented on a respective individual base or foundation insulating layer 66, as conductive trace or interconnects 74 prepare to extend horizontally to leads 12. FIG. 55R is a cross-sectional view of integrated circuit (IC) die 18 attached, via die attach material 22, to a top surface of die attach pad 14 of pre-molded lead frame unit 46 along reference line Y6-Y6 in FIG. 55A, which shows a distal end of each conductive trace or interconnect 74 as it extends down through a through hole or void 56 in an individual base or foundation layer 66 to contact an upper surface of a respective lead 12.

FIGS. 56A-56L show one example, in which a non-screen printing process 1300 is performed using a print head 68 that is controlled to translate along a controlled lateral direction or path 75 while directing insulating material along a vertical direction 77 to get a desired contour of blanket cover insulating layer 76 (e.g., in FIGS. 47A-49R), half-blanket cover insulating layers 78 (e.g., in FIGS. 50A-52R) or individual insulating layers 80 (e.g., in FIGS. 53A-53R). In one example, the process is performed with an inkjet print head 68 having position control apparatus such as servo controls configured to translate, and control the position of, the print head 68 in three dimensions (e.g., the X and Y directions shown in the figures and an orthogonal Z direction out of the page in FIGS. 56A-56L. In one implementation, the printing system translates the print head 68 in an X-Z plane while controlling the Y direction spacing between the top side of lead frame 46, die 18 and the print head 68. The printing system in one example also controls the delivery of insulating material from a nozzle of the print head to turn the printing on and off, for example, to facilitate precise, high resolution control over locations where the insulating material is printed and where it is not printed. In addition, the non-screen printing process 1300 provides control over the deposited insulating material thickness (e.g., in the Y direction) through one or more of deposition rate and controlling the time the print head 68 is positioned over a particular area of lead frame 48 and/or die 18. This facilitates printing insulating material to different thicknesses at different locations in certain implementations.

Figure 56A:
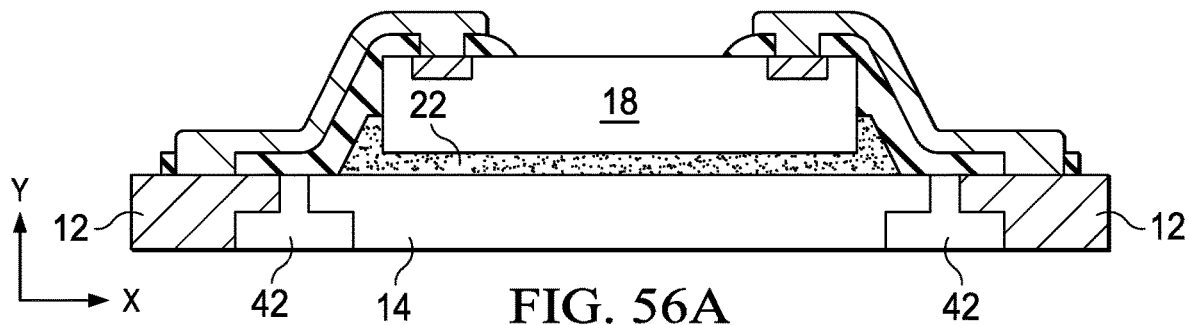
FIG. 56A shows a die 18 attached to a pre-molded lead frame 46 prior to applying insulating material for a second insulating layer.
Figure 56B:
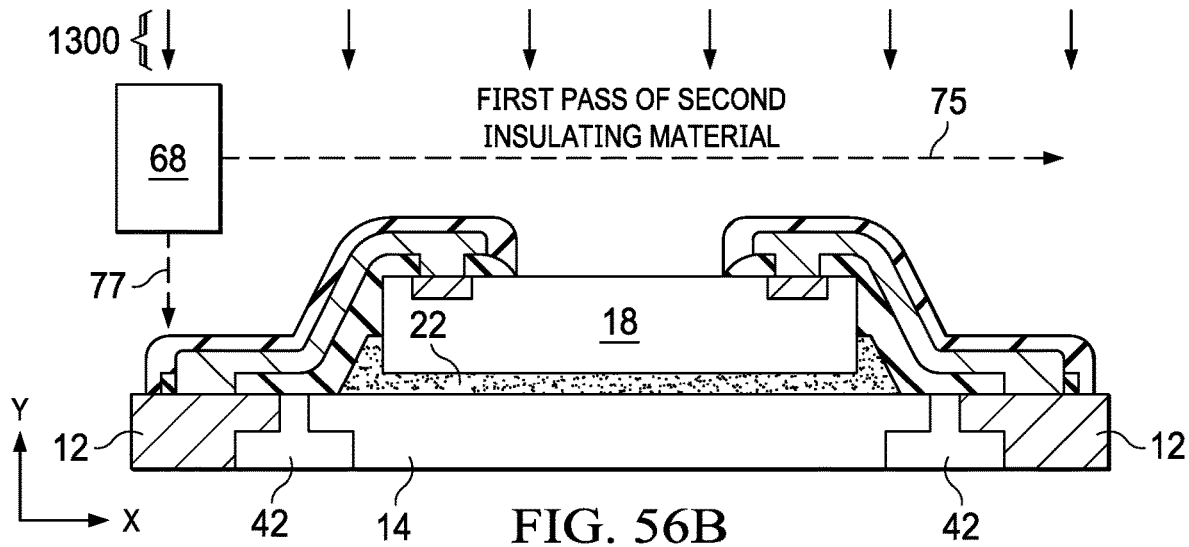
FIGS. 56B-56L show the results of multiple sequential passes of printing cover layer insulating material by print head 68.
Figure 56C:
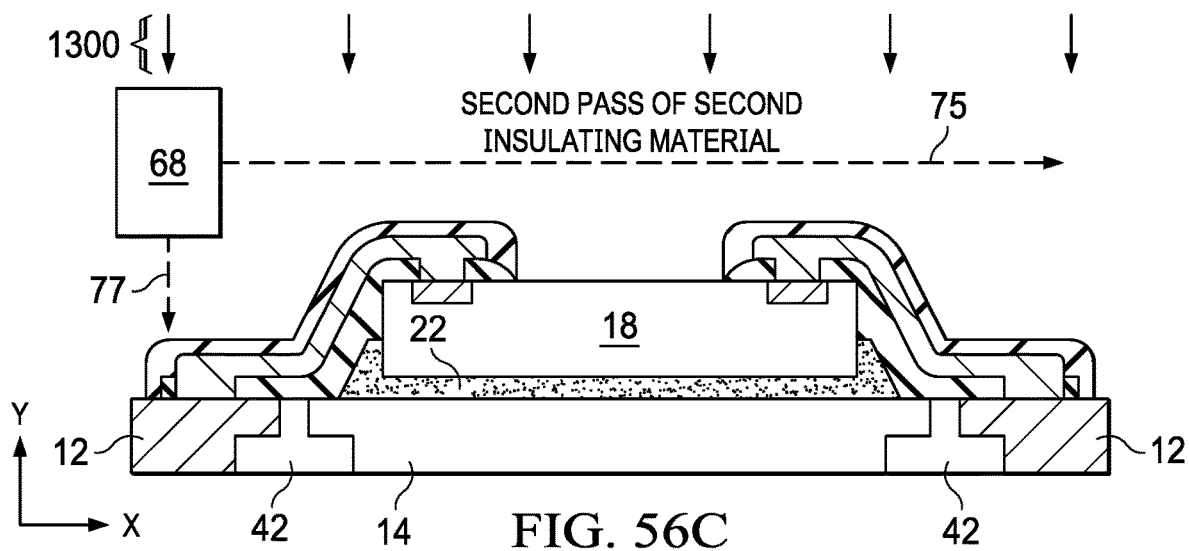
Figure 56D:
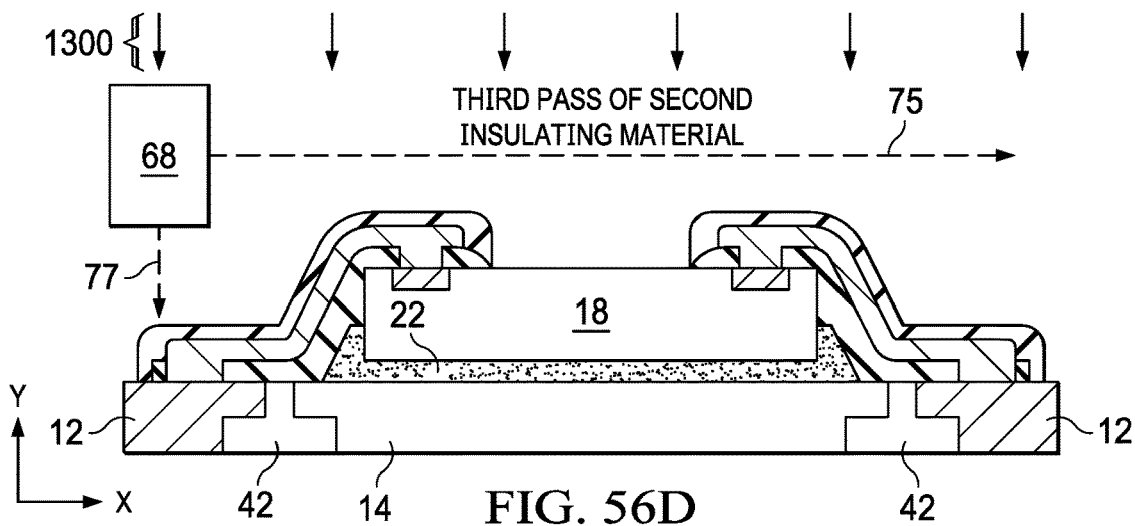
Figure 56E:
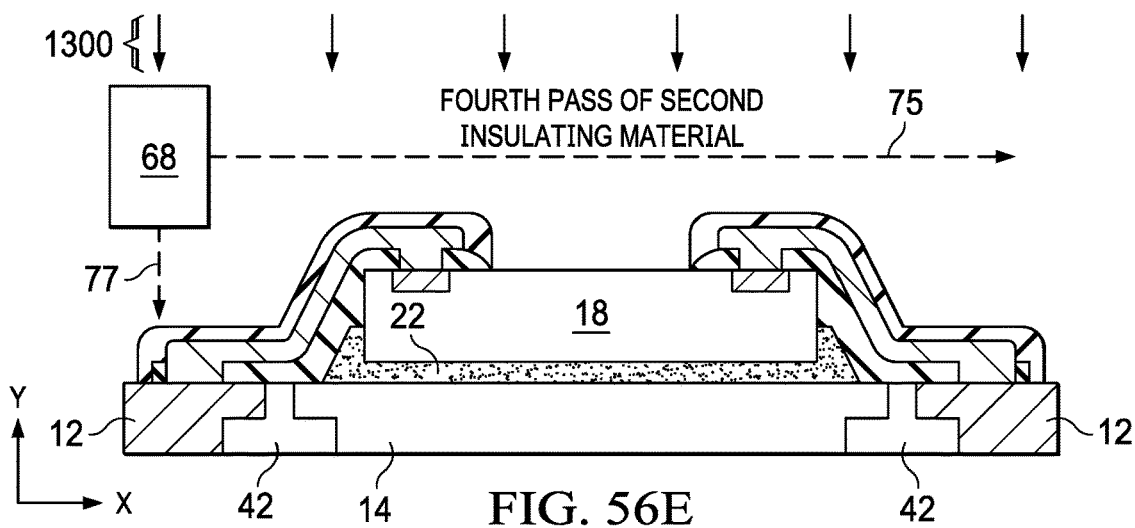
Figure 56F:
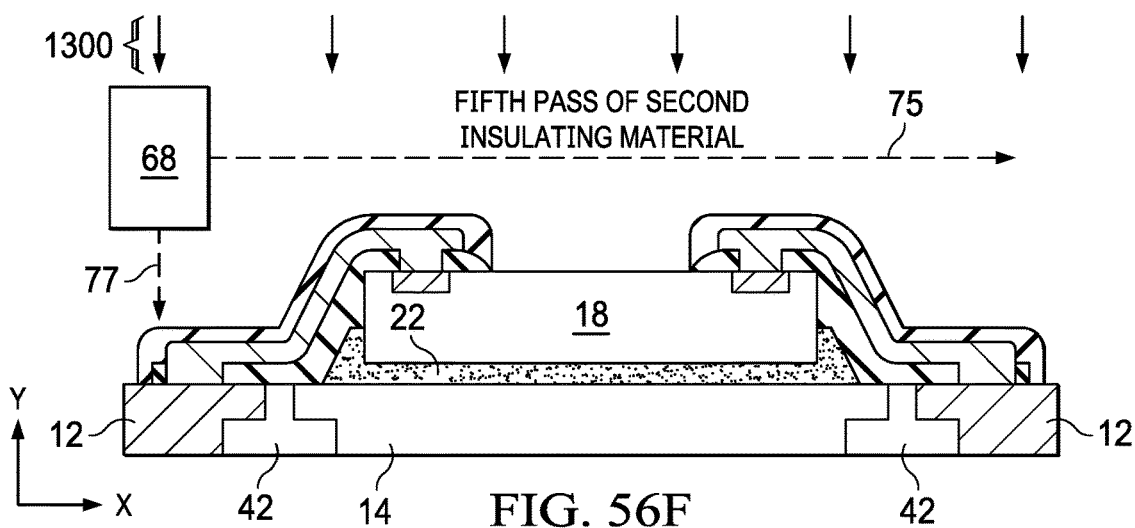
Figure 56G:
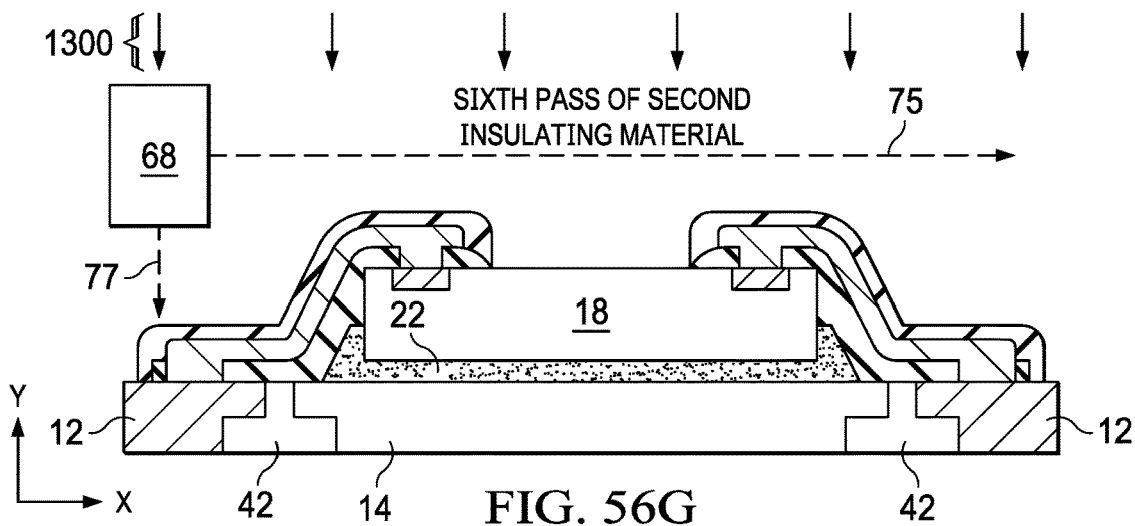
Figure 56H:
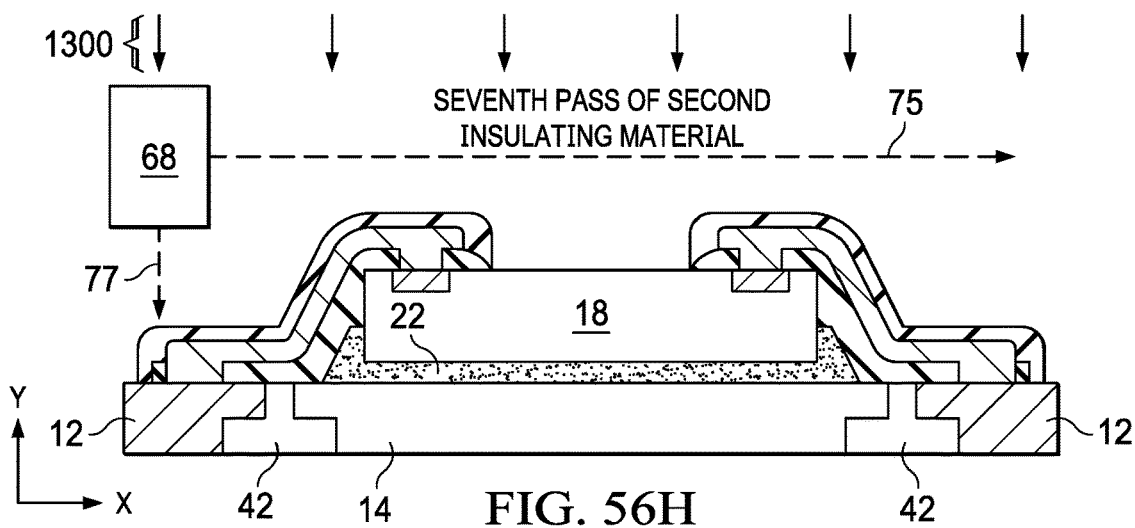
Figure 56I:
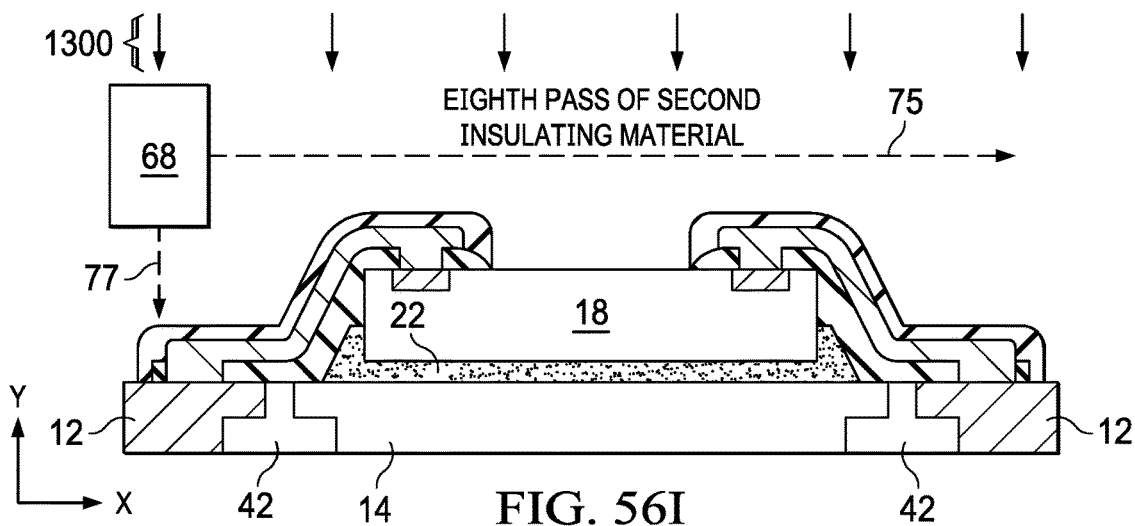
Figure 56J:
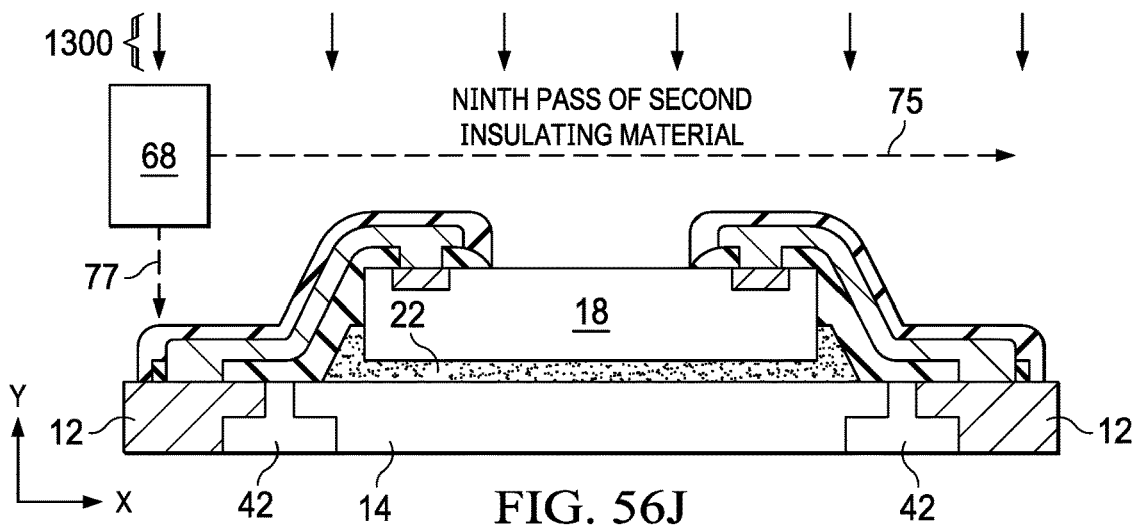
Figure 56K:
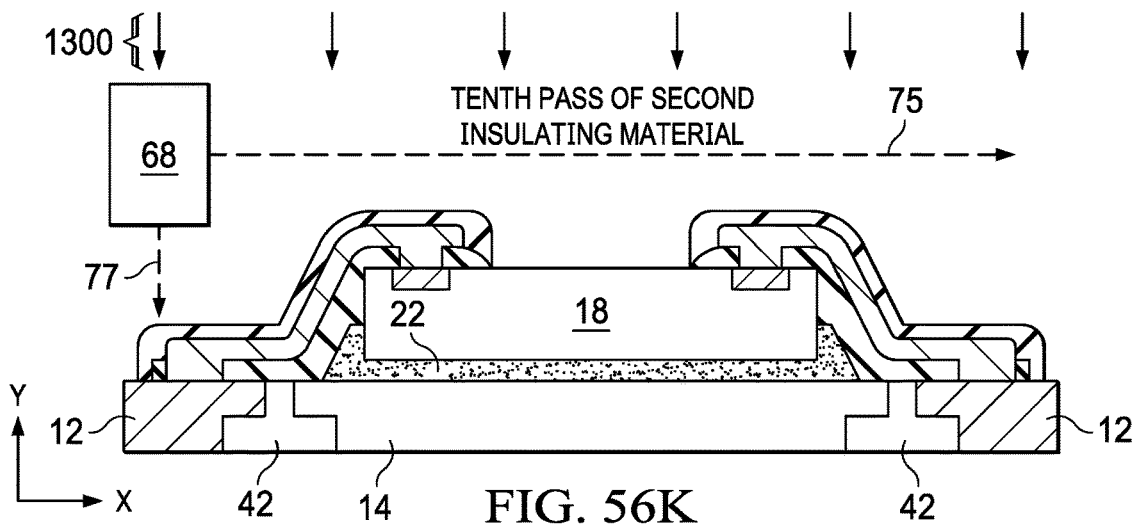
Figure 56L:
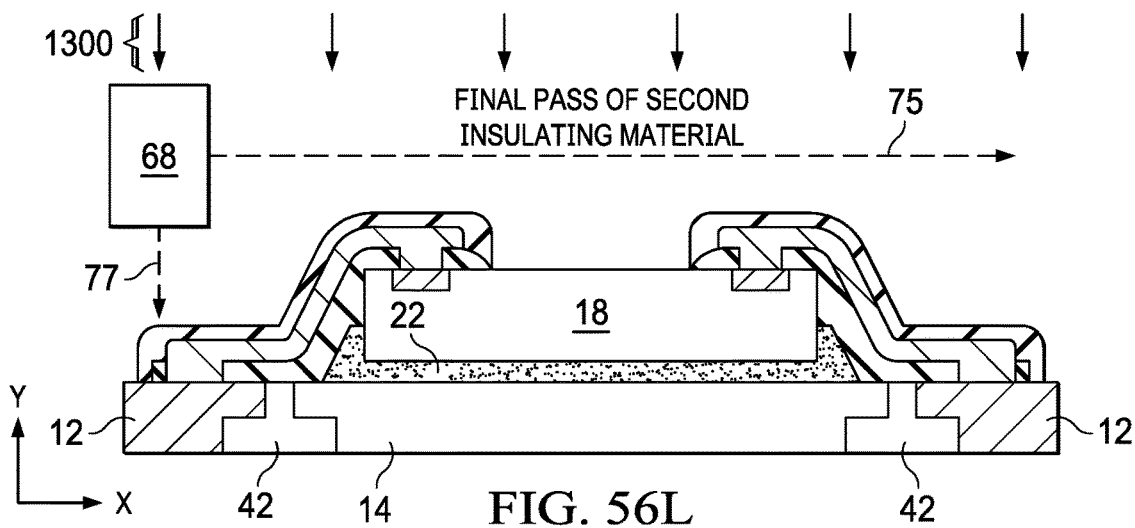
Figure 57A:
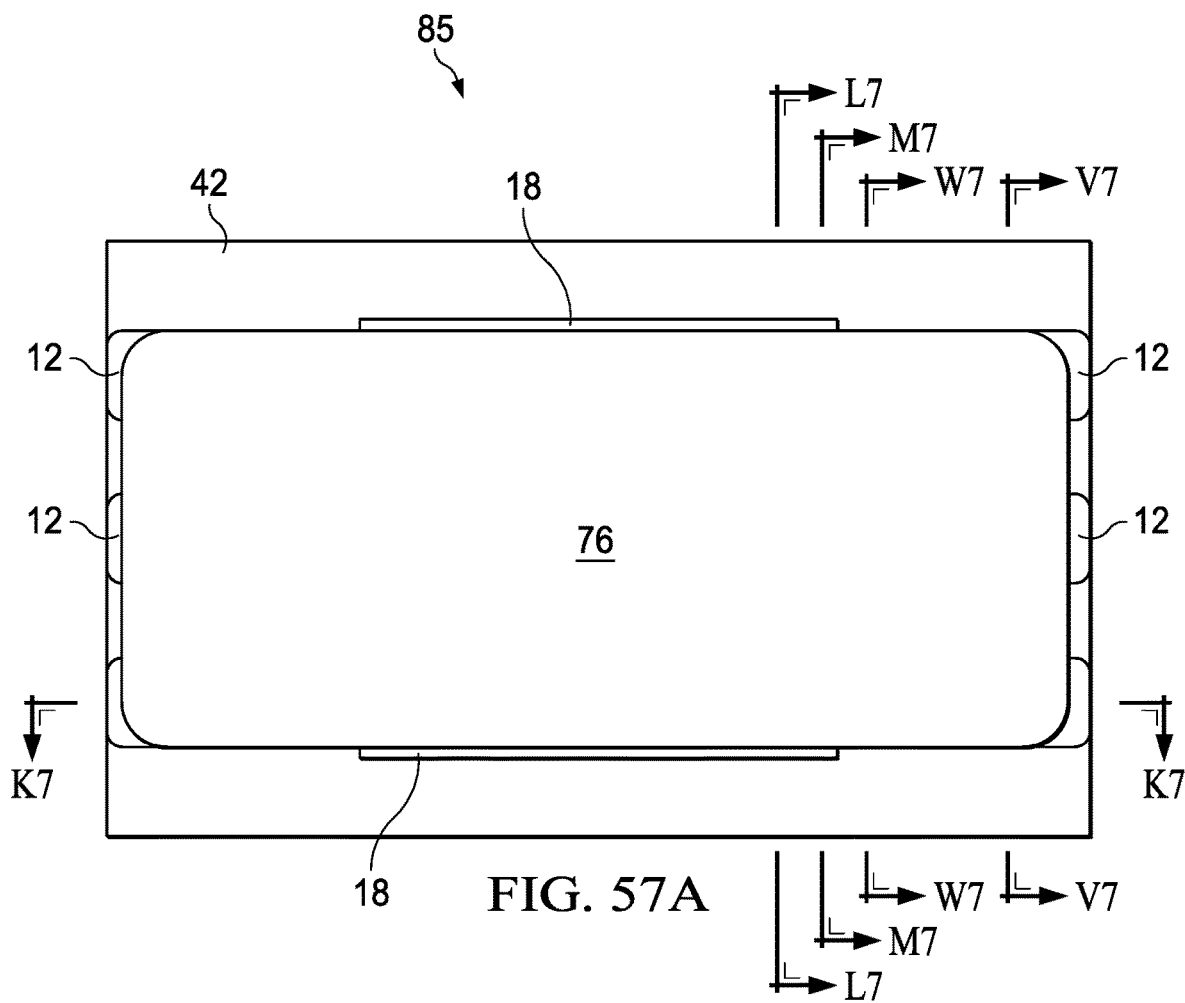
FIG. 57A is a top view of an electronic assembly undergoing fabrication according to the example method 500 of FIG. 5 with the implementation at 514, wherein a second insulating layer, e.g., a blanket cover insulating layer, 76 is printed, deposited, formed or otherwise applied over exposed portions of blanket base or foundation insulating layer 52, and exposed portions of conductive traces or interconnects 74 on base or foundation insulating layer 52 (see FIGS. 44A & 44), which spans a portion of a top surface of lead fingers 12 in pre-molded lead frame 48, across pre-mold 42, up one side of die 18, across the top of die 18, down an opposite side of die 18, across pre-mold 42 on an opposite side of pre-molded lead frame 48 and to a portion of a top surface of lead fingers 12 on the opposite side of pre-molded lead frame 48
Figure 57B:
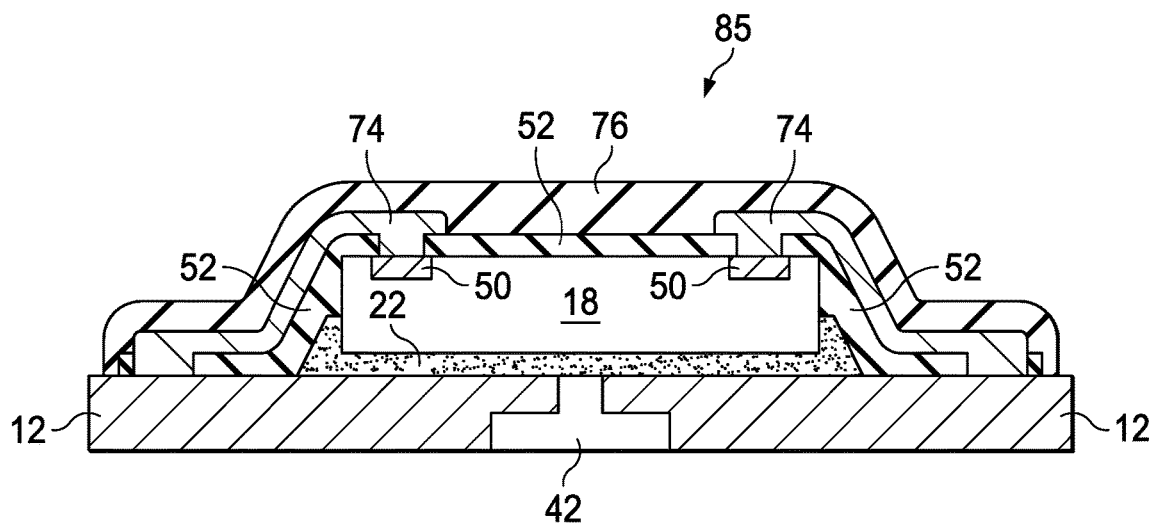
FIG. 57B is a cross-sectional view of the electronic assembly of FIG. 57A along reference lines K7-K7.
Figure 58A:
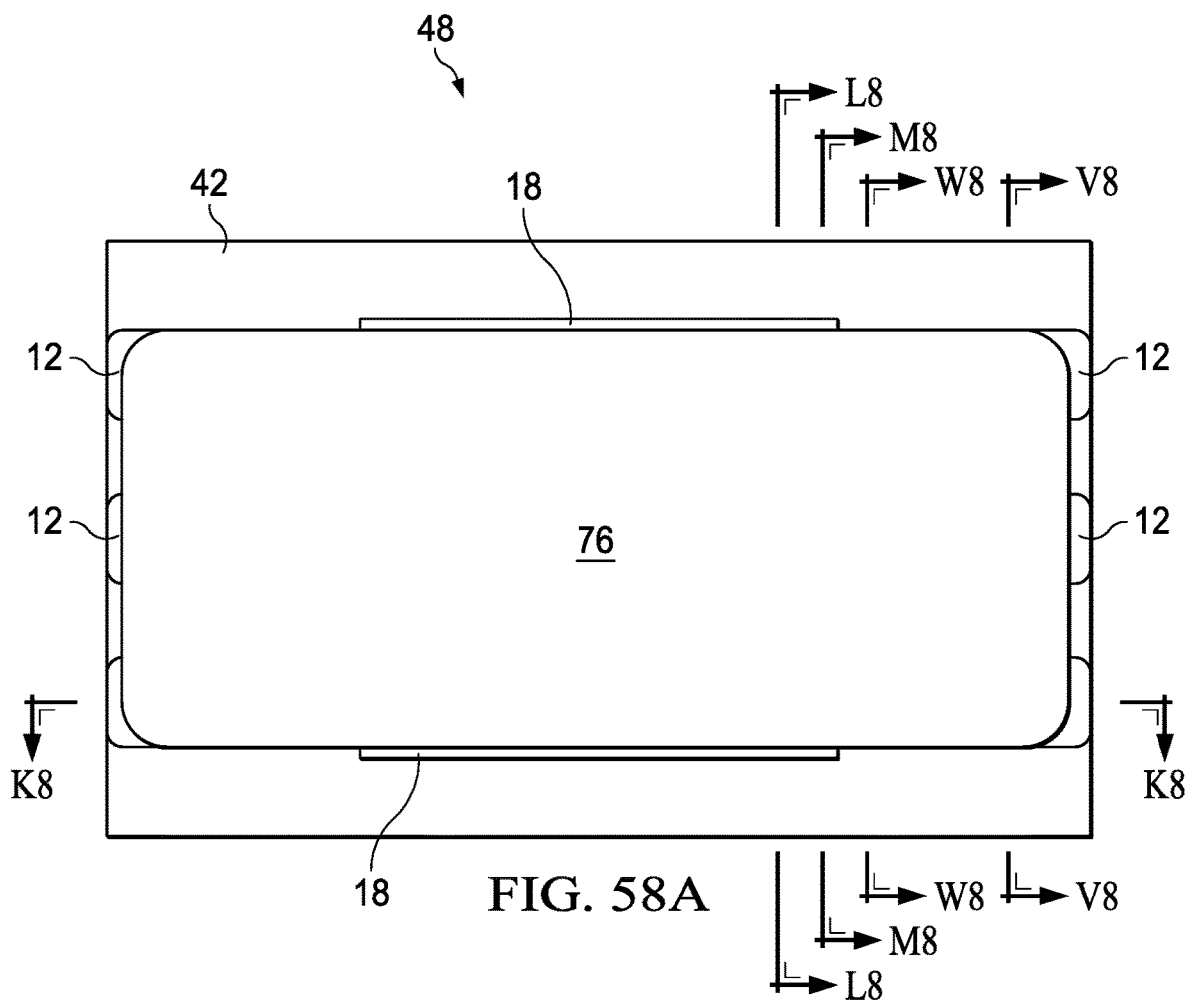
FIG. 58A is a top view of an electronic assembly undergoing fabrication according to the example method 500 of FIG. 5 with the implementation at 514, wherein a second insulating layer, e.g., a blanket cover insulating layer, 76 is printed, deposited, formed or otherwise applied over exposed portions of half-blanket base or foundation insulating layers 64, and exposed portions of conductive traces or interconnects 74 on half-blanket base or foundation insulating layers 66 (see FIGS. 44A & 44B), each spanning a portion of a top surface of lead fingers 12 in pre-molded lead frame 48, across pre-mold 42, up one side of die 18, across a portion of the top of die 18 just beyond the bond pads 50 closest to the side of die 18 upon which the respective half-blanket base or foundation insulating layer 64 is adjacent.
Figure 58B:
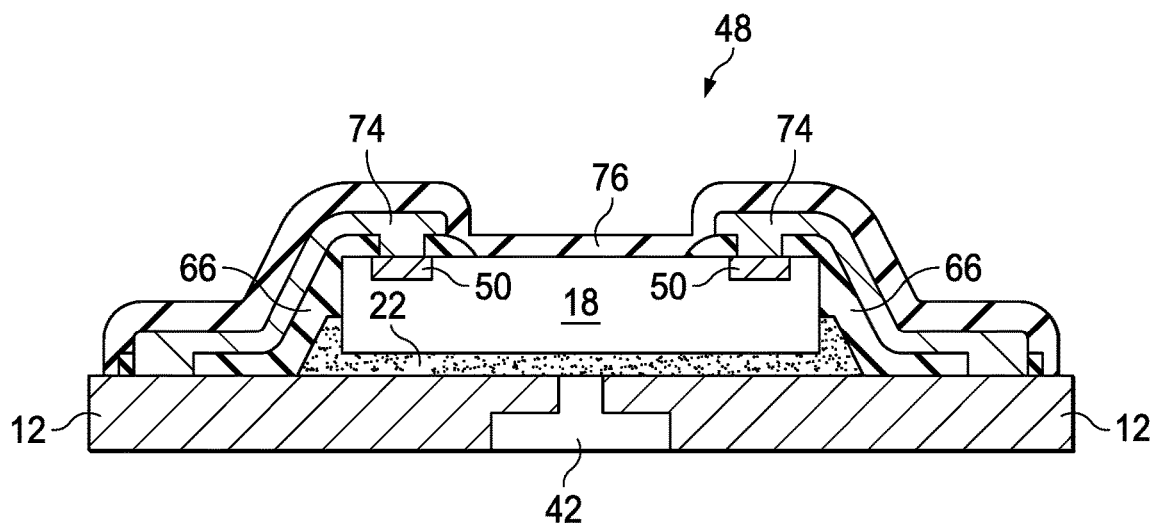
FIG. 58B is a cross-sectional view of the electronic assembly of FIG. 58A along reference lines K8-K8.
Figure 59A:
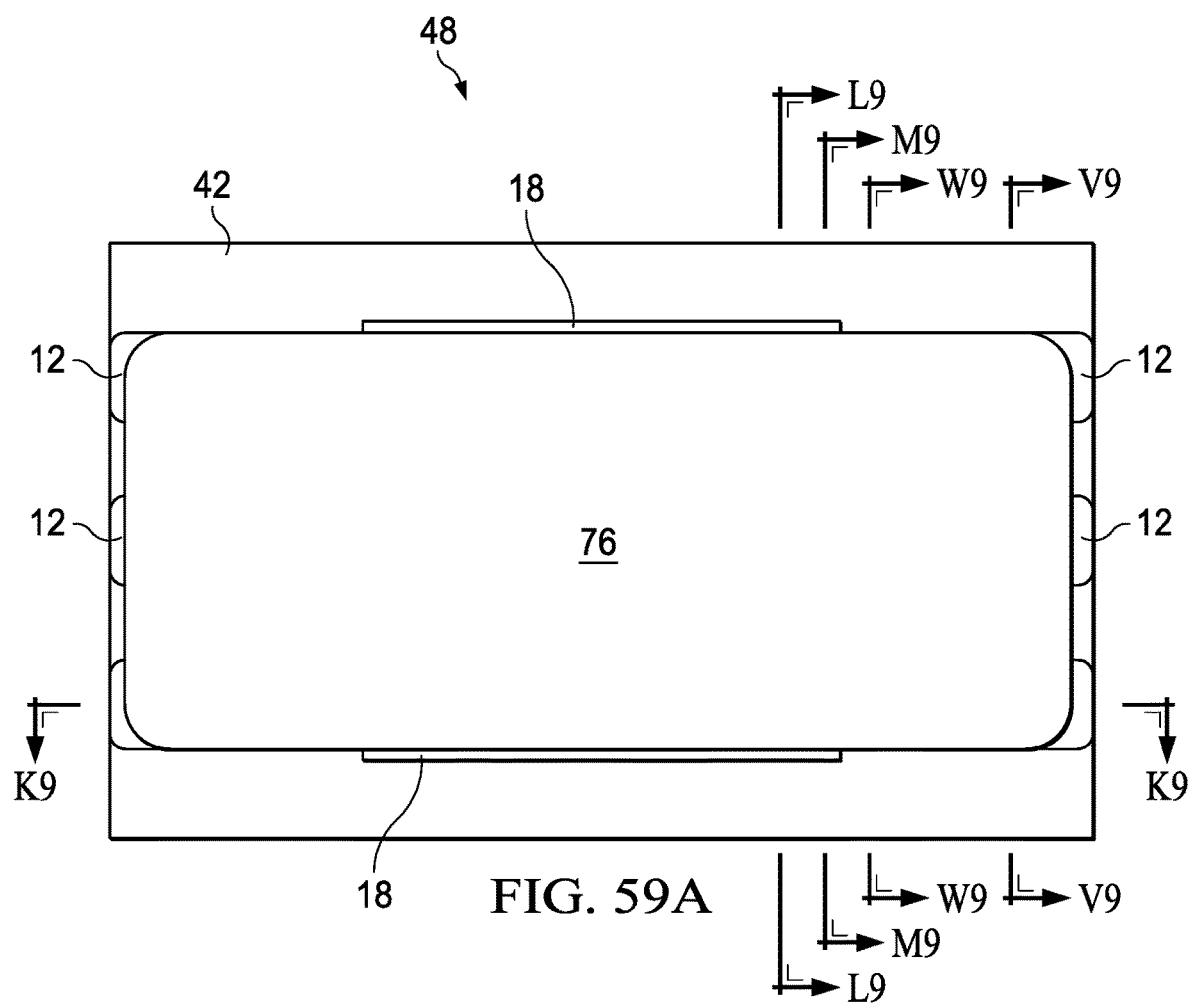
FIG. 59A is a top view of an electronic assembly undergoing fabrication according to the example method 500 of FIG. 5 with the implementation at 514, wherein a second insulating layer, e.g., a blanket cover insulating layer, 76 is printed, deposited, formed or otherwise applied over exposed portions of half-blanket base or foundation insulating layers 64, and exposed portions of conductive traces or interconnects 74 on half-blanket base or foundation insulating layers 66 (see FIGS. 44A & 44B), each spanning a portion of a top surface of lead fingers 12 in pre-molded lead frame 48, across pre-mold 42, up one side of die 18, across a portion of the top of die 18 just beyond the bond pads 50 closest to the side of die 18 upon which the respective half-blanket base or foundation insulating layer 64 is adjacent.
Figure 59B:
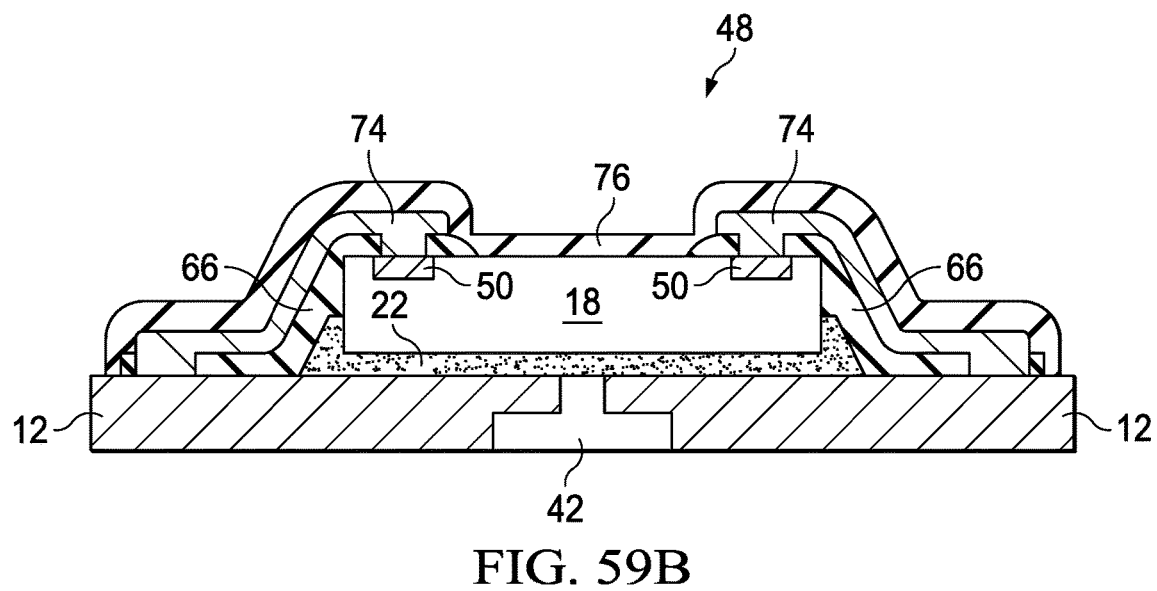
FIG. 59B is a cross-sectional view of the electronic assembly of FIG. 59A along various reference lines.

To get the desired contour of the insulating layers 76, 78 & 80 along the non-horizontal surfaces, insulating material can be formed or applied in multiple passes with each pass dispensing viscus material onto Z dimension at only desired X-Y location. Viscosity of material and exposure to temperature, light, or gas can keep the partially hardened material in place. FIG. 56A shows a die 18 attached to a pre-molded lead frame 48 prior to applying cover layer insulating material. FIG. 56B shows the result of a first pass of printing cover layer insulating material by print head 68. FIG. 56C shows the result of a second pass of printing cover layer insulating material by print head 68. FIG. 56D shows the result of a third pass of printing cover layer insulating material by print head 68. FIG. 56E shows the result of a fourth pass of printing cover layer insulating material by print head 68. FIG. 56F shows the result of a fifth pass of printing cover layer insulating material by print head 68. FIG. 56G shows the result of a sixth pass of printing cover layer insulating material by print head 68. FIG. 56H shows the result of a seventh pass of printing cover layer insulating material by print head 68. FIG. 56I shows the result of an eighth pass of printing cover layer insulating material by print head 68. FIG. 56J shows the result of a ninth pass of printing cover layer insulating material by print head 68. FIG. 56K shows the result of a tenth pass of printing cover layer insulating material by print head 68. FIG. 56L shows the result of a final pass of printing cover layer insulating material by print head 68. Curing can occur after each pass or after multiple passes. While FIGS. 56B-56L show a total of eleven pass of printing insulating material by print head 68, more or fewer could be used in practice depending on many factors including the type of insulating material used, viscosity of the insulating material, desired thickness of the insulating material, desired resolution of control of the deposition of the insulating material, etc. Also, in the example of depositing blanket cover insulating layer 76, portions of blanket cover insulating layer 76 will extend across a top surface of die 18 between bond pads 50 on opposite side of die 18 (not show in FIGS. 56K & 56L).

FIGS. 57A-65B show alternative chip-on-lead (COL) packaged electronic devices. A significant difference between the alternative chip-on-lead (COL) packaged electronic devices and the previously discussed devices is in a COL device, lead frame 46 which has a die attach pad 14 & leads 12 which are spaced from the die attach pad, is replaced with a lead frame that contains leads but no die attach pad. In the case of a COL device, a semiconductor die is attached directly to, and is supported by, the leads rather than a die attach pad, such as die attach pad 14. The actual steps for fabricating the COL devices are otherwise substantially similar to the fabrication previously discussed for devices having a die attach pad with leads spaced apart from the die attach pad (see FIGS. 47A-56L) and will not be repeated herein.

Packaging Details

In electronics manufacturing, integrated circuit packaging is the final stage of semiconductor device fabrication, in which the block of semiconductor material is encapsulated in a supporting case that prevents physical damage and corrosion. The case, known as a "package", supports the electrical contacts which connect the device to a circuit board. In the integrated circuit industry, the process is often referred to as packaging. Other names include semiconductor device assembly, assembly, encapsulation or sealing. The packaging stage is followed by testing of the integrated circuit. The term is sometimes confused with electronic packaging, which is the mounting and interconnecting of integrated circuits (and other components) onto printed-circuit boards. The current-carrying traces that run out of the die, through the package, and into the printed circuit board (PCB) have very different electrical properties compared to on-chip signals. They require special design techniques and need much more electric power than signals confined to the chip itself. Therefore, it is important that the materials used as electrical contacts exhibit characteristics like low resistance, low capacitance and low inductance.

Both the structure and materials must prioritize signal transmission properties, while minimizing any parasitic elements that could negatively affect the signal. Controlling these characteristics is becoming increasingly important as the rest of technology begins to speed up. Packaging delays have the potential to make up almost half of a high-performance computer's delay, and this bottleneck on speed is expected to increase. Cost is a factor in selection of integrated circuit packaging. Typically, an inexpensive plastic package can dissipate heat up to 2 W, which is sufficient for many simple applications, though a similar ceramic package can dissipate up to 50 W in the same scenario. As the chips inside the package get smaller and faster, they also tend to get hotter. As the subsequent need for more effective heat dissipation increases, the cost of packaging rises along with it. Generally, the smaller and more complex the package needs to be, the more expensive it is to manufacture.

Figure 66A:
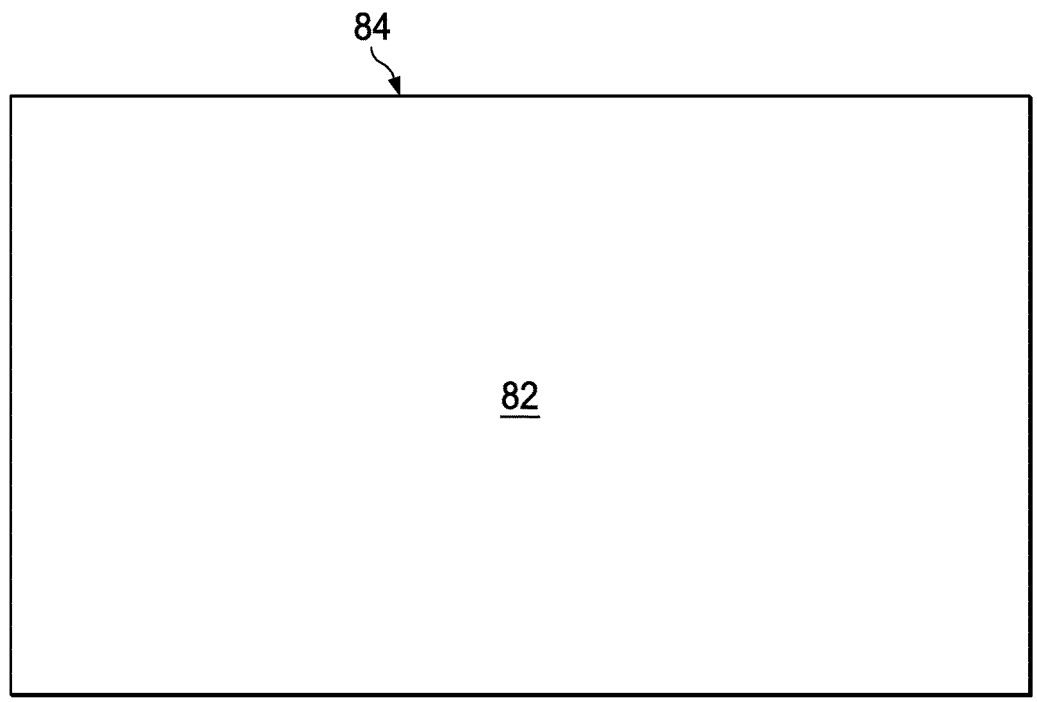
FIG. 66A is a top view of a packaged semiconductor device using plastic encapsulation.
Figure 66B:
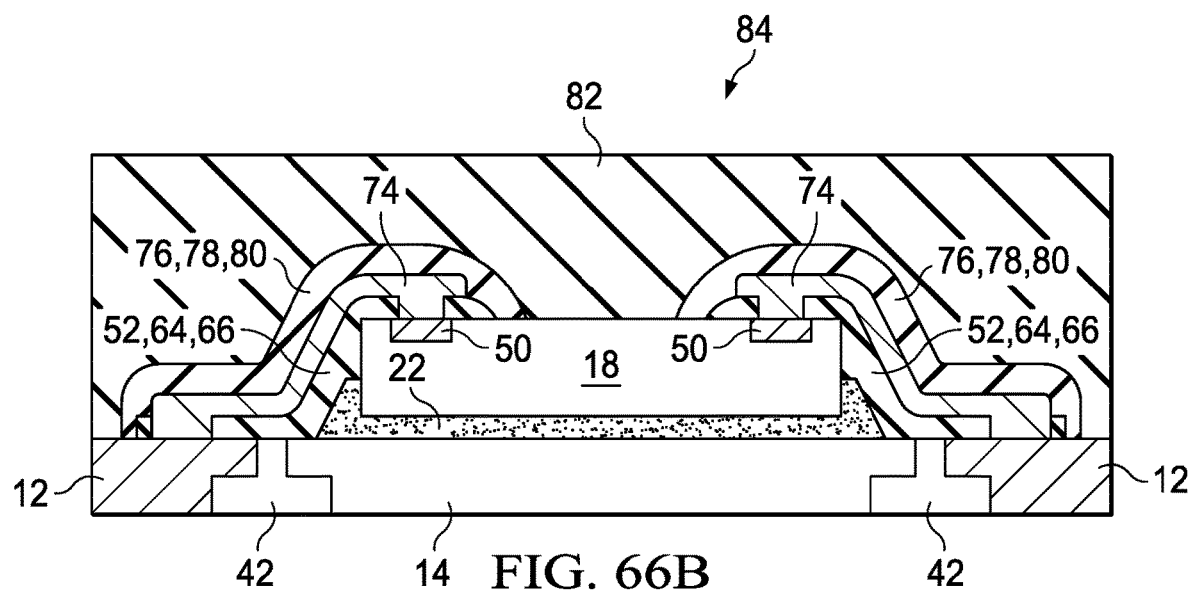
FIG. 66B is a side view of the packaged device of FIG. 66A.
Figure 67A:
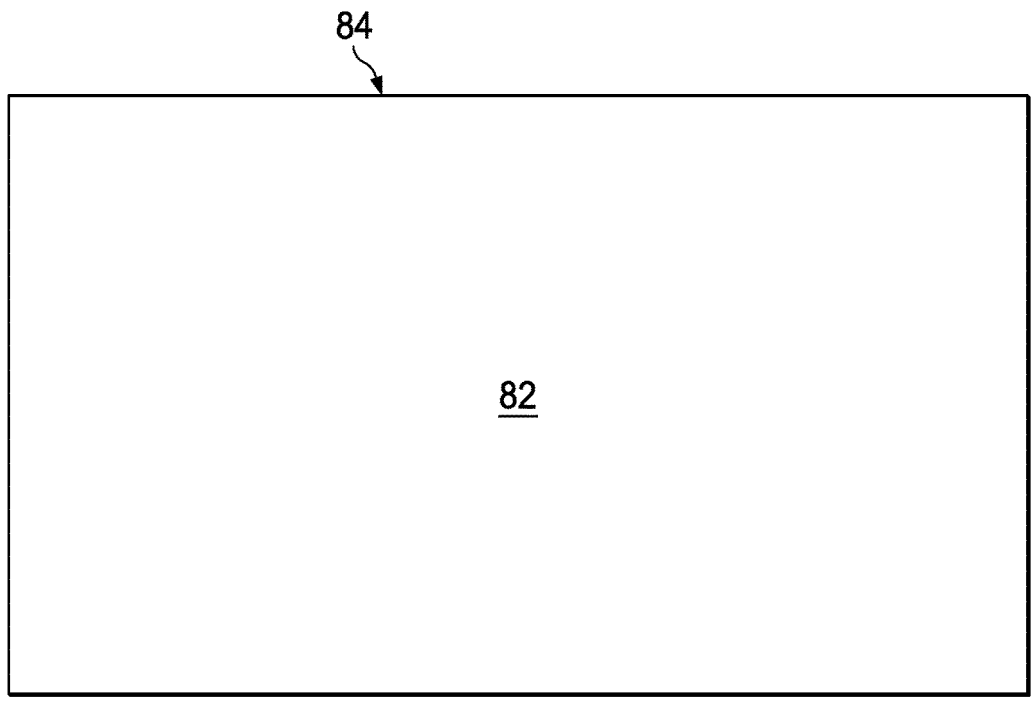
FIG. 67A is a top view of a (COL) packaged semiconductor device using plastic encapsulation.
Figure 67B:
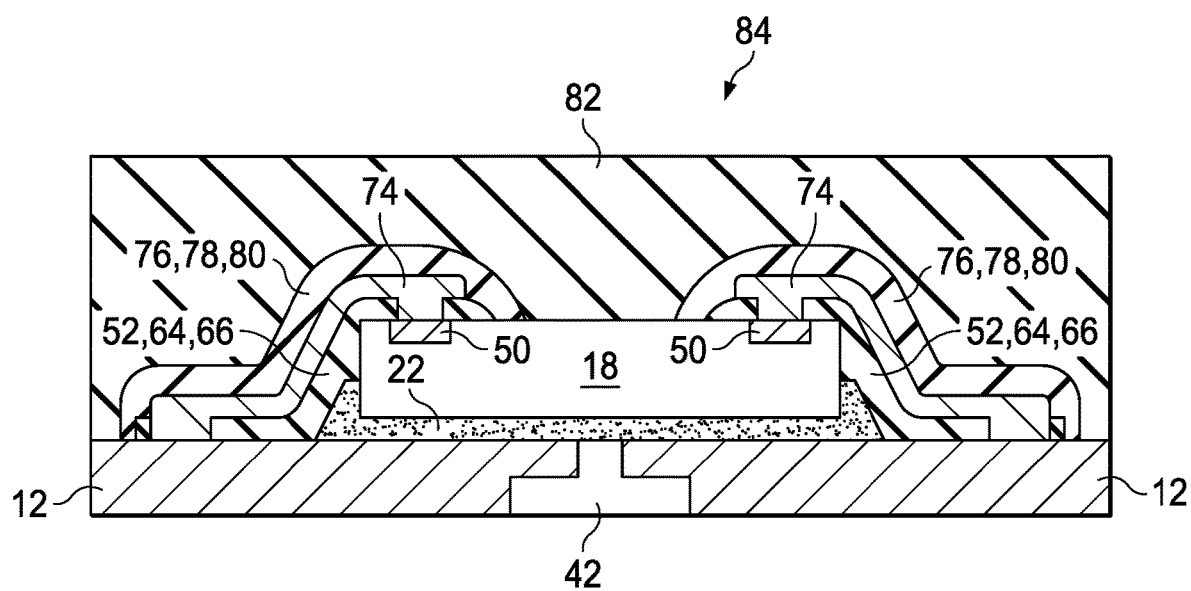
FIG. 67B is a side view of the (COL) packaged device of FIG. 67A.
Figure 68:
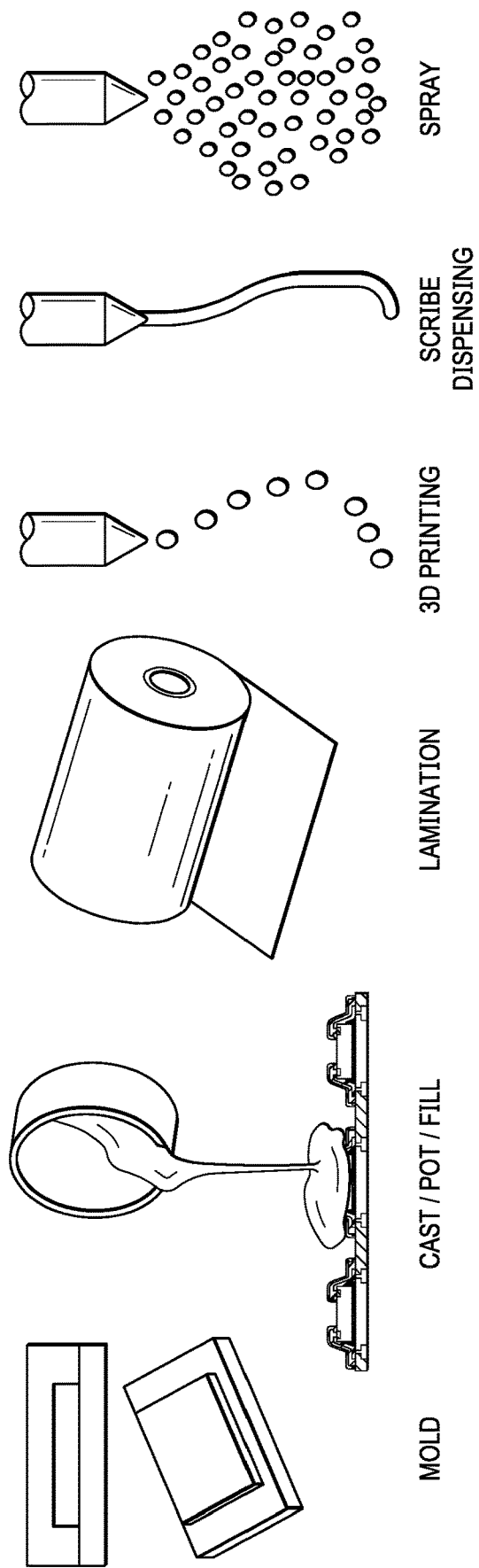
FIG. 68 shows multiple encapsulation options, such as lamination, transfer molding, injection molding, casting, potting, 3D printing, scribe dispense, screen printing, spray coating, spin coating, dipping, dam-and-fill, etc.

Any of the devices described above can be covered with a thick insulating layer 82, typically plastic, to at least cover or fully encapsulate the top side of the device as shown in FIGS. 66A & 66B, using known molding or encapsulation techniques, to produce packaged semiconductor device 84. Such covering is typical in the semiconductor industry and is mostly for mechanical strength and cosmetic appearance. FIG. 66A shows a top view of a packaged semiconductor device using plastic encapsulation. FIG. 66B is a side view of the packaged device of FIG. 66A. FIG. 67A shows a top view of a (COL) packaged semiconductor device 85 using plastic encapsulation. FIG. 67B is a side view of the (COL) packaged device of FIG. 67A. However, since no wire bonds or wire loops are used in the above described examples, no sensitive wire loops and a zero hole topology is present, the pre-encapsulation surface of the semiconductor apparatus can be physically pressed on. This allows for multiple encapsulation options, such as lamination, transfer molding, injection molding, casting, potting, 3D printing, scribe dispense, screen printing, spray coating, spin coating, dipping, dam-and-fill, etc., as shown in FIG. 68. Since the earlier insulating and conductive layers are providing most of the reliability, the encapsulation material can be optimized for adhesion while trading off on moisture permeability, ionic stability, etc. The top surface of the encapsulation material can be flattened with a hot plate while encapsulating. When the second insulating layer (e.g., cover layer 76, 78 or 80) fully covers the sensitive portions, encapsulate does not contact with die or interconnects. This significantly reduces reliability and manufacturability requirements.

Figure 69A:
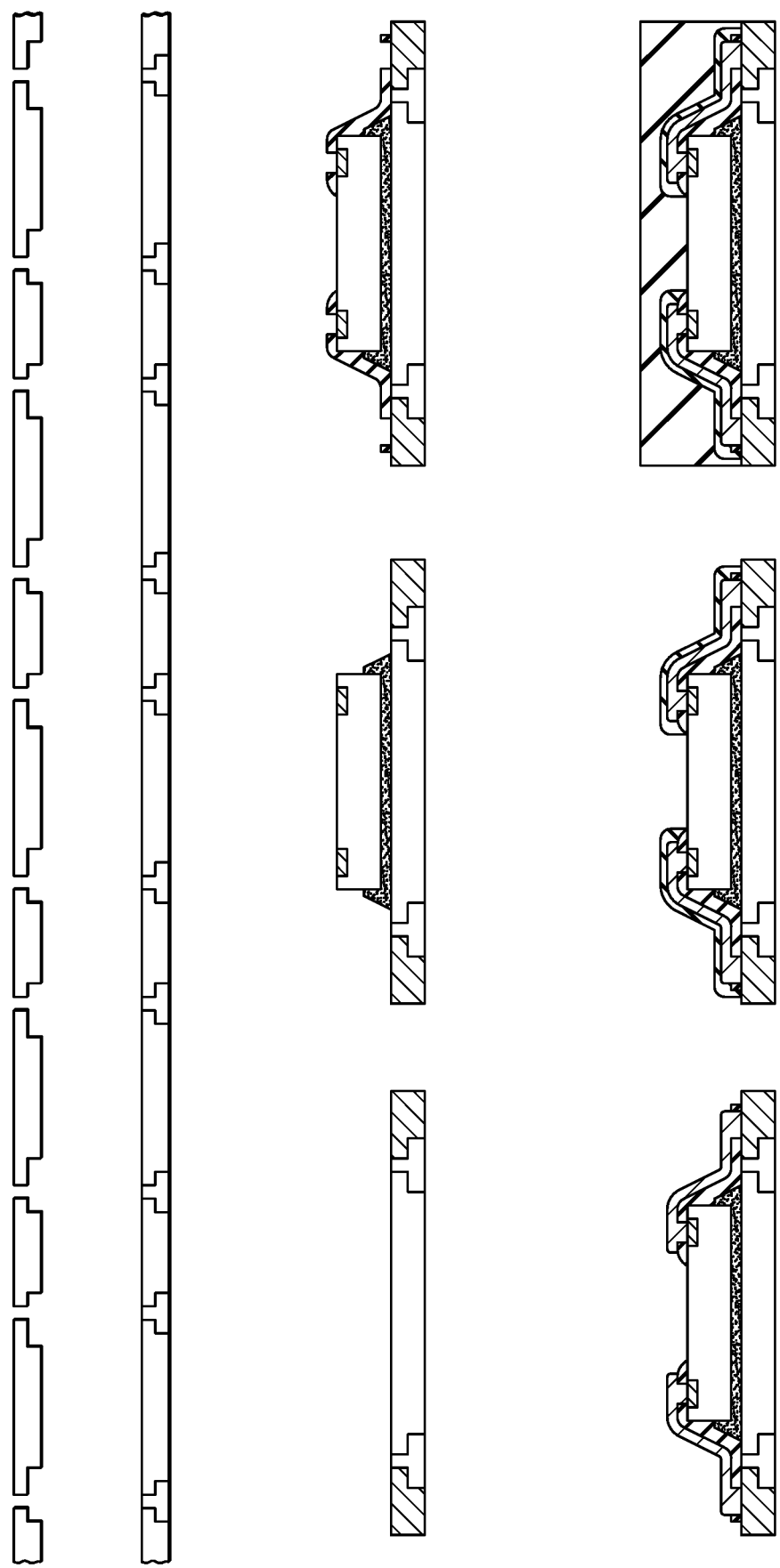
FIGS. 69A & 69B show a pictorial view summary of the package assembly process described above from manufacturing or selecting of a lead frame through molding and device singulation.
Figure 69B:
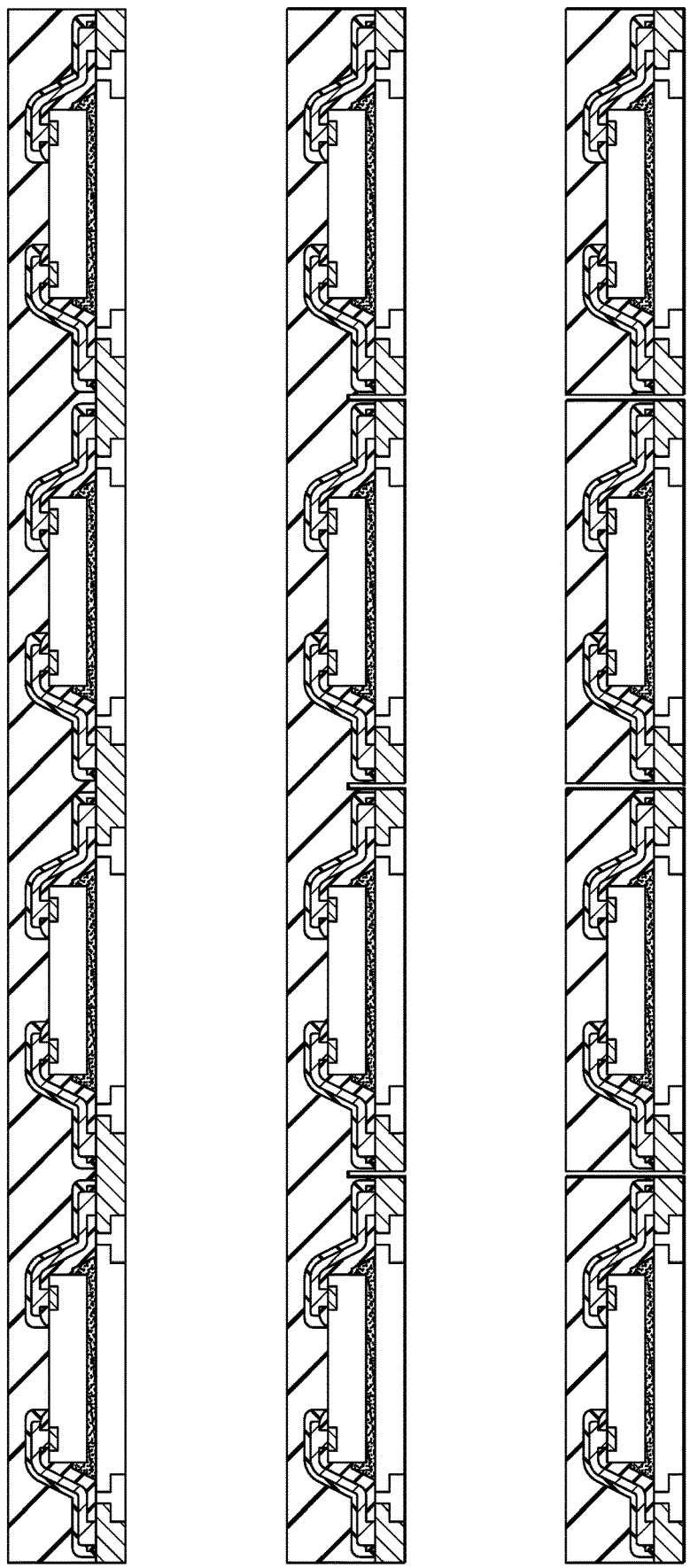
Figure 70:
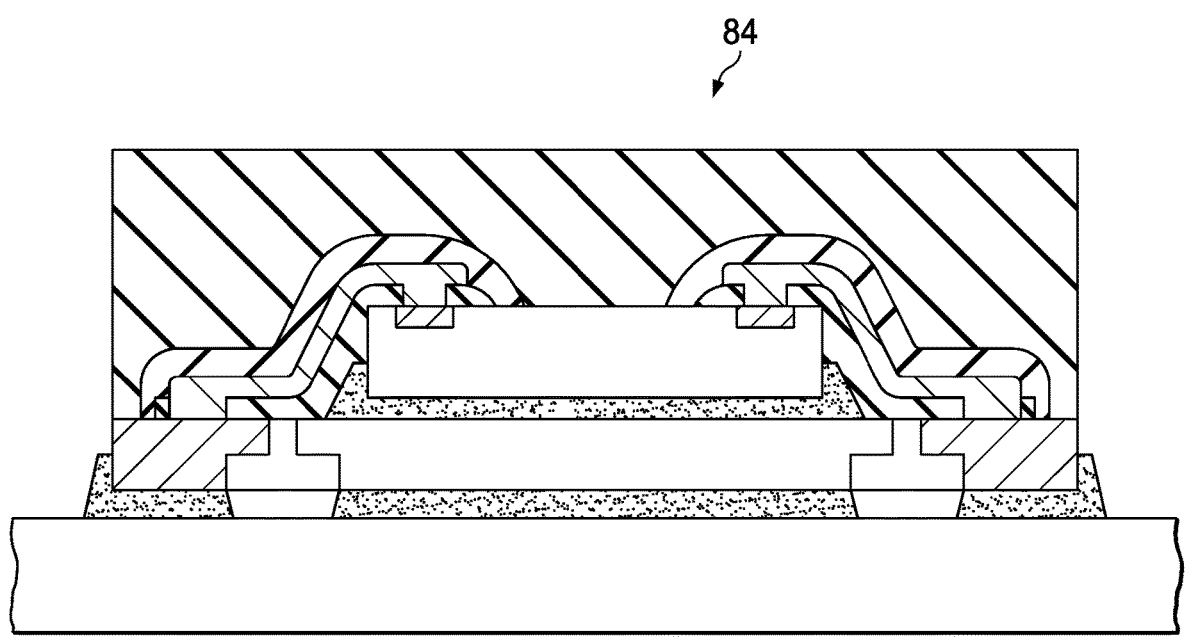
FIG. 70 shows a side view of a packaged semiconductor device 84 soldered or otherwise electrically connected to a printed wiring board (PWB) where it will be used to perform its designed function(s).

FIGS. 69A & 69B show a pictorial view summary of the package assembly process described above from manufacturing or selecting of a lead frame through molding and device singulation. FIG. 70 shows a side view of a packaged semiconductor device 84 soldered or otherwise electrically connected to a printed wiring board (PWB) where it will be used to perform its designed function(s).

While the above examples have been disclosed as being implemented in Quad Flat No Lead (QFN) packages, the techniques described above are applicable to almost any semiconductor die/lead frame combination where there is a desire to replace wire bonds between the semiconductor die and lead frame with printed conductive interconnects. Contemplated examples include through hole packages, surface mount, chip carrier, pin grid array, flat packages (other than QFN), small outline packages, etc.

Printing Technologies:

There are multiple printing technologies that can be used for printing various ones of the above described insulating layers, conductive interconnects, and protective covering layers. While inkjet printing has been described as being used throughout the above examples, other printing technologies could also be used, including aerosol jet, Laser Transfer, Spray, EHD, Microdispensing.

Figure 71:
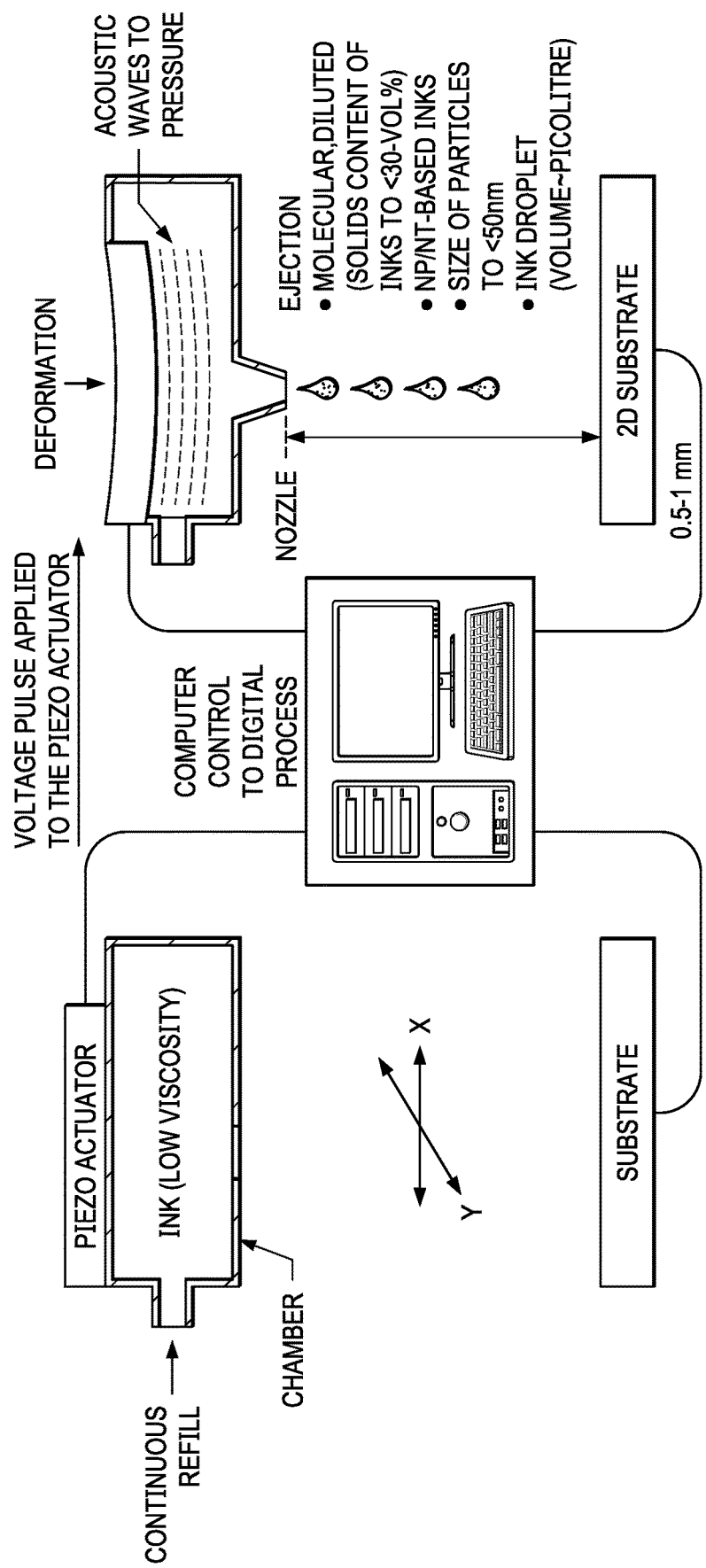
FIG. 71 is a schematic diagram of an example inkjet printing apparatus.

Inkjet Printing:

Inkjet printing can be divided into 2 categories: continuous inkjet (CIJ—continuous flow of ink) and Drop-on-Demand (DOD). DOD is further divided into 3 categories: valvejet (which uses needle valves and solenoid to control the flow of ink), thermal inkjet (a current is applied to a tiny heating element which then heats up rapidly causing the ink to vaporize and bubble within the print head chamber, forcing the ink out of the nozzle) and piezoelectric inkjet which is the focus here. Inkjet printing equipment for printing the above described insulating layers, conductive interconnects, and protective package covering is available from the following companies: Meyer Burger, Ceradrop, M-Solv, Kateeva, Notion, UniJet, TEL, SEMES, Heraeus. Alternatively, an inkjet printing apparatus can be designed using the design of FIG. 71 as a starting point. Characteristics of inkjet printing currently include: a throughput of >10 $m^2$/h; best printing resolution (μm) of 2-10; print layer thickness (μm) of 0.01-1. Strengths of inkjet printing currently include: digital scalability & non-contact versatility. Weaknesses of inkjet printing currently include: clogging issues; complex ink formulation; throughput.

Figure 72:
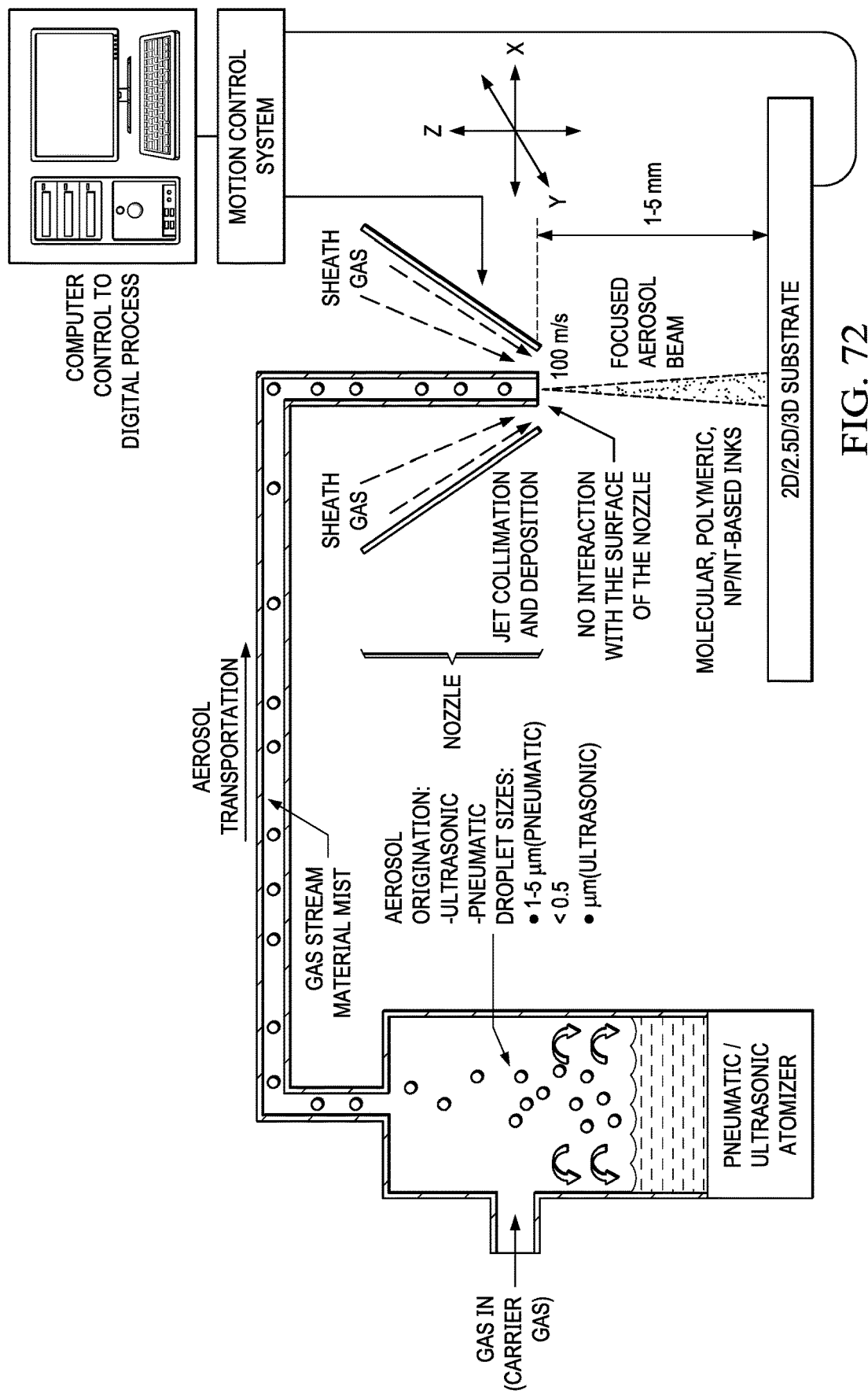
FIG. 72 is a schematic diagram of an example aerosol jet printing apparatus.

Aerosol-Jet:

Is a technology developed by Optomec. The working principle is based on the use of a deposition head that ejects a dense aerosol of microdroplets generated in the reservoir (1) and progressing through the tube (2) to reach the head (3). The head creates a high speed collimated mist stream through an aerodynamic focusing nozzle with sheath gas coming from the side of the nozzle. The technology allows use of low temperature processing (materials with limitation of 100° C. for example) and is compatible with substrates like polycarbonate or polyester. The only current manufacturer of Aerosol jet technology is Optomec. Alternatively, an aerosol jet printing apparatus can be designed using the design of FIG. 72 as a starting point. Characteristics of aerosol jet printing currently include: a throughput of 1-10 m²/h; best printing resolution (μm) of 5-10; print layer thickness (μm) of 0.01-10. Strengths of aerosol jet printing currently include: Z-flexibility; selectivity; conformality. Weaknesses of aerosol jet printing currently include: coffee stains/rings; interaction; gas/substrate.

Figure 73:
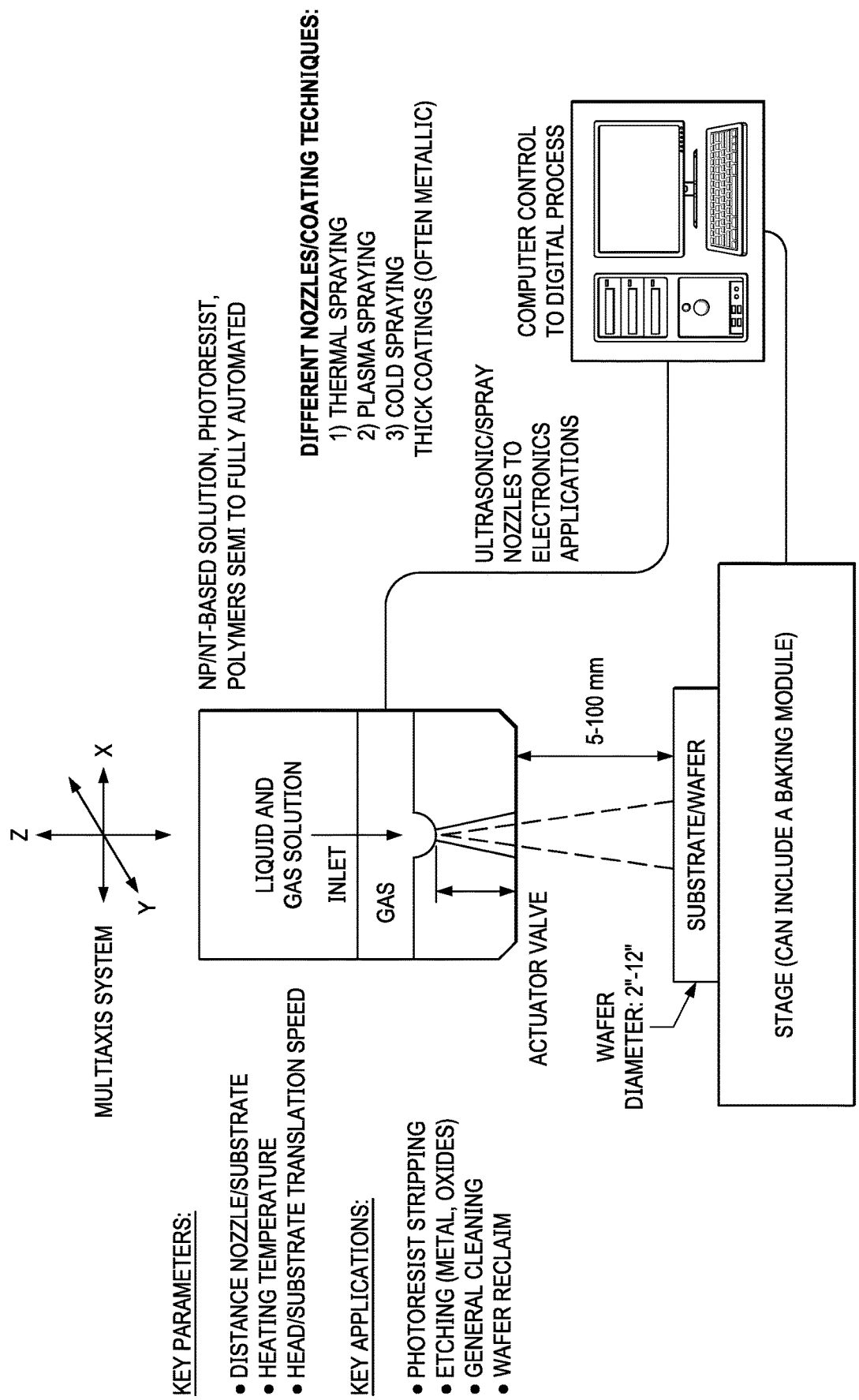
FIG. 73 is a schematic diagram of an example ultrasonic spray printing apparatus.

Spray:

Ultrasonic spray coating uses ultrasound waves to transform a liquid ejected through a nozzle into a mist of uniform micron sized droplets. The working principle is as follows: a liquid is sent though a channel, going through an ultrasonic generator; the wave generated by the ultrasonic system and the distance from the atomizing surface are especially calculated to create the mists. The frequencies used are determining the droplet size. Combining air, nozzle type and ultrasound generated, different shape of spray mist could be produced: jet, vortex, wide. Ultrasonic spray printing equipment for printing selected ones of the above described insulating layers, conductive interconnects, and protective package covering is available from the following companies: SOSS MicroTec; EVG; SONO TEK Corporation; siconnex; OEMGROUP; Nordson; M-SOLV; MYCRONIC; MEI. Alternatively, an ultrasonic spray printing apparatus can be designed using the design of FIG. 73 as a starting point. Characteristics of inkjet printing currently include: a throughput of >10 m²/h; best printing resolution (μm) of 50-100; print layer thickness (μm) of 1-100. Strengths of ultrasonic Spray printing currently include: Z-flexibility; conformality. Weaknesses of ultrasonic Spray printing currently include: Spatial resolution.

Figure 74:
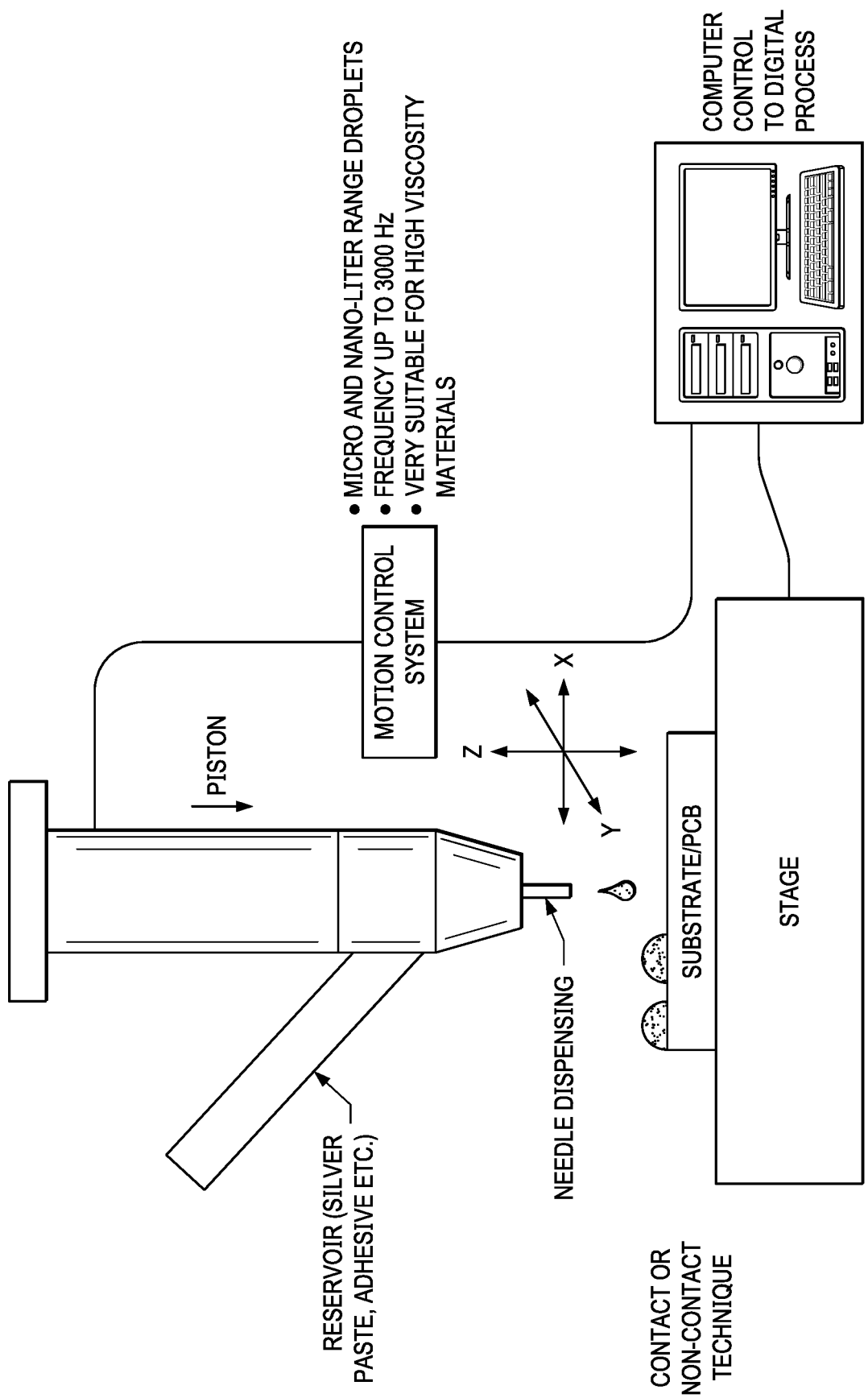
FIG. 74 is a schematic diagram of a microdispensing printing apparatus.

Microdispensing:

Microdispensing is the 3D printing of pastes, inks and other fluids in exceptionally small volumes, typically in the picolitre or nanolitre range. Mechanically, it is similar to jetting technologies but dispenses fluids much closer to the substrate surface, resulting in much finer and more precise printed structures. Ultrasonic spray printing equipment for printing selected ones of the above described insulating layers, conductive interconnects, and protective package covering is available from the following companies: VERMES; pre flow; PVA; MicroFab; microdrop; MYCRONIC. Alternatively, a microdispensing printing apparatus can be designed using the design of FIG. 74 as a starting point. Characteristics of microdispensing printing currently include: a throughput of 0.1-01 m²/h; best printing resolution (μm) of 10-500; print layer thickness (μm) of 50-500. Strengths of microdispensing printing currently include: wide range of materials; scalability. Weaknesses of microdispensing printing currently include: low throughput.

Figure 75:
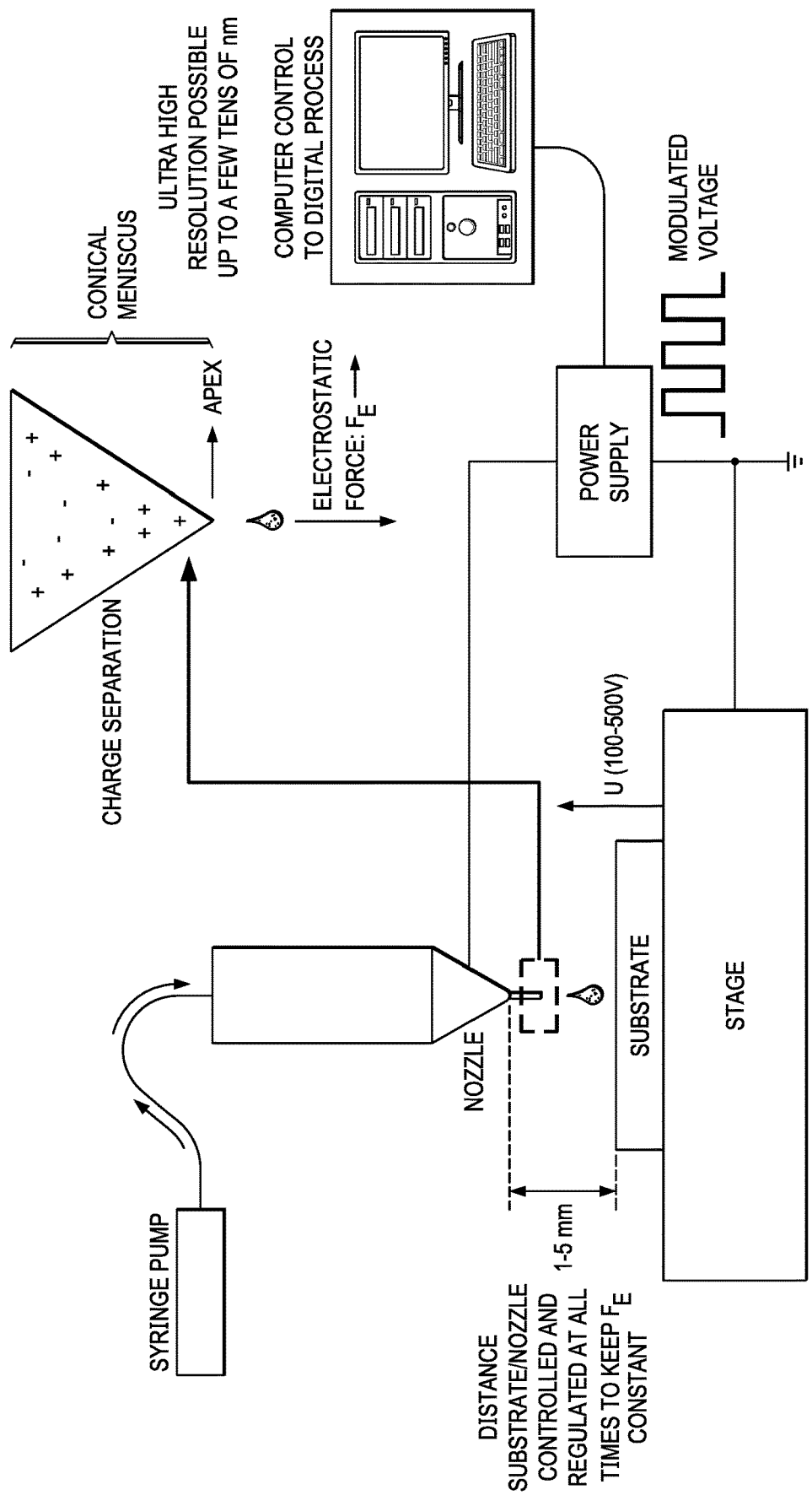

EHD/Electrospraying:

Electrohydrodynamic jet printing (EHD) is an alternative to inkjet and aerosol printing. The technique enables very fine printing capabilities. The process was originally developed for photovoltaic applications as a non-contact technique with very fine features, to avoid shadowing. This technique uses the smallest amount of liquids/inks (1 pL). EHD/Electrospraying printing equipment for printing selected ones of the above described insulating layers, conductive interconnects, and protective package covering is available from the following company: CENJET. Alternatively, an EHD/Electrospraying printing apparatus can be designed using the design of FIG. 75 as a starting point. Characteristics of microdispensing printing currently include: a throughput of 1-5 m²/h; best printing resolution (μm) of 0.01-0.1; print layer thickness (μm) of 0.1-0.5. Strengths of EHD/Electrospraying printing currently include: excellent spatial resolution. Weaknesses of EHD/Electrospraying printing currently include: low throughput.

Laser-Induced Forward Transfer:

Laser-induced forward transfer (LIFT) is a digital printing technique that uses a pulsed laser beam as the driving force to project material from a donor thin film toward the receiving substrate whereon that material will be finally deposited as a voxel. This working principle allows LIFT to operate with both solid and liquid donor films, which provides the technique with an unprecedented broad spectrum of printable materials, and thus makes it very competitive over other digital technologies, like inkjet printing. It is not only that LIFT can access a much wider range of ink viscosities and loading particle sizes; the possibility of printing from solid films allows the single-step printing of multilayers and entire devices, and even makes possible 3D printing. This versatility translates, in turn, into a broad field of applications, from graphics production to printed electronics, from the fabrication of chemical sensors to tissue engineering. This monograph provides an extensive review of the LIFT technique, from its origins to the most recent achievements, focusing on the fundamental aspects of both its working principle and transfer dynamics, as well as on its broad range of applications.

Figure 76:
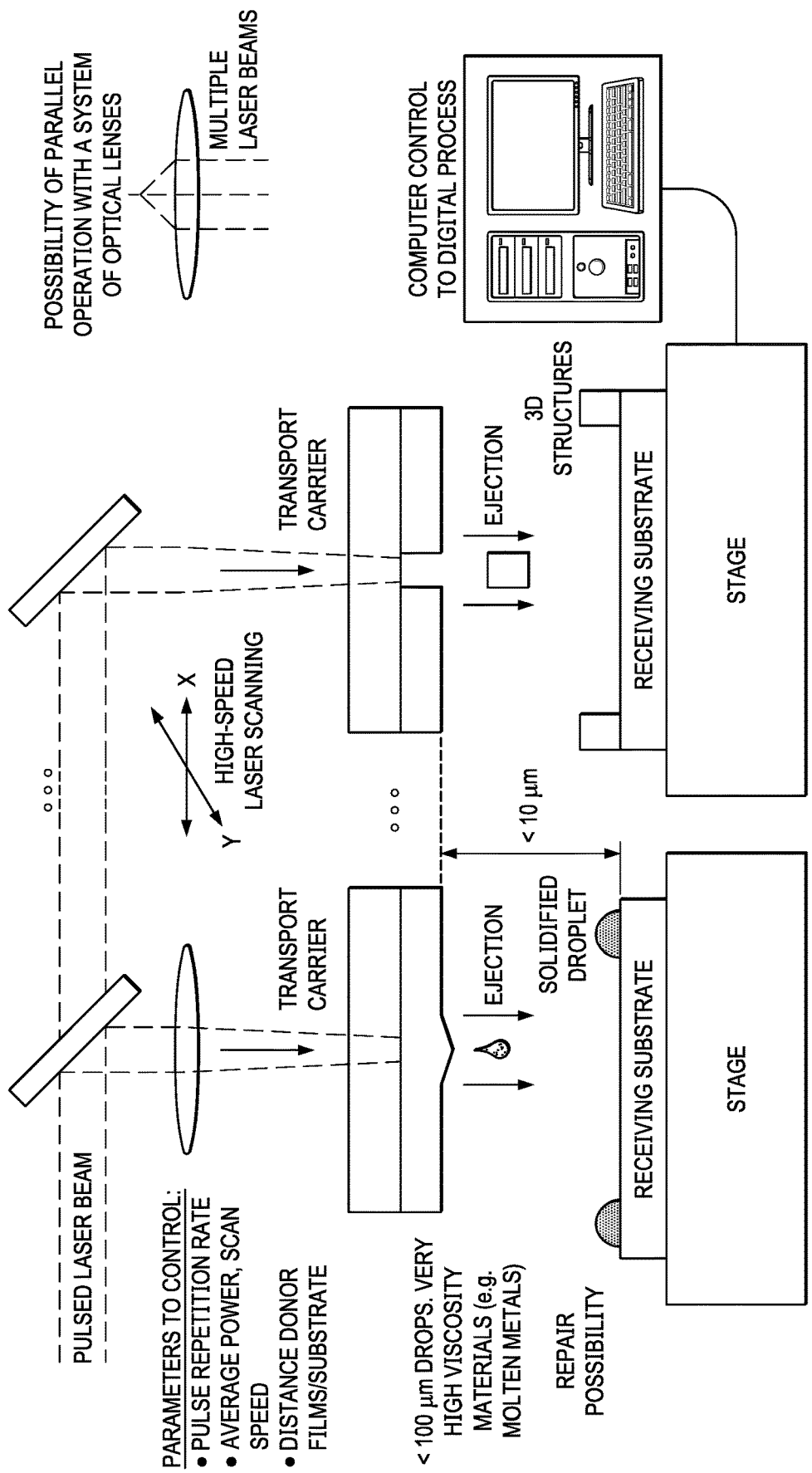

Laser-induced forward transfer (LIFT) printing equipment for printing selected ones of the above described insulating layers, conductive interconnects, and protective package covering is available from the following companies: orbotech, uniqarta, COHERENT. Alternatively, an Laser-induced forward transfer (LIFT) printing apparatus can be designed using the design of FIG. 76 as a starting point. Characteristics of Laser-induced forward transfer (LIFT) printing currently include: a throughput of >1 m units/h; best printing resolution (μm) of 0.1-1; print layer thickness (μm) of 0.1-010. Strengths of Laser-induced forward transfer (UFT) printing currently include: scalability; versatility. Weaknesses of Laser-induced forward transfer (LIFT) printing currently include: integration in clean room; possible interactions; laser/material ejected.

Inks:

Functional inks are characterized in three groups: 1) conductive; 2) dielectric; 3) semiconductive. Conductive inks are typically metallic (Au, Ag, Cu, etc.) and are useful for forming interconnections (such as the above described interconnects (74)), electrodes, antennas, tracks, bus bars, etc. Dielectric inks are useful for insulating multilayer circuity (such as the above described foundation & cover insulating layers 52, 64 & 66) and crossover allowing for multilayer applications. Dielectric inks are mostly based on metal oxide particles and tend to be very thick in the forms of paste or thick liquid, often with a viscosity >20,000 mPa·s. Functional inks can be custom formulated or acquired from companies specializing in developing various types of conductive & insulating inks, including: Dupont, Clevois & Agfa.

Figure 77A:
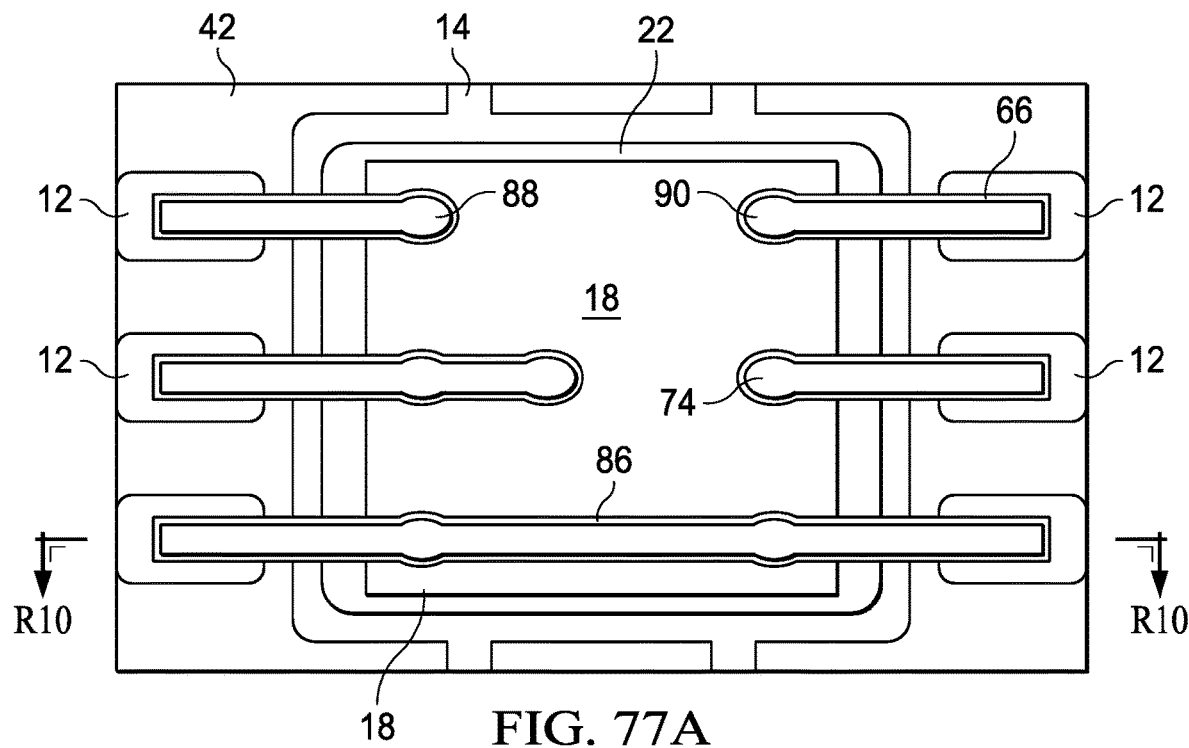
Figure 77B:
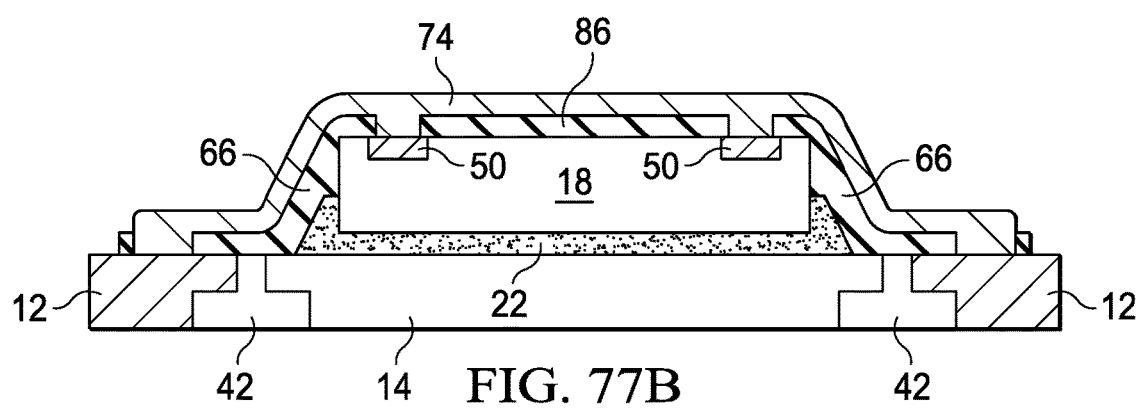
Figure 78A:
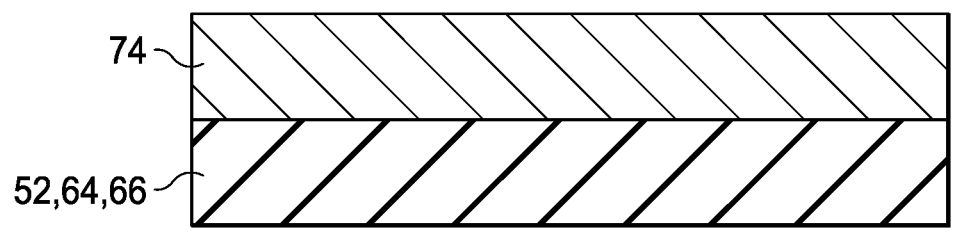
Figure 78B:
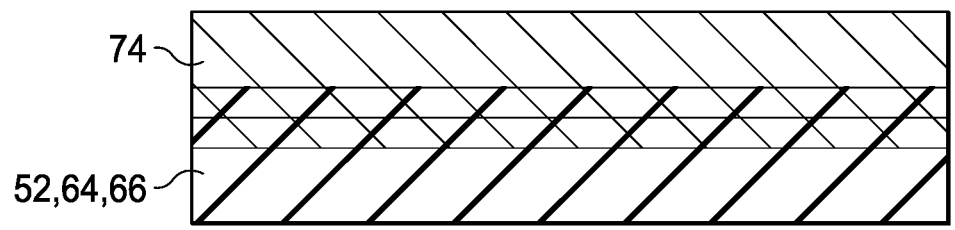
Figure 79A:
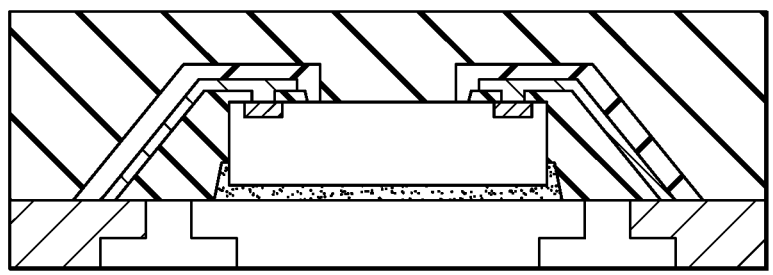
Figure 79B:
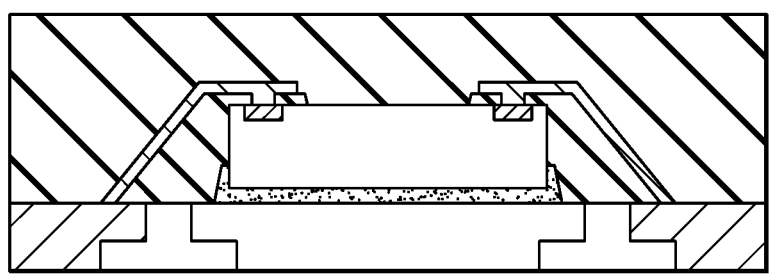
Figure 79C:
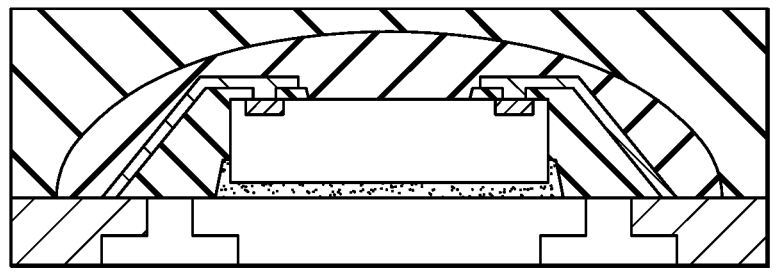
Figure 79D:
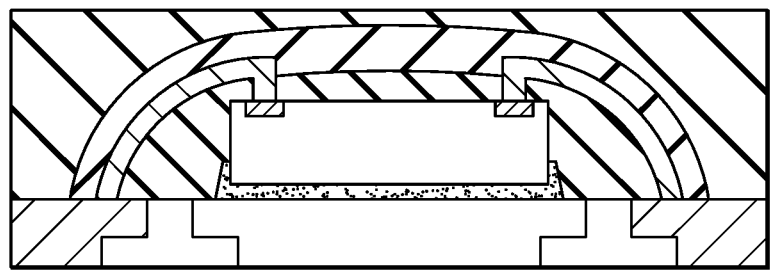
Figure 79E:
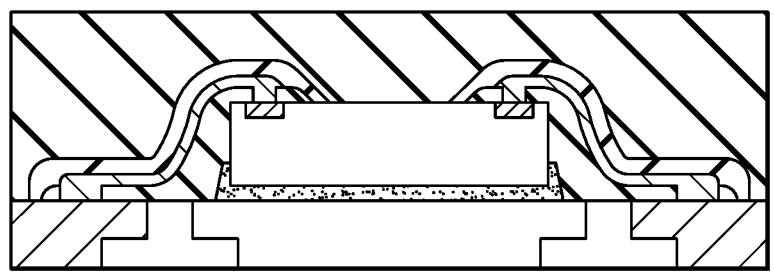
Figure 79F:
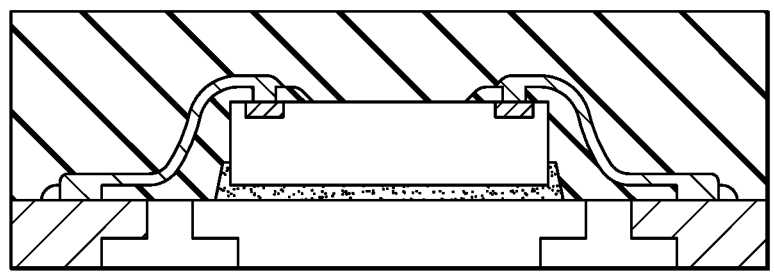
Figure 79G:
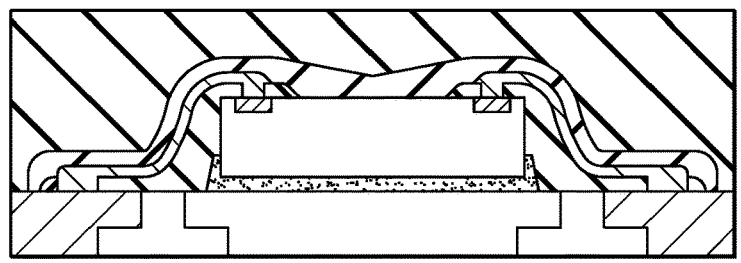
Figure 79H:
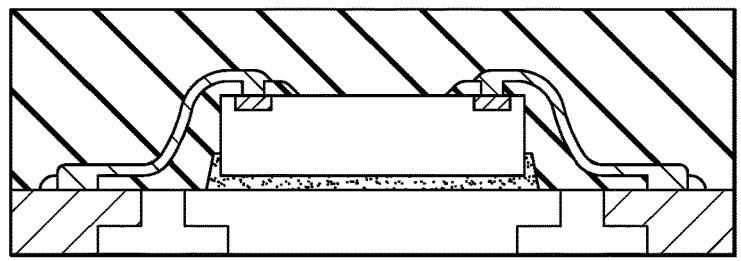

Alternative Implementations:

Alternatively, multiple interconnect shapes, sizes, materials, and contacts can be created within a single die. For example, as shown in FIG. 77A, conductive trace or interconnect 86 is an extension of conductive trace or interconnect 74 on a top surface of die 18 between two bond pads 50 on die 18. While two connections on die 18 are shown, more could be used. This could be useful for connecting together multiple grounds or multiple voltage sources. Another alternative implementation shown in FIG. 77A is the use of different size conductive traces or interconnects on the same device. For example, use of a smaller/thinner conductive trace or interconnect 88 than the size of conductive trace or interconnects 74, Using less material as in conductive trace or interconnect 88 could be useful for a signal line where higher amounts of current are not expected. And while conductive trace or interconnect 88 is shown as being smaller, it could also be larger than conductive trace or interconnects 74 for interconnects where higher currents are expected. FIG. 77A further shows a conductive trace or interconnect 90 that is comprised of a conductive material different than that of conductive trace or interconnect 74. In a wire bonding process, we are limited to one single diameter wire size at a time. However, in the above described printing processes, there is a lot more flexibility as is shown in FIG. 77A. A few concepts are shown above as examples, while several others can be similarly created. FIG. 77B is a cross-sectional view along R10-R10 of FIG. 77A, FIG. 78A show the difference between step and gradient transitions in the barrier or border between conductive interconnects 74 and foundation insulating layers 52, 64, 66. The same also applies to the barrier or boarder between conductive interconnects 74 and cover insulating layers 76, 78 & 80 (not shown). Typically, as in FIG. 78A, there is a discrete step boundary between conductive interconnect and insulating layers as different printing inks are used for each, one conductive and the other insulating. FIG. 78B shows an alternative where proposed gradient transitions between these two layers are possible where the printer is provided with a mix of two contacting materials while gradually changing the mix ratio. Start with insulating material (100%), slowly add some conductive material (5%). As layers are printed, bring that ratio to 50% each, and continue to reduce the insulating material while increasing the conductive material. Eventually fully convert to conductive material. The gradient can be adjusted to meet the of requirements of design specifications, material properties, and space constraints. When the materials differ significantly in properties, then the gradient is slow and wide. When reliability and life times needed are longer, then the gradient is slow and wider. When the design is space constrained, the gradient has to be fast and narrow. Gradient transitions between insulating and conductive layers tends to lower subsequent separation between insulating and conductive layers in a device due to thermal expansion issues.

FIGS. 79A-79H show alternative implementations for a printed package. Layers shown are of different properties as some have to be conductive and some insulating. Each variation can provide a different set of benefits and drawbacks. Option G provides a good compromise between manufacturability, reliability, and cost. It is better when insulating foundation layer, conductive trace, and cover insulating layer closely follow the topology of the lead frame, die and die-attach (as in options E-H). Such a configuration reduces the material usage as well as keep them of mostly uniform thickness. A uniformly thick layer will expand and shrink uniformly. Thicker portions of the insulating layers can deform while higher modulus conductive layer in-between can crack. CTE mismatches between conductive and insulating layers can also lead to delamination and other failures if the layers are too thick, or more importantly, not very uniform in thickness as measured to the closest rigid body. Some alternatives, such as options B, F & H do not use a cover insulating layer over the conductive interconnect and foundation insulating layer(s). In these alternatives, the mold material (or other cover material used in lieu of molding material) is formed directly on exposed portions of the conductive interconnects and foundation insulating layers.

Print Head Alternatives:

In a typical inkjet printer, such as the one in FIG. 80A (e.g., example by MEYER BURGER), an individual print nozzle, such as the one in FIG. 80B, provides individually controlled flow of a specific material and can move along the X, Y & Z axis shown in FIG. 90C. An alternative to the single nozzle inkjet printer is a nozzle array that can span up to the full extent of work distance on that axis, as shown in FIG. 81A. However, pixel pitch and nozzle pitch may not match. An alternative to a nozzle row is a nozzle bank comprising multiple rows of nozzles, as shown in FIG. 81B, offset to fill the pixels in between the nozzles. Row count=Nozzle pitch/Pixel Pitch. Length nozzle bank (L), spanning the full width of the lead frame. (B>lead frame width). Y-axis movement is not needed. Yet an alternative to the nozzle bank's multiple rows of nozzles would be rows of nozzles would be a nozzle system as shown in FIG. 91C. A nozzle system comprises multiple nozzle banks, with each bank optimized for a specific material type. With a nozzle system, multiple machines can be combined and printed in parallel to give higher productivity and compact manufacturing foot-print. As such, based on the package design, multiple nozzles can be combined and configured as shown. Off-set rows to create banks can increase the resolution. Such arrays of nozzles can dispense material at a much faster rate and can operate in parallel at different portions of the device, which increases throughput. Moreover, each nozzle bank could be implemented to deposit a different material, for instance, one bank could deposit insulating material, another bank could deposit conductive material, and a third bank could deposit mold material.

By sequentially arranging the banks of nozzles, layers of material can be applied to the manufacturing process. A nozzle system with integrated curing systems can enable productivity and materials flexibility. By providing additional snap-cure capability between layer printings, as shown in FIG. 82, higher temperature cures and outgassing can be accommodated without clogging or warping the nozzles (and other control equipment).

Those skilled in the art to which this Disclosure relates will appreciate that many other aspects and variations thereof are possible within the scope of the claimed invention, and further additions, deletions, substitutions and modifications may be made without departing from the scope of the Disclosure.

The invention claimed is:

1. A method of making a semiconductor apparatus, comprising:
   forming a first insulating structure extending from a first bond pad of a semiconductor die to a first conductive lead;
   forming a first conductive trace on the first insulating structure from the first bond pad to the first conductive lead;
   forming a second insulating structure on the first conductive trace extending from the first bond pad to the first conductive lead; and
   forming a third insulating structure, the third insulating structure extending from a second of the bond pads to a second of the conductive leads.

2. The method of claim 1, wherein the first insulating structure and the second insulating structure encapsulate the first conductive trace.

3. The method of claim 1, wherein the first insulating structure further extends from a second of the bond pads to a second of the conductive leads.

4. The method of claim 1, further including forming a second conductive trace on the third insulating structure from the second bond pad to the second conductive lead.

5. The method of claim 4, further including forming a fourth insulating structure on the second conductive trace.

6. The method of claim 5, wherein the third and fourth insulating structures encapsulate the second conductive trace.

7. The method of claim 4, wherein the first and second conductive traces are made using conductive inks, conductive polymers, metal filled epoxies, sintered metallic powder, liquid assisted sintering particles, solder paste or solder powder.

8. The method of claim 1, further comprising:
providing a die attach pad, the conductive leads being spaced from the die attach pad and a first surface of the semiconductor die being attached to the die attach pad.

9. The method of claim 1, wherein a second surface of the semiconductor die, opposite the first surface, is attached to the conductive leads.

10. The method of claim 1, wherein a first end of the first insulating structure surrounds but does not completely cover the respective bond pad.

11. The method of claim 1, wherein the first conductive trace is part of a lead frame pre-molded to fill the gaps between metal lead sections with insulating materials such as mold compound, epoxy, polymer or ceramics.

12. The method of claim 1, wherein the first conductive lead is part of a pre-taped lead frame.

13. The method of claim 1, further including forming a channel within the first insulating structure for receiving at least a portion of the first conductive trace.

14. The method of claim 1, wherein the semiconductor die has a side surface extending from a first surface having the bond pads to a second surface opposite the first surface, the first insulating structure extending from the first bond pad along the first surface and the side surface to the first conductive lead.

15. The method of claim 1, wherein the first insulating layer and the second insulating layer comprise the same material.

16. The method of claim 1, wherein the first insulating layer contains a trough that contains the first conductive trace.

17. The method of claim 1, further including applying an encapsulation layer of laminate, injection mold, transfer mold, spray, cast, 3D print, dispense, potting, screen print, spin coat on the first surface of the semiconductor die, the first insulating layer, the second insulating portion and at least a portion of each conductive lead.

18. The method of claim 1, wherein the first and second insulating structures comprise a polymer, epoxy or silicone.

19. A method of making a semiconductor apparatus, comprising:
forming a first insulating structure extending from a first bond pad of a semiconductor die to a first conductive lead and extending from a second bond pad to a second conductive lead;
forming a first conductive trace on the first insulating structure from the first bond pad to the first conductive lead;
forming a second insulating structure on the first conductive trace extending from the first bond pad to the first conductive lead; and
forming a second conductive trace on the first insulating structure from the second bond pad to the second conductive lead.

20. The method of claim 19, further including forming a third insulating structure on the second conductive trace.

21. The method of claim 20, wherein the first and third insulating structures encapsulate the second conductive trace.

22. The method of claim 19, wherein the second insulating structure further covers the second conductive trace from the second bond pad to the second conductive lead.

23. The method of claim 22, wherein the first and second insulating structures encapsulate the first conductive trace and the second conductive trace.

24. The method of claim 19, wherein the first and second conductive traces are made using conductive inks, conductive polymers, metal filled epoxies, sintered metallic powder, liquid assisted sintering particles, solder paste or solder powder.

25. The method of claim 19, wherein the first and second conductive traces comprise various shapes, sizes, materials, current carrying capacities within the same semiconductor apparatus.

26. The method of claim 19, wherein the first conductive trace has a first width and the second conductive trace has a second width different from the first width.

27. The method of claim 19, wherein the first conductive trace comprises a first material and the second conducive trace comprises a second material different than the first material.

28. The method of claim 19, wherein the first insulating structure and the second insulating structure encapsulate the first conductive trace.

29. The method of claim 19, wherein the first insulating structure further extends from a second of the bond pads to a second of the conductive leads.

30. The method of claim 19, further comprising:
providing a die attach pad, the conductive leads being spaced from the die attach pad and a first surface of the semiconductor die being attached to the die attach pad.

31. The method of claim 19, wherein a second surface of the semiconductor die, opposite the first surface, is attached to the conductive leads.

32. The method of claim 19, wherein a first end of the first insulating structure surrounds but does not completely cover the respective bond pad.

33. The method of claim 19, wherein the first conductive trace is part of a lead frame pre-molded to fill the gaps between metal lead sections with insulating materials such as mold compound, epoxy, polymer or ceramics.

34. The method of claim 19, wherein the first conductive lead is part of a pre-taped lead frame.

35. The method of claim 19, further including forming a channel within the first insulating structure for receiving at least a portion of the first conductive trace.

36. The method of claim 19, wherein the semiconductor die has a side surface extending from a first surface having the bond pads to a second surface opposite the first surface, the first insulating structure extending from the first bond pad along the first surface and the side surface to the first conductive lead.

37. The method of claim 19, wherein the first insulating structure and the second insulating structure comprise the same material.

38. The method of claim 19, wherein the first insulating structure contains a trough that contains the first conductive trace.

39. The method of claim 19, further including applying an encapsulation layer of laminate, injection mold, transfer mold, spray, cast, 3D print, dispense, potting, screen print, spin coat on the first surface of the semiconductor die, the first insulating layer, the second insulating portion and at least a portion of each conductive lead.

40. The method of claim 19, wherein the first and second insulating structures comprise a polymer, epoxy or silicone.

41. A method of making a semiconductor apparatus, comprising:
   forming a first insulating structure extending from a first bond pad of a semiconductor die to a first conductive lead;
   forming a first conductive trace on the first insulating structure from the first bond pad to the first conductive lead, wherein the first conductive trace is part of a lead frame pre-molded to fill the gaps between metal lead sections with insulating materials such as mold compound, epoxy, polymer or ceramics, wherein thickness of the pre-molding is about the same as thickness of the leads; and
   forming a second insulating structure on the first conductive trace extending from the first bond pad to the first conductive lead.

42. A method of making a semiconductor apparatus, comprising:
   forming a first insulating structure extending from a first bond pad of a semiconductor die to a first conductive lead, wherein the first insulating layer comprises a thickness in the range of 5-20 microns;
   forming a first conductive trace on the first insulating structure from the first bond pad to the first conductive lead; and
   forming a second insulating structure on the first conductive trace extending from the first bond pad to the first conductive lead.

43. A method of making a semiconductor apparatus, comprising:
   forming a first insulating structure extending from a first bond pad of a semiconductor die to a first conductive lead;
   forming a first conductive trace on the first insulating structure from the first bond pad to the first conductive lead; and
   forming a second insulating structure on the first conductive trace extending from the first bond pad to the first conductive lead, wherein the first insulating layer, the first conductive trace and the second insulating layer follow contours of the topology from the first conductive lead to the first of the bond pads on the semiconductor die.

44. A method of making a semiconductor apparatus, comprising:
   forming a first insulating structure extending from a first bond pad of a semiconductor die to a first conductive lead;
   forming a first conductive trace on the first insulating structure from the first bond pad to the first conductive lead, wherein the first conductive trace comprises a thickness in the range of 5-30 microns; and
   forming a second insulating structure on the first conductive trace extending from the first bond pad to the first conductive lead.

45. A method of making a semiconductor apparatus, comprising:
   forming a first insulating structure extending from a first bond pad of a semiconductor die to a first conductive lead, wherein the first insulating layer has a first thickness on opposite edges and a second thickness in a center portion between the opposite edges, the first thickness being greater than the second thickness;
   forming a first conductive trace on the first insulating structure from the first bond pad to the first conductive lead; and
   forming a second insulating structure on the first conductive trace extending from the first bond pad to the first conductive lead.

46. The method of claim 45, wherein the first conductive trace does not extend above the opposite edges.

47. A method of making a semiconductor apparatus, comprising:
   forming a first insulating structure extending from a first bond pad of a semiconductor die to a first conductive lead;
   forming a first conductive trace on the first insulating structure from the first bond pad to the first conductive lead; and
   forming a second insulating structure on the first conductive trace extending from the first bond pad to the first conductive lead, wherein a transition region between the first insulating structure and the first conductive trace is a composite with a gradient of mix ratios at the transition region.

48. A method of making a semiconductor apparatus, comprising:
   forming a first insulating structure extending from a first bond pad of a semiconductor die to a first conductive lead;
   forming a first conductive trace on the first insulating structure from the first bond pad to the first conductive lead; and
   forming a second insulating structure on the first conductive trace extending from the first bond pad to the first conductive lead, wherein a transition region between the first conductive trace and the second insulating structure is a composite with a gradient of mix ratios at the transition region.

49. A method of making a semiconductor apparatus, comprising:
   forming a first insulating structure extending from a first bond pad of a semiconductor die to a first conductive lead;
   forming a first conductive trace on the first insulating structure from the first bond pad to the first conductive lead, wherein the first conductive trace has a cross-sectional shape that is one of rectangular, square, triangular, circular, semi-circular; and
   forming a second insulating structure on the first conductive trace extending from the first bond pad to the first conductive lead.

50. A method of making a semiconductor apparatus, comprising:
   forming a first insulating structure extending from a first bond pad of a semiconductor die to a first conductive lead;
   forming a first conductive trace on the first insulating structure from the first bond pad to the first conductive lead; and
   forming a second insulating structure on the first conductive trace extending from the first bond pad to the first conductive lead, wherein to get a desired contour of insulating layers along non-horizontal surfaces of the semiconductor die, material is applied in multiple passes with each pass dispensing viscus material onto Z dimension at only desired X-Y location.

51. The method of claim 50, wherein viscosity of the material and exposure to temperature, light, or gases keeps partially hardened material in place.

* * * * *